US009052590B2

(12) United States Patent
Takahashi et al.

(10) Patent No.: US 9,052,590 B2
(45) Date of Patent: Jun. 9, 2015

(54) ACTINIC-RAY- OR RADIATION-SENSITIVE RESIN COMPOSITION AND METHOD OF FORMING PATTERN USING THE COMPOSITION

(75) Inventors: Hidenori Takahashi, Shizuoka (JP); Shuji Hirano, Shizuoka (JP); Takayuki Ito, Shizuoka (JP); Hideaki Tsubaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/393,173

(22) PCT Filed: Aug. 31, 2010

(86) PCT No.: PCT/JP2010/065192
§ 371 (c)(1),
(2), (4) Date: Feb. 28, 2012

(87) PCT Pub. No.: WO2011/025070
PCT Pub. Date: Mar. 3, 2011

(65) Prior Publication Data

US 2012/0156618 A1 Jun. 21, 2012

(30) Foreign Application Priority Data

Aug. 31, 2009 (JP) ................................. 2009-200912

(51) Int. Cl.
*G03F 7/004* (2006.01)
*G03F 7/00* (2006.01)
(Continued)

(52) U.S. Cl.
CPC ................ *G03F 7/0045* (2013.01); *G03F 7/20* (2013.01); *G03F 7/0046* (2013.01); *G03F 7/0392* (2013.01); *G03F 7/0397* (2013.01)

(58) Field of Classification Search
None
See application file for complete search history.

(56) References Cited

U.S. PATENT DOCUMENTS 5,945,250 A 8/1999 Aoai et al.
6,013,411 A * 1/2000 Aoai et al. ................. 430/270.1
7,026,098 B2 4/2006 Komatsu et al.

(Continued)

FOREIGN PATENT DOCUMENTS

JP 09-325497 A 12/1997
JP 10-221852 A 8/1998

(Continued)

OTHER PUBLICATIONS

Wang, Mingxing, et al., "Sythesis and Properties of New Anionic Photoacid Generators Bound Polymer Resists for e-beam and EUV lithography", Proc. of SPIE, pp. 692312-1-692312-7, vol. 6923.

(Continued)

*Primary Examiner* — Cynthia H Kelly
*Assistant Examiner* — Alyssa L Cepluch
(74) *Attorney, Agent, or Firm* — Sughrue Mion, PLLC

(57) ABSTRACT

According to one embodiment, an actinic-ray- or radiation-sensitive resin composition includes a resin (P) containing not only at least one repeating unit (A) that when exposed to actinic rays or radiation, is decomposed to thereby generate an acid and is expressed by any of general formulae (I) to (III) below but also a repeating unit (B) containing at least an aromatic ring group provided that the repeating unit (B) does not include any of those of general formulae (I) to (III). (The characters used in general formulae (I) to (III) have the meanings mentioned in the description.)

(I)

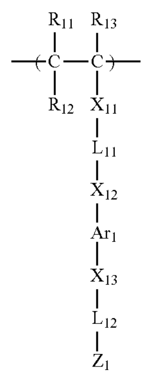

(II)

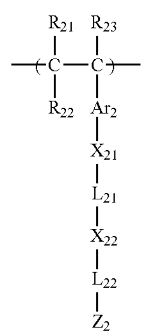

(III)

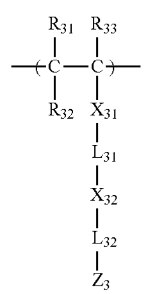

14 Claims, No Drawings

(51) Int. Cl.
*G03F 7/20* (2006.01)
*G03F 7/039* (2006.01)

(56) References Cited

U.S. PATENT DOCUMENTS

| | | | | |
|---|---|---|---|---|
| 7,569,326 | B2 | 8/2009 | Ohsawa et al. | |
| 7,897,821 | B2 | 3/2011 | Nagai et al. | |
| 2003/0134225 | A1* | 7/2003 | Fujimori et al. | 430/270.1 |
| 2005/0221224 | A1* | 10/2005 | Mizutani | 430/270.1 |
| 2007/0117043 | A1 | 5/2007 | Gonsalves | |
| 2008/0102407 | A1* | 5/2008 | Ohsawa et al. | 430/286.1 |
| 2009/0202940 | A1* | 8/2009 | Hatakeyama et al. | 430/270.1 |
| 2010/0040977 | A1 | 2/2010 | Nagai et al. | |
| 2010/0055608 | A1 | 3/2010 | Ohashi et al. | |
| 2010/0233617 | A1* | 9/2010 | Wada | 430/270.1 |
| 2010/0248149 | A1* | 9/2010 | Tsuchimura et al. | 430/296 |
| 2011/0159431 | A1 | 6/2011 | Gonsalves et al. | |
| 2011/0165519 | A1 | 7/2011 | Ando et al. | |
| 2011/0183263 | A1* | 7/2011 | Takahashi et al. | 430/270.1 |
| 2012/0202141 | A1* | 8/2012 | Inasaki et al. | 430/5 |

FOREIGN PATENT DOCUMENTS

| | | | |
|---|---|---|---|
| JP | 2004-158287 | A | 6/2004 |
| JP | 2007-197718 | A | 8/2007 |
| JP | 2008-133448 | A | 6/2008 |
| JP | 2010-077404 | A | 6/2008 |
| JP | 2008-162101 | A | 7/2008 |
| JP | 2009-093137 | A | 4/2009 |
| JP | 2009-211050 | A | 9/2009 |
| JP | 2010-250290 | A | 11/2010 |
| WO | WO 2006/121096 | A1 | 11/2006 |
| WO | WO 2008/056796 | A1 | 5/2008 |
| WO | WO 2009038148 | A1 * | 3/2009 |
| WO | 2009/152276 | A2 | 12/2009 |
| WO | WO 2009152276 | A2 * | 12/2009 |
| WO | WO 2010026973 | A1 * | 3/2010 |

OTHER PUBLICATIONS

Japanese Office Action dated Sep. 3, 2013, issued in corresponding application No. 2009-200912.

* cited by examiner

ACTINIC-RAY- OR RADIATION-SENSITIVE RESIN COMPOSITION AND METHOD OF FORMING PATTERN USING THE COMPOSITION

CROSS REFERENCE TO RELATED APPLICATIONS

This application is a National Stage of International Application No. PCT/JP2010/065192 filed Aug. 31, 2010. This application is based upon and claims the benefit of priority from prior Japanese Patent Application No. 2009-200912, filed Aug. 31, 2009, the entire contents of which are incorporated herein by reference.

TECHNICAL FIELD

The present invention relates to an actinic-ray- or radiation-sensitive resin composition suitable for use in the lithography process or other photofabrication processes for the production of very-large-scale integrated circuits, large-capacity microchips, imprint mold structures, etc. and further to a method of forming a pattern using the composition. More particularly, the present invention relates to a positive resist composition for electron beams, X-rays or EUV light that can find appropriate application in the above processes.

In the present invention, the terms "actinic rays" and "radiation" mean, for example, brightline spectra from a mercury lamp, far ultraviolet represented by excimer laser, extreme ultraviolet, X-rays, electron beams and the like. In the present invention, the term "light" means actinic rays or radiation.

BACKGROUND ART

In the microfabrication by lithography, in recent years, the formation of an ultrafine pattern on the order of tens of nanometers is increasingly demanded in accordance with the realization of high integration for integrated circuits. In accordance with the demand, the trend of exposure wavelength toward a short wavelength, for example, from g-rays to i-rays and further to a KrF excimer laser light is seen. Moreover, now, the development of lithography using electron beams, X-rays or EUV light besides the excimer laser light is progressing.

Further, the microfabrication using a resist composition is not only directly used in the manufacturing of integrated circuits but also, in recent years, finds application in the fabrication of so-called imprint mold structures, etc. (see, for example, patent references 1 and 2 and non-patent reference 1).

In particular, the lithography using electron beams is positioned as the next-generation or next-next-generation pattern forming technology. Positive resists of high sensitivity and high resolution are demanded for the lithography. Specifically, increasing the sensitivity is a very important task to be attained for the reduction of wafer processing time. However, the pursuit of increasing the sensitivity with respect to the positive resists for electron beams is likely to invite not only the lowering of resolving power but also the deterioration of line edge roughness. Thus, there is a strong demand for the development of resists that simultaneously satisfy these properties. Herein, the line edge roughness refers to the phenomenon that the edge at an interface of resist pattern and substrate is irregularly varied in the direction perpendicular to the line direction due to the characteristics of the resist, so that when the pattern is viewed from above, the pattern edge is observed uneven. This unevenness is transferred in the etching operation using the resist as a mask to thereby cause poor electrical properties resulting in poor yield. Especially in the ultrafine region of 0.25 μm or less, the line edge roughness is now an extremely important theme in which improvement is to be attained. High sensitivity is in a relationship of trade-off with high resolution, good pattern configuration and good line edge roughness. How to simultaneously satisfy all of them is a critical issue.

In the lithography using X-rays or EUV light as well, simultaneously satisfying the requirements for high sensitivity on the one hand and high resolution, good pattern configuration and good line edge roughness on the other hand is now an important task, and it is required to resolve the task.

As a means for solving these problems, using a resin provided on its polymer principal chain or side chain with a photoacid generator is now being studied (see, for example, patent references 3 to 8 and non-patent reference 2). However, in the technology disclosed in patent reference 3, a mixed system comprising a resin provided with a photoacid generator and a dissolution inhibiting compound whose solubility in an alkali developer is increased by acid decomposition is used, so that because of the heterogeneous mixing of these materials, it was difficult to realize desirable pattern configuration and line edge roughness.

On the other hand, patent references 4 to 7 disclose a resin containing in its molecule both a photoacid generating group and a group whose solubility in an alkali developer is increased by acid decomposition. However, no aromatic ring group was introduced in the resin except for a cation moiety of the photoacid generating group with the intent to retain the transparency to 193 nm light in consideration of ArF and ArF liquid-immersion exposure. In the lithography using electron beams or EUV light, it is generally contemplated that the aromatic ring moiety of, for example, polyhydroxystyrene or the like when exposed to electron beams or EUV light emits secondary electrons, by which the photoacid generator is decomposed to thereby generate an acid. Therefore, it does not seem quite proper to state that the sensitivity of the resin to electron beams, X-rays or EUV light is satisfactory.

Moreover, patent reference 8 and non-patent reference 2 describe a terpolymer obtained from hydroxystyrene, an acrylate containing an adamantyl group and an acrylate containing a photoacid generator. Patent reference 9 discloses a resist comprising a resin containing a repeating unit sensitive to high-energy rays or heat that generates sulfonic acid at a fluorinated terminal of its side chain in order to enhance the high resolution, iso/dense bias and exposure margin of the resist.

However, with respect to a resin containing a photoacid generating group and an acid-decomposable group in its side chain, the structure of the photoacid generating group is important, and it has been difficult for the above prior art to simultaneously satisfy the requirements for high sensitivity on the one hand and high resolution, desirable pattern configuration and desirable line edge roughness on the other hand in the lithography using X-rays or EUV light.

Furthermore, depending on the structure of the photoacid generating group, an unsatisfactory aging stability of resist has been experienced.

As apparent from the above, the current situation is that any combination of prior art technologies known to now cannot simultaneously fully satisfy the requirements for high sensitivity, high resolution, desirable pattern configuration, desirable line edge roughness, resist aging stability, dry etching resistance and the like in the lithography using electron beams, X-rays or EUV light.

PRIOR ART REFERENCE

Patent Reference

[Patent reference 1] Jpn. Pat. Appln. KOKAI Publication No. (hereinafter referred to as JP-A-) 2004-158287,
[Patent reference 2] JP-A-2008-162101,
[Patent reference 3] JP-A-H9-325497,
[Patent reference 4] JP-A-H10-221852,
[Patent reference 5] JP-A-2007-197718,
[Patent reference 6] International Publication No. 06/121096 (pamphlet),
[Patent reference 7] JP-A-2009-93137,
[Patent reference 8] US Patent Application Publication No. 2007/117043, and
[Patent reference 9] JP-A-2008-133448.

Non-Patent Reference

[Non-patent reference 1] "Fundamentals of nanoimprint and its technology development/application deployment—technology of nanoimprint substrate and its latest technology deployment" edited by Yoshihiko Hirai, published by Frontier Publishing (issued in June, 2006) and
[Non-patent reference 2] Proc. of SPIE Vol. 6923, 692312, 2008.

DISCLOSURE OF INVENTION

It is an object of the present invention to provide, in view of the above-mentioned background art, an actinic-ray- or radiation-sensitive resin composition that simultaneously satisfies all the requirement for sensitivity, resolution, pattern configuration, line edge roughness, resist aging stability and dry etching resistance in especially the lithography using electron beams, X-rays or EUV light as an exposure light source. It is another object of the present invention to provide a method of forming a pattern using the composition.

The present invention in its one aspect is as follows.

(1) An actinic-ray- or radiation-sensitive resin composition comprising a resin (P) containing not only at least one repeating unit (A) that when exposed to actinic rays or radiation, is decomposed to thereby generate an acid and is expressed by any of general formulae (I) to (III) below but also a repeating unit (B) containing at least an aromatic ring group provided that the repeating unit (B) does not include any of those of general formulae (I) to (III), (I)

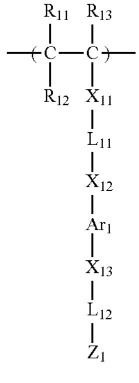

-continued (II)

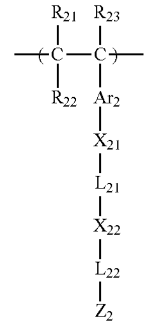

(III)

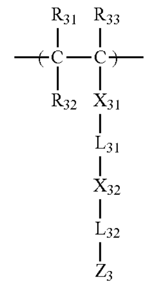

in general formula (I), each of $R_{11}$, $R_{12}$ and $R_{13}$ independently represents a hydrogen atom, an alkyl group, a monovalent aliphatic hydrocarbon ring group, a halogen atom, a cyano group or an alkoxycarbonyl group;

$X_{11}$ represents —O—, —S—, —CO—, —$SO_2$—, —NR— (R represents a hydrogen atom or an alkyl group), a bivalent nitrogenous nonaromatic heterocyclic group or a group composed of a combination of these;

$L_{11}$ represents an alkylene group, an alkenylene group, a bivalent aliphatic hydrocarbon ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group, a bivalent aromatic ring group or a group composed of a combination of these;

each of $X_{12}$ and $X_{13}$ independently represents a single bond, —O—, —S—, —CO—, —$SO_2$—, —NR— (R represents a hydrogen atom or an alkyl group), a bivalent nitrogenous nonaromatic heterocyclic group or a group composed of a combination of these;

$Ar_1$ represents a bivalent aromatic ring group;

$L_{12}$ represents an alkylene group, an alkenylene group, a bivalent aliphatic hydrocarbon ring group, a bivalent aromatic ring group or a group composed of a combination of two or more of these, provided that the hydrogen atoms of these groups are partially or entirely substituted with a substituent selected from among a fluorine atom, a fluoroalkyl group, a nitro group and a cyano group, and provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these; and $Z_1$ represents a moiety that when exposed to actinic rays or radiation, is converted to a sulfonate group, in general formula (II), each of $R_{21}$, $R_{22}$ and $R_{23}$ independently represents a hydrogen atom, an alkyl group, a monovalent aliphatic hydrocarbon ring group, a halogen atom, a cyano group or an alkoxycarbonyl group, provided that $R_{22}$ may be bonded to $Ar_2$ to thereby form a ring, which $R_{22}$ in this instance is an alkylene group;

$Ar_2$ represents a bivalent aromatic ring group;

$X_{21}$ represents —O—, —S—, —CO—, —$SO_2$—, —NR— (R represents a hydrogen atom or an alkyl group), a bivalent nitrogenous nonaromatic heterocyclic group or a group composed of a combination of these;

$L_{21}$ represents a single bond, an alkylene group, an alkenylene group, a bivalent aliphatic hydrocarbon ring group, a bivalent aromatic ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these;

$X_{22}$ represents a single bond, —O—, —S—, —CO—, —$SO_2$—, —NR— (R represents a hydrogen atom or an alkyl group), a bivalent nitrogenous nonaromatic heterocyclic group or a group composed of a combination of these;

$L_{22}$ represents an alkylene group, an alkenylene group, a bivalent aliphatic hydrocarbon ring group, a bivalent aromatic ring group or a group composed of a combination of two or more of these, provided that the hydrogen atoms of these groups may be partially or entirely substituted with a substituent selected from among a fluorine atom, a fluoroalkyl group, a nitro group and a cyano group, and provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these; and $Z_2$ represents a moiety that when exposed to actinic rays or radiation, is converted to a sulfonate group, and in general formula (III), each of $R_{31}$, $R_{32}$ and $R_{33}$ independently represents a hydrogen atom, an alkyl group, a monovalent aliphatic hydrocarbon ring group, a halogen atom, a cyano group or an alkoxycarbonyl group;

each of $X_{31}$ and $X_{32}$ independently represents a single bond, —O—, —S—, —CO—, —$SO_2$—, —NR— (R represents a hydrogen atom or an alkyl group), a bivalent nitrogenous nonaromatic heterocyclic group or a group composed of a combination of these;

$L_{31}$ represents a single bond, an alkylene group, an alkenylene group, a bivalent aliphatic hydrocarbon ring group, a bivalent aromatic ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these;

$L_{32}$ represents an alkylene group, an alkenylene group, a bivalent aliphatic hydrocarbon ring group, a bivalent aromatic ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these;

when $X_{31}$ is a single bond while $L_{31}$ is a bivalent aromatic ring group, $R_{32}$ may form a ring in cooperation with the aromatic ring group of $L_{31}$, which $R_{32}$ in this instance is an alkylene group; and $Z_3$ represents a moiety that when exposed to actinic rays or radiation, is converted to an imidate group or a methidate group.

(2) The actinic-ray- or radiation-sensitive resin composition according to item (1), wherein at least any of the repeating units (B1) of general formula (IV) below is contained as the repeating unit (B), (IV)

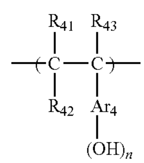

wherein each of $R_{41}$, $R_{42}$ and $R_{43}$ independently represents a hydrogen atom, an alkyl group, a monovalent aliphatic hydrocarbon ring group, a halogen atom, a cyano group or an alkoxycarbonyl group, provided that $R_{42}$ may be bonded to $Ar_4$ to thereby form a ring, which $R_{42}$ in this instance is an alkylene group;

$Ar_4$ represents a bivalent aromatic ring group; and n is an integer of 1 to 4.

(3) The actinic-ray- or radiation-sensitive resin composition according to item (1) or (2), wherein at least a repeating unit (B2) containing a group that when acted on by an acid, is decomposed to thereby generate an alkali-soluble group is contained as the repeating unit (B).

(4) The actinic-ray- or radiation-sensitive resin composition according to item (3), wherein the repeating unit (B2) is any of those of general formulae (V) and (VI) below, (V)

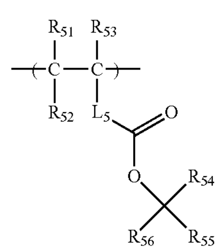

-continued (VI)

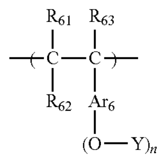

in general formula (V), each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L_5$ to thereby form a ring, which $R_{52}$ in this instance is an alkylene group;

$L_5$ represents a single bond or a bivalent connecting group, provided that $L_5$ may be bonded to $R_{52}$ to thereby form a ring, which $L_5$ in this instance is a trivalent connecting group; and $R_{54}$ represents an alkyl group, and each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to thereby form a ring, provided that at least one of $L_5$, $R_{55}$ and $R_{56}$ is an aromatic ring group or a group containing an aromatic ring group, and that $R_{55}$ and $R_{56}$ are not simultaneously hydrogen atoms, and in general formula (VI), each of $R_{61}$, $R_{62}$ and $R_{63}$ independently represents a hydrogen atom, an alkyl group, a monovalent aliphatic hydrocarbon ring group, a halogen atom, a cyano group or an alkoxycarbonyl group, provided that $R_{62}$ may be bonded to $Ar_6$ to thereby form a ring, which $R_{62}$ in this instance is an alkylene group;

$Ar_6$ represents an aromatic ring group;

Y, or each of Ys independently, represents a hydrogen atom or a group that when acted on by an acid, is cleaved, provided that at least one of Ys is a group that when acted on by an acid, is cleaved; and n is an integer of 1 to 4.

(5) The actinic-ray- or radiation-sensitive resin composition according to any or items (1) to (4), wherein the resin (P) further contains any of the repeating units (C) of general formula (V') below, (V')

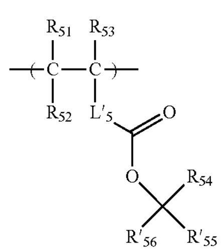

in which each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L'_5$ to thereby form a ring, which $R_{52}$ in this instance is an alkylene group;

$L'_5$ represents a single bond or any of bivalent connecting groups not including a bivalent aromatic ring group, provided that $L'_5$ may form a ring in cooperation with $R_{52}$, which $L'_5$ in this instance is a trivalent connecting group; and $R_{54}$ represents an alkyl group, and each of $R'_{55}$ and $R'_{56}$ independently represents a hydrogen atom, an alkyl group or a monovalent aliphatic hydrocarbon ring group, provided that $R'_{55}$ and $R'_{56}$ may be bonded to each other to thereby form a ring.

(6) The actinic-ray- or radiation-sensitive resin composition according to any or items (1) to (5), wherein the resin (P) further contains a repeating units (D) containing a group that when acted on by an alkali developer is decomposed to thereby increase its dissolution rate in the alkali developer.

(7) The actinic-ray- or radiation-sensitive resin composition according to any of items (1) to (6), which further comprises a basic compound.

(8) The actinic-ray- or radiation-sensitive resin composition according to any of items (1) to (7), adapted for exposure using electron beams, X-rays or EUV light as an exposure light source.

(9) A method of forming a pattern, comprising the steps of forming the actinic-ray- or radiation-sensitive resin composition according to any of items (1) to (8) into a film, exposing the film and developing the exposed film.

(10) The method of forming a pattern according to item (9), wherein the exposure is carried out using electron beams, X-rays or EUV light as an exposure light source.

The present invention has made it feasible to provide a pattern formed with an actinic-ray- or radiation-sensitive resin composition ensuring excellent sensitivity, resolution, pattern configuration, line edge roughness, resist aging stability and dry etching resistance in the lithography using electron beams, X-rays or EUV light as an exposure light source.

BEST MODE FOR CARRYING OUT THE INVENTION

The present invention will be described in detail below.

With respect to the expression of a group (atomic group) used in this specification, the expression even when there is no mention of “substituted and unsubstituted” encompasses groups not only having no substituent but also having substituents. For example, the expression “alkyl groups” encompasses not only alkyls having no substituent (unsubstituted alkyls) but also alkyls having substituents (substituted alkyls).

<Resin (P)>

The resin (P) to be contained in the actinic-ray- or radiation-sensitive resin composition of the present invention contains a repeating unit (A) that when exposed to actinic rays or radiation, is decomposed to thereby generate an acid and a repeating unit (B) containing at least an aromatic ring group.

[Repeating Unit (A)]

The resin (P) contains, as a repeating unit (A), at least one repeating unit selected from among those of any of general formulae (I) to (III) below.

(I)

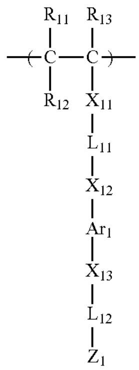

(II)

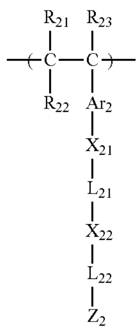

(III)

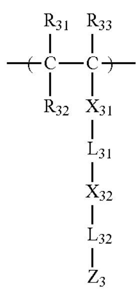

First, general formula (I) will be described.

In general formula (I), each of $R_{11}$, $R_{12}$ and $R_{13}$ independently represents a hydrogen atom, an alkyl group, a monovalent aliphatic hydrocarbon ring group, a halogen atom, a cyano group or an alkoxycarbonyl group.

The alkyl group is an optionally substituted linear or branched alkyl group, preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred. An alkyl group having 3 or less carbon atoms is most preferred.

The alkyl group contained in the alkoxycarbonyl group is preferably the same as the alkyl group mentioned above with respect to $R_{11}$, $R_{12}$ and $R_{13}$.

As the monovalent aliphatic hydrocarbon ring group, there can be mentioned an optionally substituted monocyclic or polycyclic aliphatic hydrocarbon ring group. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is especially preferred.

As preferred substituents that can be introduced in these groups, there can be mentioned a hydroxyl group; a halogen atom (fluorine, chlorine, bromine or iodine); a nitro group; a cyano group; an amido group; a sulfonamido group; any of the alkyl groups mentioned above with respect to $R_{11}$ to $R_{13}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. A hydroxyl group and a halogen atom are especially preferred.

In general formula (I), each of $R_{11}$, $R_{12}$ and $R_{13}$ is preferably a hydrogen atom, an alkyl group or a halogen atom. A hydrogen atom, a methyl group, an ethyl group, a trifluoromethyl group (—$CF_3$), a hydroxymethyl group (—$CH_2$—OH), a chloromethyl group (—$CH_2$—Cl) and a fluorine atom are especially preferred.

$X_{11}$ represents —O—, —S—, —CO—, —$SO_2$—, —NR— (R represents a hydrogen atom or an alkyl group), a bivalent nitrogenous nonaromatic heterocyclic group or a group composed of a combination of these.

With respect to —NR—, the alkyl group represented by R is an optionally substituted linear or branched alkyl group. Particular examples thereof are the same as those of the alkyl groups represented by $R_{11}$, $R_{12}$ and $R_{13}$. R is most preferably a hydrogen atom, a methyl group or an ethyl group.

The bivalent nitrogenous nonaromatic heterocyclic group refers to a preferably 3- to 8-membered nonaromatic heterocyclic group having at least one nitrogen atom. In particular, there can be mentioned, for example, bivalent connecting groups with the following structures.

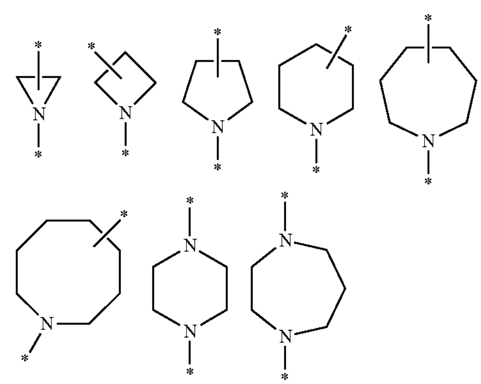

$X_{11}$ is preferably —O—, —CO—, —$SO_2$—, —NR— (R represents a hydrogen atom or an alkyl group) or a group composed of a combination of these. $X_{11}$ is most preferably —COO— or —CONR— (R represents a hydrogen atom or an alkyl group).

$L_{11}$ represents an alkylene group, an alkenylene group, a bivalent aliphatic hydrocarbon ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group, a bivalent aromatic ring group or a group composed of a combination of these.

The alkylene group represented by $L_{11}$ may be linear or branched. As preferred examples thereof, there can be mentioned, for example, alkylene groups having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the alkylene group described above in connection with $L_{11}$.

The bivalent aliphatic hydrocarbon ring group may be monocyclic or polycyclic. As preferred examples thereof, there can be mentioned, for example, bivalent aliphatic hydrocarbon ring groups each having 3 to 17 carbon atoms, such as a cyclobutylene group, a cyclopentylene group, a cyclohexylene group, a norbornanylene group, an adamantylene group or a diamantanylene group. A bivalent aliphatic hydrocarbon ring group having 5 to 12 carbon atoms is more preferred. A bivalent aliphatic hydrocarbon ring group having 6 to 10 carbon atoms is more preferred.

As the bivalent aromatic ring group as a connecting group, there can be mentioned, for example, an optionally substituted arylene group having 6 to 14 carbon atoms, such as a phenylene group, a tolylene group or a naphthylene group, or a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Particular examples of the —NR— and bivalent nitrogenous nonaromatic heterocyclic group are the same as mentioned above in connection with $X_{11}$. Preferred examples are also the same.

Most preferably, $L_{11}$ is an alkylene group, a bivalent aliphatic hydrocarbon ring group or a group composed of an alkylene group combined with a bivalent aliphatic hydrocarbon ring group through —OCO—, —O— or —CONH— (for example, -alkylene-O-alkylene-, -alkylene-OCO-alkylene-, -bivalent aliphatic hydrocarbon ring group-O-alkylene-, -alkylene-CONH-alkylene- or the like).

Each of $X_{12}$ and $X_{13}$ independently represents a single bond, —O—, —S—, —CO—, —$SO_2$—, —NR— (R represents a hydrogen atom or an alkyl group), a bivalent nitrogenous nonaromatic heterocyclic group or a group composed of a combination of these.

Particular examples of the —NR— and bivalent nitrogenous nonaromatic heterocyclic group represented by $X_{12}$ and $X_{13}$ are the same as mentioned above in connection with $X_{11}$. Preferred examples are also the same.

Preferably, $X_{12}$ is a single bond, —S—, —O—, —CO—, —$SO_2$— or a group composed of a combination of these. A single bond, —S—, —OCO— and —$OSO_2$— are especially preferred.

Preferably, $X_{13}$ is —O—, —CO—, —$SO_2$— or a group composed of a combination of these. —$OSO_2$— is especially preferred.

$Ar_1$ represents a bivalent aromatic ring group. A substituent may be introduced in the bivalent aromatic ring group. As preferred examples thereof, there can be mentioned, for example, an arylene group having 6 to 18 carbon atoms, such as a phenylene group, a tolylene group or a naphthylene group; an aralkylene group resulting from combination of an arylene group having 6 to 18 carbon atoms with an alkylene having 1 to 8 carbon atoms; and a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Preferred substituents that can be introduced in these groups are, for example, the alkyl group mentioned in connection with $R_{11}$ to $R_{13}$, an alkoxy group such as a methoxy group, an ethoxy group, a hydroxyethoxy group, a propoxy group, a hydroxypropoxy group or a butoxy group and an aryl group such as a phenyl group.

Preferably, $Ar_1$ is an optionally substituted arylene group having 6 to 18 carbon atoms or an aralkylene group resulting from combination of an arylene group having 6 to 18 carbon atoms with an alkylene having 1 to 4 carbon atoms. A phenylene group, a naphthylene group, a biphenylene group and a phenylene group substituted with a phenyl group are especially preferred.

$L_{12}$ represents an alkylene group, an alkenylene group, a bivalent aliphatic hydrocarbon ring group, a bivalent aromatic ring group or a group composed of a combination of two or more of these, provided that the hydrogen atoms of these groups are partially or entirely substituted with a substituent selected from among a fluorine atom, a fluoroalkyl group, a nitro group and a cyano group, and provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these.

Preferably, $L_{12}$ is an alkylene group, bivalent aromatic ring group or group composed of a combination of these whose hydrogen atoms are partially or entirely substituted with a fluorine atom or a fluoroalkyl group (more preferably a perfluoroalkyl group). An alkylene group and bivalent aromatic ring group at least partially or entirely substituted with a fluorine atom are especially preferred. $L_{12}$ is most preferably an alkylene group or bivalent aromatic ring group, 30 to 100% of the hydrogen atoms of which are substituted with a fluorine atom.

The alkylene group represented by $L_{12}$ may be linear or branched. As preferred examples thereof, there can be mentioned, for example, alkylene groups each having 1 to 8 carbon atoms, such as a methylene group, an ethylene group, a propylene group, a butylene group, a hexylene group and an octylene group. An 15, alkylene group having 1 to 6 carbon atoms is more preferred. An alkylene group having 1 to 4 carbon atoms is most preferred.

As the alkenylene group, there can be mentioned a group resulting from the introduction of a double bond in any position of the above alkylene group.

The bivalent aliphatic hydrocarbon ring group may be monocyclic or polycyclic. As preferred examples thereof, there can be mentioned, for example, bivalent aliphatic hydrocarbon ring groups each having 3 to 17 carbon atoms, such as a cyclobutylene group, a cyclopentylene group, a cyclohexylene group, a norbornanylene group, an adamantylene group or a diadamantanylene group.

Particular examples of the bivalent aromatic ring group are the same as set forth above with respect to the bivalent aromatic ring group as a connecting group represented by $L_{11}$.

Particular examples of the —NR— and bivalent nitrogenous nonaromatic heterocyclic group as connecting groups represented by $L_{12}$ are the same as mentioned above in connection with $X_{11}$. Preferred examples are also the same.

Preferred particular examples of $L_{12}$ are shown below, which in no way limit the scope of appropriate $L_{12}$.

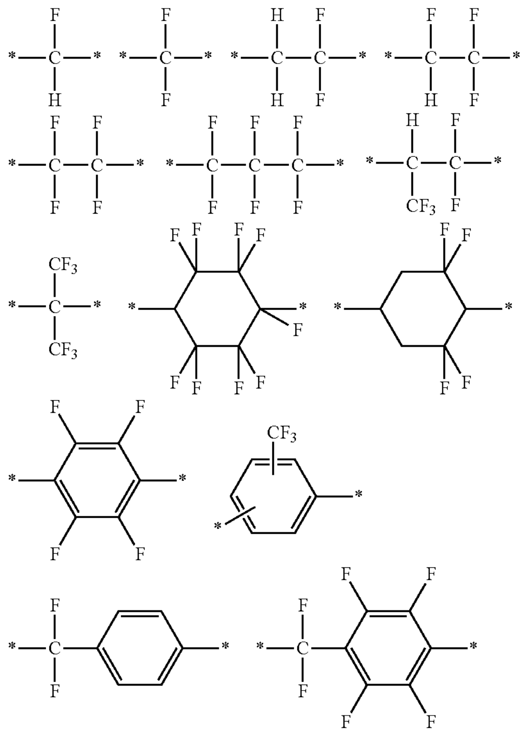

$Z_1$ represents a moiety that when exposed to actinic rays or radiation, is converted to a sulfonate group.

It is preferred for the moiety represented by $Z_1$ to be an onium salt. The onium salt is preferably a sulfonium salt or an iodonium salt. The onium salt preferably has the structure of general formula (ZI) or (ZII) below.

(ZI)

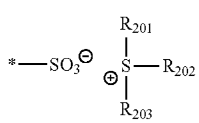

(ZII)

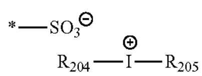

In the above general formula (ZI), each of $R_{201}$, $R_{202}$ and $R_{203}$ independently represents an organic group.

The number of carbon atoms of the organic group represented by $R_{201}$, $R_{202}$ and $R_{203}$ is generally in the range of 1 to 30, preferably 1 to 20.

Two of $R_{201}$ to $R_{203}$ may be bonded with each other to thereby form a ring structure (including a condensed ring), and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

As the organic groups represented by $R_{201}$, $R_{202}$ and $R_{203}$, there can be mentioned, for example, groups corresponding to the compounds (ZI-1), (ZI-2) and (ZI-3) to be described hereinafter.

The compounds (ZI-1) are arylsulfonium compounds of the general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a monovalent aliphatic hydrocarbon ring group.

As the arylsulfonium compounds, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the heterocyclic structure, there can be mentioned, for example, a pyrrole, a furan, a thiophene, an indole, a benzofuran, a benzothiophene or the like.

When the arylsulfonium compound has two or more aryl groups, the two or more aryl groups may be identical to or different from each other.

The alkyl group or monovalent aliphatic hydrocarbon ring group contained in the arylsulfonium compound according to necessity is preferably a linear or branched alkyl group having 1 to 15 carbon atoms or a monovalent aliphatic hydrocarbon ring group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or monovalent aliphatic hydrocarbon ring group represented by $R_{201}$ to $R_{203}$ may have as its substituent an alkyl group (for example, 1 to 15 carbon atoms), a monovalent aliphatic hydrocarbon ring group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, monovalent aliphatic hydrocarbon ring group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent As one aspect of groups of (ZI-1), there can be mentioned the structure of general formula (ZI-1A) below.

(ZI-1A)

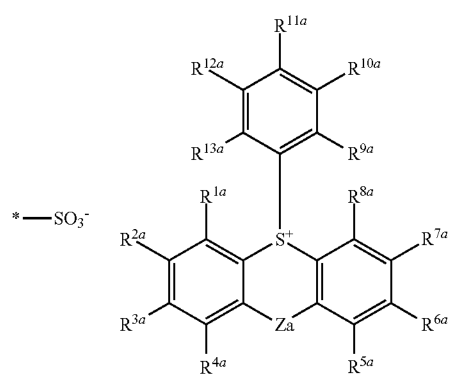

In the general formula (ZI-1A), each of $R^{1a}$ to $R^{13a}$ independently represents a hydrogen atom or a substituent, provided that at least one of $R^{1a}$ to $R^{13a}$ is a substituent containing an alcoholic hydroxyl group.

Za represents a single bond or a bivalent connecting group.

In the present invention, the alcoholic hydroxyl group refers to a hydroxyl group bonded to a carbon atom of a linear, branched or cyclic alkyl group.

When $R^{1a}$ to $R^{13a}$ represent substituents containing an alcoholic hydroxyl group, it is preferred for the $R^{1a}$ to $R^{13a}$ to represent the groups of the formula —W—Y, wherein Y represents a hydroxyl-substituted linear, branched or cyclic alkyl group and W represents a single bond or a bivalent connecting group.

As the linear, branched or cyclic alkyl group represented by Y, there can be mentioned a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a cyclopropyl group, a cyclopentyl group, a cyclohexyl group, an adamantyl group, a norbornyl group, a boronyl group or the like. Of these, an ethyl group, a propyl group, an isopropyl group, an n-butyl group, an isobutyl group and a sec-butyl group are preferred. An ethyl group, a propyl group and an isopropyl group are more preferred. Especially preferably, Y contains the structure of —$CH_2CH_2OH$.

W is preferably a single bond, or a bivalent group as obtained by replacing with a single bond any hydrogen atom of a group selected from among an alkoxy group, an acyloxy group, an acylamino group, an alkyl- or arylsulfonylamino group, an alkylthio group, an alkylsulfonyl group, an acyl group, an alkoxycarbonyl group and a carbamoyl group. More preferably, W is a single bond, or a bivalent group as obtained by replacing with a single bond any hydrogen atom of a group selected from among an acyloxy group, an alkylsulfonyl group, an acyl group and an alkoxycarbonyl group.

When $R^{1a}$ to $R^{13a}$ represent substituents containing an alcoholic hydroxyl group, the number of carbon atoms contained in each of the substituents is preferably in the range of 2 to 10, more preferably 2 to 6 and further preferably 2 to 4.

Each of the substituents containing an alcoholic hydroxyl group represented by $R^{1a}$ to $R^{13a}$ may have two or more alcoholic hydroxyl groups. The number of alcoholic hydroxyl groups contained in each of the substituents containing an alcoholic hydroxyl group represented by $R^{1a}$ to $R^{13a}$ is in the range of 1 to 6, preferably 1 to 3 and more preferably 1.

The number of alcoholic hydroxyl groups contained in any of the compounds of the general formula (ZI-1A) as the total of those of $R^{1a}$ to $R^{13a}$ is in the range of 1 to 10, preferably 1 to 6 and more preferably 1 to 3.

When $R^{1a}$ to $R^{13a}$ do not contain any alcoholic hydroxyl group, each of $R^{1a}$ to $R^{13a}$ preferably represents a hydrogen atom, a halogen atom, any of alkyl groups (including a monovalent aliphatic hydrocarbon ring group), any of alkenyl groups (including a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or arylsulfonylamino group, an alkylthio group, an arylthio group, a sulfamoyl group, an alkyl- or arylsulfonyl group, an aryloxycarbonyl group, an alkoxycarbonyl group, a carbamoyl group, an imido group, a silyl group or a ureido group.

When $R^{1a}$ to $R^{13a}$ do not contain any alcoholic hydroxyl group, each of $R^{1a}$ to $R^{13a}$ more preferably represents a hydrogen atom, a halogen atom, any of alkyl groups (including a monovalent aliphatic hydrocarbon ring group), a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group or a carbamoyl group.

When $R^{1a}$ to $R^{13a}$ do not contain any alcoholic hydroxyl group, especially preferably, each of $R^{1a}$ to $R^{13a}$ represents a hydrogen atom, any of alkyl groups (including a monovalent aliphatic hydrocarbon ring group), a halogen atom or an alkoxy group.

Any two adjacent to each other of $R^{1a}$ to $R^{13a}$ can cooperate with each other so as to form a ring (an aromatic or nonaromatic cyclohydrocarbon or heterocycle which can form a condensed polycycle through further combination; as such, there can be mentioned, for example, a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring).

In the general formula (ZI-1A), at least one of $R^{1a}$ to $R^{13a}$ contains an alcoholic hydroxyl group. Preferably, at least one of $R^{9a}$ to $R^{13a}$ contains an alcoholic hydroxyl group.

Za represents a single bond or a bivalent connecting group. The bivalent connecting group is, for example, an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH═CH—, —C≡C—, an aminocarbonylamino group, an aminosulfonylamino group or the like. The bivalent connecting group may have a substituent. The same substituents as mentioned above with respect to $R^{1a}$ to $R^{13a}$ can be employed. Preferably, Za is a single bond or a substituent exhibiting no electron withdrawing properties, such as an alkylene group, an arylene group, an ether group, a thioether group, an amino group, —CH═CH—, —CH≡CH—, an aminocarbonylamino group or an aminosulfonylamino group. More preferably, Z is a single bond, an ether group or a thioether group. Most preferably, Z is a single bond.

Now, the compounds (ZI-2) will be described.

The compounds (ZI-2) are compounds of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a monovalent aliphatic hydrocarbon ring group, an allyl group or a vinyl group. More preferred groups are a linear or branched 2-oxoalkyl group, a 2-oxoaliphatic hydrocarbon ring group and an alkoxycarbonylmethyl group. Especially preferred is a linear or branched 2-oxoalkyl group.

As preferred alkyl groups and aliphatic hydrocarbon ring groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and an aliphatic hydrocarbon ring group having 3 to 10 carbon atoms (a cyclopentyl group, a cyclohexyl group or a norbornyl group). As more preferred alkyl groups, there can be mentioned a 2-oxoalkyl group and an alkoxycarbonylmethyl group. As more preferred aliphatic hydrocarbon ring group, there can be mentioned a 2-oxoaliphatic hydrocarbon ring group.

The 2-oxoalkyl group may be linear or branched. A group having >C═O at the 2-position of the alkyl group is preferred.

The 2-oxoaliphatic hydrocarbon ring group is preferably a group having >C═O at the 2-position of the aliphatic hydrocarbon ring group.

As preferred alkoxy groups of the alkoxycarbonylmethyl group, there can be mentioned alkoxy groups having 1 to 5 carbon atoms (a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

Now, the compounds (ZI-3) will be described.

The compounds (ZI-3) are those represented by general formula (ZI-3), below, which have a phenacylsulfonium salt structure.

(ZI-3)

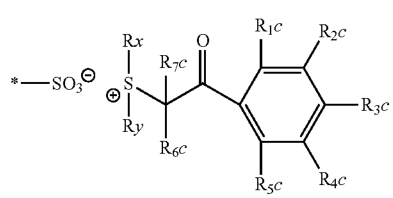

In general formula (ZI-3), each of $R_{1c}$ to $R_{5c}$ independently represents a hydrogen atom, an alkyl group, a monovalent aliphatic hydrocarbon ring group, an alkoxy group or a halogen atom.

Each of $R_{6c}$ and $R_{7c}$ independently represents a hydrogen atom, an alkyl group or a monovalent aliphatic hydrocarbon ring group.

Each of $R_x$ and $R_y$ independently represents an alkyl group, a monovalent aliphatic hydrocarbon ring group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group).

As the monovalent aliphatic hydrocarbon ring group represented by $R_{1c}$ to $R_{7c}$, there can be mentioned, for example, a monovalent aliphatic hydrocarbon ring group (monocyclic or polycyclic) having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a monovalent aliphatic hydrocarbon ring group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

As the alkyl groups and monovalent aliphatic hydrocarbon ring groups represented by $R_x$ and $R_y$, there can be mentioned the same alkyl groups and monovalent aliphatic hydrocarbon ring groups as mentioned with respect to $R_{1c}$ to $R_{7c}$. Among them, a 2-oxoalkyl group, a 2-oxoaliphatic hydrocarbon ring group and an alkoxycarbonylmethyl group are preferred.

As the 2-oxoalkyl group and 2-oxoaliphatic hydrocarbon ring group, there can be mentioned groups having >C═O at the 2-position of the alkyl group and aliphatic hydrocarbon ring group represented by $R_{1c}$ to $R_{7c}$.

Regarding the alkoxy group of the alkoxycarbonylmethyl group, there can be mentioned the same alkoxy groups as mentioned with respect to $R_{1c}$ to $R_{5c}$.

Each of $R_x$ and $R_y$ is preferably an alkyl group or a monovalent aliphatic hydrocarbon ring group having preferably 4 or more carbon atoms. The alkyl group or monovalent aliphatic hydrocarbon ring group has more preferably 6 or more carbon atoms and still more preferably 8 or more carbon atoms.

Now, general formula (ZII) will be described.

In general formula (ZII), each of $R_{204}$ and $R_{205}$ independently represents an aryl group, an alkyl group or a monovalent aliphatic hydrocarbon ring group.

Particular examples of the aryl group, alkyl group and monovalent aliphatic hydrocarbon ring group represented by each of $R_{204}$ and $R_{205}$ are the same as mentioned above with respect to the groups (ZI-1).

Substituents may be introduced in the aryl group, alkyl group and monovalent aliphatic hydrocarbon ring group represented by each of $R_{204}$ and $R_{205}$. As the substituents that may be introduced in the aryl group, alkyl group and monovalent aliphatic hydrocarbon ring group represented by each of $R_{204}$ and $R_{205}$, there can be mentioned, for example, an alkyl group (for example, 1 to 15 carbon atoms), a monovalent aliphatic hydrocarbon ring group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group and the like.

With respect to the polymerizable monomer units corresponding to the repeating units of general formula (I), examples of the sulfonate units generated by the cleavage of a cation upon exposure to actinic rays or radiation will be shown below.

(I-1)
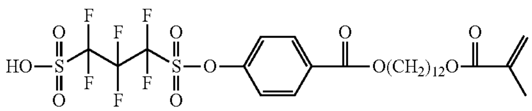
(I-2)
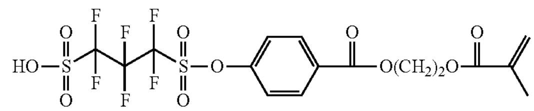
(I-3)
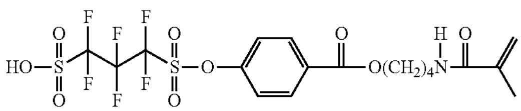
(I-4)
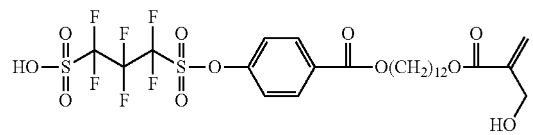
(I-5)
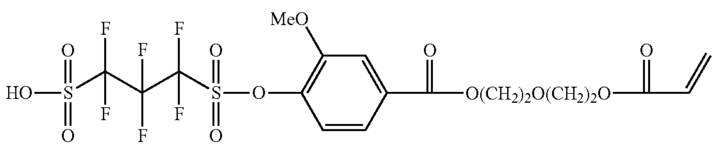
(I-6)
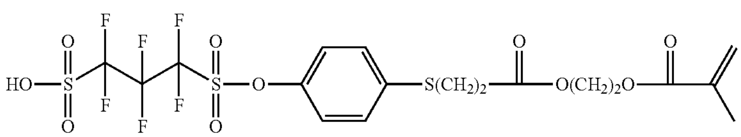
(I-7)
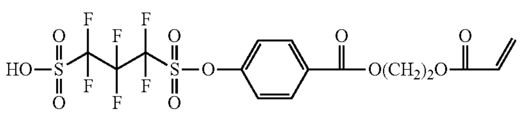
(I-8)
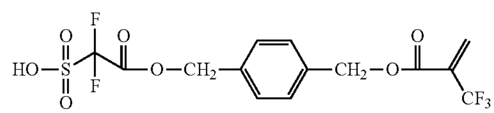
(I-9)
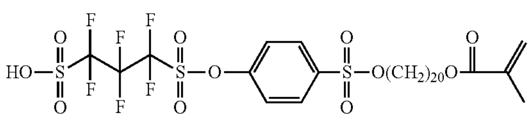
(I-10)
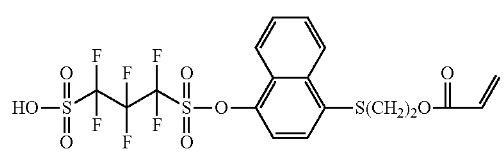
(I-11)
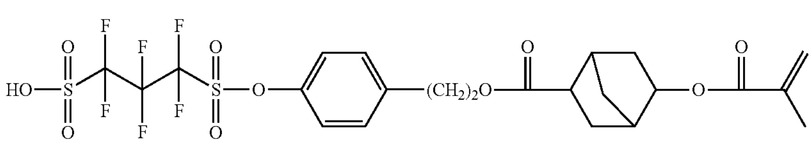
(I-12)
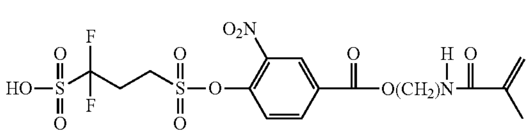
(I-13)
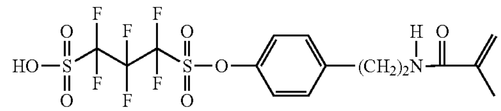
(I-14)
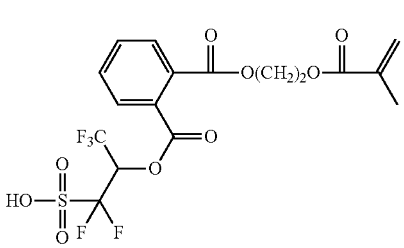
(I-15)
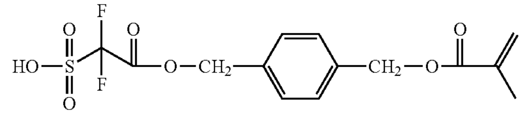

-continued (I-16)

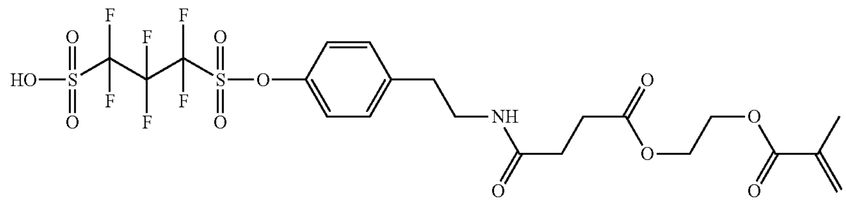

Below, general formula (II) will be described.

In general formula (II), each of $R_{21}$, $R_{22}$ and $R_{23}$ independently represents a hydrogen atom, an alkyl group, a monovalent aliphatic hydrocarbon ring group, a halogen atom, a cyano group or an alkoxycarbonyl group, provided that $R_{22}$ may be bonded to $Ar_2$ to thereby form a ring (in particular, preferably a 5- or 6-membered ring), which $R_{22}$ in this instance is an alkylene group.

The alkyl group represented by each of $R_{21}$, $R_{22}$ and $R_{23}$ is an optionally substituted linear or branched alkyl group, preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred. An alkyl group having 3 or less carbon atoms is most preferred.

The alkyl group contained in the alkoxycarbonyl group is preferably the same as the alkyl group mentioned above with respect to $R_{21}$, $R_{22}$ and $R_{23}$.

As the monovalent aliphatic hydrocarbon ring group, there can be mentioned an optionally substituted mono- or polycycloalkyl group. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is especially preferred.

As preferred substituents that can be introduced in these groups, there can be mentioned a hydroxyl group; a halogen atom (fluorine, chlorine, bromine or iodine); a nitro group; a cyano group; an amido group; a sulfonamido group; any of the alkyl groups mentioned above with respect to $R_{21}$ to $R_{23}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. A hydroxyl group and a halogen atom are especially preferred.

When $R_{22}$ is an alkylene group and is bonded to $Ar_2$ to thereby form a ring, the alkylene group is preferably an alkylene group having 1 to 8 carbon atoms, such as a methylene group, an ethylene group, a propylene group, a butylene group, a hexylene group or an octylene group. An alkylene group having 1 to 4 carbon atoms is more preferred. An alkylene group having 1 or 2 carbon atoms is most preferred.

In general formula (II), each of $R_{21}$ and $R_{23}$ preferably represents a hydrogen atom, an alkyl group or a halogen atom. $R_{22}$ preferably represents a hydrogen atom, an alkyl group, a halogen atom or an alkylene group which forms a ring in cooperation with $Ar_2$ $Ar_2$ represents a bivalent aromatic ring group. A substituent may be introduced in the bivalent aromatic ring group. As preferred examples of the bivalent aromatic ring group, there can be mentioned, for example, an arylene group having 6 to 18 carbon atoms, such as a phenylene group, a tolylene group or a naphthylene group, and a bivalent aromatic ring group containing a heteroring, such as thiophene, furan, pyrrole, benzothiophene, benzofuran, benzopyrrole, triazine, imidazole, benzimidazole, triazole, thiadiazole or triazole.

$X_{21}$ represents —O—, —S—, —CO—, —$SO_2$—, —NR— (R represents a hydrogen atom or an alkyl group), a bivalent nitrogenous nonaromatic heterocyclic group or a group composed of a combination of these.

Particular examples of the —NR— and bivalent nitrogenous nonaromatic heterocyclic group represented by $X_{21}$ are the same as mentioned above in connection with $X_{11}$. Preferred examples are also the same.

Preferably, $X_{21}$ is —O—, —S—, —CO—, —$SO_2$— or a group composed of a combination of these. —O—, —OCO— and —$OSO_2$— are especially preferred.

$X_{22}$ represents a single bond, —O—, —S—, —CO—, —$SO_2$—, —NR— (R represents a hydrogen atom or an alkyl group), a bivalent nitrogenous nonaromatic heterocyclic group or a group composed of a combination of these.

Particular examples of the —NR— and bivalent nitrogenous nonaromatic heterocyclic group represented by $X_{22}$ are the same as mentioned above in connection with $X_{11}$. Preferred examples are also the same.

Preferably, $X_{22}$ is —O—, —S—, —CO—, —$SO_2$— or a group composed of a combination of these. —O—, —OCO—and —$OSO_2$— are especially preferred.

$L_{21}$ represents a single bond, an alkylene group, an alkenylene group, a bivalent aliphatic hydrocarbon ring group, a bivalent aromatic ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these.

Particular examples of the alkylene group, alkenylene group and bivalent aliphatic hydrocarbon ring group represented by $L_{21}$ are the same as the above preferred examples of the alkylene group, alkenylene group and bivalent aliphatic hydrocarbon ring group represented by $L_{11}$ of general formula (I).

As the bivalent aromatic ring group represented by $L_{21}$, there can be mentioned, for example, an optionally substituted arylene group having 6 to 14 carbon atoms, such as a phenylene group, a tolylene group or a naphthylene group, or an optionally substituted bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Particular examples of the —NR— and bivalent nitrogenous nonaromatic heterocyclic group as connecting groups represented by $L_{21}$ are the same as mentioned above in connection with $X_{11}$. Preferred examples are also the same.

Most preferably, $L_{21}$ is a single bond, an alkylene group, a bivalent aliphatic hydrocarbon ring group, a bivalent aromatic ring group, a group composed of a combination of two or more of these (for example, -alkylene-bivalent aromatic ring group-, -bivalent aliphatic hydrocarbon ring group-alkylene- or the like), or a group composed of two or more of these combined through —OCO—, —COO—, —O— or —S— as a connecting group (for example, -alkylene-OCO-bivalent aromatic ring group-, -alkylene-S-bivalent aromatic ring group-, -alkylene-O-alkylene-bivalent aromatic ring group- or the like).

$L_{22}$ represents an alkylene group, an alkenylene group, a bivalent aliphatic hydrocarbon ring group, a bivalent aromatic ring group or a group composed of a combination of two or more of these, provided that the hydrogen atoms of these groups may be partially or entirely substituted with a substituent selected from among a fluorine atom, a fluoroalkyl group, a nitro group and a cyano group, and provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these.

Preferably, $L_{22}$ is an alkylene group, bivalent aromatic ring group or group composed of a combination of these whose hydrogen atoms are partially or entirely substituted with a fluorine atom or a fluoroalkyl group (more preferably a perfluoroalkyl group). An alkylene group and bivalent aromatic ring group at least partially or entirely substituted with a fluorine atom are especially preferred. $L_{22}$ is most preferably an alkylene group or bivalent aromatic ring group, 30 to 100% of the hydrogen atoms of which are substituted with a fluorine atom.

Particular examples of the alkylene group, alkenylene group, bivalent aliphatic hydrocarbon ring group, bivalent aromatic ring group or group composed of a combination of two or more of these, represented by $L_{22}$ are the same as set forth above with respect to $L_{12}$ of general formula (I).

Particular examples of the —NR— and bivalent nitrogenous nonaromatic heterocyclic group as connecting groups represented by $L_{22}$ are the same as mentioned above in connection with $X_{11}$. Preferred examples are also the same.

$Z_2$ represents a moiety that when exposed to actinic rays or radiation, is converted to a sulfonate group. Particular examples of the moiety represented by $Z_2$ are the same as set forth above with respect to $Z_1$ of general formula (I).

With respect to the polymerizable monomer units corresponding to the repeating units of general formula (II), examples of the sulfonate units generated by the cleavage of a cation upon exposure to actinic rays or radiation will be shown below.

(II-1)

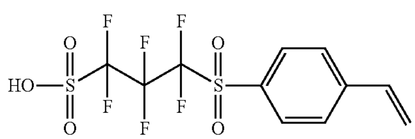

(II-2)

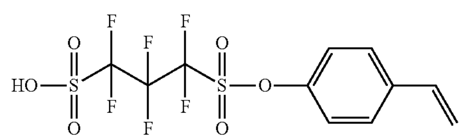

(II-3)

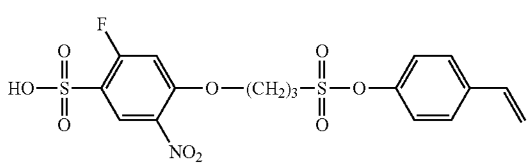

(II-4)

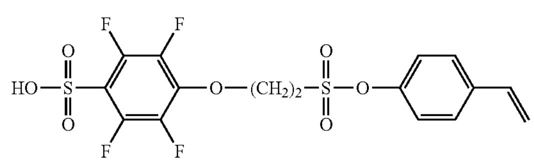

(II-5)

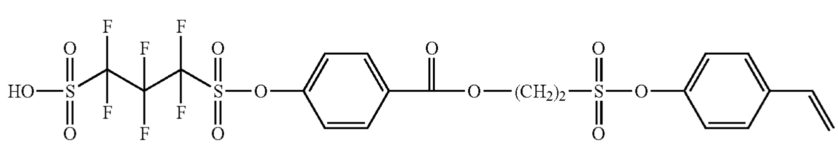

(II-6)

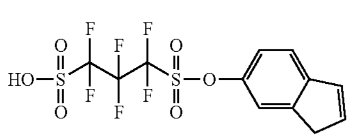

(II-7)

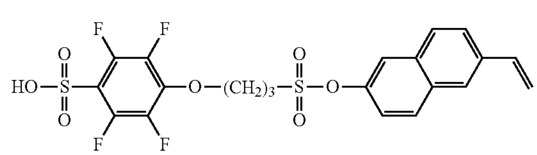

(II-8)

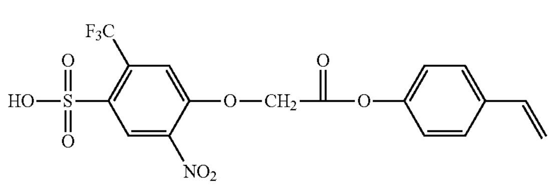

-continued (II-9)

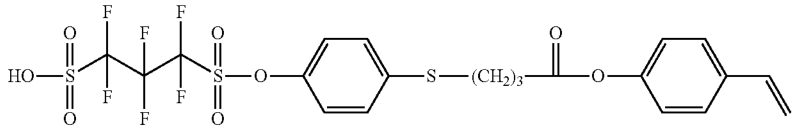

(II-10)

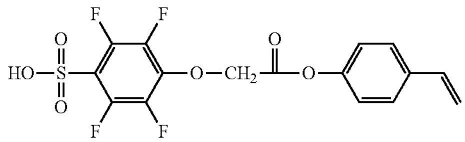

(II-11)

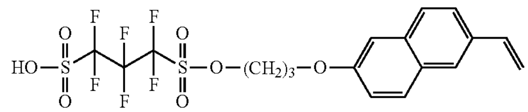

(II-12)

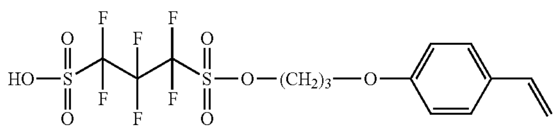

(II-13)

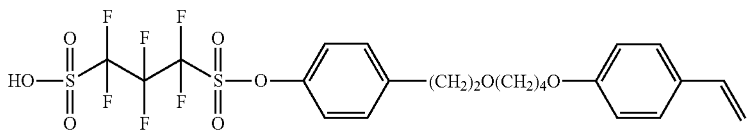

(II-14)

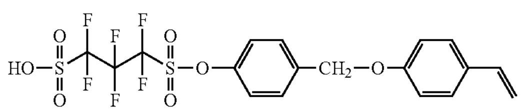

(II-15)

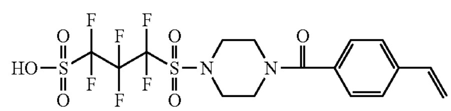

(II-16)

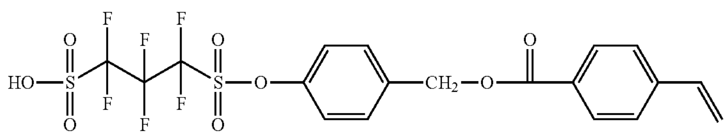

(II-17)

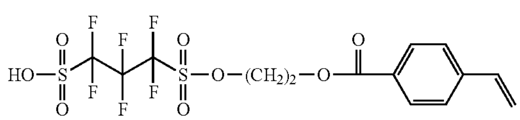

(II-18)

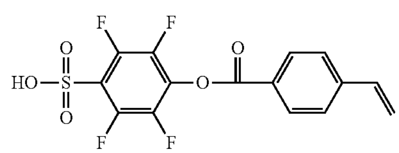

(II-19)

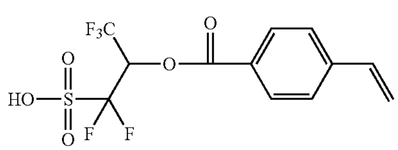

(II-20)

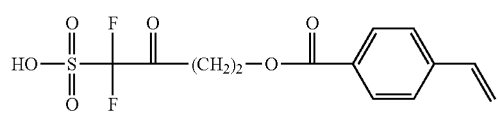

(II-21)

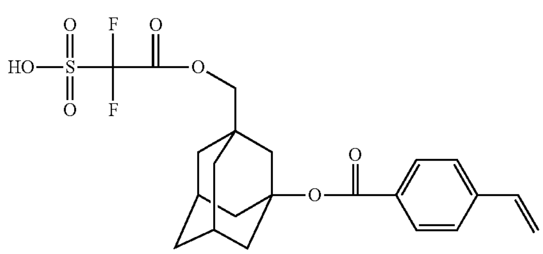

Below, general formula (III) will be described.

In general formula (III), each of $R_{31}$, $R_{32}$ and $R_{33}$ independently represents a hydrogen atom, an alkyl group, a monovalent aliphatic hydrocarbon ring group, a halogen atom, a cyano group or an alkoxycarbonyl group. When $X_{31}$ to be described below is a single bond while $L_{31}$ is a bivalent aromatic ring group, $R_{32}$ may form a ring in cooperation with the aromatic ring group of $L_{31}$, which $R_{32}$ in this instance is an alkylene group.

Particular examples of the alkyl group, monovalent aliphatic hydrocarbon ring group, halogen atom, cyano group and alkoxycarbonyl group represented by each of $R_{31}$, $R_{32}$ and $R_{33}$ are the same as set forth above with respect to the $R_{21}$, $R_{22}$ and $R_{23}$ of general formula (II).

Each of $X_{31}$ and $X_{32}$ independently represents a single bond, —O—, —S—, —CO—, —$SO_2$—, —NR— (R represents a hydrogen atom or an alkyl group), a bivalent nitrogenous nonaromatic heterocyclic group or a group composed of a combination of these.

Particular examples of the —NR— and bivalent nitrogenous nonaromatic heterocyclic group are the same as mentioned above in connection with $X_{11}$ of general formula (I). Preferred examples are also the same.

$X_{31}$ is preferably a single bond, —O—, —CO—, —NR—(R represents a hydrogen atom or an alkyl group) or a group composed of a combination of these. $X_{31}$ is most preferably a single bond, —COO— or —CONR— (R represents a hydrogen atom or an alkyl group).

$X_{32}$ is preferably —O—, —S—, —CO—, —$SO_2$—, a bivalent nitrogenous nonaromatic heterocyclic group or a group composed of a combination of these. $X_{32}$ is most preferably —O—, —OCO— or —$OSO_2$—.

$L_{31}$ represents a single bond, an alkylene group, an alkenylene group, a bivalent aliphatic hydrocarbon ring group, a bivalent aromatic ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these.

Preferred particular examples of the alkylene group, alkenylene group, bivalent aliphatic hydrocarbon ring group and bivalent aromatic ring group represented by $L_{31}$ are the same as set forth above with respect to $L_{21}$ of general formula (II).

Particular examples of the —NR— and bivalent nitrogenous nonaromatic heterocyclic group as connecting groups represented by $L_{31}$ are the same as mentioned above in connection with $L_{21}$. Preferred examples are also the same.

$L_{32}$ represents an alkylene group, an alkenylene group, a bivalent aliphatic hydrocarbon ring group, a bivalent aromatic ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these.

With respect to the alkylene group, alkenylene group, bivalent aliphatic hydrocarbon ring group, bivalent aromatic ring group or group composed of a combination of two or more of these, it is preferred for the hydrogen atoms thereof to be partially or entirely substituted with a substituent selected from among a fluorine atom, a fluoroalkyl group, a nitro group and a cyano group.

Preferably, $L_{32}$ is an alkylene group, bivalent aromatic ring group or group composed of a combination of these whose hydrogen atoms are partially or entirely substituted with a fluorine atom or a fluoroalkyl group (more preferably a perfluoroalkyl group). An alkylene group and bivalent aromatic ring group at least partially or entirely substituted with a fluorine atom are especially preferred. $L_{22}$ is most preferably an alkylene group or bivalent aromatic ring group, 30 to 100% of the hydrogen atoms of which are substituted with a fluorine atom.

Particular examples of the alkylene group, alkenylene group, bivalent aliphatic hydrocarbon ring group, bivalent aromatic ring group and group composed of a combination of two or more of these represented by $L_{32}$ are the same as set forth above with respect to $L_{12}$ of general formula (I).

Particular examples of the —NR— and bivalent nitrogenous nonaromatic heterocyclic group as connecting groups represented by $L_{32}$ are the same as mentioned above in connection with $X_{11}$. Preferred examples are also the same.

When $X_{31}$ is a single bond while $L_{31}$ is an aromatic ring group and when $R_{32}$ forms a ring in cooperation with the aromatic ring group of $L_{31}$, the alkylene group represented by $R_{32}$ is preferably an alkylene group having 1 to 8 carbon atoms, such as a methylene group, an ethylene group, a propylene group, a butylene group, a hexylene group or an octylene group. An alkylene group having 1 to 4 carbon atoms is more preferred. An alkylene group having 1 or 2 carbon atoms is most preferred.

$Z_3$ represents an onium salt that when exposed to actinic rays or radiation, is converted to an imidate group or a methidate group.

It is preferred for the onium salt represented by $Z_3$ to be a sulfonium salt or an iodonium salt. The onium salt preferably has the structure of general formula (ZIII) or (ZIV) below.

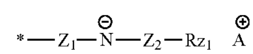

(ZIII)

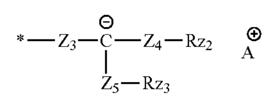

(ZIV)

In general formulae (ZIII) and (ZIV), each of $Z_1$, $Z_2$, $Z_3$, $Z_4$ and $Z_5$ independently represents —CO— or —$SO_2$—, preferably —$SO_2$—.

Each of $Rz_1$, $Rz_2$ and $Rz_3$ independently represents an alkyl group, a monovalent aliphatic hydrocarbon ring group, an aryl group or an aralkyl group. Forms of these groups having the hydrogen atoms thereof partially or entirely substituted with a fluorine atom or a fluoroalkyl group (especially a perfluoroalkyl group) are preferred. Forms of these groups having 30 to 100% of the hydrogen atoms thereof substituted with a fluorine atom are most preferred.

The above alkyl group may be linear or branched. As a preferred form thereof, there can be mentioned, for example, an alkyl group having 1 to 8 carbon atoms, such as a methyl group, an ethyl group, a propyl group, a butyl group, a hexyl group or an octyl group. An alkyl group having 1 to 6 carbon atoms is more preferred. An alkyl group having 1 to 4 carbon atoms is most preferred.

The monovalent aliphatic hydrocarbon ring group is preferably a monovalent aliphatic hydrocarbon ring group having 3 to 10 carbon atoms, such as a cyclobutyl group, a cyclopentyl group or a cyclohexyl group. A monovalent aliphatic hydrocarbon ring group having 3 to 6 carbon atoms is more preferred.

The aryl group is preferably one having 6 to 18 carbon atoms. An aryl group having 6 to 10 carbon atoms is more preferred. A phenyl group is most preferred.

As a preferred form of the aralkyl group, there can be mentioned one resulting from the bonding of the above aryl group to an alkylene group having 1 to 8 carbon atoms. An aralkyl group resulting from the bonding of the above aryl group to an alkylene group having 1 to 6 carbon atoms is more preferred. An aralkyl group resulting from the bonding of the above aryl group to an alkylene group having 1 to 4 carbon atoms is most preferred.

$A^+$ represents a sulfonium cation or an iodonium cation, preferably having the sulfonium cation structure of general formula (ZI) above or the iodonium cation structure of general formula (ZII) above.

With respect to the polymerizable monomer units corresponding to the repeating units of general formula (III), examples of the imidate and methidate units generated by the cleavage of a cation upon exposure to actinic rays or radiation will be shown below.

(III-1)

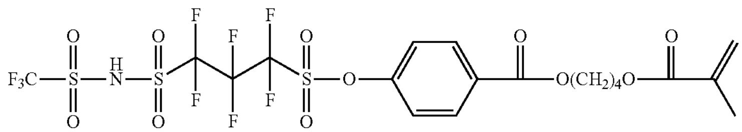

(III-2)

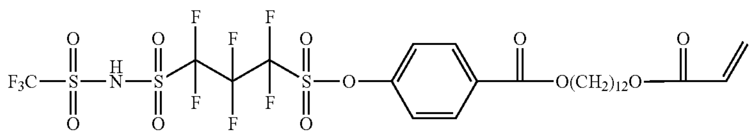

(III-3)

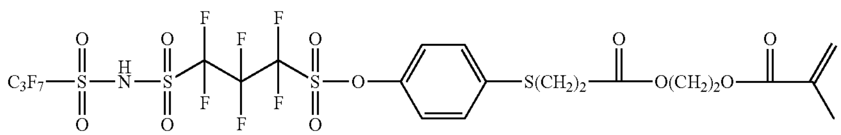

(III-4)

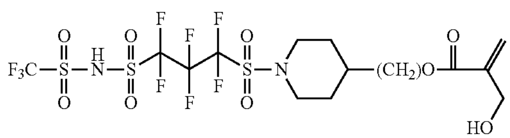

(III-5)

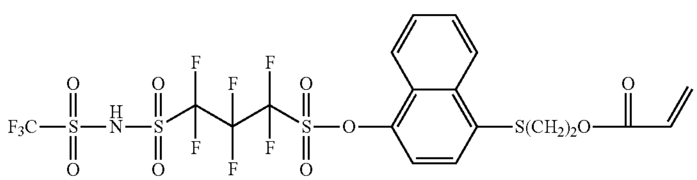

(III-6)

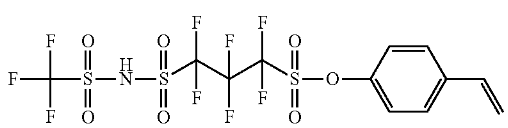

(III-7)

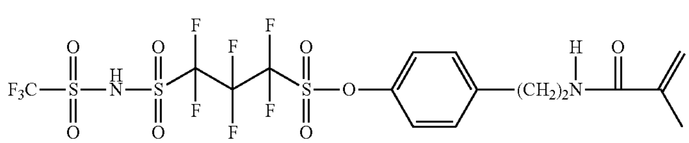

(III-8)

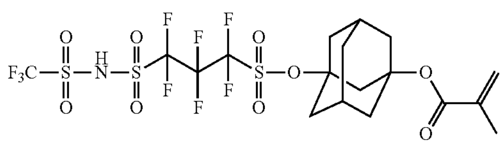

(III-9)

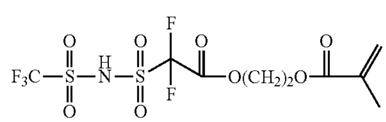

(III-10)

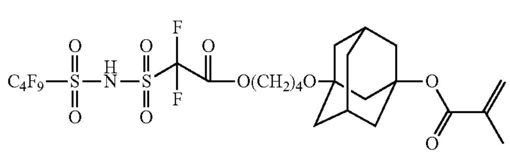

-continued (III-11)

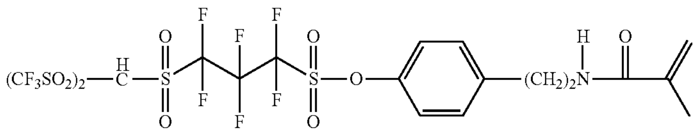

(III-12)

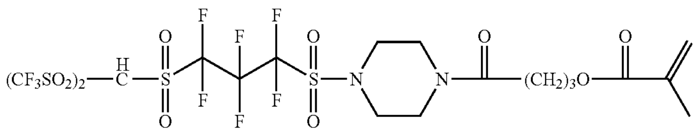

(III-13)

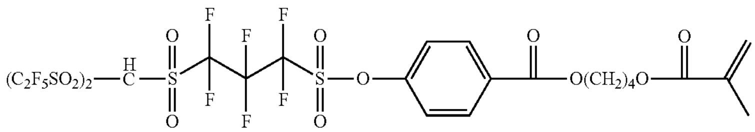

(III-14)

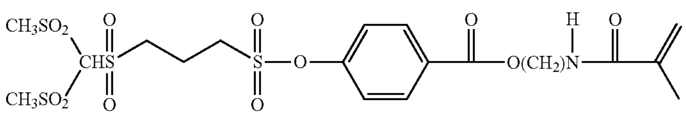

(III-15)

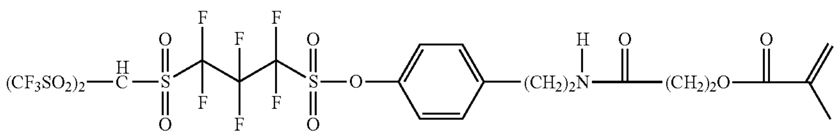

(III-16)

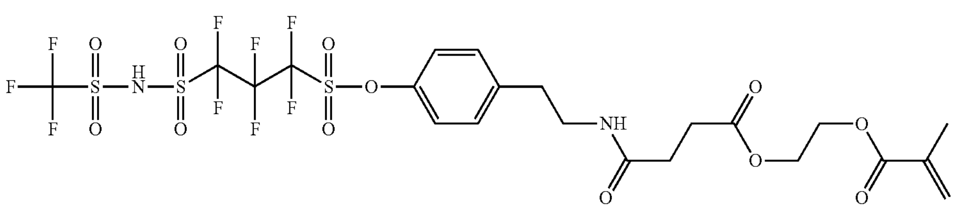

The polymerizable compounds corresponding to the repeating units of general formulae (I) to (III) can be synthesized through the general sulfonating reaction or sulfonamidating reaction. For example, the polymerizable compounds can be obtained by either a method in which one of the sulfonyl halide moieties of a bissulfonyl halide compound is selectively reacted with an amine, an alcohol or the like to thereby form a sulfonamide bond or a sulfonic ester bond and thereafter the other sulfonyl halide moiety is hydrolyzed, or a method in which the ring of a cyclic sulfonic anhydride is opened by an amine or an alcohol. Further, the polymerizable compounds can be easily synthesized through the methods described in U.S. Pat. No. 5,554,664, J. Fluorine Chem. 105 (2000) 129-136 and J. Fluorine Chem. 116 (2002) 45-48.

The polymerizable compounds corresponding to the repeating units of general formulae (I) to (III) can be easily synthesized from a lithium, sodium or potassium salt of organic acid synthesized above, a hydroxide, bromide or chloride of iodonium or sulfonium, etc. through the salt exchange method described in Jpn. PCT National Publication No. 11-501909 and JP-A-2003-246786.

Particular examples of the onium salt cations represented by $Z_1$ to $Z_3$ of general formulae (I) to (III) are shown below.

(Z-1)

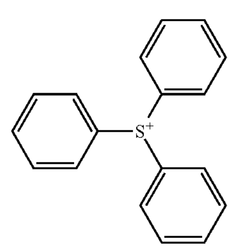

(Z-2)

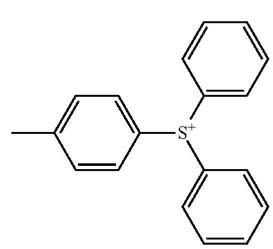

-continued
(Z-3)
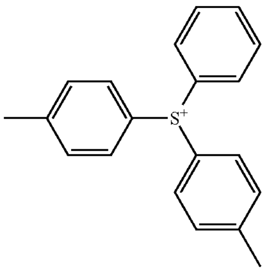
(Z-4)
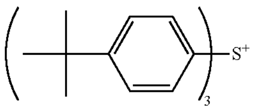
(Z-5)
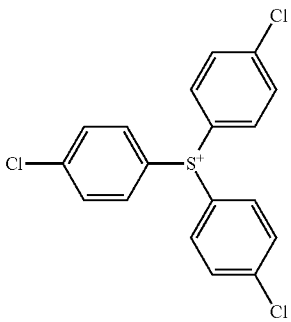
(Z-6)
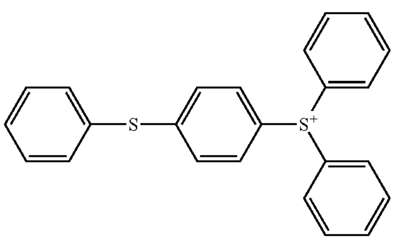
(Z-7)
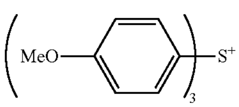
(Z-8)
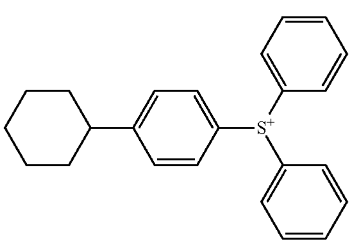
(Z-9)
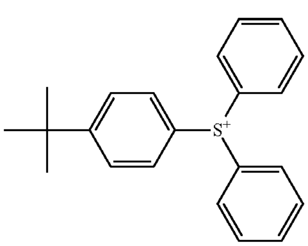
-continued
(Z-10)
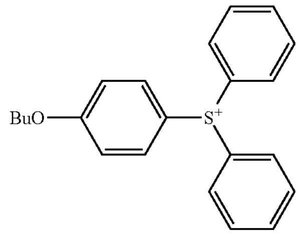
(Z-11)
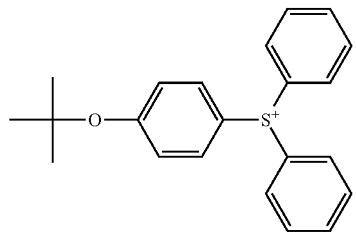
(Z-12)
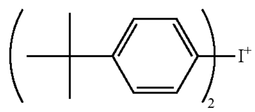
(Z-13)
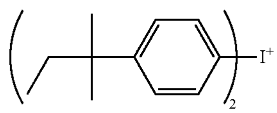
(Z-14)
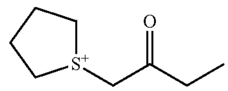
(Z-15)
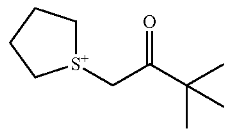
(Z-16)
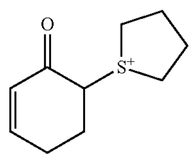
(Z-17)
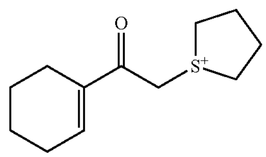
(Z-18)
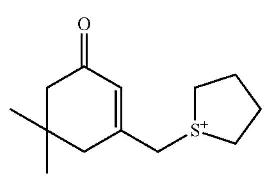
(Z-19)
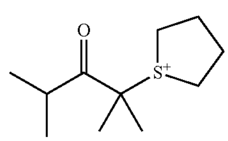

-continued
(Z-20)
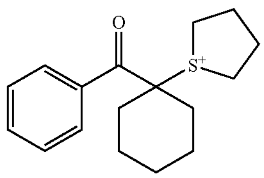
(Z-21)
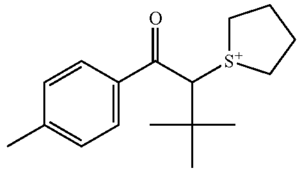
(Z-22)
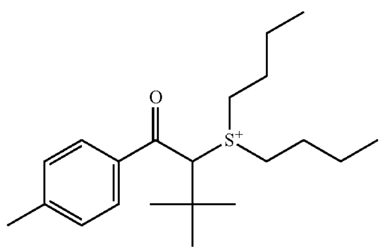
(Z-23)
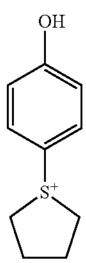
(Z-24)
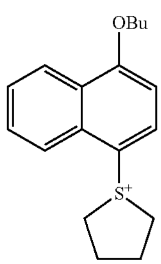
(Z-25)
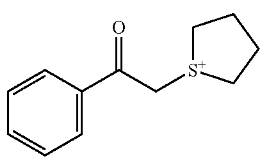
(Z-26)
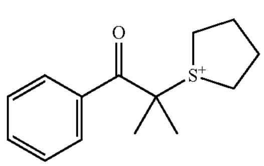
-continued
(Z-27)
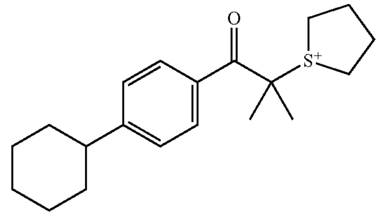
(Z-28)
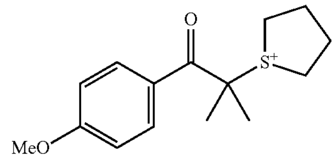
(Z-29)
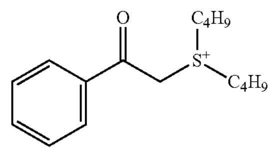
(Z-30)
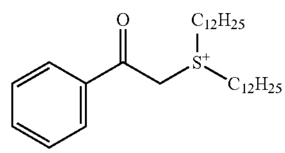
(Z-31)
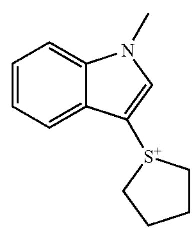
(Z-32)
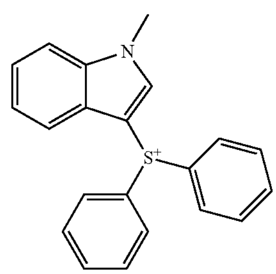
(Z-33)
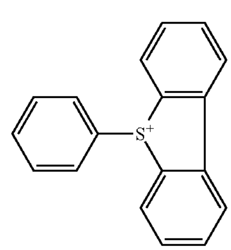

-continued
(Z-34)
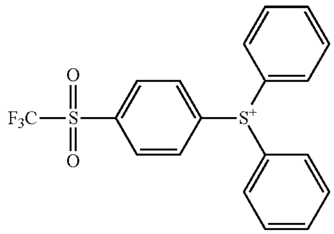
(Z-35)
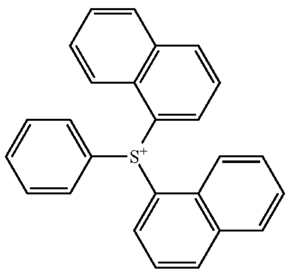
(Z-36)
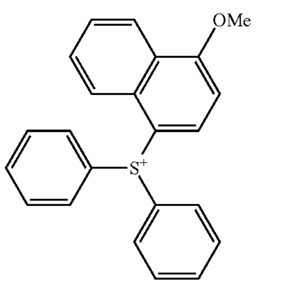
(Z-37)
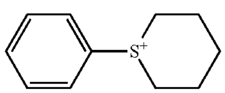
(Z-38)
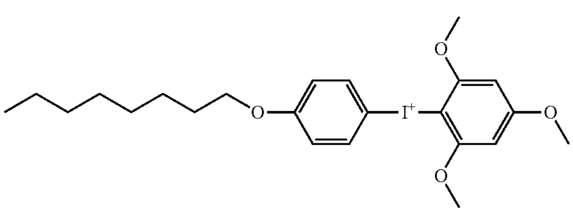
(Z-39)
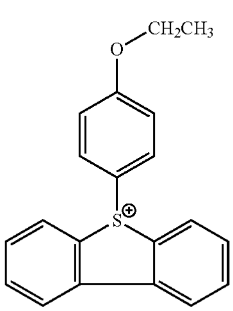
-continued
(Z-40)
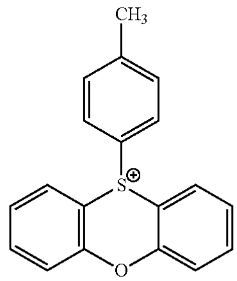
(Z-41)
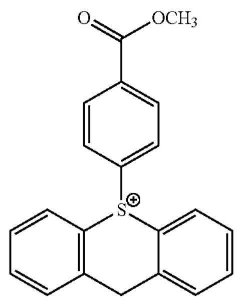
(Z-42)
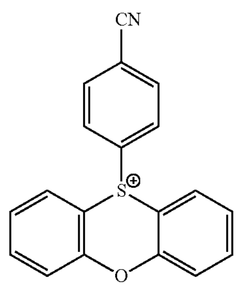
(Z-43)
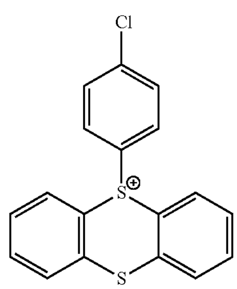
(Z-44)
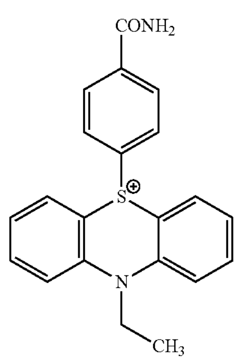

-continued
(Z-45)
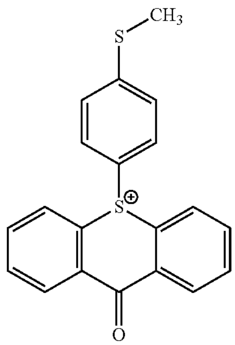
(Z-46)
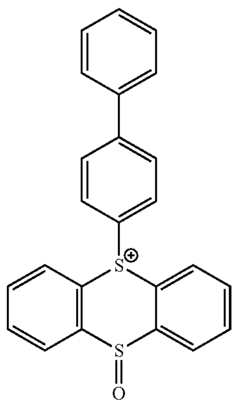
(Z-47)
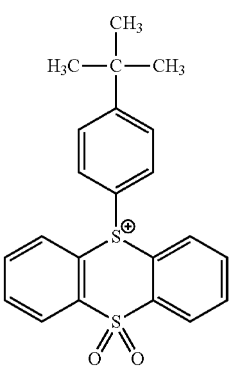
(Z-48)
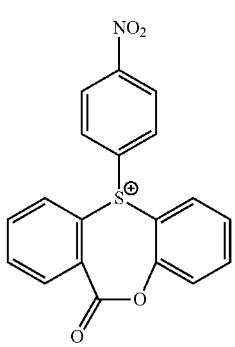
-continued
(Z-49)
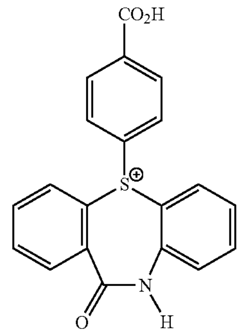
(Z-50)
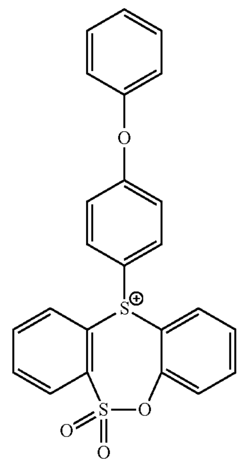
(Z-51)
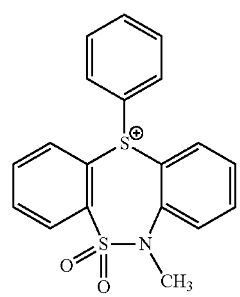
(Z-52)
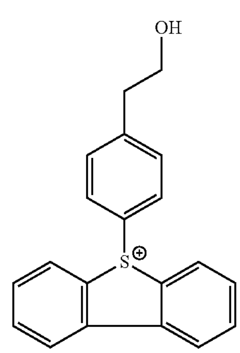

(Z-53)

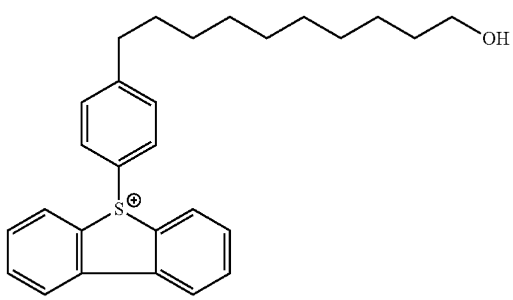

(Z-54)

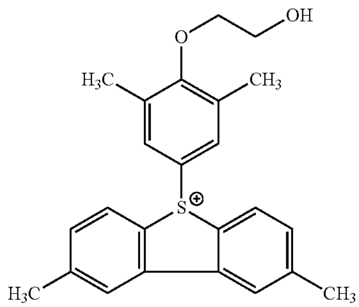

(Z-55)

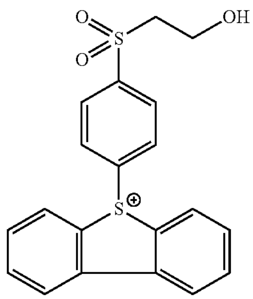

(Z-56)

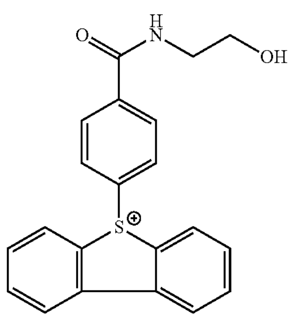

(Z-57)

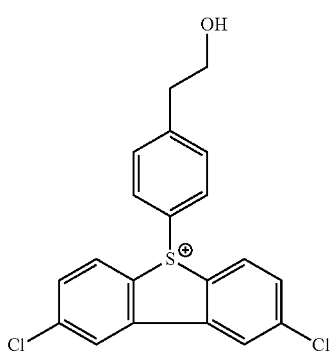

(Z-58)

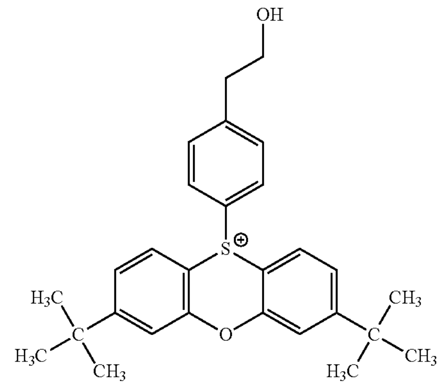

The following Tables list particular examples of the polymerizable compounds (M) corresponding to the repeating units of general formulae (I) to (III) as combinations of cation structure (examples (Z-1) to (Z-58) given above) and anion structure (anions resulting from the removal of a hydrogen atom from organic acid examples (I-1) to (I-16), (II-1) to (II-21) and (III-1) to (III-16) given above).

TABLE 1

| Polymerizable compound (M) | Cation structure | Anion structure |
|---|---|---|
| M-I-1 | Z-1 | I-1 |
| M-I-2 | Z-1 | I-2 |
| M-I-3 | Z-1 | I-3 |
| M-I-4 | Z-1 | I-4 |
| M-I-5 | Z-1 | I-5 |
| M-I-6 | Z-1 | I-6 |
| M-I-7 | Z-1 | I-7 |
| M-I-8 | Z-1 | I-8 |
| M-I-9 | Z-1 | I-9 |
| M-I-10 | Z-1 | I-10 |
| M-I-11 | Z-1 | I-11 |
| M-I-12 | Z-1 | I-12 |
| M-I-13 | Z-1 | I-13 |
| M-I-14 | Z-1 | I-14 |
| M-I-15 | Z-1 | I-15 |
| M-I-16 | Z-1 | I-16 |
| M-I-17 | Z-2 | I-1 |
| M-I-18 | Z-2 | I-2 |
| M-I-19 | Z-3 | I-3 |
| M-I-20 | Z-3 | I-4 |
| M-I-21 | Z-4 | I-5 |
| M-I-22 | Z-4 | I-6 |
| M-I-23 | Z-5 | I-2 |
| M-I-24 | Z-6 | I-7 |
| M-I-25 | Z-6 | I-8 |
| M-I-26 | Z-7 | I-9 |
| M-I-27 | Z-7 | I-10 |
| M-I-28 | Z-8 | I-11 |
| M-I-29 | Z-8 | I-12 |
| M-I-30 | Z-9 | I-13 |
| M-I-31 | Z-9 | I-14 |
| M-I-32 | Z-10 | I-15 |
| M-I-33 | Z-10 | I-16 |
| M-I-34 | Z-11 | I-1 |
| M-I-35 | Z-11 | I-2 |
| M-I-36 | Z-12 | I-3 |
| M-I-37 | Z-13 | I-4 |
| M-I-38 | Z-14 | I-5 |
| M-I-39 | Z-15 | I-6 |
| M-I-40 | Z-16 | I-7 |
| M-I-41 | Z-17 | I-8 |
| M-I-42 | Z-18 | I-9 |
| M-I-43 | Z-19 | I-10 |
| M-I-44 | Z-20 | I-11 |
| M-I-45 | Z-21 | I-12 |

TABLE 1-continued

| Polymerizable compound (M) | Cation structure | Anion structure |
|---|---|---|
| M-I-46 | Z-22 | I-13 |
| M-I-47 | Z-23 | I-14 |
| M-I-48 | Z-24 | I-15 |
| M-I-49 | Z-25 | I-16 |
| M-I-50 | Z-26 | I-1 |
| M-I-51 | Z-27 | I-2 |
| M-I-52 | Z-28 | I-3 |
| M-I-53 | Z-29 | I-4 |
| M-I-54 | Z-30 | I-5 |
| M-I-55 | Z-31 | I-6 |
| M-I-56 | Z-32 | I-7 |
| M-I-57 | Z-33 | I-8 |
| M-I-58 | Z-33 | I-9 |
| M-I-59 | Z-34 | I-10 |
| M-I-60 | Z-35 | I-11 |
| M-I-61 | Z-36 | I-12 |
| M-I-62 | Z-37 | I-13 |
| M-I-63 | Z-38 | I-2 |
| M-I-64 | Z-38 | I-14 |
| M-I-65 | Z-38 | I-15 |
| M-I-66 | Z-38 | I-16 |
| M-I-67 | Z-39 | I-2 |
| M-I-68 | Z-39 | I-3 |
| M-I-69 | Z-39 | I-4 |
| M-I-70 | Z-40 | I-5 |
| M-I-71 | Z-41 | I-6 |
| M-I-72 | Z-42 | I-7 |
| M-I-73 | Z-43 | I-8 |
| M-I-74 | Z-44 | I-9 |
| M-I-75 | Z-45 | I-10 |
| M-I-76 | Z-46 | I-11 |
| M-I-77 | Z-47 | I-12 |
| M-I-78 | Z-48 | I-13 |
| M-I-79 | Z-49 | I-14 |
| M-I-80 | Z-50 | I-15 |
| M-I-81 | Z-51 | I-16 |
| M-I-82 | Z-52 | I-1 |
| M-I-83 | Z-52 | I-2 |
| M-I-84 | Z-52 | I-13 |
| M-I-85 | Z-52 | I-14 |
| M-I-86 | Z-52 | I-15 |
| M-I-87 | Z-52 | I-16 |
| M-I-88 | Z-53 | I-1 |
| M-I-89 | Z-53 | I-2 |
| M-I-90 | Z-54 | I-3 |
| M-I-91 | Z-54 | I-4 |
| M-I-92 | Z-55 | I-5 |
| M-I-93 | Z-55 | I-6 |
| M-I-94 | Z-56 | I-7 |
| M-I-95 | Z-56 | I-8 |
| M-I-96 | Z-57 | I-9 |
| M-I-97 | Z-57 | I-10 |
| M-I-98 | Z-58 | I-11 |
| M-I-99 | Z-58 | I-12 |
| M-I-100 | Z-58 | I-13 |
| M-II-1 | Z-1 | II-1 |
| M-II-2 | Z-1 | II-2 |
| M-II-3 | Z-1 | II-3 |
| M-II-4 | Z-1 | II-4 |
| M-II-5 | Z-1 | II-5 |
| M-II-6 | Z-1 | II-6 |
| M-II-7 | Z-1 | II-7 |
| M-II-8 | Z-1 | II-8 |
| M-II-9 | Z-1 | II-9 |
| M-II-10 | Z-1 | II-10 |
| M-II-11 | Z-1 | II-11 |
| M-II-12 | Z-1 | II-12 |
| M-II-13 | Z-1 | II-13 |
| M-II-14 | Z-1 | II-14 |
| M-II-15 | Z-1 | II-15 |
| M-II-16 | Z-1 | II-16 |
| M-II-17 | Z-1 | II-17 |
| M-II-18 | Z-1 | II-18 |
| M-II-19 | Z-1 | II-19 |
| M-II-20 | Z-1 | II-20 |
| M-II-21 | Z-1 | II-21 |
| M-II-22 | Z-2 | II-1 |

TABLE 1-continued

| Polymerizable compound (M) | Cation structure | Anion structure |
|---|---|---|
| M-II-23 | Z-3 | II-2 |
| M-II-24 | Z-4 | II-3 |
| M-II-25 | Z-4 | II-4 |
| M-II-26 | Z-5 | II-5 |
| M-II-27 | Z-6 | II-6 |
| M-II-28 | Z-6 | II-7 |
| M-II-29 | Z-7 | II-8 |
| M-II-30 | Z-7 | II-9 |
| M-II-31 | Z-8 | II-10 |
| M-II-32 | Z-8 | II-11 |
| M-II-33 | Z-9 | II-12 |
| M-II-34 | Z-9 | II-13 |
| M-II-35 | Z-10 | II-14 |
| M-II-36 | Z-11 | II-15 |
| M-II-37 | Z-12 | II-16 |
| M-II-38 | Z-13 | II-17 |
| M-II-39 | Z-14 | II-18 |
| M-II-40 | Z-15 | II-19 |
| M-II-41 | Z-16 | II-20 |
| M-II-42 | Z-17 | II-21 |
| M-II-43 | Z-18 | II-1 |
| M-II-44 | Z-19 | II-2 |
| M-II-45 | Z-20 | II-3 |
| M-II-46 | Z-21 | II-4 |
| M-II-47 | Z-22 | II-5 |
| M-II-48 | Z-23 | II-6 |
| M-II-49 | Z-24 | II-7 |
| M-II-50 | Z-25 | II-8 |
| M-II-51 | Z-26 | II-9 |
| M-II-52 | Z-27 | II-10 |
| M-II-53 | Z-28 | II-11 |
| M-II-54 | Z-29 | II-12 |
| M-II-55 | Z-30 | II-13 |
| M-II-56 | Z-31 | II-14 |
| M-II-57 | Z-32 | II-15 |
| M-II-58 | Z-33 | II-16 |
| M-II-59 | Z-33 | II-17 |
| M-II-60 | Z-34 | II-18 |
| M-II-61 | Z-35 | II-19 |
| M-II-62 | Z-36 | II-20 |
| M-II-63 | Z-37 | II-21 |
| M-II-64 | Z-38 | II-2 |
| M-II-65 | Z-38 | II-4 |
| M-II-66 | Z-38 | II-10 |
| M-II-67 | Z-38 | II-17 |
| M-II-68 | Z-39 | II-1 |
| M-II-69 | Z-39 | II-2 |
| M-II-70 | Z-39 | II-3 |
| M-II-71 | Z-40 | II-4 |
| M-II-72 | Z-41 | II-5 |
| M-II-73 | Z-42 | II-6 |
| M-II-74 | Z-43 | II-7 |
| M-II-75 | Z-44 | II-8 |
| M-II-76 | Z-45 | II-9 |
| M-II-77 | Z-46 | II-10 |
| M-II-78 | Z-47 | II-11 |
| M-II-79 | Z-48 | II-12 |
| M-II-80 | Z-49 | II-13 |
| M-II-81 | Z-50 | II-14 |
| M-II-82 | Z-51 | II-15 |
| M-II-83 | Z-52 | II-2 |
| M-II-84 | Z-52 | II-4 |
| M-II-85 | Z-52 | II-10 |
| M-II-86 | Z-52 | II-14 |
| M-II-87 | Z-52 | II-17 |
| M-II-88 | Z-52 | II-19 |
| M-II-89 | Z-53 | II-16 |
| M-II-90 | Z-53 | II-17 |
| M-II-91 | Z-54 | II-18 |
| M-II-92 | Z-54 | II-19 |
| M-II-93 | Z-55 | II-20 |
| M-II-94 | Z-55 | II-21 |
| M-II-95 | Z-56 | II-1 |
| M-II-96 | Z-56 | II-2 |
| M-II-97 | Z-57 | II-3 |
| M-II-98 | Z-57 | II-4 |
| M-II-99 | Z-58 | II-5 |

TABLE 1-continued

| Polymerizable compound (M) | Cation structure | Anion structure |
|---|---|---|
| M-II-100 | Z-58 | II-6 |
| M-III-1 | Z-1 | III-1 |
| M-III-2 | Z-1 | III-2 |
| M-III-3 | Z-1 | III-3 |
| M-III-4 | Z-1 | III-4 |
| M-III-5 | Z-1 | III-5 |
| M-III-6 | Z-1 | III-6 |
| M-III-7 | Z-1 | III-7 |
| M-III-8 | Z-1 | III-8 |
| M-III-9 | Z-1 | III-9 |
| M-III-10 | Z-1 | III-10 |
| M-III-11 | Z-1 | III-11 |
| M-III-12 | Z-1 | III-12 |
| M-III-13 | Z-1 | III-13 |
| M-III-14 | Z-1 | III-14 |
| M-III-15 | Z-1 | III-15 |
| M-III-16 | Z-1 | III-16 |
| M-III-17 | Z-2 | III-1 |
| M-III-18 | Z-2 | III-2 |
| M-III-19 | Z-3 | III-3 |
| M-III-20 | Z-3 | III-4 |
| M-III-21 | Z-4 | III-5 |
| M-III-22 | Z-4 | III-6 |
| M-III-23 | Z-5 | III-7 |
| M-III-24 | Z-6 | III-8 |
| M-III-25 | Z-6 | III-9 |
| M-III-26 | Z-7 | III-10 |
| M-III-27 | Z-7 | III-11 |
| M-III-28 | Z-8 | III-12 |
| M-III-29 | Z-8 | III-13 |
| M-III-30 | Z-9 | III-14 |
| M-III-31 | Z-9 | III-15 |
| M-III-32 | Z-10 | III-16 |
| M-III-33 | Z-10 | III-1 |
| M-III-34 | Z-11 | III-2 |
| M-III-35 | Z-11 | III-3 |
| M-III-36 | Z-12 | III-4 |
| M-III-37 | Z-13 | III-5 |
| M-III-38 | Z-14 | III-6 |
| M-III-39 | Z-15 | III-7 |
| M-III-40 | Z-16 | III-8 |
| M-III-41 | Z-17 | III-16 |
| M-III-42 | Z-18 | III-10 |
| M-III-43 | Z-19 | III-11 |
| M-III-44 | Z-20 | III-12 |
| M-III-45 | Z-21 | III-13 |
| M-III-46 | Z-22 | III-14 |
| M-III-47 | Z-23 | III-15 |
| M-III-48 | Z-24 | III-9 |
| M-III-49 | Z-25 | III-1 |
| M-III-50 | Z-26 | III-2 |
| M-III-51 | Z-27 | III-3 |
| M-III-52 | Z-28 | III-4 |
| M-III-53 | Z-29 | III-5 |
| M-III-54 | Z-30 | III-6 |
| M-III-55 | Z-31 | III-7 |
| M-III-56 | Z-32 | III-8 |
| M-III-57 | Z-33 | III-9 |
| M-III-58 | Z-33 | III-10 |
| M-III-59 | Z-34 | III-11 |
| M-III-60 | Z-35 | III-12 |
| M-III-61 | Z-36 | III-13 |
| M-III-62 | Z-37 | III-14 |
| M-III-63 | Z-38 | III-7 |
| M-III-64 | Z-38 | III-9 |
| M-III-65 | Z-38 | III-11 |
| M-III-66 | Z-38 | III-12 |
| M-III-67 | Z-39 | III-16 |
| M-III-68 | Z-39 | III-1 |
| M-III-69 | Z-39 | III-2 |
| M-III-70 | Z-40 | III-15 |
| M-III-71 | Z-41 | III-16 |
| M-III-72 | Z-42 | III-3 |
| M-III-73 | Z-43 | III-4 |
| M-III-74 | Z-44 | III-5 |
| M-III-75 | Z-45 | III-6 |
| M-III-76 | Z-46 | III-7 |

TABLE 1-continued

| Polymerizable compound (M) | Cation structure | Anion structure |
|---|---|---|
| M-III-77 | Z-47 | III-8 |
| M-III-78 | Z-48 | III-9 |
| M-III-79 | Z-49 | III-10 |
| M-III-80 | Z-50 | III-11 |
| M-III-81 | Z-51 | III-12 |
| M-III-82 | Z-52 | III-1 |
| M-III-83 | Z-52 | III-7 |
| M-III-84 | Z-52 | III-9 |
| M-III-85 | Z-52 | III-11 |
| M-III-86 | Z-52 | III-12 |
| M-III-87 | Z-52 | III-16 |
| M-III-88 | Z-53 | III-13 |
| M-III-89 | Z-53 | III-14 |
| M-III-90 | Z-54 | III-15 |
| M-III-91 | Z-54 | III-16 |
| M-III-92 | Z-55 | III-1 |
| M-III-93 | Z-55 | III-2 |
| M-III-94 | Z-56 | III-3 |
| M-III-95 | Z-56 | III-4 |
| M-III-96 | Z-57 | III-5 |
| M-III-97 | Z-57 | III-6 |
| M-III-98 | Z-58 | III-7 |
| M-III-99 | Z-58 | III-8 |
| M-III-100 | Z-58 | III-9 |

The content of repeating unit (A) in the resin (P), based on all the repeating units of the resin, is preferably in the range of 0.5 to 80 mol %, more preferably 1 to 60 mol % and further more preferably 3 to 40 mol %.

[Repeating Unit (B)]

The repeating unit (B) contains at least an aromatic ring group. Even if an aromatic ring group is contained, however, the above repeating unit (A) and the repeating unit (D) to be described hereinafter are not included in the category "repeating unit (B)."

Repeating Units (B1)

The resin (P) in its one form contains at least any of the repeating units (B1) of general formula (VII) below as the repeating unit (B).

(VII)

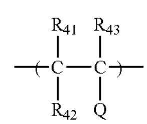

In the formula, each of $R_{41}$, $R_{42}$ and $R_{43}$ independently represents a hydrogen atom, an alkyl group, a monovalent aliphatic hydrocarbon ring group, a halogen atom, a cyano group or an alkoxycarbonyl group, provided that $R_{42}$ may be bonded to Q to thereby form a ring (preferably a 5- or 6-membered ring), which $R_{42}$ in this instance is an alkylene group.

Q represents a group containing an aromatic ring group.

General formula (VII) will be described in detail below.

The alkyl group represented by each of $R_{41}$, $R_{42}$ and $R_{43}$ of formula (VII) is preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred. An alkyl group having 3 or less carbon atoms is most preferred.

The alkyl group contained in the alkoxycarbonyl group is preferably the same as the alkyl group mentioned above with respect to $R_{41}$, $R_{42}$ and $R_{43}$.

As the monovalent aliphatic hydrocarbon ring group, there can be mentioned an either monocyclic or polycyclic monovalent aliphatic hydrocarbon ring group. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is especially preferred.

As preferred substituents that can be introduced in these groups, there can be mentioned a hydroxyl group; a halogen atom (fluorine, chlorine, bromine or iodine); a nitro group; a cyano group; an amido group; a sulfonamido group; any of the alkyl groups mentioned above with respect to $R_{41}$ to $R_{43}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. A hydroxyl group and a halogen atom are especially preferred.

When $R_{42}$ represents an alkylene group, the alkylene group is preferably an alkylene group having 1 to 8 carbon atoms, such as a methylene group, an ethylene group, a propylene group, a butylene group, a hexylene group or an octylene group. An alkylene group having 1 to 4 carbon atoms is more preferred. An alkylene group having 1 or 2 carbon atoms is most preferred.

In formula (VII), it is preferred for each of $R_{41}$ and $R_{43}$ to be a hydrogen atom, an alkyl group or a halogen atom, especially a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F). With respect to $R_{42}$, it is preferred for the same to be a hydrogen atom, an alkyl group a halogen atom or an alkylene group (forming a ring with Q), especially a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), methylene group (forming a ring with Q) or an ethylene group (forming a ring with Q).

In general formula (VII), Q is preferably a substituted or unsubstituted aromatic group having 1 to 20 carbon atoms. As the aromatic group represented by Q, there can be mentioned, for example, the following.

A phenyl group, a naphthyl group, an anthranyl group, a phenanthryl group, a fluorenyl group, triphenylenyl group, a naphthacenyl group, a biphenyl group, a pyrrolinyl group, a furanyl group, a thiophenyl group, an imidazolyl group, an oxazolyl group, a thiazolyl group, a pyridyl group, a pyrazinyl group, a pyrimidyl group, a pyridazyl group, an indolizyl group, a benzofuranyl group, a benzothiophenyl group, an isobenzofuranyl group, a quinolizyl group, a quinolinyl group, a phthalazyl group, a naphthyridyl group, a quinoxalyl group, a quinoxazolyl group, an isoquinolinyl group, a carbazolyl group, an acridyl group, a phenanthrolyl group, a thianthrenyl group, a chromenyl group, a xanthenyl group, a phenoxathiinyl group, a phenothiazyl group or a phenazyl group. Of these, aromatic hydrocarbon rings are preferred. A phenyl group, a naphthyl group, an anthranyl group and a phenanthryl group are more preferred. A phenyl group is further more preferred.

In one form of general formula (VII), it is preferred for $R_{41}$, $R_{42}$ and $R_{43}$ to be hydrogen atoms. Namely, the repeating units of general formula (VII-1) below are preferred.

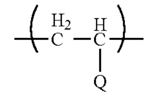

(VII-1)

Q represents a group containing an aromatic ring group.

The repeating units (B1) preferably have the structure of general formula (IV) below.

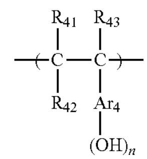

(IV)

In the formula, each of $R_{41}$, $R_{42}$ and $R_{43}$ independently represents a hydrogen atom, an alkyl group, a monovalent aliphatic hydrocarbon ring group, a halogen atom, a cyano group or an alkoxycarbonyl group, provided that $R_{42}$ may be bonded to $Ar_4$ to thereby form a ring (preferably a 5- or 6-membered ring), which $R_{42}$ in this instance is an alkylene group.

$Ar_4$ represents a bivalent aromatic ring group; and n is an integer of 1 to 4.

Particular examples of the alkyl group, monovalent aliphatic hydrocarbon ring group, halogen atom and alkoxycarbonyl group represented by each of $R_{41}$, $R_{42}$ and $R_{43}$ of formula (IV) and also particular examples of the substituents that can be introduced in these groups are the same as set forth above in connection with general formula (VII).

$Ar_4$ represents a bivalent aromatic ring group. A substituent may be introduced in the bivalent aromatic ring group. As preferred examples of the bivalent aromatic ring group, there can be mentioned, for example, an arylene group having 6 to 18 carbon atoms, such as a phenylene group, a tolylene group, a naphthylene group or an anthracenylene group, and a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Preferred substituents that can be introduced in these groups include an alkyl group, an alkoxy group such as a methoxy group, an ethoxy group, a hydroxyethoxy group, a propoxy group, a hydroxypropoxy group or a butoxy group and an aryl group such as a phenyl group, as mentioned in connection with $R_{11}$ to $R_{13}$.

$Ar_4$ is more preferably an optionally substituted arylene group having 6 to 18 carbon atoms. A phenylene group, a naphthylene group and a biphenylene group are most preferred.

The method of synthesizing the monomers corresponding to the repeating units (B1) is not particularly limited. For example, the synthesis can be performed with reference to the methods of synthesizing an aromatic compound containing a polymerizable carbon to carbon double bond, as described in J. Med. Chem., Vol. 34(5), 1675-1692 (1991), ditto Vol. 3525), 4665-4675 (1992), J. Org. Chem. Vol. 45(18), 3657-3664 (1980), Adv. Synth. Catal. Vol. 349(1-2), 152-156 (2007), J. Org. Chem. Vol. 28, 1921-1922 (1963), Synth. Commun. Vol. 28(15), 2677-2682 (1989), literature cited by these, etc.

Particular examples of the repeating units (B1) contained in the resin (P) will be shown below, which in no way limit the scope of the present invention. In the formulae, a is an integer of 0 to 2.
(B-1)
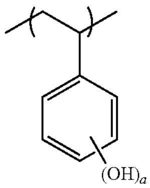
(B-2)
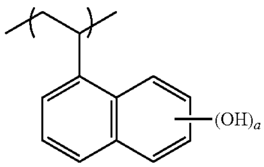
(B-3)
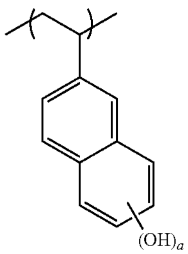
(B-4)
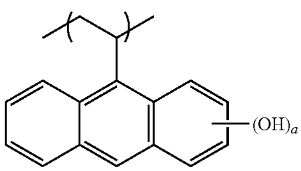
(B-5)
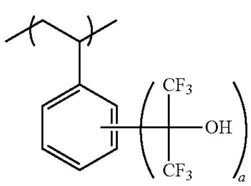
(B-6)
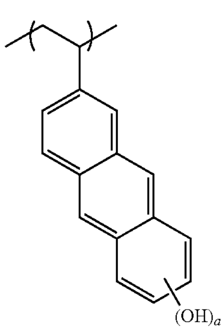
-continued
(B-7)
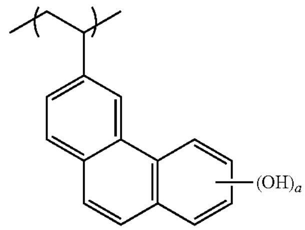
(B-8)
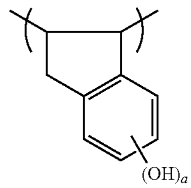
(B-9)
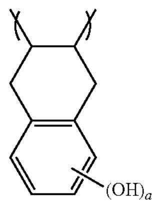
(B-10)
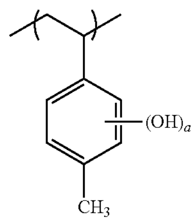
(B-11)
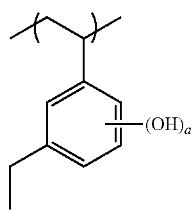
(B-12)
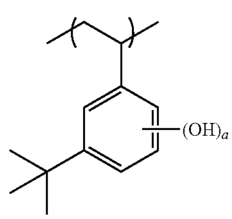
(B-13)
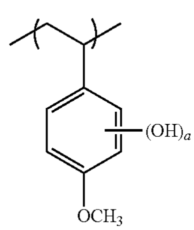

-continued
(B-14)
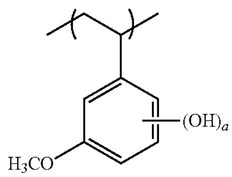
(B-15)
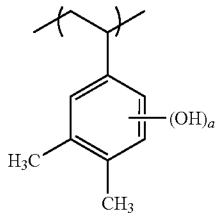
(B-16)
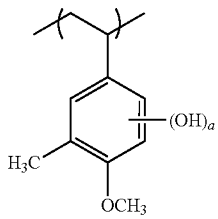
(B-17)
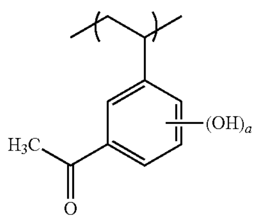
(B-18)
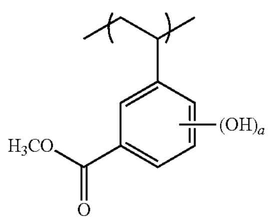
(B-19)
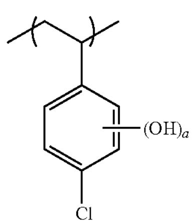
(B-20)
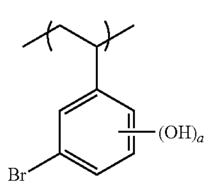
-continued
(B-21)
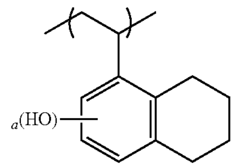
(B-22)
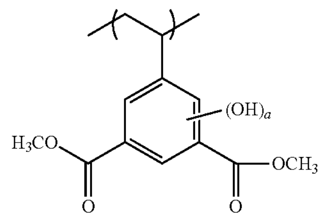
(B-23)
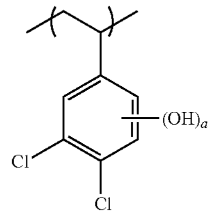
(B-24)
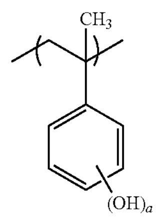
(B-25)
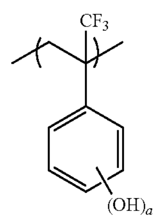
(B-26)
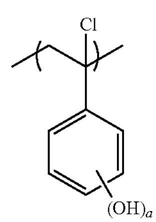
(B-27)
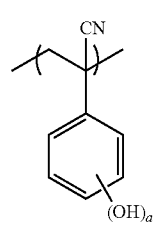

-continued
(B-28)
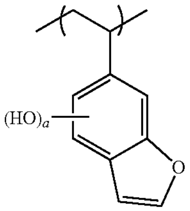
(B-29)
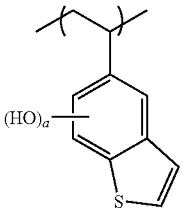
(B-30)
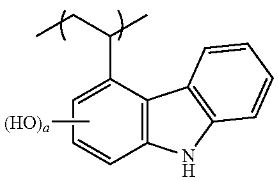
(B-31)
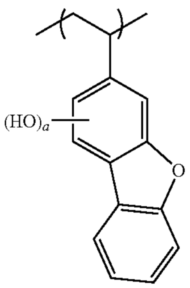
(B-32)
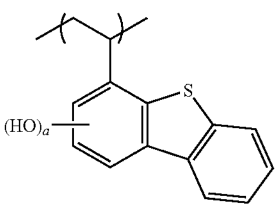
(B-33)
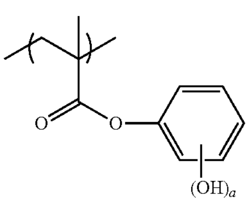
(B-34)
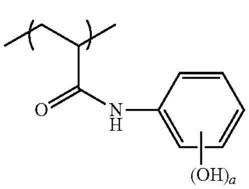
-continued
(B-35)
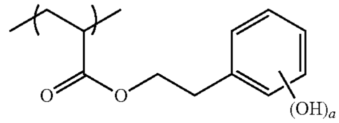
(B-36)
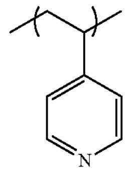
(B-37)
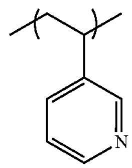
(B-38)
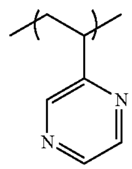
(B-39)
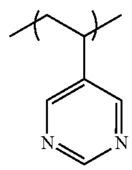
(B-40)
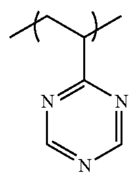
(B-41)
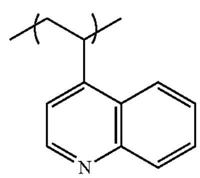
(B-42)
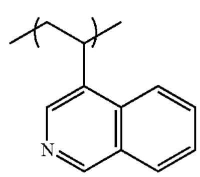
(B-43)
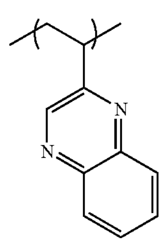

-continued
(B-44)
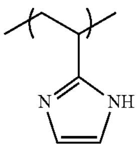
(B-45)
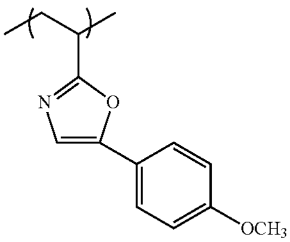
(B-46)
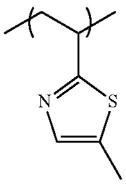
(B-47)
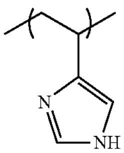
(B-48)
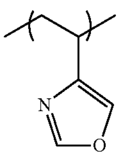
(B-49)
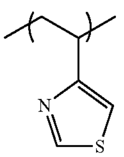
(B-50)
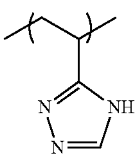
(B-51)
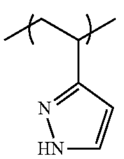
(B-52)
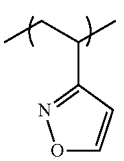
-continued
(B-53)
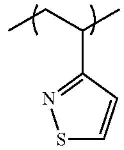
(B-54)
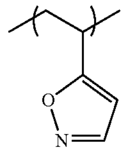
(B-55)
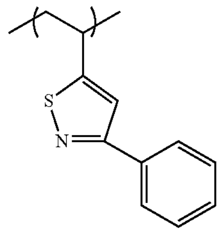
(B-56)
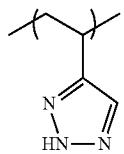
(B-57)
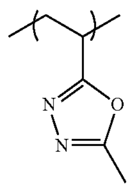
(B-58)
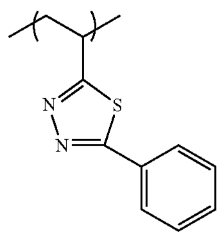
(B-59)
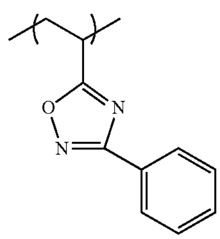
(B-60)
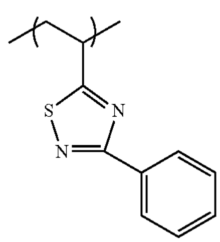

-continued (B-61)

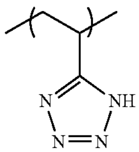

(B-62)

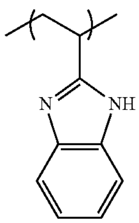

(B-63)

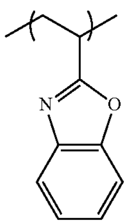

(B-64)

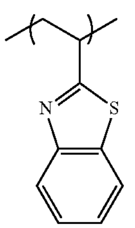

(B-65)

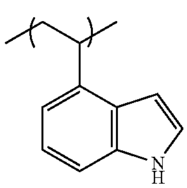

The content of repeating unit (B1) in the resin (P), based on all the repeating units of the resin, is preferably in the range of 5 to 90 mol %, more preferably 10 to 80 mol % and further more preferably 20 to 70 mol %. A single type of repeating unit (B1) may be used alone, or two or more types of repeating units (B1) may be used in combination. It is preferred for the resin to contain at least any of the repeating units of general formula (IV).

In the present invention, it is preferred for the content (mol %) of the repeating unit (B1) to be equivalent to or greater than the total content of repeating unit (B2) and repeating unit (C) containing acid-decomposable groups to be described hereinafter.

Repeating Unit (B2)

The resin (P) in its one form contains, as a repeating unit (B), at least a repeating unit (B2) containing not only an aromatic ring group but also a group that when acted on by an acid, is decomposed to thereby generate an alkali soluble group (hereinafter also referred to as "acid-decomposable group").

As the alkali soluble group, there can be mentioned a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali soluble groups, there can be mentioned a phenolic hydroxyl group, a carboxyl group, a fluoroalcohol group (preferably hexafluoroisopropanol) and a sulfonate group.

The acid-decomposable group is preferably a group as obtained by substituting the hydrogen atom of any of these alkali soluble groups with an acid eliminable group.

As the acid eliminable group, there can be mentioned, for example, $—C(R_{36})(R_{37})(R_{38})$, $—C(R_{36})(R_{37})(OR_{39})$, $—C(R_{01})(R_{02})(OR_{39})$ or the like.

In the formulae, each of $R_{36}$ to $R_{39}$ independently represents an alkyl group, a monovalent aliphatic hydrocarbon ring group, a monovalent aromatic ring group, a combination of an alkylene group and a monovalent aromatic ring group or an alkenyl group. $R_{36}$ and $R_{37}$ may be bonded with each other to thereby form a ring structure.

Each of $R_{01}$ to $R_{02}$ independently represents a hydrogen atom, an alkyl group, a monovalent aliphatic hydrocarbon ring group, a monovalent aromatic ring group, a combination of an alkylene group and a monovalent aromatic ring group or an alkenyl group.

Preferably, the acid-decomposable group is a cumyl ester group, an enol ester group, an acetal ester group, a tertiary alkyl ester group or the like. A tertiary alkyl ester group is more preferred.

The repeating unit (B2) is preferably any of those of general formula (V), below.

(V)

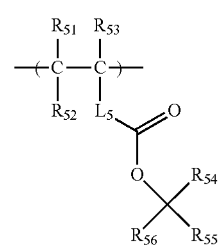

In general formula (V), each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L_5$ to thereby form a ring (preferably a 5- or 6-membered ring), which $R_{52}$ in this instance is an alkylene group.

$L_5$ represents a single bond or a bivalent connecting group. When a ring is formed in cooperation with $R_{52}$, $L_5$ is a trivalent connecting group.

$R_{54}$ represents an alkyl group, and each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to thereby form a ring.

In the formula, at least one of $L_5$, $R_{55}$ and $R_{56}$ is an aromatic ring group or a group containing an aromatic ring group, and $R_{55}$ and $R_{56}$ are not simultaneously hydrogen atoms.

General formula (V) will be described in greater detail below.

Particular examples of the alkyl group, monovalent aliphatic hydrocarbon ring group, halogen atom and alkoxycarbonyl group represented by each of $R_{51}$ to $R_{53}$ are the same as set forth above with respect to the $R_{41}$, $R_{42}$ and $R_{43}$ of general formula (VII).

As the bivalent connecting group represented by $L_5$, there can be mentioned an alkylene group, a bivalent aromatic ring group, —COO-$L_1$-, —O-$L_1$-, a group composed of a combination of two or more of these, or the like. $L_1$ represents an alkylene group, a bivalent aliphatic hydrocarbon ring group, a bivalent aromatic ring group or a group composed of a combination of an alkylene group and a bivalent aromatic ring group.

$L_5$ is preferably a single bond, —COO-$L_1$- ($L_1$ is preferably an alkylene group having 1 to 5 carbon atoms, more preferably a methylene group or a propylene group) or a bivalent aromatic ring group.

The alkyl group represented by each of $R_{54}$ to $R_{56}$ is preferably an alkyl group having 1 to 20 carbon atoms, more preferably 1 to 10 carbon atoms. An alkyl group having 1 to 4 carbon atoms, such as a methyl group, an ethyl group, an n-propyl group, an isopropyl group, an n-butyl group, an isobutyl group or a t-butyl group, is most preferred.

The monovalent aliphatic hydrocarbon ring group represented by each of $R_{55}$ and $R_{56}$ preferably has 1 to 20 carbon atoms. It may be a monocyclic one, such as a cyclopentyl group or a cyclohexyl group, or a polycyclic one, such as a norbornyl group, an adamantyl group, a tetracyclodecanyl group or a tetracyclododecanyl group.

The ring formed by the mutual bonding of $R_{55}$ and $R_{56}$ preferably has 1 to 20 carbon atoms. The ring may be a monocyclic one, such as a cyclopentyl group or a cyclohexyl group, or a polycyclic one, such as a norbornyl group, an adamantyl group, a tetracyclodecanyl group or a tetracyclododecanyl group. When a ring is formed by the mutual bonding of $R_{55}$ and $R_{56}$, $R_{54}$ is preferably an alkyl group having 1 to 3 carbon atoms, more preferably a methyl group or an ethyl group.

The monovalent aromatic ring group represented by each of $R_{55}$ and $R_{56}$ preferably has 6 to 20 carbon atoms. As such, there can be mentioned, for example, a phenyl group, a naphthyl group or the like. When either $R_{55}$ or $R_{56}$ is a hydrogen atom, the other is preferably a monovalent aromatic ring group.

In the synthesis of the monomers corresponding to the repeating units of general formula (V), any of general methods of synthesizing an ester containing a polymerizable group can be used, and the synthetic method is not particularly limited.

Particular examples of the repeating units of general formula (V) will be shown below, which in no way limit the scope of the present invention.

(V-57)

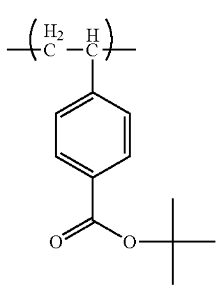

-continued (V-58)

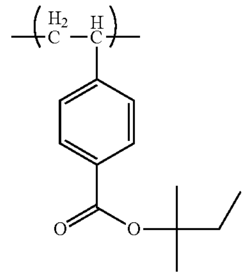

(V-59)

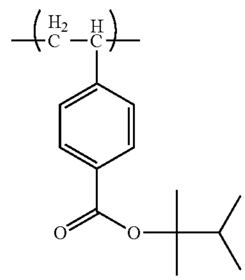

(V-60)

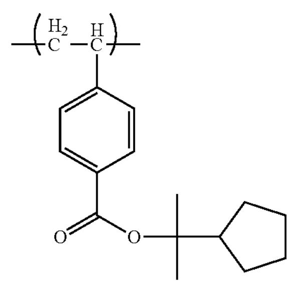

(V-61)

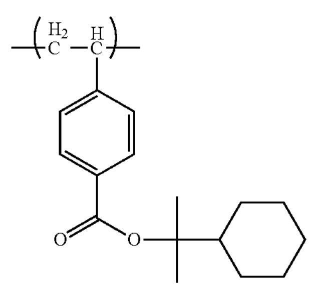

(V-62)

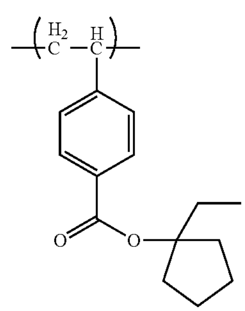

-continued
(V-63)
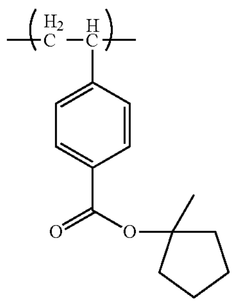
(V-64)
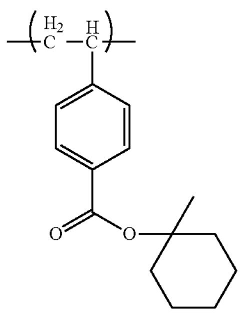
(V-65)
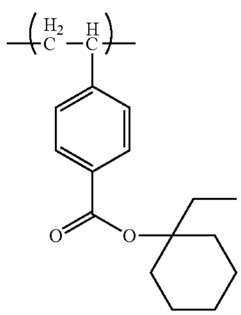
(V-66)
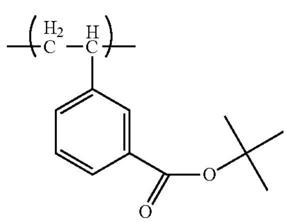
(V-67)
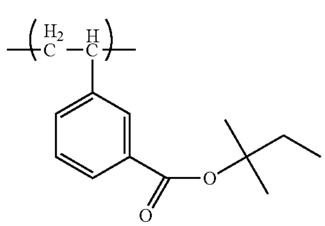
(V-68)
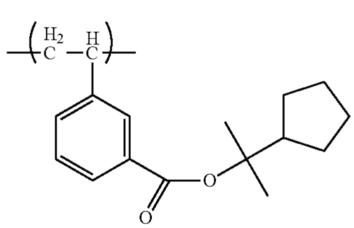
-continued
(V-69)
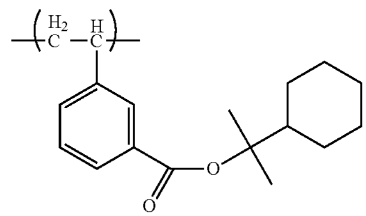
(V-70)
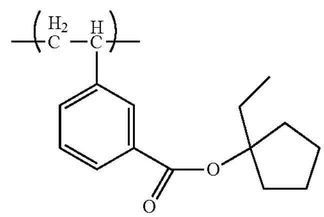
(V-71)
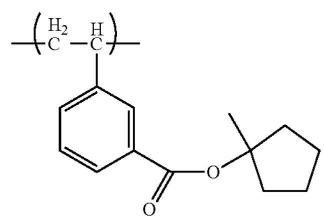
(V-72)
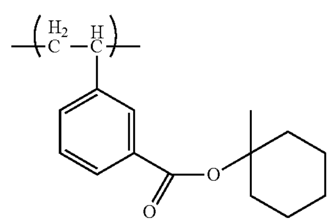
(V-73)
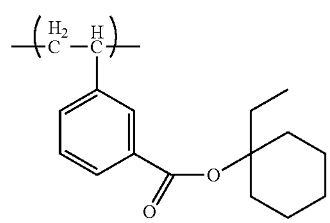
(V-74)
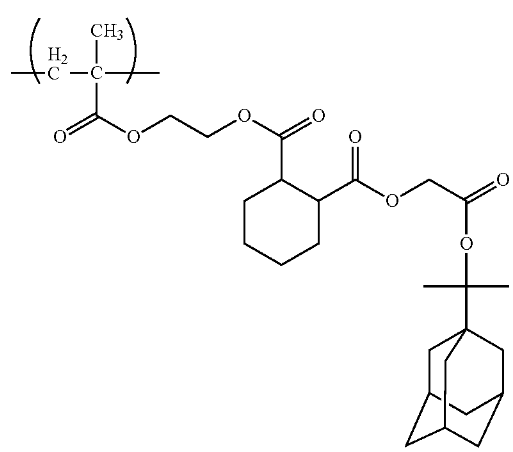

-continued
(V-75)
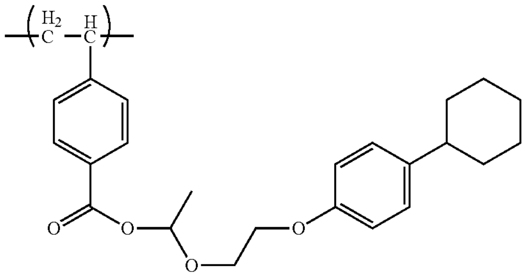
(V-76)
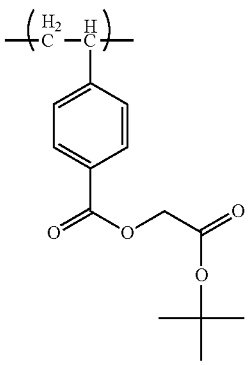
(V-77)
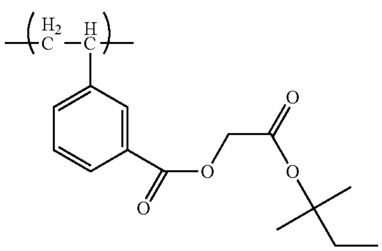
(V-78)
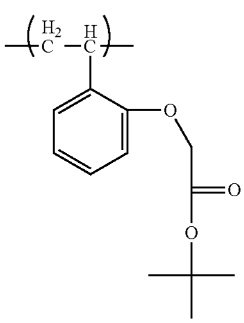
(V-79)
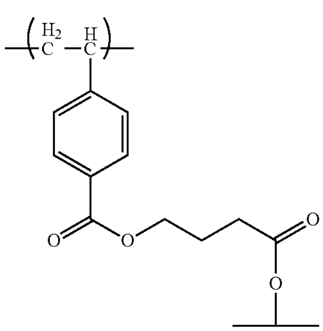
-continued
(V-80)
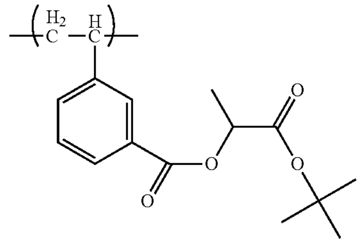
(V-81)
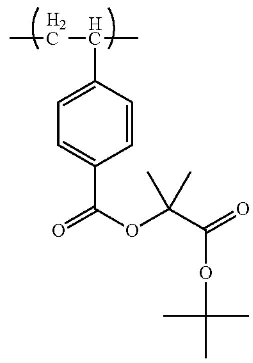
(V-82)
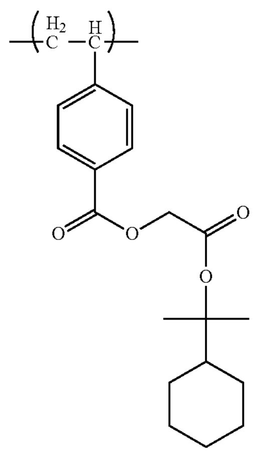
(V-83)
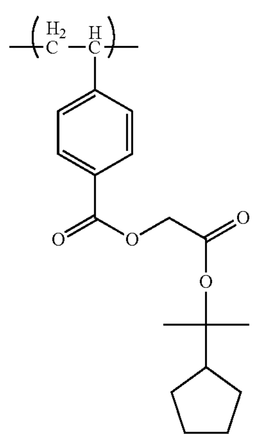

-continued
(V-84)
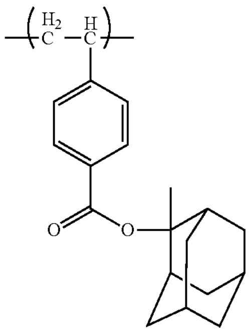
(V-85)
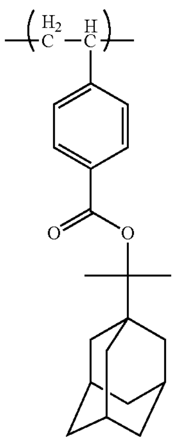
(V-86)
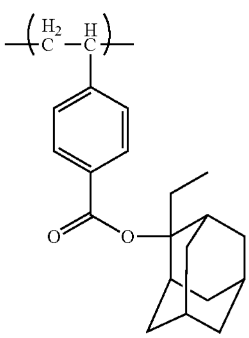
(V-87)
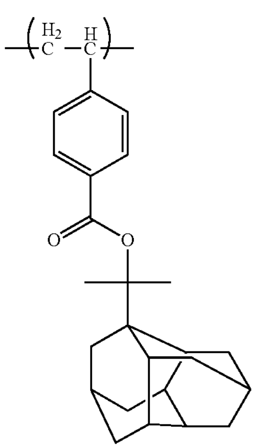
-continued
(V-88)
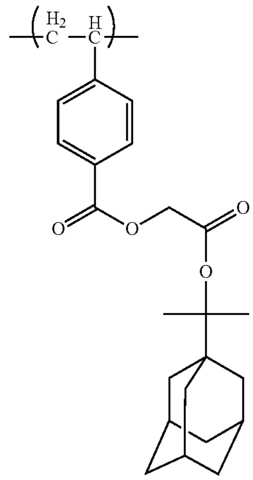
(V-89)
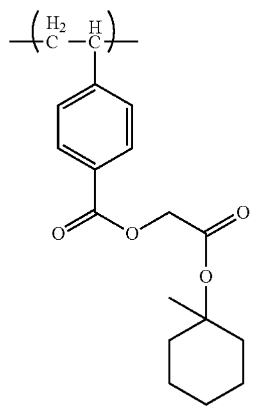
(V-90)
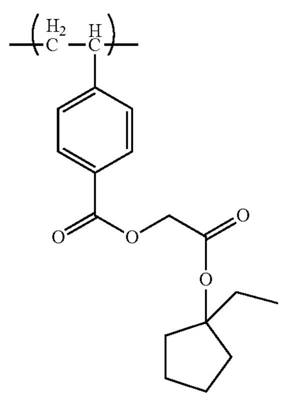
(V-91)
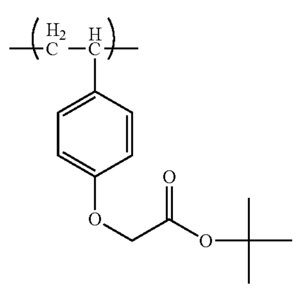

-continued (V-92)

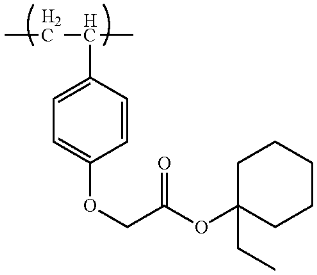

(V-93)

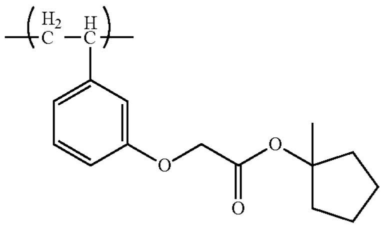

(V-94)

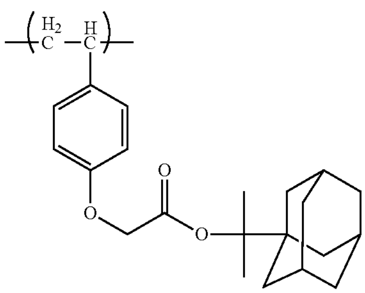

(V-95)

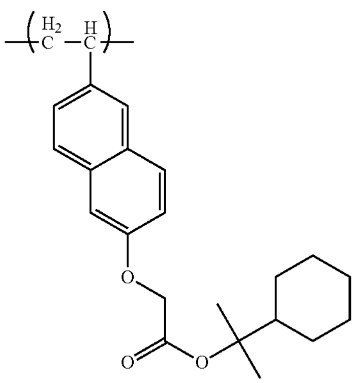

(V-96)

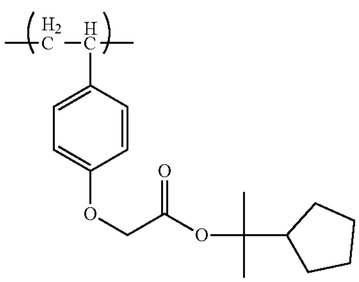

-continued (V-97)

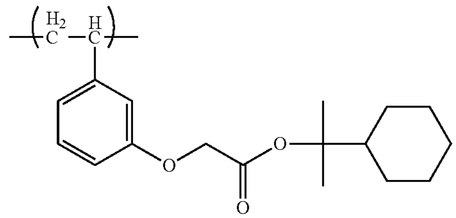

(V-98)

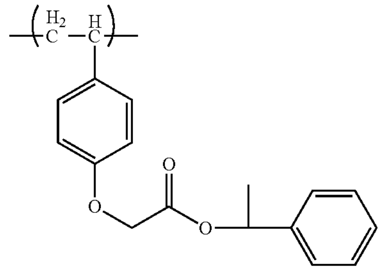

(V-99)

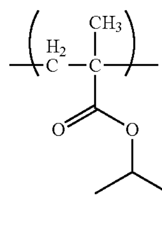

(V-100)

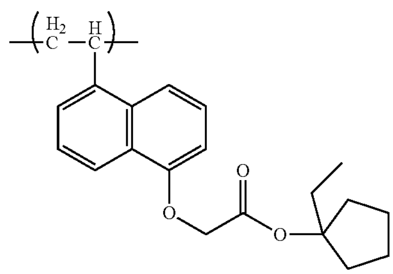

The repeating units of general formula (VI) below are also preferred as the repeating unit (B2).

(VI)

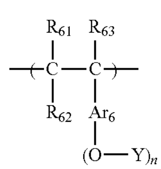

In general formula (VI), each of $R_{61}$, $R_{62}$ and $R_{63}$ independently represents a hydrogen atom, an alkyl group, a monovalent aliphatic hydrocarbon ring group, a halogen atom, a cyano group or an alkoxycarbonyl group, provided that $R_{62}$ may be bonded to $Ar_6$ to thereby form a ring (preferably a 5- or 6-membered ring), which $R_{62}$ in this instance is an alkylene group.

$Ar_6$ represents an aromatic ring group.

Y, or each of Ys independently, represents a hydrogen atom or a group that when acted on by an acid, is cleaved, provided that at least one of Ys is a group that when acted on by an acid, is cleaved.

In the formula, n is an integer of 1 to 4.

General formula (VI) will be described in greater detail below.

The alkyl group represented by each of $R_{61}$ to $R_{63}$ of general formula (VI) is preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred.

The alkyl group contained in the alkoxycarbonyl group is preferably the same as the alkyl group mentioned above with respect to $R_{61}$ to $R_{63}$.

The monovalent aliphatic hydrocarbon ring group may be monocyclic or polycyclic. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is preferred.

When $R_{62}$ represents an alkylene group, the alkylene group is preferably an optionally substituted alkylene group having 1 to 8 carbon atoms, such as a methylene group, an ethylene group, a propylene group, a butylene group, a hexylene group or an octylene group.

$Ar_6$ represents a bivalent aromatic ring group. Particular examples of the bivalent aromatic ring groups and particular examples of the substituents that can be introduced in the aromatic ring groups are the same as set forth above with respect to $Ar_2$ of general formula (II).

Particular examples of the substituents that can be introduced in the above alkyl group, monovalent aliphatic hydrocarbon ring group, alkoxycarbonyl group, alkylene group and bivalent aromatic ring group are the same as set forth above with respect to the $R_{41}$ to $R_{43}$ of general formula (VII).

In the formula, n is preferably 1 or 2, more preferably 1.

Each of n Ys independently represents a hydrogen atom or a group that is cleaved by the action of an acid, provided that at least one of n Ys is a group that is cleaved by the action of an acid.

As the group (Y) that is eliminated by the action of an acid, there can be mentioned, for example, $-C(R_{36})(R_{37})(R_{38})$, $-C(=O)-O-C(R_{36})(R_{37})(R_{38})$, $-C(R_{01})(R_{02})(OR_{39})$, $-C(R_{01})(R_{02})-C(=O)-O-C(R_{36})(R_{37})(R_{38})$, $-CH(R_{36})(Ar)$ or the like.

In the formulae, each of $R_{36}$ to $R_{39}$ independently represents an alkyl group, a monovalent aliphatic hydrocarbon ring group, a monovalent aromatic ring group, a combination of an alkylene group and a monovalent aromatic ring group or an alkenyl group. $R_{36}$ and $R_{37}$ may be bonded with each other to thereby form a ring structure.

Each of $R_{01}$ and $R_{02}$ independently represents a hydrogen atom, an alkyl group, a monovalent aliphatic hydrocarbon ring group, a monovalent aromatic ring group, a combination of an alkylene group and a monovalent aromatic ring group or an alkenyl group.

Ar represents a monovalent aromatic ring group.

Each of the alkyl groups represented by $R_{36}$ to $R_{39}$, $R_{01}$ and $R_{02}$ preferably has 1 to 8 carbon atoms. For example, there can be mentioned a methyl group, an ethyl group, a propyl group, an n-butyl group, a sec-butyl group, a hexyl group, an octyl group or the like.

The monovalent aliphatic hydrocarbon ring groups represented by $R_{36}$ to $R_{39}$, $R_{01}$ and $R_{02}$ may be monocyclic or polycyclic. When the monovalent aliphatic hydrocarbon ring group is monocyclic, it is preferably an aliphatic hydrocarbon ring group having 3 to 8 carbon atoms. As such, there can be mentioned, for example, a cyclopropyl group, a cyclobutyl group, a cyclopentyl group, a cyclohexyl group, a cyclooctyl group or the like. When the monovalent aliphatic hydrocarbon ring group is polycyclic, it is preferably an aliphatic hydrocarbon ring group having 6 to 20 carbon atoms. As such, there can be mentioned, for example, an adamantyl group, a norbornyl group, an isobornyl group, a camphonyl group, a dicyclopentyl group, an α-pinel group, a tricyclodecanyl group, a tetracyclododecyl group, an androstanyl group or the like. With respect to these, the carbon atoms of each of the aliphatic hydrocarbon ring groups may be partially substituted with a heteroatom, such as an oxygen atom.

Each of the monovalent aromatic ring groups represented by $R_{36}$ to $R_{39}$, $R_{01}$, $R_{02}$ and Ar is preferably one having 6 to 10 carbon atoms. For example, there can be mentioned an aryl group, such as a phenyl group, a naphthyl group or an anthryl group, or a monovalent aromatic ring group containing a heteroring, such as thiophene, furan, pyrrole, benzothiophene, benzofuran, benzopyrrole, triazine, imidazole, benzimidazole, triazole, thiadiazole or thiazole.

Each of the groups consisting of an alkylene group combined with a monovalent aromatic ring group, represented by $R_{36}$ to $R_{39}$, $R_{01}$ and $R_{02}$ is preferably an aralkyl group having 7 to 12 carbon atoms. For example, there can be mentioned a benzyl group, a phenethyl group, a naphthylmethyl group or the like.

Each of the alkenyl groups represented by $R_{36}$ to $R_{39}$, $R_{01}$ and $R_{02}$ preferably has 2 to 8 carbon atoms. For example, there can be mentioned a vinyl group, an allyl group, a butenyl group, a cyclohexenyl group or the like.

The ring formed by the mutual bonding of $R_{36}$ and $R_{37}$ may be monocyclic or polycyclic. The monocyclic structure is preferably an aliphatic hydrocarbon ring structure having 3 to 8 carbon atoms. As such, there can be mentioned, for example, a cyclopropane structure, a cyclobutane structure, a cyclopentane structure, a cyclohexane structure, a cycloheptane structure, a cyclooctane structure or the like. The polycyclic structure is preferably an aliphatic hydrocarbon ring structure having 6 to 20 carbon atoms. As such, there can be mentioned, for example, an adamantane structure, a norbornane structure, a dicyclopentane structure, a tricyclodecane structure, a tetracyclododecane structure or the like. With respect to these, the carbon atoms of each of the aliphatic hydrocarbon ring structures may be partially replaced with a heteroatom, such as an oxygen atom.

A substituent may be introduced in each of the above groups represented by $R_{36}$ to $R_{39}$, $R_{01}$, $R_{02}$ and Ar. As the substituent, there can be mentioned, for example, an alkyl group, a monovalent aliphatic hydrocarbon ring group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group or the like. Preferably, the number of carbon atoms of each of the substituents is up to 8.

The group that is cleaved by the action of an acid, Y, preferably has any of the structures of general formula (VI-A) below.

(VI-A)

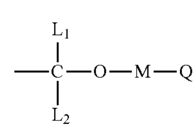

In the formula, each of $L_1$ and $L_2$ independently represents a hydrogen atom, an alkyl group, a monovalent aliphatic hydrocarbon ring group, a monovalent aromatic ring group or a group consisting of an alkylene group combined with a monovalent aromatic ring group.

M represents a single bond or a bivalent connecting group.

Q represents an alkyl group, a monovalent aliphatic hydrocarbon ring group optionally containing a heteroatom, a monovalent aromatic ring group optionally containing a heteroatom, an amino group, an ammonium group, a mercapto group, a cyano group or an aldehyde group.

At least two of Q, M and $L_1$ may be bonded to each other to thereby form a ring (preferably, a 5-membered or 6-membered ring).

The alkyl groups represented by $L_1$ and $L_2$ are, for example, alkyl groups having 1 to 8 carbon atoms. As preferred examples thereof, there can be mentioned a methyl group, an ethyl group, a propyl group, an n-butyl group, a sec-butyl group, a hexyl group and an octyl group.

The monovalent aliphatic hydrocarbon ring groups represented by $L_1$ and $L_2$ are, for example, aliphatic hydrocarbon ring groups each having 3 to 15 carbon atoms. As preferred examples thereof, there can be mentioned a cyclopentyl group, a cyclohexyl group, a norbornyl group, an adamantyl group and the like.

The monovalent aromatic ring groups represented by $L_1$ and $L_2$ are, for example, aryl groups having 6 to 15 carbon atoms. As preferred examples thereof, there can be mentioned a phenyl group, a tolyl group, a naphthyl group, an anthryl group and the like.

The groups each consisting of an alkylene group combined with a monovalent aromatic ring group, represented by $L_1$ and $L_2$ are, for example, those having 6 to 20 carbon atoms. There can be mentioned aralkyl groups, such as a benzyl group and a phenethyl group.

The bivalent connecting group represented by M is, for example, an alkylene group (e.g., a methylene group, an ethylene group, a propylene group, a butylene group, a hexylene group, an octylene group, etc.), a bivalent aliphatic hydrocarbon ring group (e.g., a cyclopentylene group, a cyclohexylene group, an adamantylene group, etc.), an alkenylene group (e.g., an ethylene group, a propenylene group, a butenylene group, etc.), a bivalent aromatic ring group (e.g., a phenylene group, a tolylene group, a naphthylene group, etc.), —S—, —O—, —CO—, $—SO_2—$, $—N(R_0)—$ or a bivalent connecting group resulting from combination of these groups. $R_0$ represents a hydrogen atom or an alkyl group (for example, an alkyl group having 1 to 8 carbon atoms; in particular, a methyl group, an ethyl group, a propyl group, an n-butyl group, a sec-butyl group, a hexyl group, an octyl group or the like).

The alkyl group represented by Q is the same as mentioned above with respect to $L_1$ and $L_2$.

As the aliphatic hydrocarbon ring group containing no heteroatom and monovalent aromatic ring group containing no heteroatom respectively contained in the monovalent aliphatic hydrocarbon ring group optionally containing a heteroatom and monovalent aromatic ring group optionally containing a heteroatom both represented by Q, there can be mentioned, for example, the monovalent aliphatic hydrocarbon ring group and monovalent aromatic ring group mentioned above as being represented by each of $L_1$ and $L_2$. Preferably, each thereof has 3 to 15 carbon atoms.

As the monovalent aliphatic hydrocarbon ring group containing a heteroatom and monovalent aromatic ring group containing a heteroatom, there can be mentioned, for example, groups having a heterocyclic structure, such as thiirane, cyclothiorane, thiophene, furan, pyrrole, benzothiophene, benzofuran, benzopyrrole, triazine, imidazole, benzimidazole, triazole, thiadiazole, thiazole and pyrrolidone. However, the above monovalent aliphatic hydrocarbon ring groups and monovalent aromatic ring groups are not limited to these as long as a structure generally known as a heteroring (ring formed by carbon and a heteroatom or ring formed by heteroatoms) is included.

As the ring that may be formed by the mutual bonding of at least two of Q, M and $L_1$, there can be mentioned one resulting from the mutual bonding of at least two of Q, M and $L_1$ so as to form, for example, a propylene group or a butylene group and the subsequent formation of a 5-membered or 6-membered ring containing an oxygen atom.

In general formula (VI-A), a substituent may be introduced in each of the groups represented by $L_1$, $L_2$, M and Q. As the substituent, there can be mentioned, for example, any of those set forth above as being optionally introduced in $R_{36}$ to $R_{39}$, $R_{01}$, $R_{02}$ and Ar. Preferably, the number of carbon atoms of each of the substituents is up to 8.

The groups of the formula -M-Q are preferably groups each composed of 1 to 30 carbon atoms, more preferably groups each composed of 5 to 20 carbon atoms.

Particular examples of the repeating units of general formula (VI) will be shown below as preferred particular examples of the repeating units (B2), which however in no way limit the scope of the present invention.

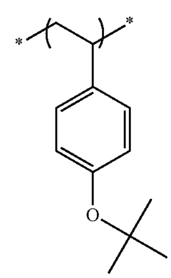

(VI-1)

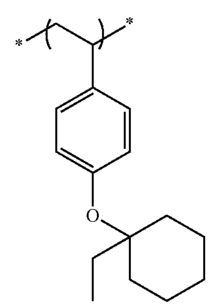

(VI-2)

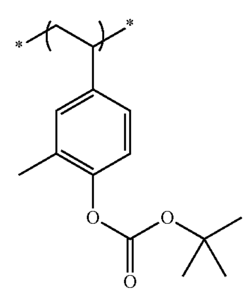

(VI-3)

(VI-4)
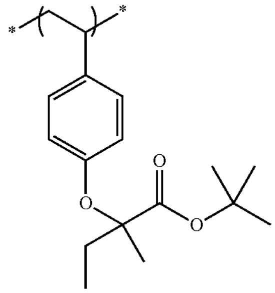
(VI-5)
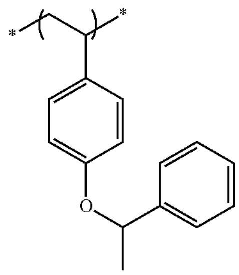
(VI-6)
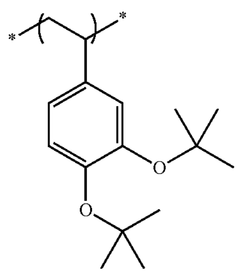
(VI-7)
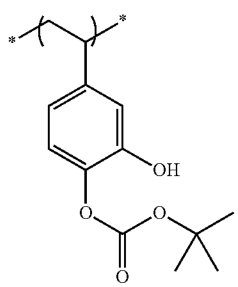
(VI-8)
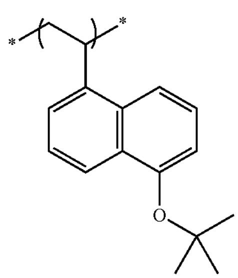
(VI-9)
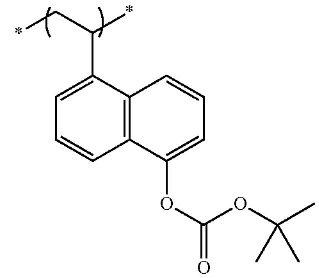
(VI-10)
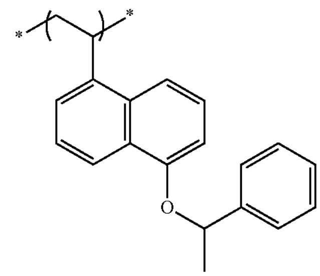
(VI-11)
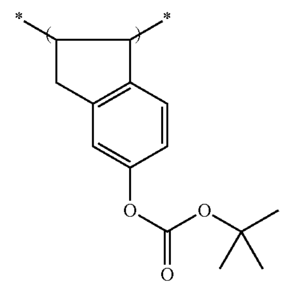
(VI-12)
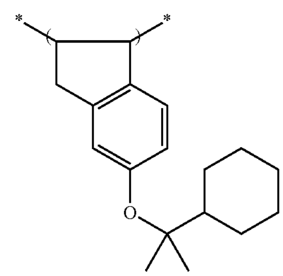
(VI-13)
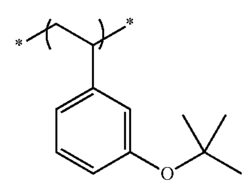
(VI-14)
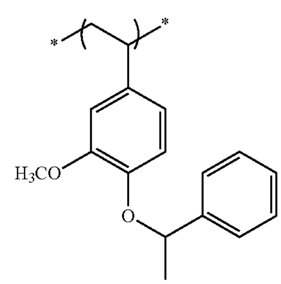

-continued
(VI-15)
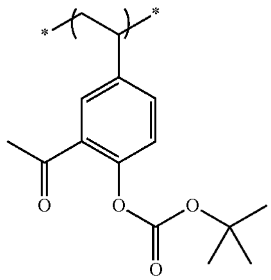
(VI-16)
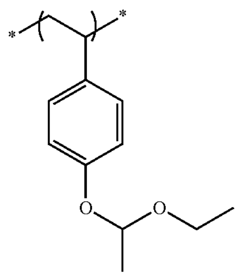
(VI-17)
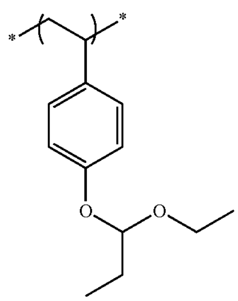
(VI-18)
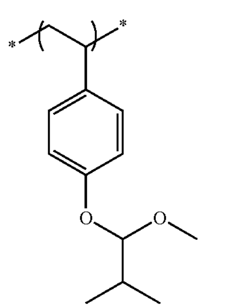
(VI-19)
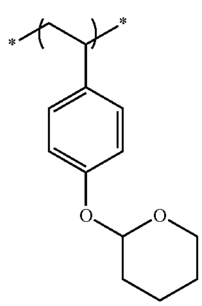
-continued
(VI-20)
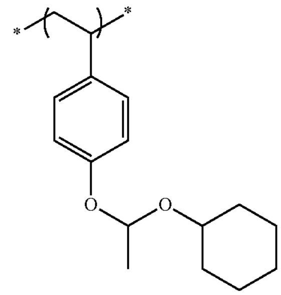
(VI-21)
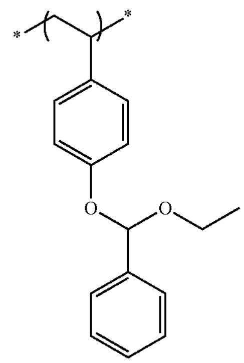
(VI-22)
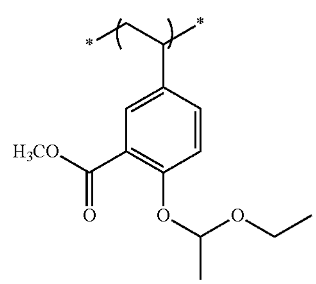
(VI-23)
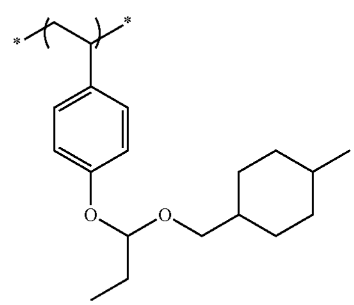
(VI-24)
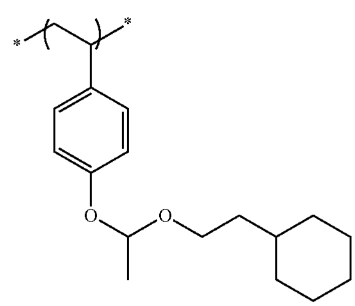

-continued
(VI-25)
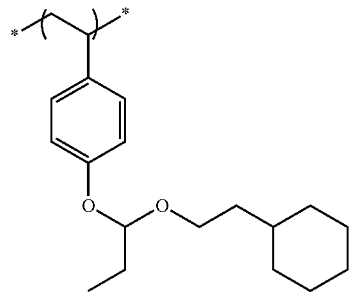
(VI-26)
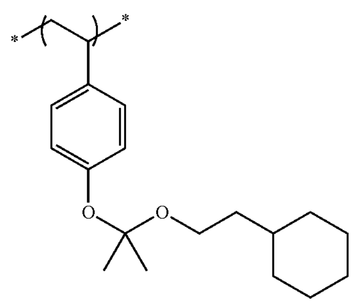
(VI-27)
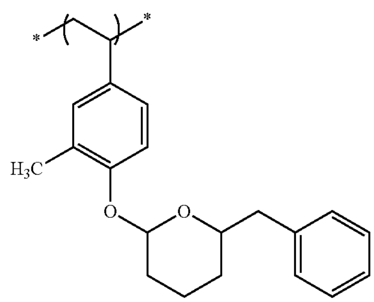
(VI-28)
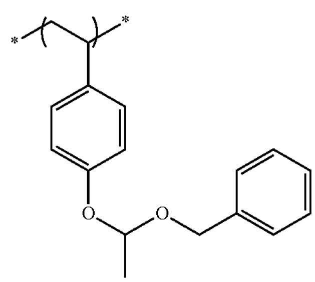
(VI-29)
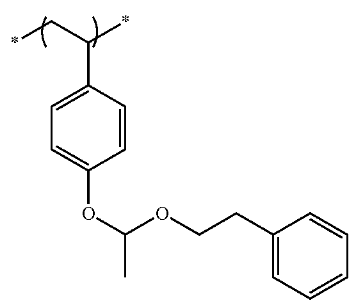
-continued
(VI-30)
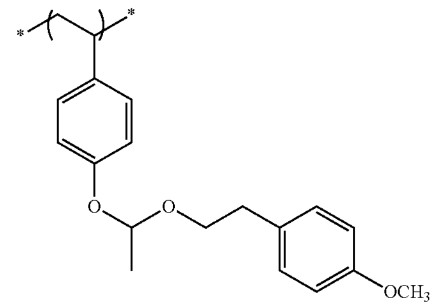
(VI-31)
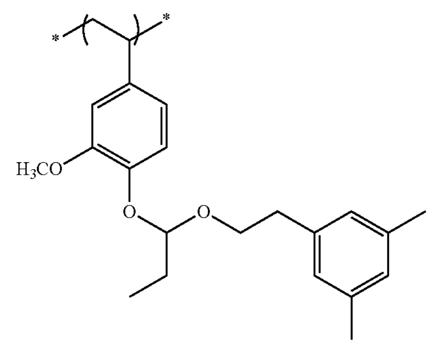
(VI-32)
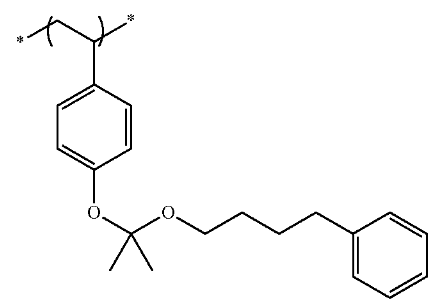
(VI-33)
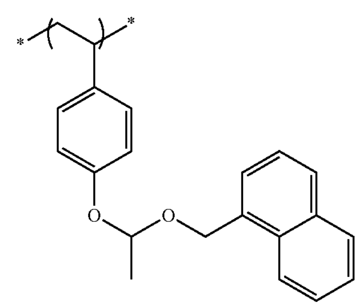
(VI-34)
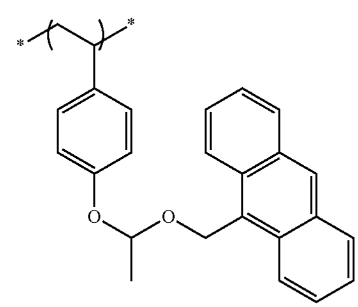

-continued
(VI-35)
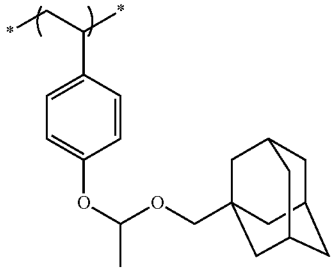
(VI-36)
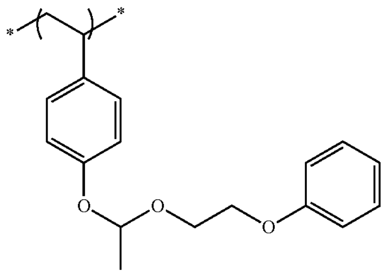
(VI-37)
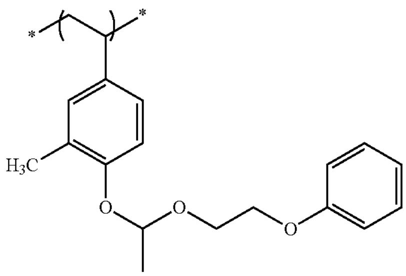
(VI-38)
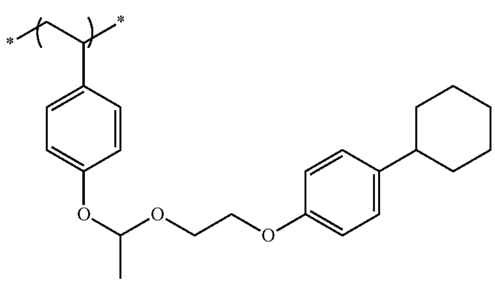
(VI-39)
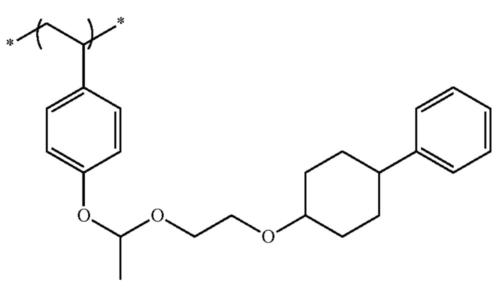
-continued
(VI-40)
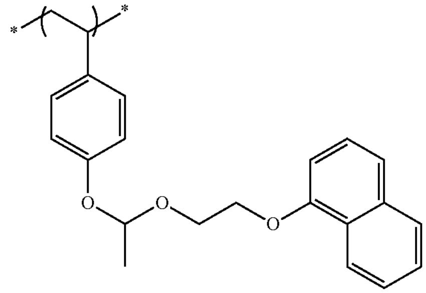
(VI-41)
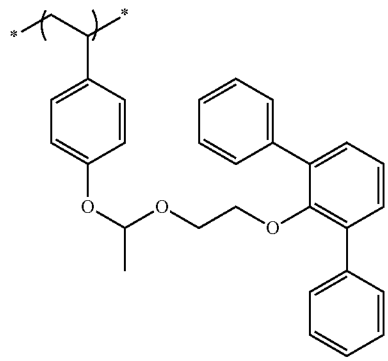
(VI-42)
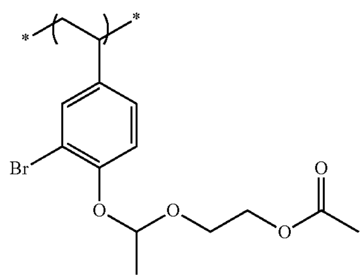
(VI-43)
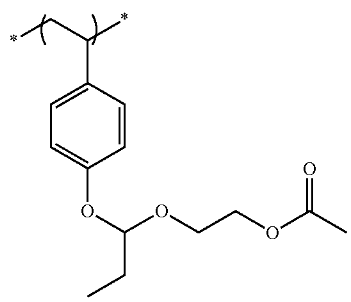
(VI-44)
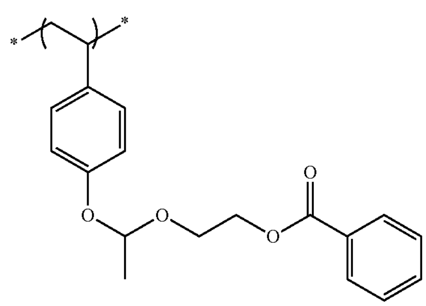

-continued
(VI-45)
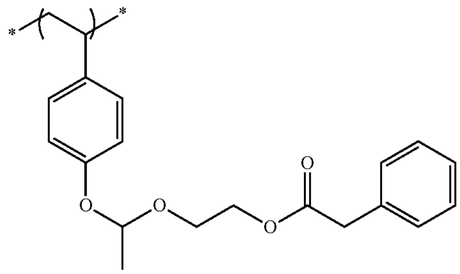
(VI-46)
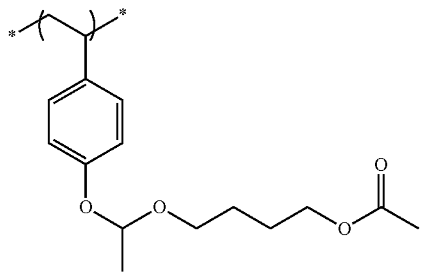
(VI-47)
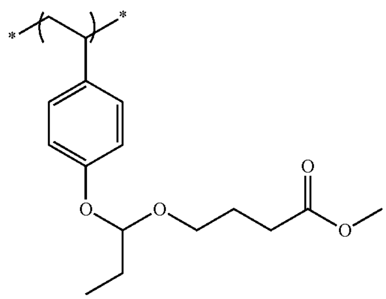
(VI-48)
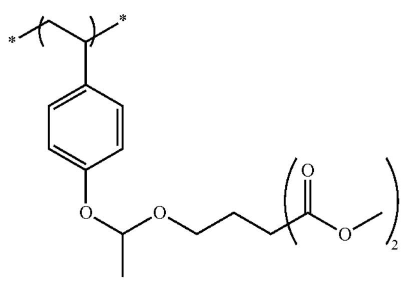
(VI-49)
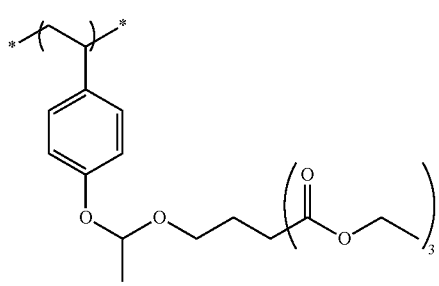
-continued
(VI-50)
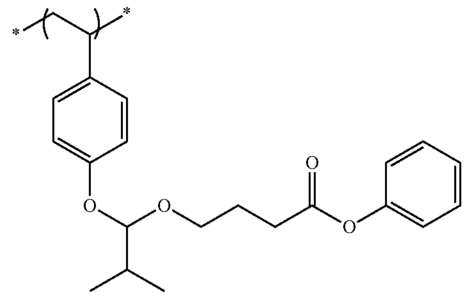
(VI-51)
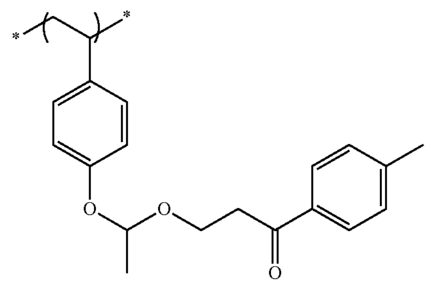
(VI-52)
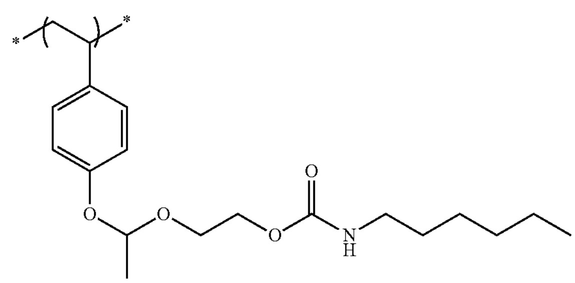
(VI-53)
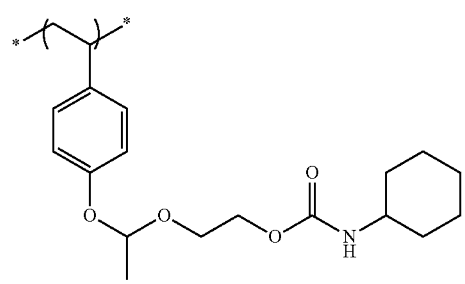
(VI-54)
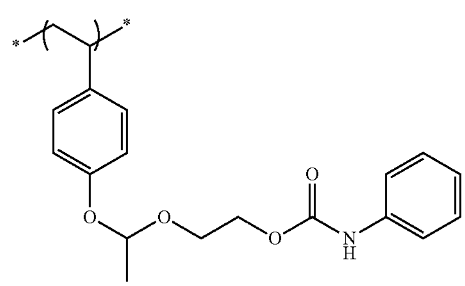

-continued
(VI-55)
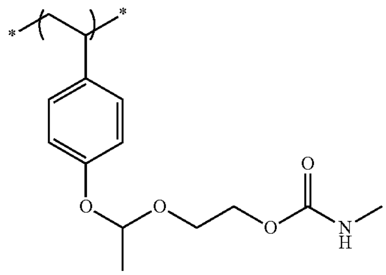
(VI-56)
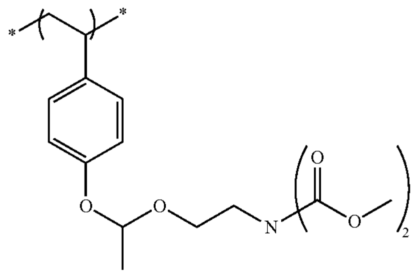
(VI-57)
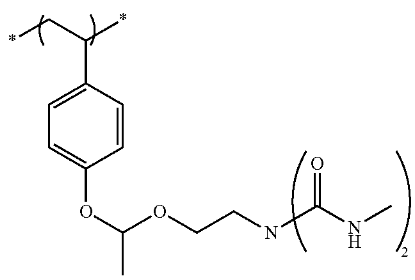
(VI-58)
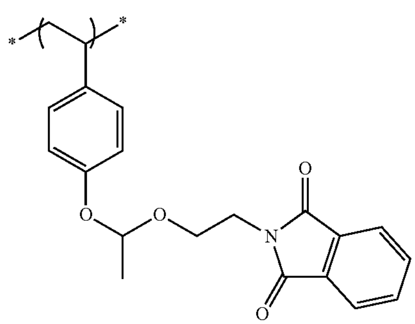
(VI-59)
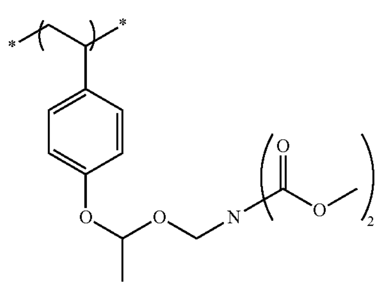
-continued
(VI-60)
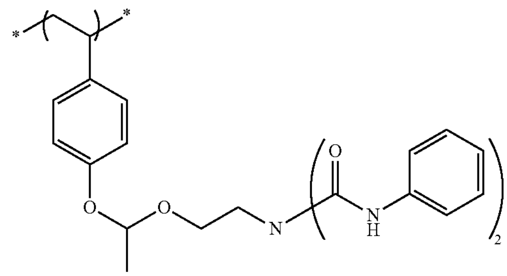
(VI-61)
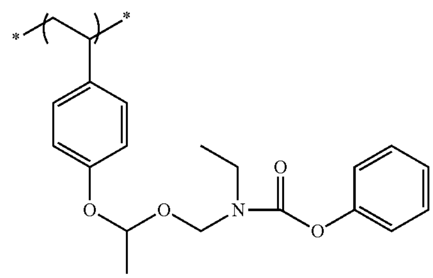
(VI-62)
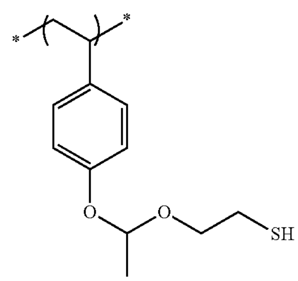
(VI-63)
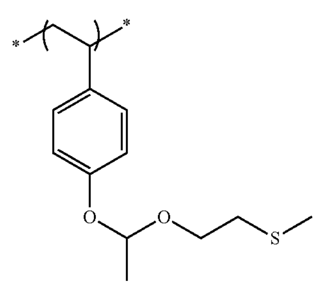
(VI-64)
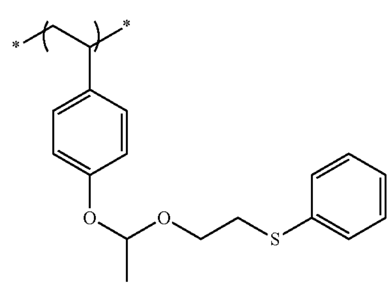

-continued
(VI-65)
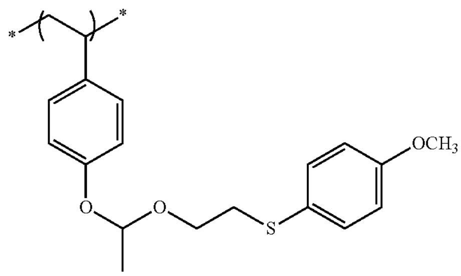
(VI-66)
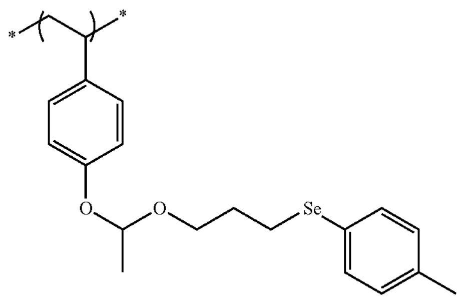
(VI-67)
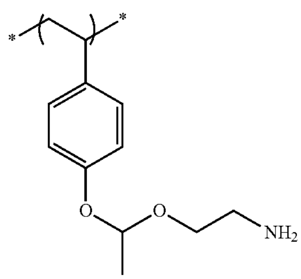
(VI-68)
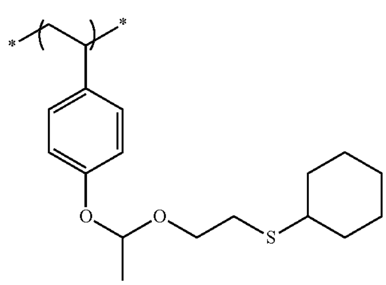
(VI-69)
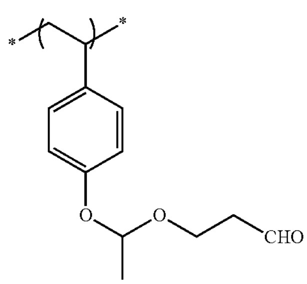
-continued
(VI-70)
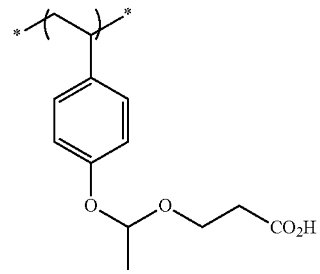
(VI-71)
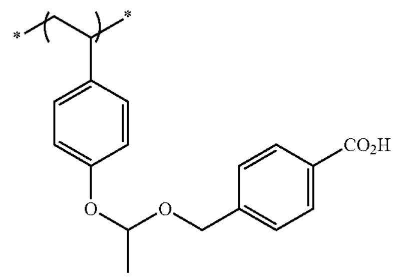
(VI-72)
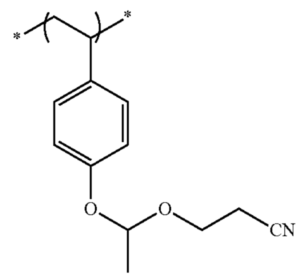
(VI-73)
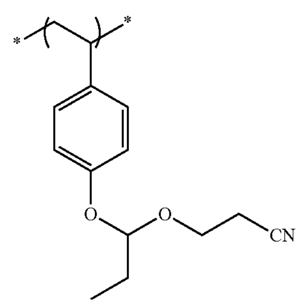
(VI-74)
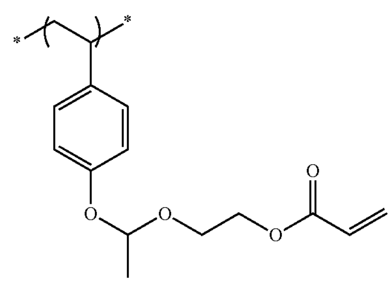

-continued
(VI-75)
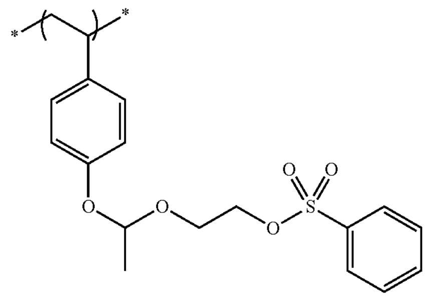
(VI-76)
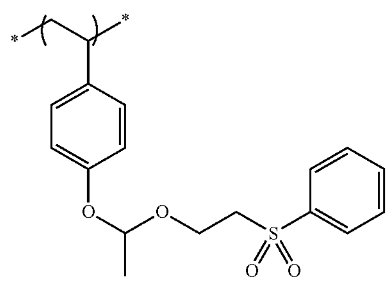
(VI-77)
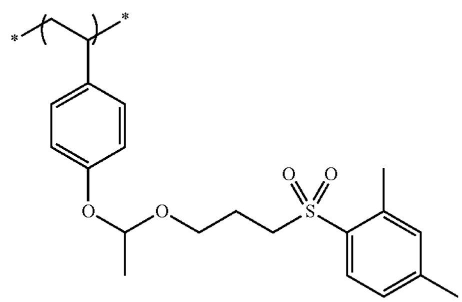
(VI-78)
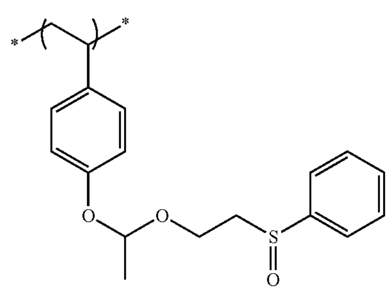
(VI-79)
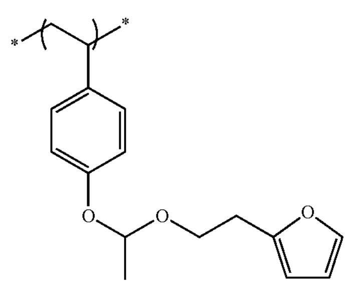
-continued
(VI-80)
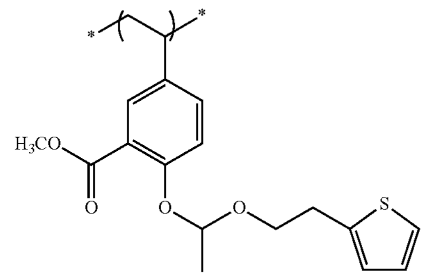
(VI-81)
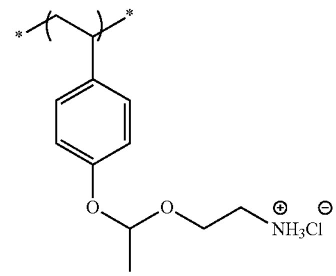
(VI-82)
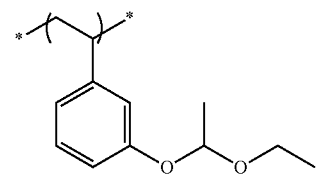
(VI-83)
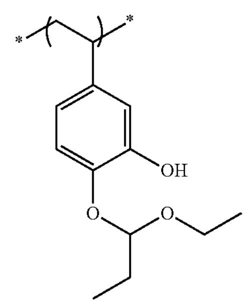
(VI-84)
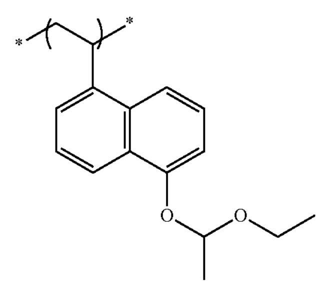
(VI-85)
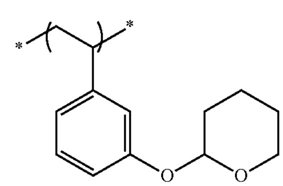

-continued
(VI-86)
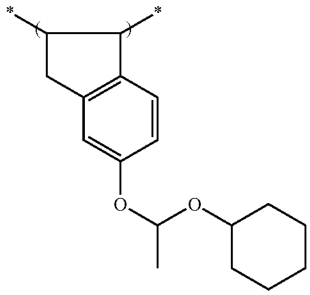
(VI-87)
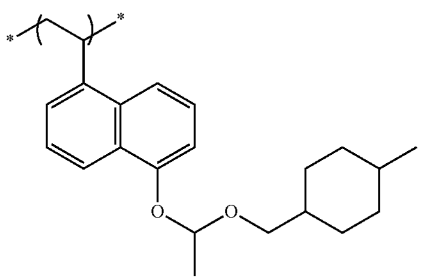
(VI-88)
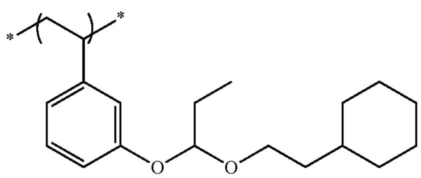
(VI-89)
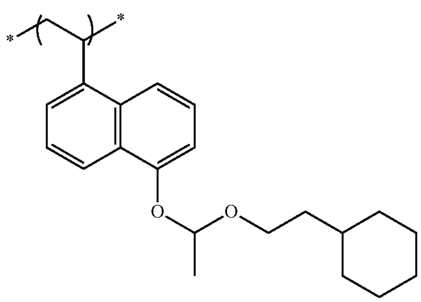
(VI-90)
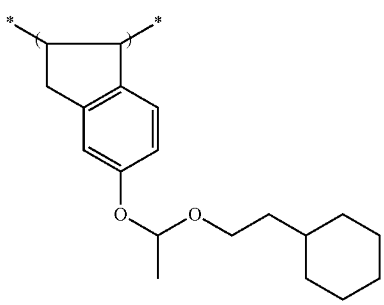
(VI-91)
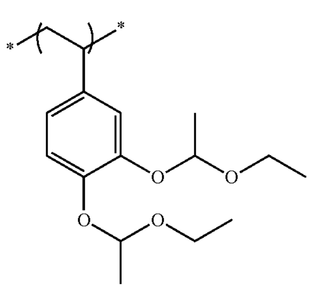
-continued
(VI-92)
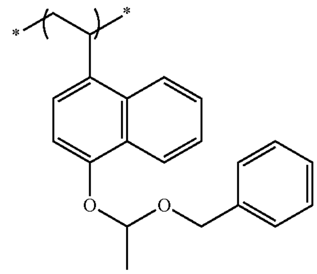
(VI-93)
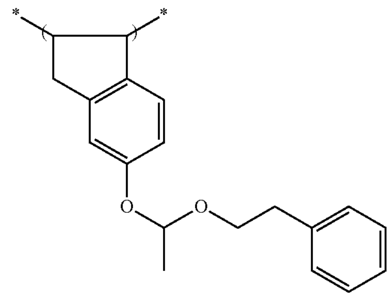
(VI-94)
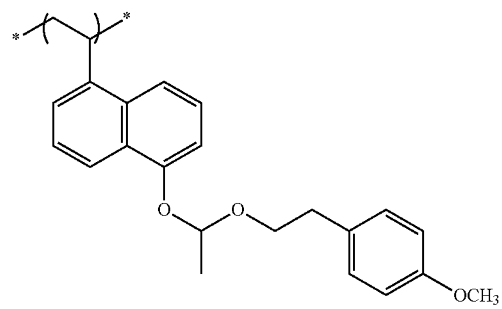
(VI-95)
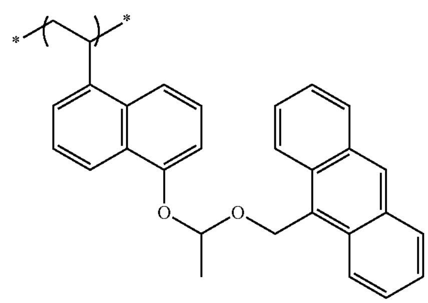
(VI-96)
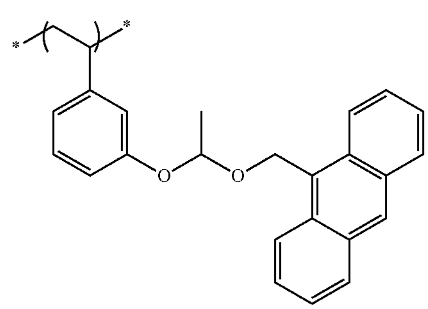

-continued
(VI-97)
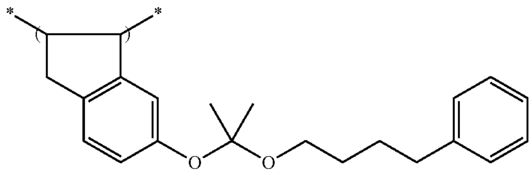
(VI-98)
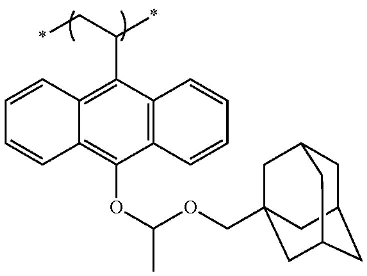
(VI-99)
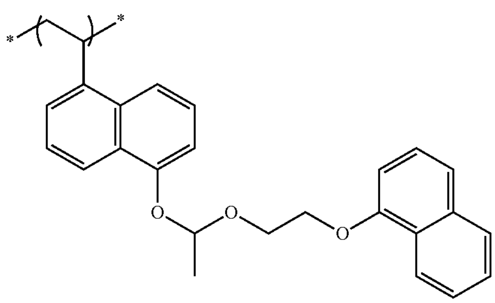
(VI-100)
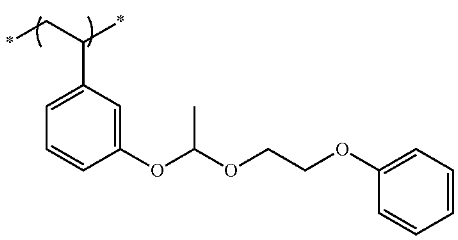
(VI-101)
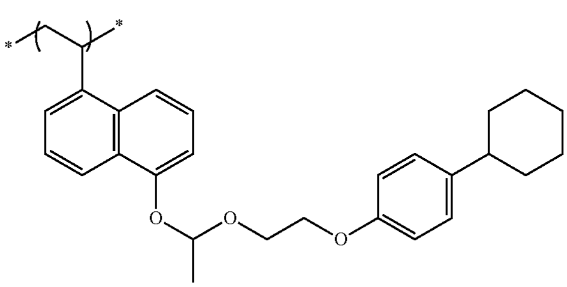
-continued
(VI-102)
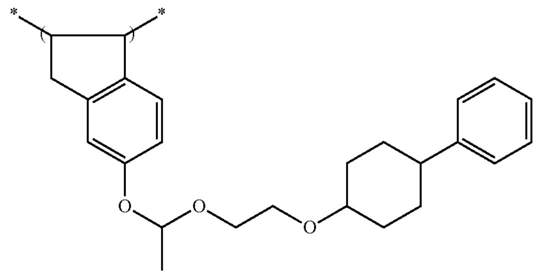
(VI-103)
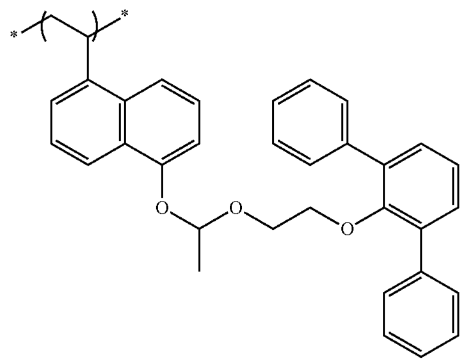
(VI-104)
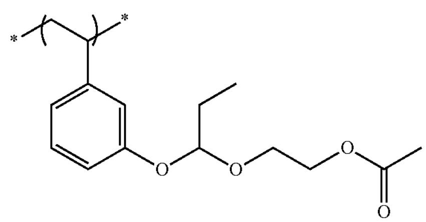
(VI-105)
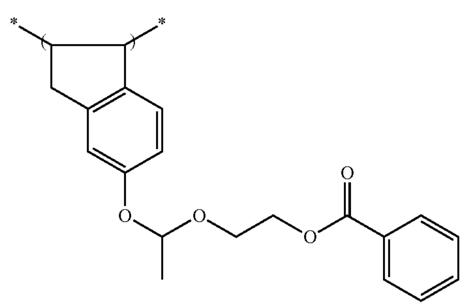
(VI-106)
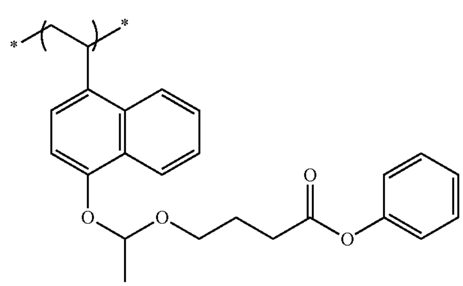

-continued (VI-107)

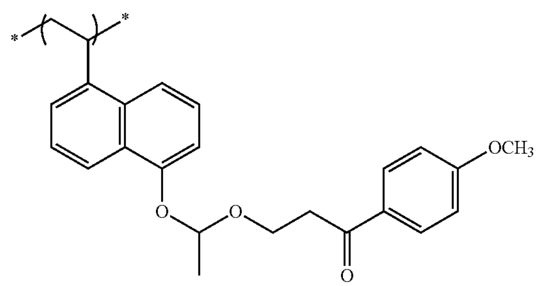

(VI-108)

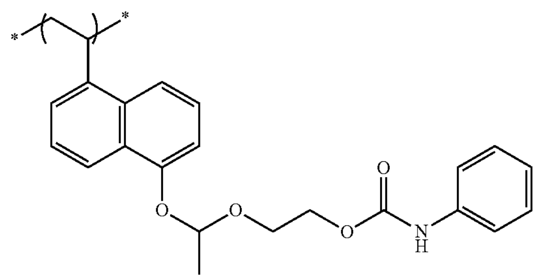

(VI-109)

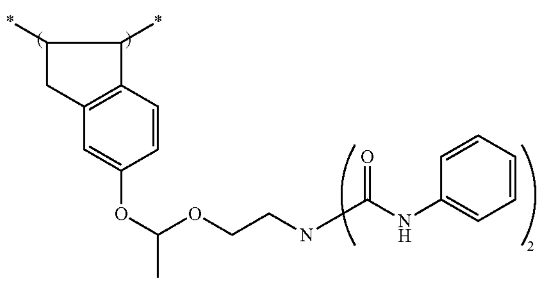

(VI-110)

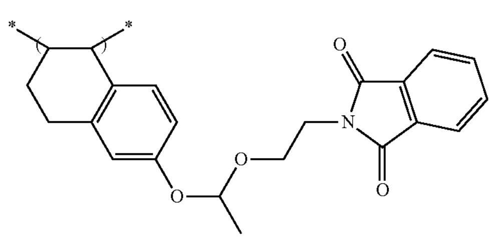

(VI-111)

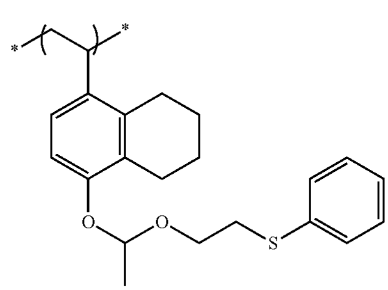

-continued (VI-112)

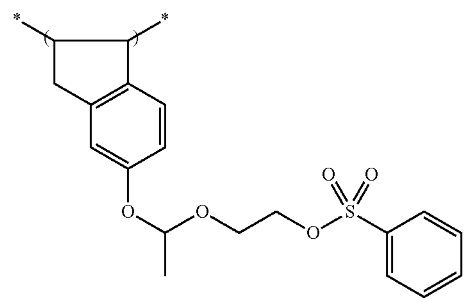

In the resin (P) of the present invention, the content of repeating units containing acid-decomposable groups (including the repeating unit (B2) and the repeating unit (C) to be described hereinafter), based on all the repeating units of the resin, is preferably in the range of 3 to 90 mol %, more preferably 5 to 80 mol % and most preferably 7 to 70 mol %.

The ratio between repeating unit (A) and repeating unit (B2) (number of moles of A/number of moles of B) in the resin is preferably in the range of 0.04 to 1.0, more preferably 0.05 to 0.9 and most preferably 0.06 to 0.8.

[Repeating Unit (C)]

The resin (P) may further contain a repeating unit (C) that contains an acid-decomposable group but does not contain any aromatic ring group.

The repeating unit (C) is preferably any of those of general formula (V') below.

(V')

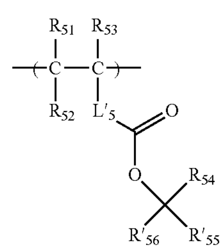

In general formula (V'), $R_{51}$ to $R_{54}$ are as defined above in connection with general formula (V).

$L'_5$, $R'_{55}$ and $R'_{56}$ have the same meanings as those of $L_5$, $R_{55}$ and $R_{56}$ of general formula (V), respectively, except that $L'_5$, $R'_{55}$ and $R'_{56}$ are neither aromatic ring groups nor groups having aromatic ring groups.

Particular examples of the repeating units of general formula (V') will be shown below, which however in no way limit the scope of the present invention.

(V-1)

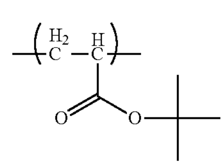

-continued
(V-2)
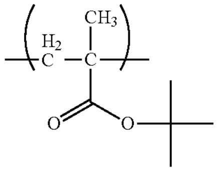
(V-3)
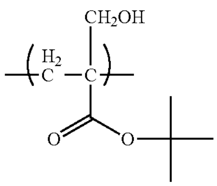
(V-4)
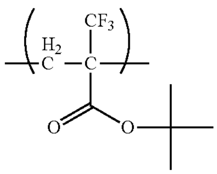
(V-5)
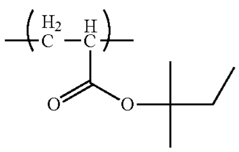
(V-6)
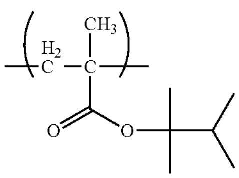
(V-7)
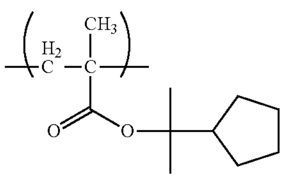
(V-8)
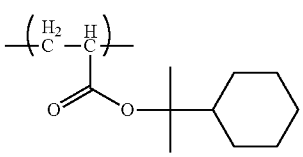
(V-9)
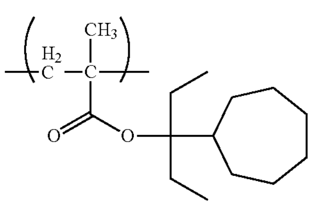
(V-10)
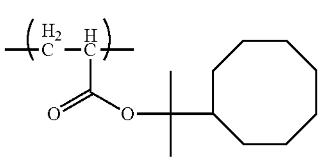
-continued
(V-11)
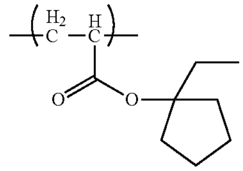
(V-12)
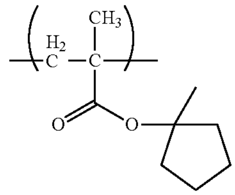
(V-13)
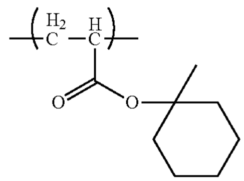
(V-14)
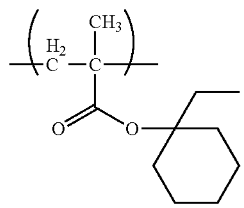
(V-15)
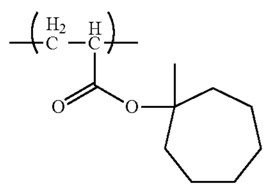
(V-16)
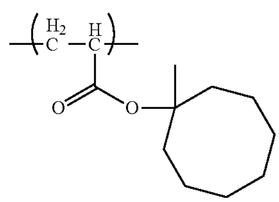
(V-17)
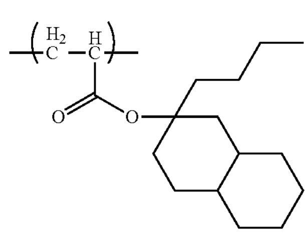
(V-18)
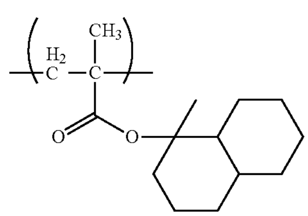

-continued
(I-19)
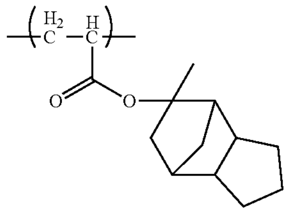
(V-20)
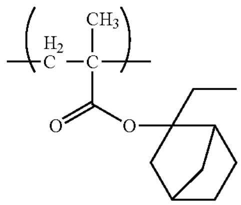
(V-21)
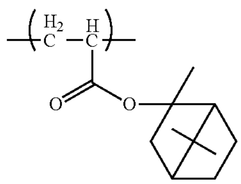
(V-22)
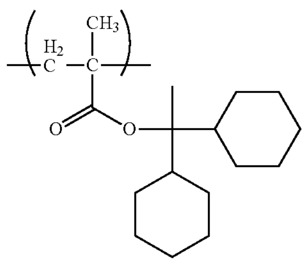
(V-23)
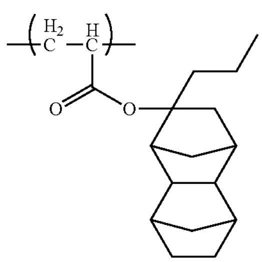
(V-24)
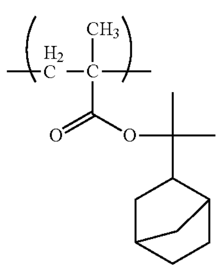
(V-25)
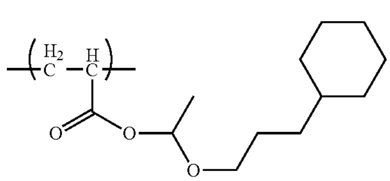
-continued
(V-26)
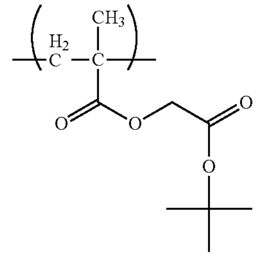
(V-27)
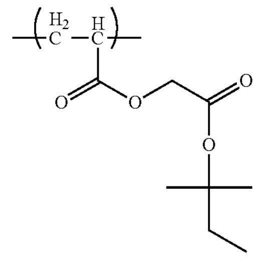
(V-28)
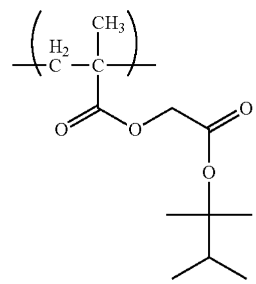
(V-29)
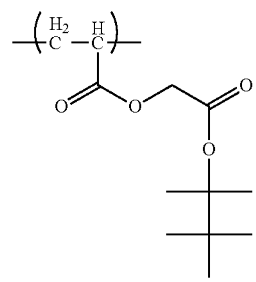
(V-30)
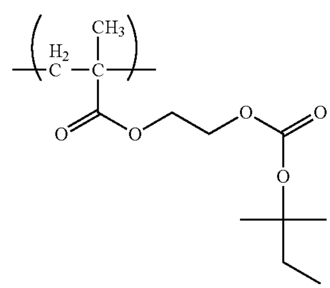
(V-31)
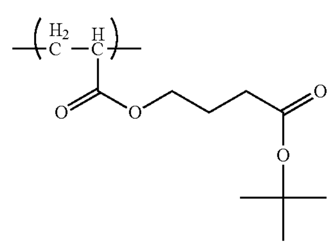

(V-32)
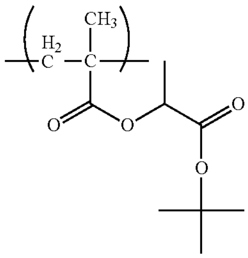
(V-33)
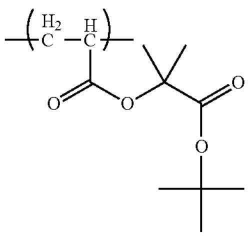
(V-34)
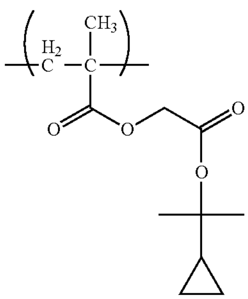
(V-35)
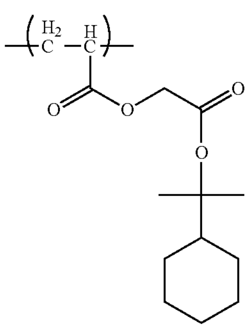
(V-36)
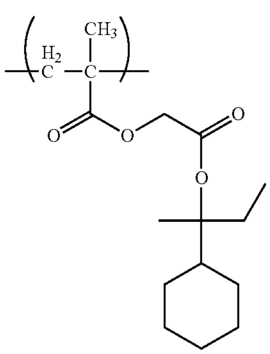
(V-37)
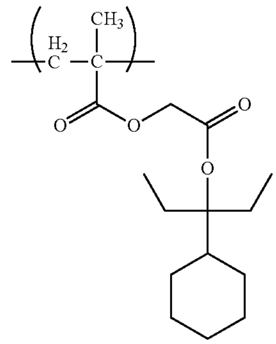
(V-38)
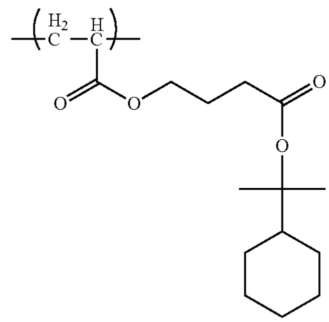
(V-39)
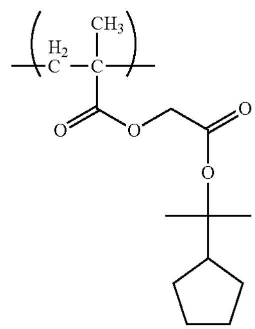
(V-40)
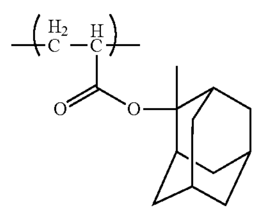
(V-41)
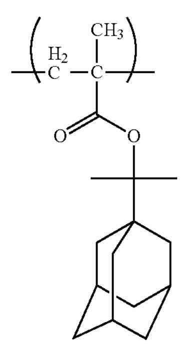

-continued
(V-42)
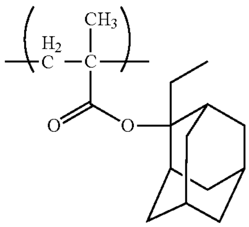
(V-43)
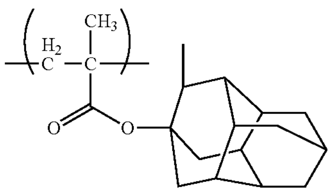
(V-44)
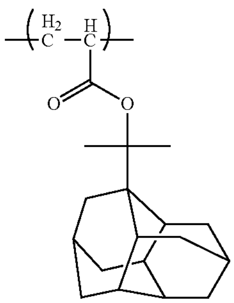
(V-45)
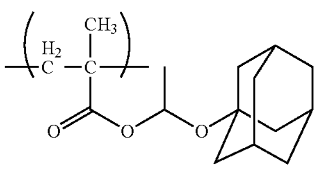
(V-46)
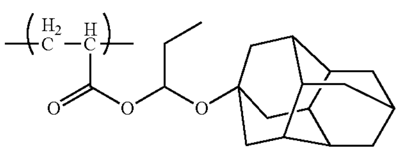
(V-47)
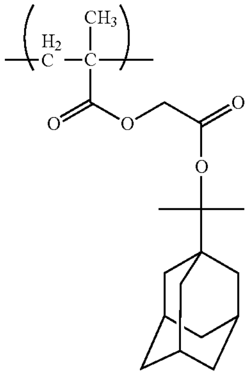
-continued
(V-48)
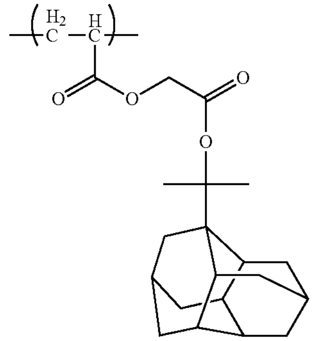
(V-49)
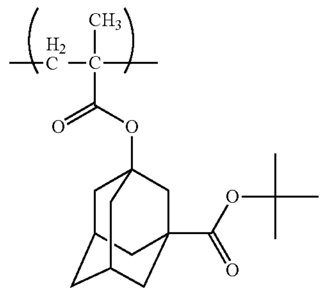
(V-50)
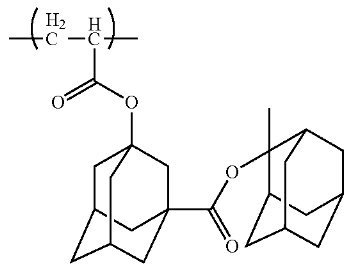
(V-51)
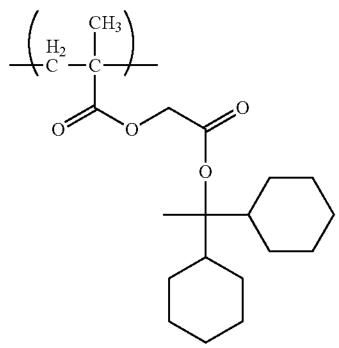
(V-52)
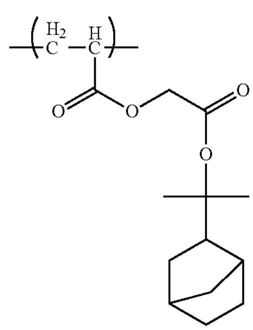

-continued (V-53)

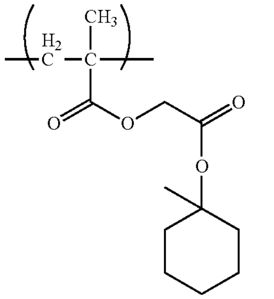

(V-54)

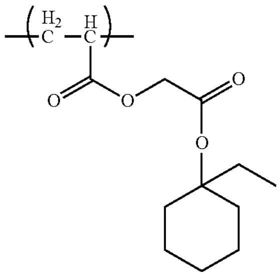

(V-55)

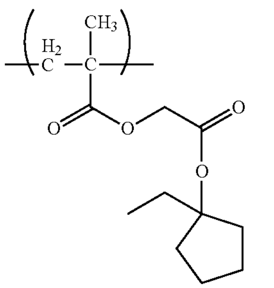

(V-56)

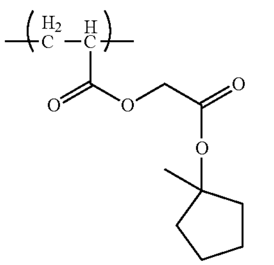

[Repeating Unit (D)]

Preferably, the resin (P) may further contain a repeating unit (D) that contains a group that when acted on by an alkali developer, is decomposed to thereby increase its rate of dissolution in the alkali developer.

As the group that when acted on by an alkali developer, is decomposed to thereby increase its rate of dissolution in the alkali developer, there can be mentioned, for example, a lactone structure, phenylester structure or the like.

The repeating unit (D) is more preferably any of those of general formula (AII), below.

(AII)

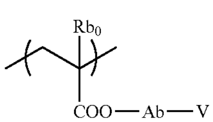

In the general formula (AII), $Rb_0$ represents a hydrogen atom, a halogen atom or an optionally substituted alkyl group (preferably having 1 to 4 carbon atoms).

As a preferred substituent optionally contained in the alkyl group represented by $Rb_0$, there can be mentioned a hydroxyl group or a halogen atom. As the halogen atom represented by $Rb_0$, there can be mentioned a fluorine atom, a chlorine atom, a bromine atom or an iodine atom. The $Rb_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with an alicyclic hydrocarbon structure of a single ring or multiple rings, an ether group, an ester group, a carbonyl group, or a bivalent connecting group resulting from combination thereof. A single bond and a bivalent connecting group of the formula $-Ab_1-CO_2-$ are preferred.

$Ab_1$ is a linear or branched alkylene group or a cycloalkylene group of a single ring or multiple rings, being preferably a methylene group, an ethylene group, a cyclohexylene group, an adamantylene group or a norbornylene group.

V represents a group that when acted on by an alkali developer, is decomposed to thereby increase its rate of dissolution in the alkali developer. The group is preferably a group having an ester bond, more preferably a group having a lactone structure.

Any groups having a lactone structure can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having a lactone structure represented by any of the following general formulae (LC1-1) to (LC1-17) is more preferred. The lactone structures may be directly bonded to the principal chain of the resin. Preferred lactone structures are those of the formulae (LC1-1), (LC1-4), (LC1-5), (LC1-6), (LC1-13) and (LC1-14).

LC1-1

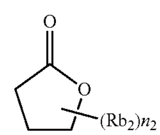

LC1-2

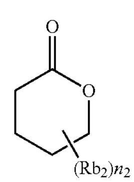

LC1-3

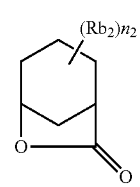

-continued

LC1-4

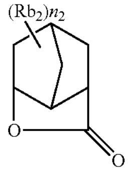

LC1-5

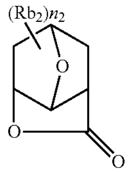

LC1-6

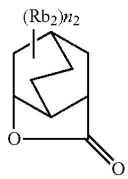

LC1-7

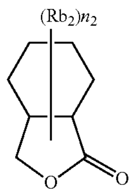

LC1-8

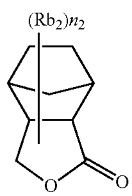

LC1-9

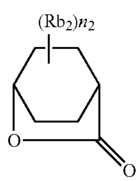

LC1-10

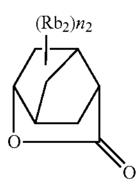

LC1-11

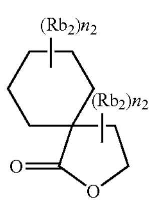

-continued

LC1-12

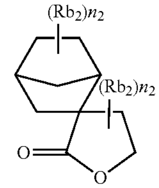

LC1-13

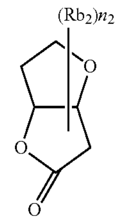

LC1-14

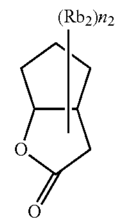

LC1-15

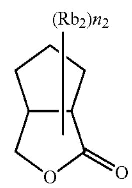

LC1-16

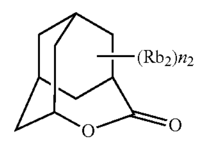

LC1-17

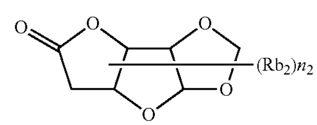

The presence of a substituent ($Rb_2$) on the portion of the lactone structure is optional. As a preferred substituent ($Rb_2$), there can be mentioned an alkyl group having 1 to 8 carbon atoms, a monovalent aliphatic hydrocarbon ring group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded with each other to thereby form a ring.

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90 or higher, more preferably 95 or higher.

The content ratio of the repeating unit (D) based on all the repeating units of the resin (P) is preferably in the range of 0.5 to 80 mol %, more preferably 1 to 60 mol % and still more preferably 2 to 40 mol %. The repeating unit (D) can be used either individually or in combination. The use of specified lactone structures would ensure improvement in the line edge roughness and development defect.

Specific examples of the repeating units (D) of the resin (P) will be shown below, which however in no way limit the scope of the present invention. In the formulae, Rx represents H, $CH_3$, $CH_2OH$ or $CF_3$.

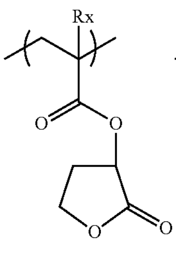
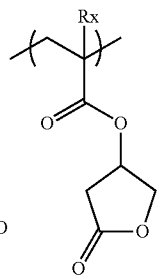
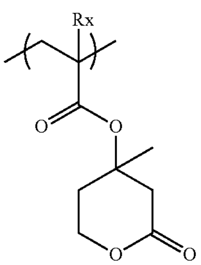
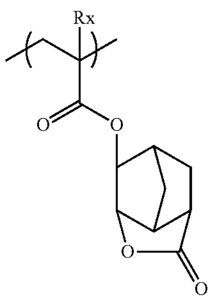
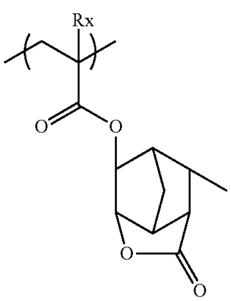
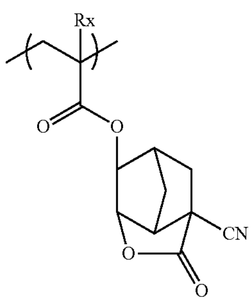
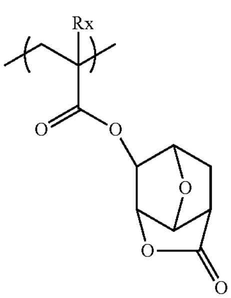
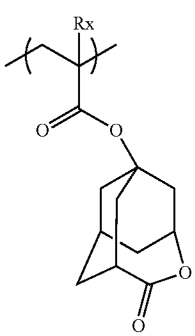

-continued

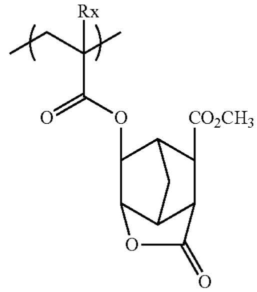
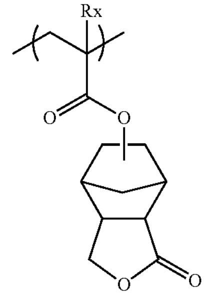
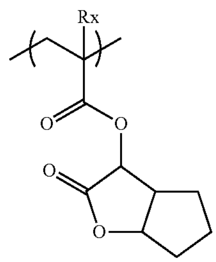
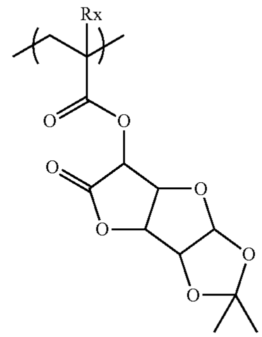
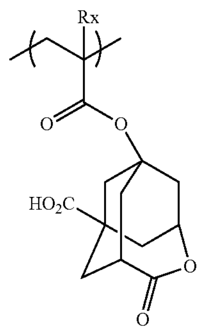
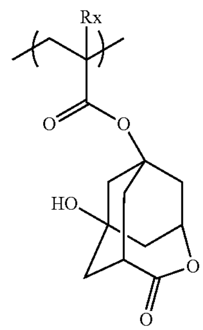
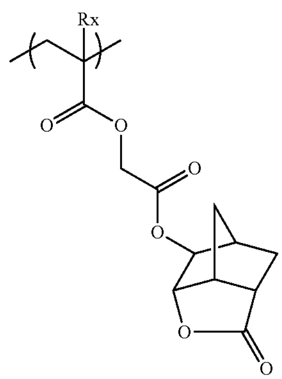
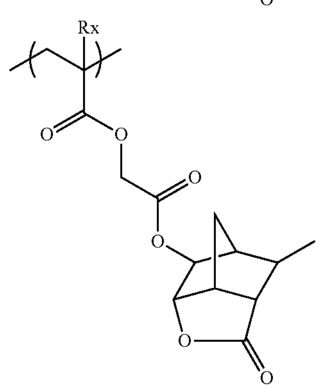

-continued
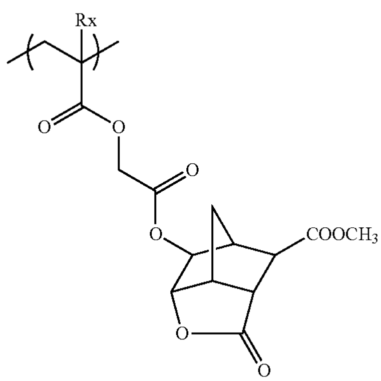
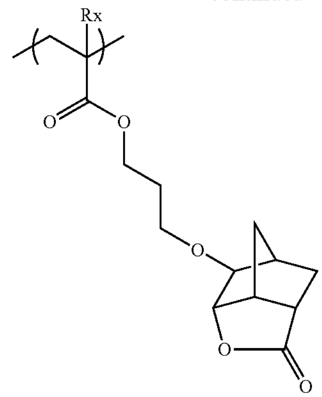
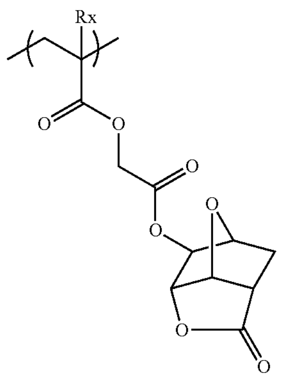
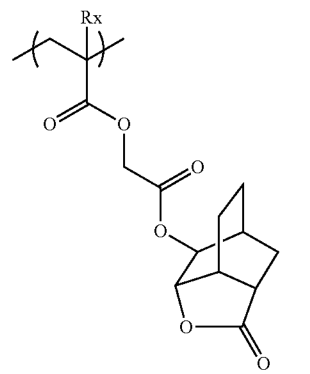
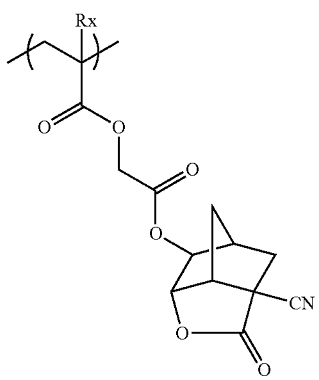
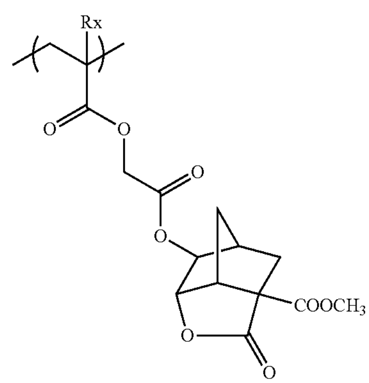
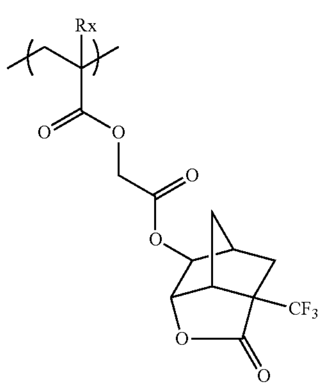
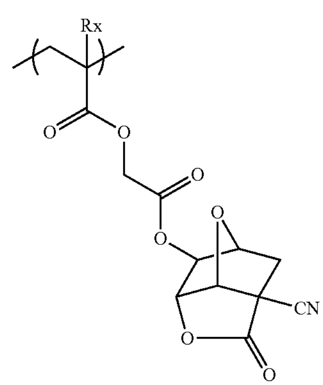

-continued

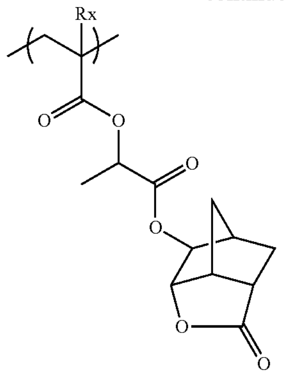

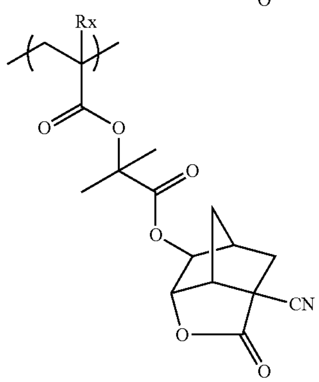

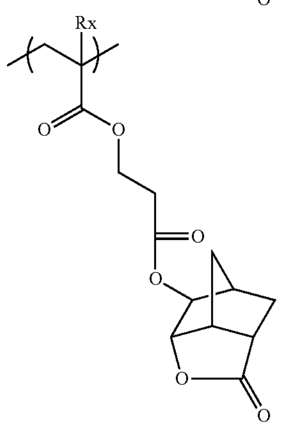

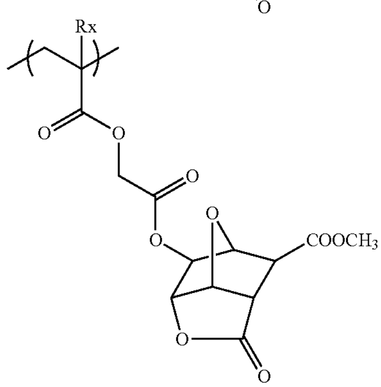

The resin (P) according to the present invention may have any of the random, block, comb and star configurations.

The resin (P) can be synthesized by, for example, the radical, cation or anion polymerization of unsaturated monomers corresponding to given structures. Further, the intended resin can be obtained by first polymerizing unsaturated monomers corresponding to the precursors of given structures and thereafter carrying out a polymer reaction.

The molecular weight of the resin (P) according to the present invention is not particularly limited. Preferably, the weight average molecular weight thereof is in the range of 1000 to 100,000. It is more preferably in the range of 1500 to 60,000, most preferably 2000 to 30,000. Herein, the weight average molecular weight of the resin refers to the molecular weight in terms of polystyrene molecular weight measured by GPC (carrier: THF or N-methyl-2-pyrrolidone (NMP)).

The molecular weight dispersity (Mw/Mn) of the resin is preferably in the range of 1.00 to 5.00, more preferably 1.03 to 3.50 and further more preferably 1.05 to 2.50.

In order to enhance the performance of the resin according to the present invention, a repeating unit derived from another polymerizable monomer may be contained in the resin in a ratio such that the dry etching resistance of the resin is not markedly deteriorated. The content of repeating unit derived from another polymerizable monomer in the resin, based on all the repeating units of the resin, is generally 50 mol % or less, preferably 30 mol % or less. Usable other polymerizable monomers include, for example, a compound having one addition-polymerizable unsaturated bond, selected from among selected from among (meth)acrylic esters, (meth) acrylamides, allyl compounds, vinyl ethers, vinyl esters, styrenes, crotonic esters and the like.

In particular, as the (meth)acrylic esters, there can be mentioned, for example, methyl(meth)acrylate, ethyl(meth)acrylate, propyl(meth)acrylate, t-butyl (meth)acrylate, amyl (meth)acrylate, cyclohexyl (meth)acrylate, ethylhexyl(meth) acrylate, octyl (meth)acrylate, t-octyl (meth)acrylate, 2-chloroethyl (meth)acrylate, 2-hydroxyethyl (meth)acrylate, glycidyl (meth)acrylate, benzyl (meth)acrylate, phenyl (meth)acrylate and the like.

As the (meth)acrylamides, there can be mentioned, for example, (meth)acrylamide, an N-alkyl(meth)acrylamide (alkyl having 1 to 10 carbon atoms, for example, methyl, ethyl, propyl, butyl, t-butyl, heptyl, octyl, cyclohexyl, benzyl, hydroxyethyl or the like), an N-aryl(meth)acrylamide (as aryl, for example, phenyl, tolyl, nitrophenyl, naphthyl, cyanophenyl, hydroxyphenyl, carboxyphenyl or the like), an N,N-dialkyl(meth)acrylamide (alkyl R having 1 to 10 carbon atoms, for example, methyl, ethyl, butyl, isobutyl, ethylhexyl, cyclohexyl or the like), an N,N-diaryl(meth)acrylamide (as aryl, for example, phenyl or the like), N-methyl-N-phenylacrylamide, N-hydroxyethyl-N-methylacrylamide, N-2-acetoamidoethyl-N-acetylacrylamide and the like.

As the allyl compounds, there can be mentioned, for example, allyl esters (for example, allyl acetate, allyl caproate, allyl caprylate, allyl laurate, allyl palmitate, allyl stearate, allyl benzoate, allyl acetoacetate, allyl lactate and the like), allyloxyethanol and the like.

As the vinyl ethers, there can be mentioned, for example, an alkyl vinyl ether (for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether or the like) and a vinyl aryl ether (for example, vinyl phenyl ether, vinyl tolyl ether, vinyl chlorophenyl ether, vinyl 2,4-dichlorophenyl ether, vinyl naphthyl ether, vinyl anthranyl ether or the like).

As the vinyl esters, there can be mentioned, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, vinyl naphthoate and the like.

As the crotonic esters, there can be mentioned, for example, an alkyl crotonate (for example, butyl crotonate, hexyl crotonate, glycerol monocrotonate or the like) and the like.

The other polymerizable monomers also may include dialkyl itaconates. As such, there can be mentioned, for example, dimethyl itaconate, diethyl itaconate, dibutyl itaconate and the like.

The other polymerizable monomers also may include dialkyl maleates or fumarates. As such, there can be mentioned, for example, dimethyl maleate, dibutyl fumarate and the like.

Furthermore, the other polymerizable monomers include maleic anhydride, maleimide, acrylonitrile, methacrylonitrile, maleonitrile and the like. Still further, generally, any addition-polymerizable unsaturated compounds that can be copolymerized with the monomers corresponding to the repeating units according to the present invention can be used without particular limitation.

In the present invention, a single type of resin (P) can be used alone, or two or more types of resins (P) can be used in combination. The content of resin (P) in the actinic-ray- or radiation-sensitive resin composition of the present invention based on the total solids thereof is preferably in the range of 30 to 100 mass %, more preferably 50 to 100 mass % and most preferably 70 to 100 mass %.

Preferred particular examples of resins (P) are, for example, a resin comprising one or more repeating units (A) selected from among particular examples of those of general formulae (I) to (III) above/one or more repeating units (B1) selected from among particular examples of those of general formula (IV) above/one or more repeating units (B2) selected from among particular examples of those of general formulae (V) to (VI) above; a resin comprising one or more repeating units (A) selected from among particular examples of those of general formulae (I) to (III) above/one or more repeating units (B1) selected from among particular examples of those of general formula (IV) above/one or more repeating units (C) selected from among particular examples of those of general formula (V') above; a resin comprising one or more repeating units (A) selected from among particular examples of those of general formulae (I) to (III) above/one or more repeating units (B1) selected from among particular examples of those of general formula (IV) above/one or more repeating units (B2) selected from among particular examples of those of general formulae (V) to (VI) above/one or more repeating units (D) selected from among particular examples of those of general formula (AII) above; and a resin comprising one or more repeating units (A) selected from among particular examples of those of general formulae (I) to (III) above/one or more repeating units (B1) selected from among particular examples of those of general formula (IV) above/one or more repeating units (C) selected from among particular examples of those of general formula (V') above/one or more repeating units (D) selected from among particular examples of those of general formula (AII) above.

More preferred particular examples of resins (P) will be shown below, which however in no way limit the scope of the present invention.

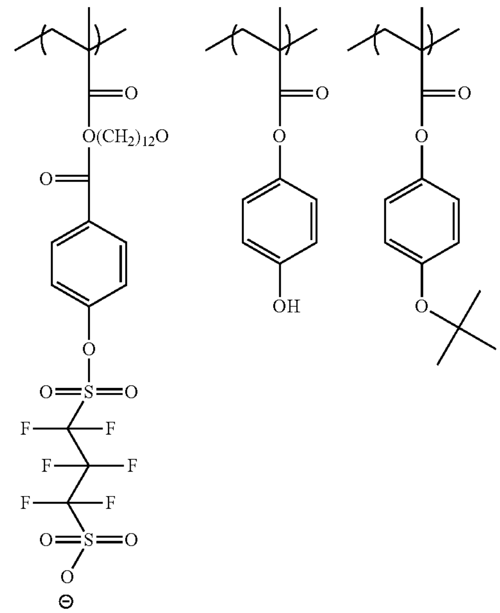

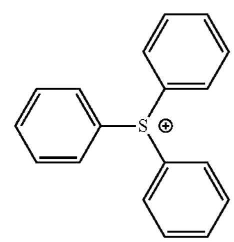

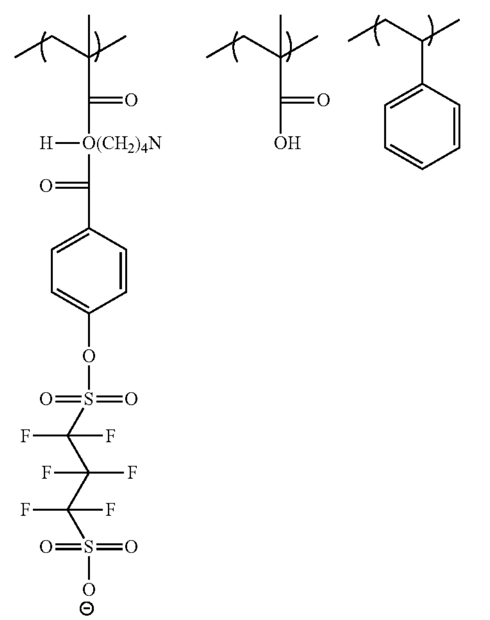

-continued
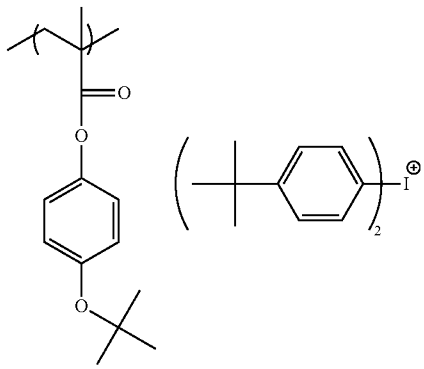
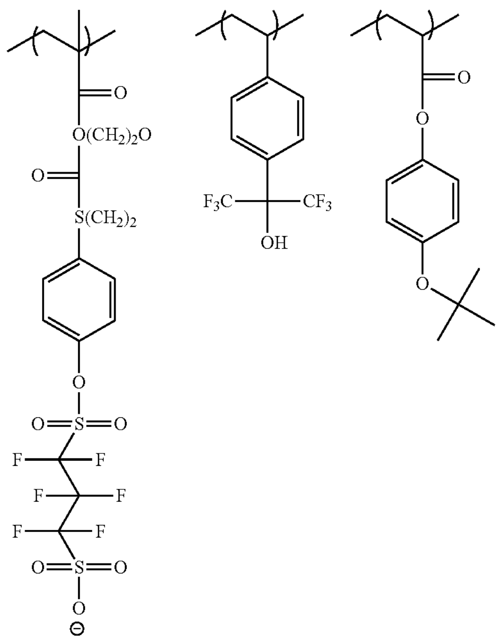
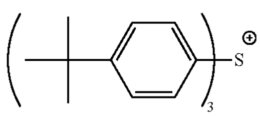
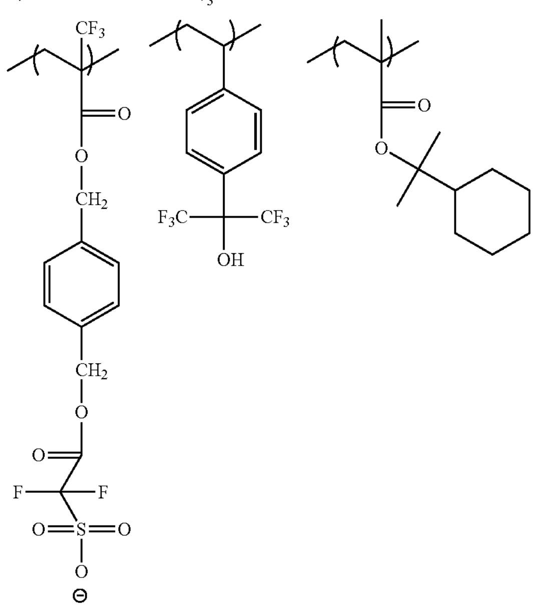
-continued
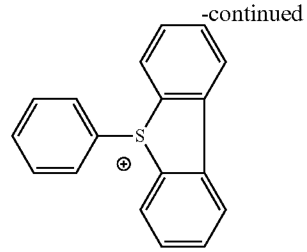
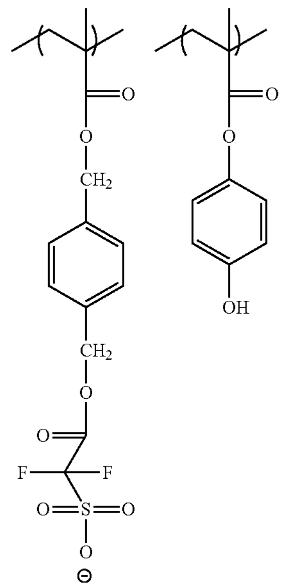
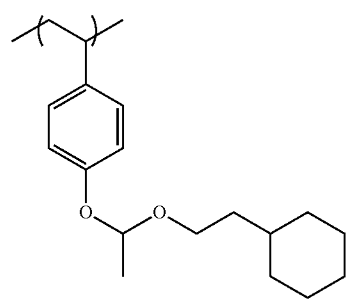
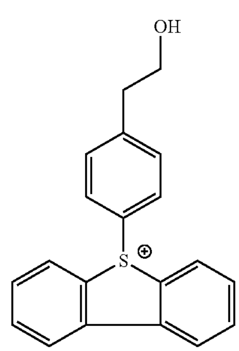

-continued
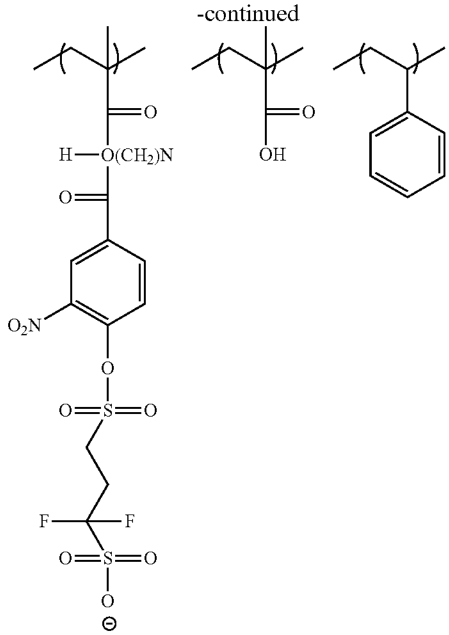
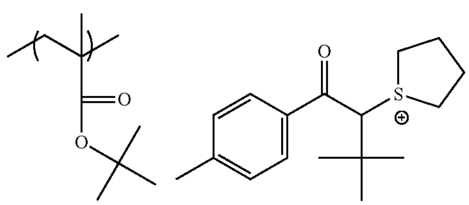
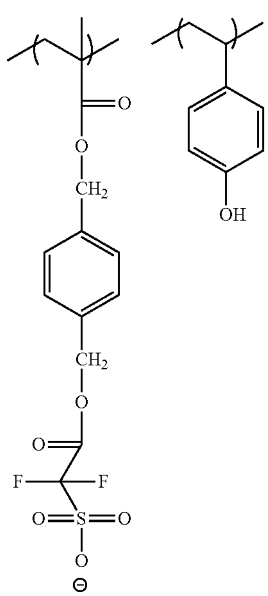
-continued
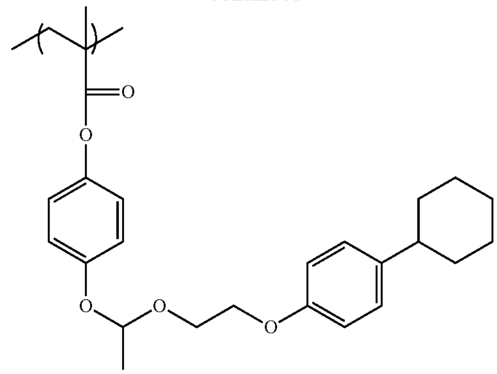
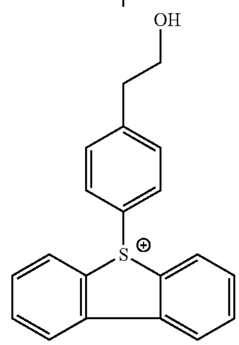
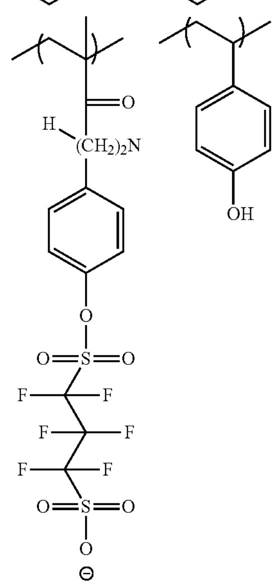
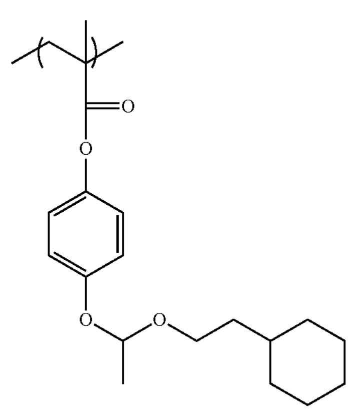

-continued
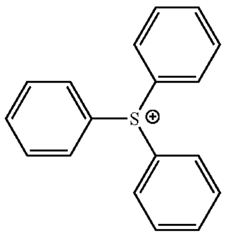
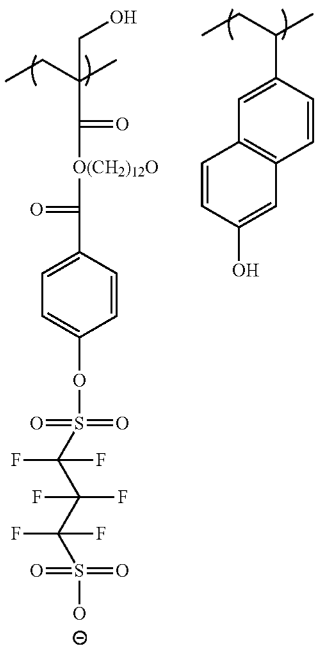
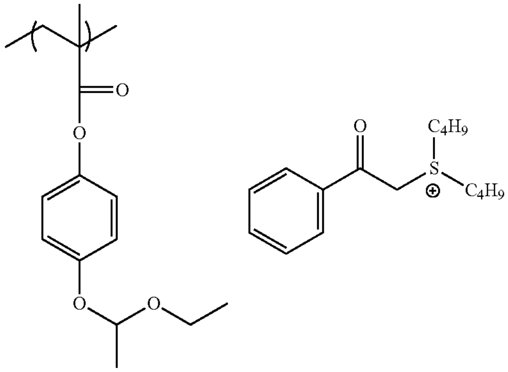
-continued
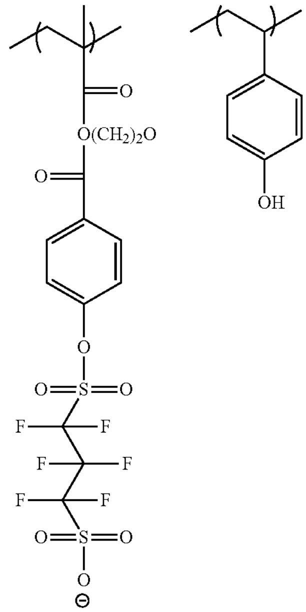
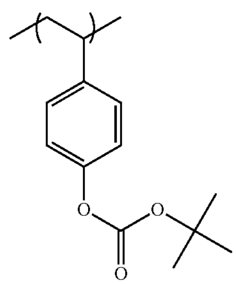
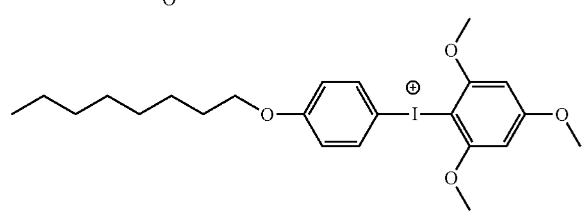
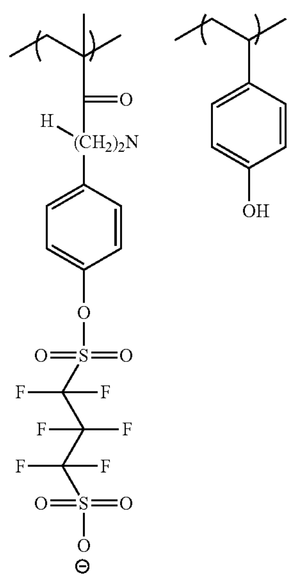

-continued
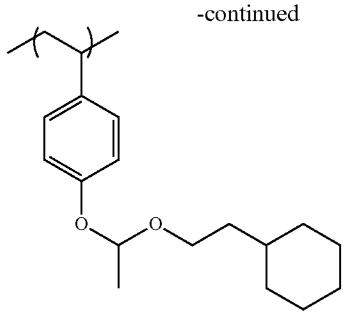
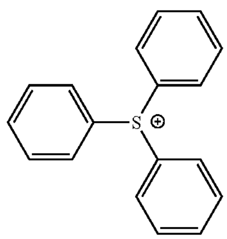
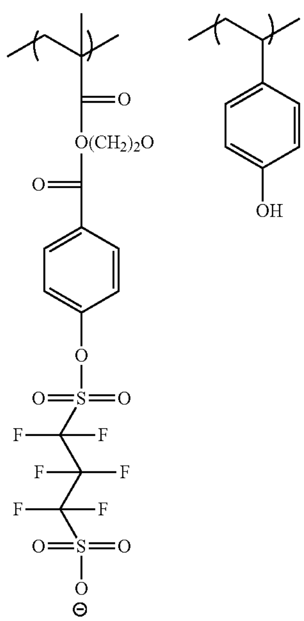
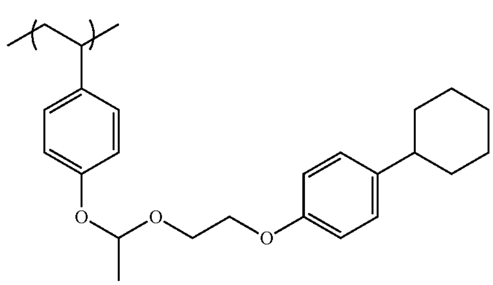
-continued
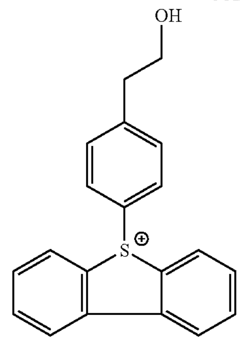
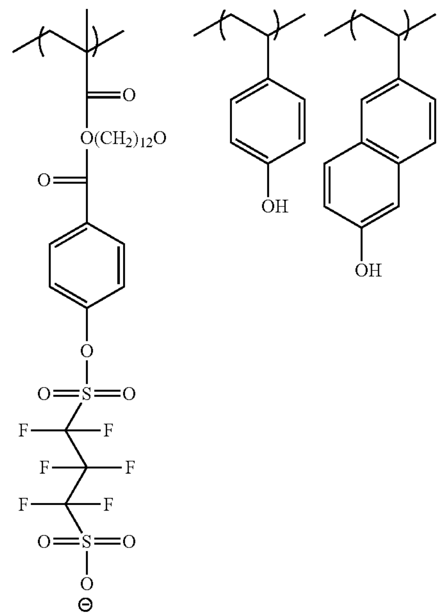
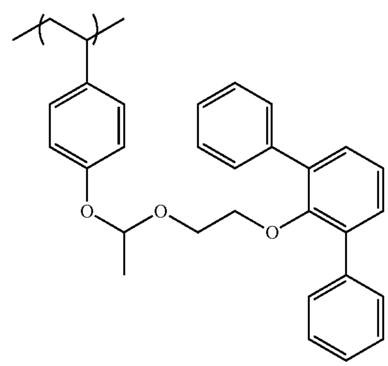
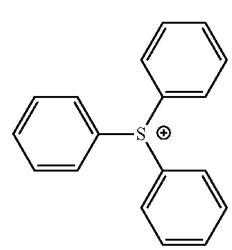

-continued
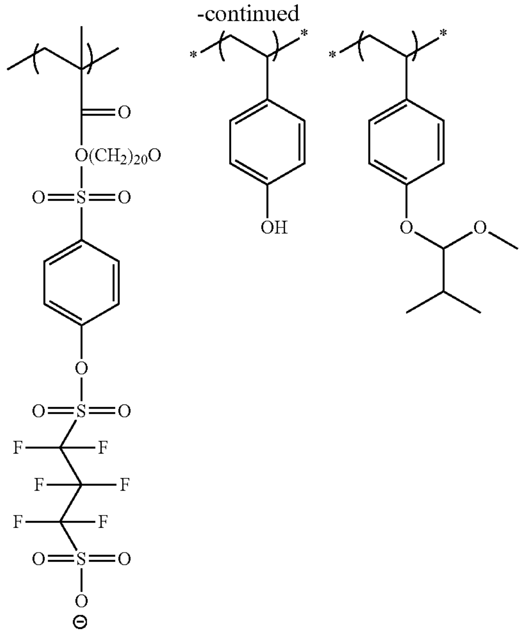
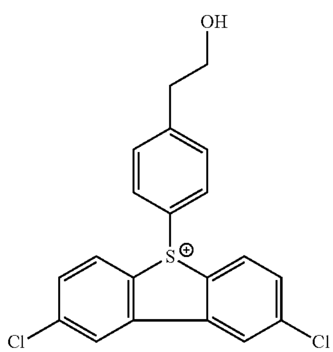
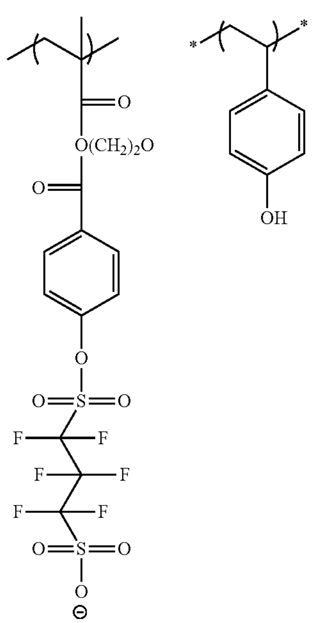
-continued
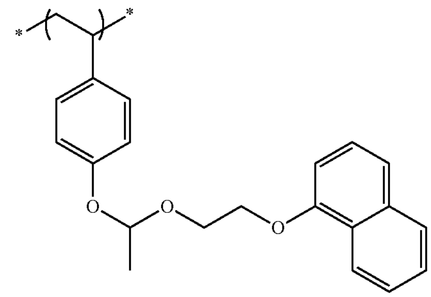
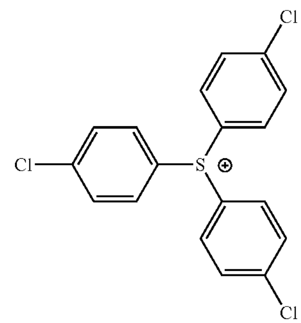
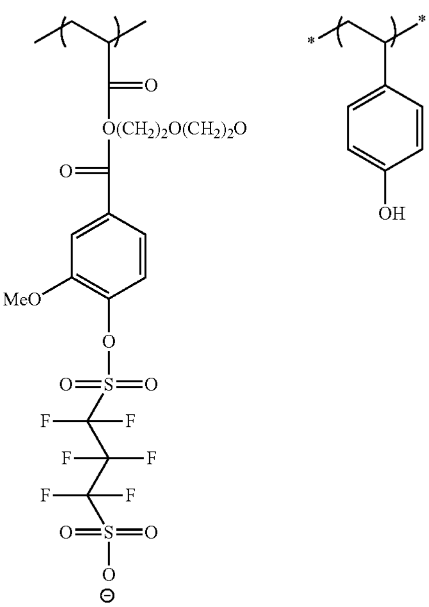
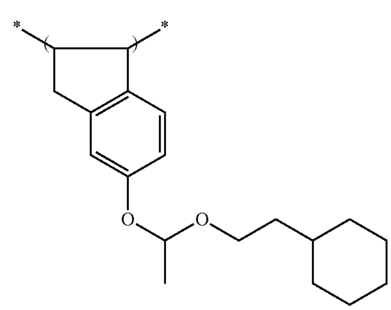

-continued
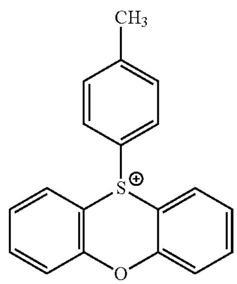
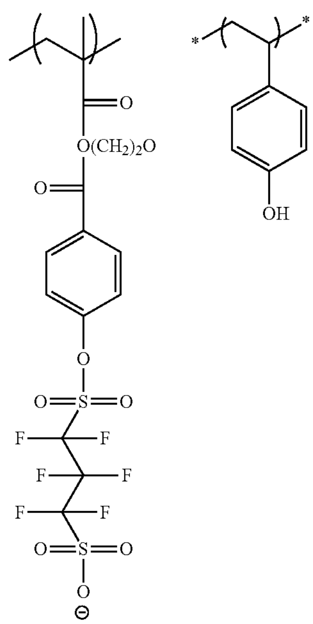
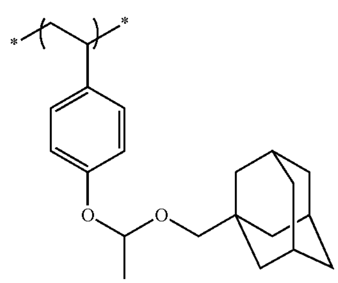
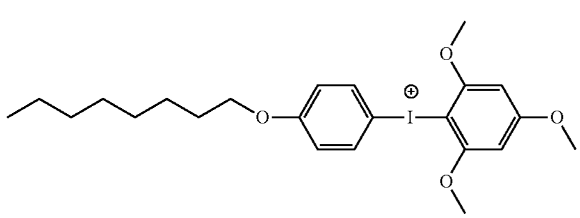
-continued
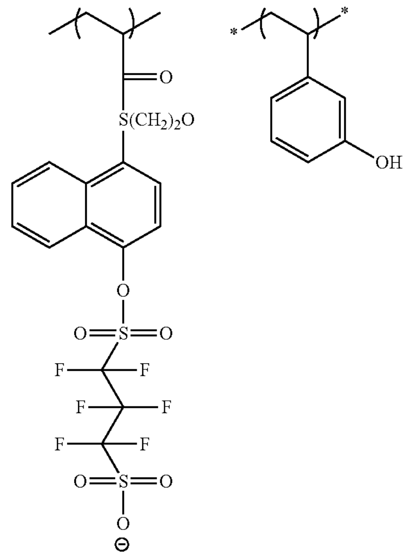
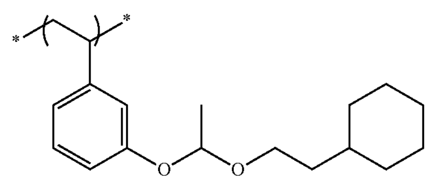
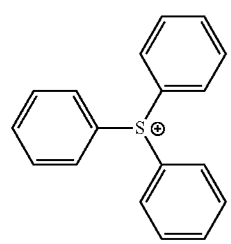
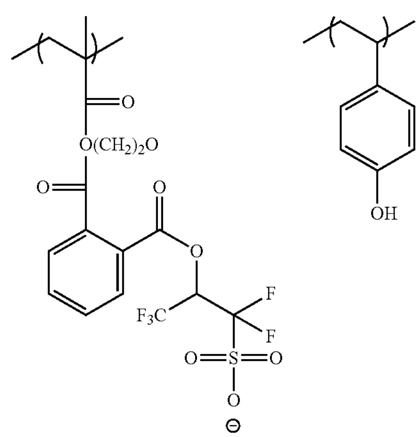
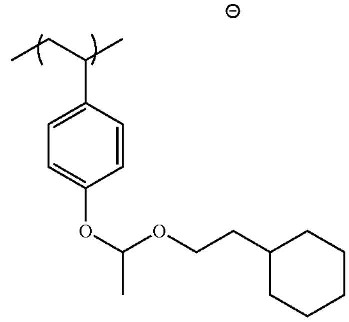

-continued
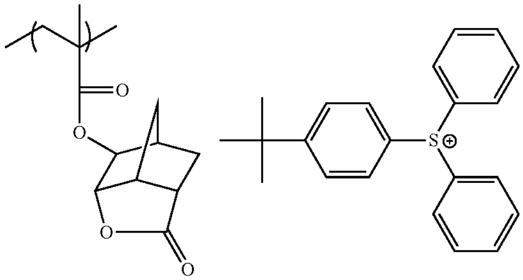
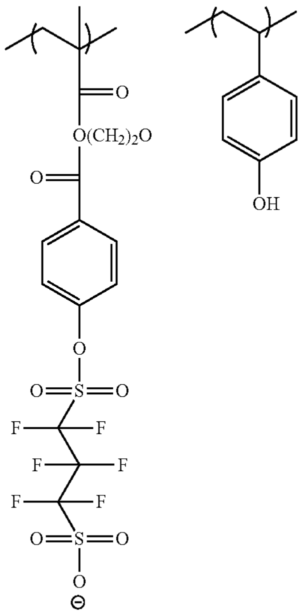
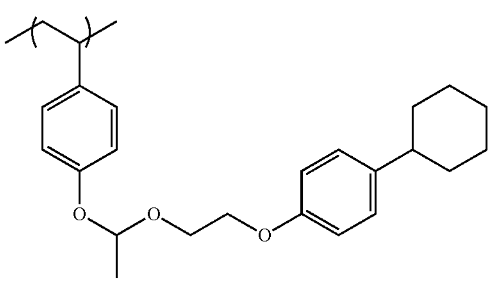
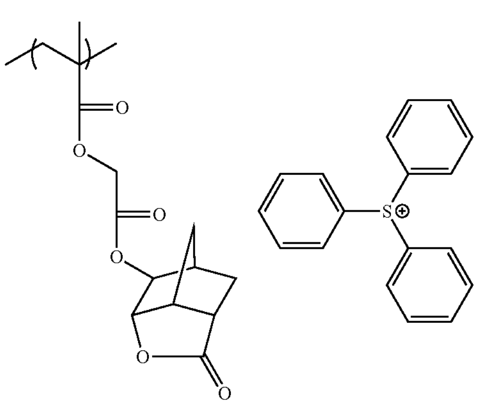
-continued
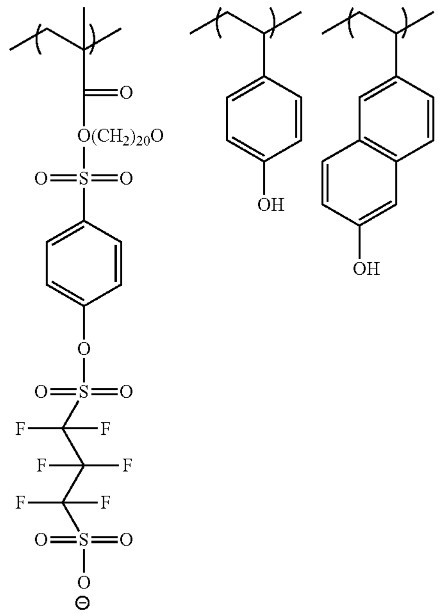
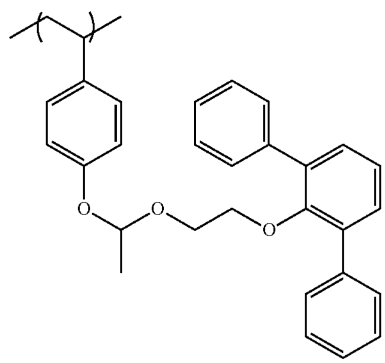
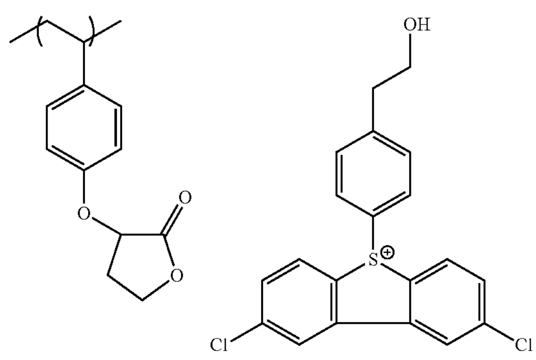

-continued
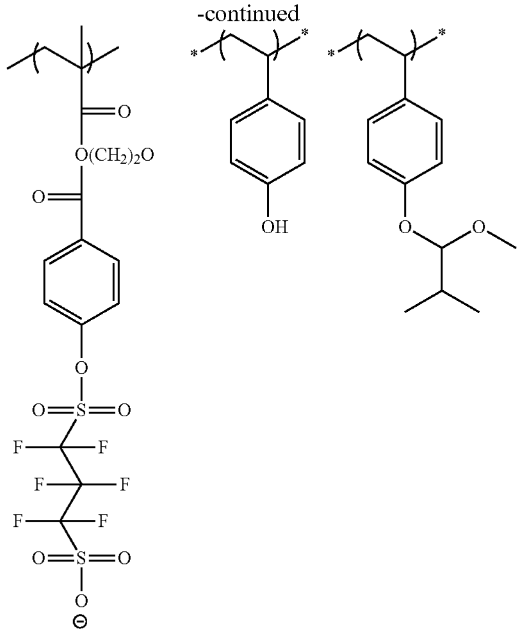
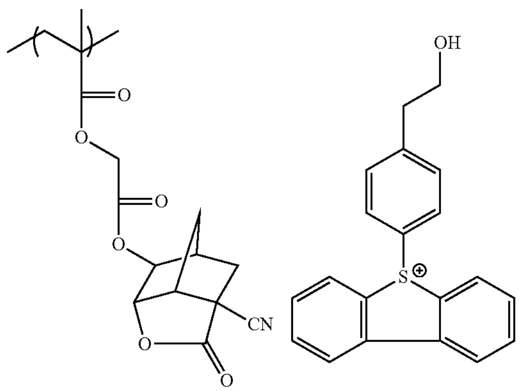
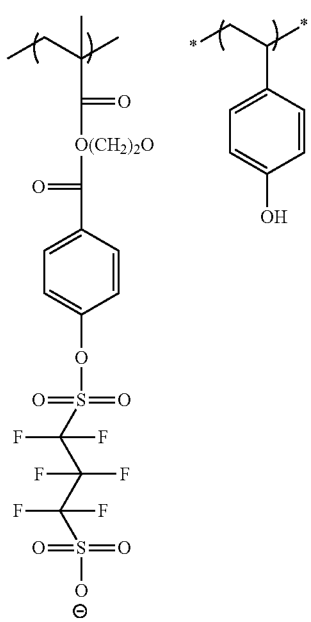
-continued
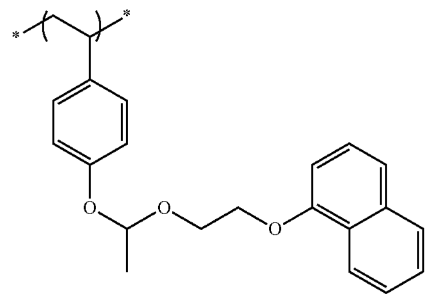
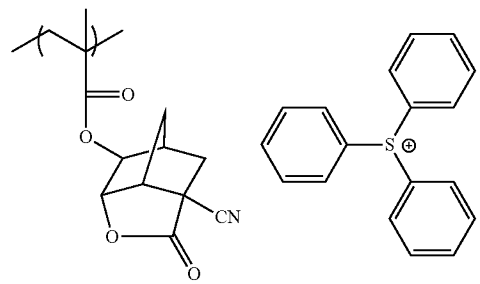
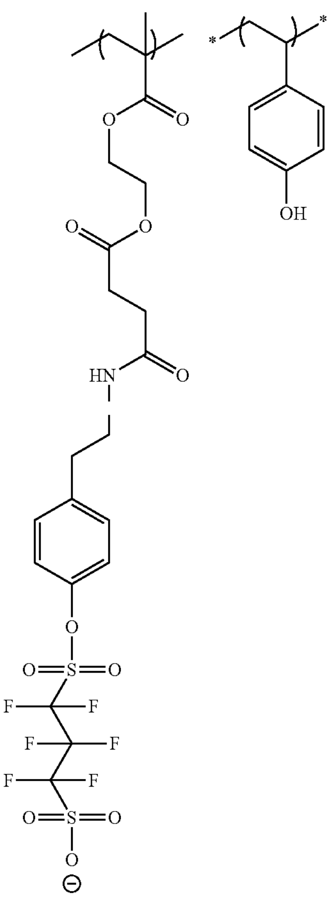

-continued
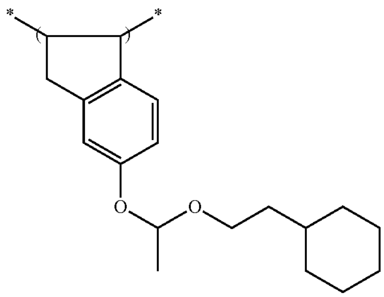
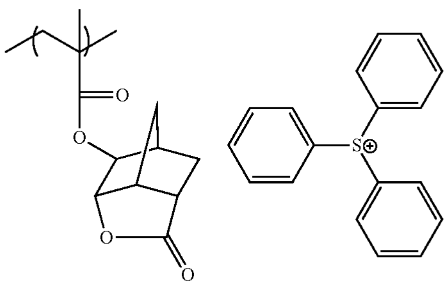
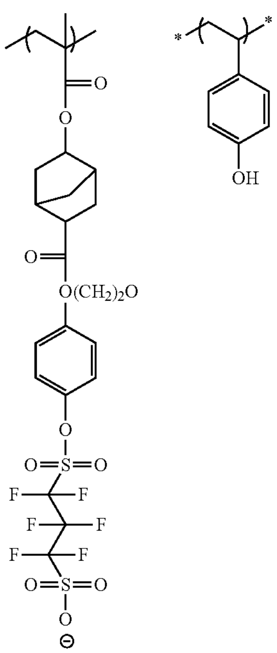
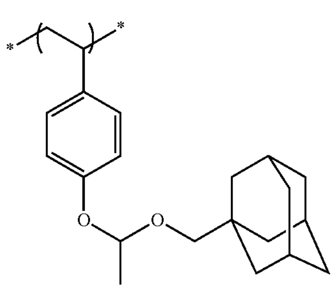
-continued
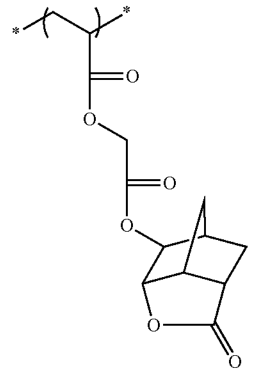
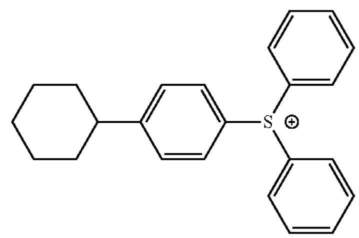
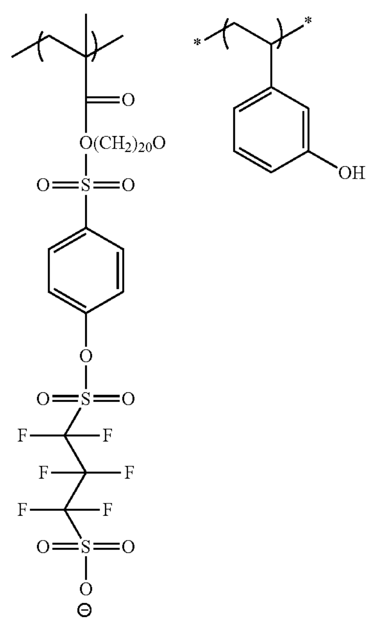
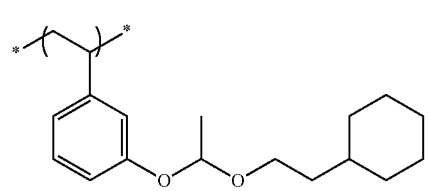

-continued
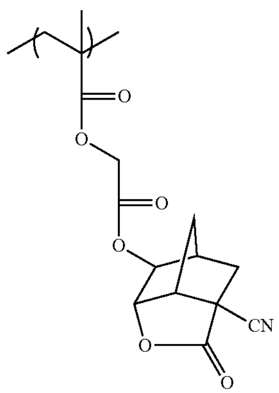
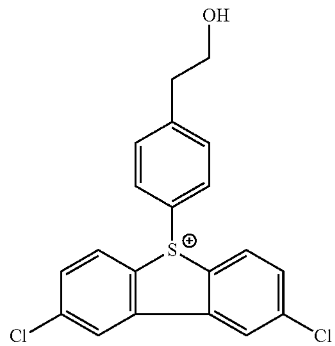
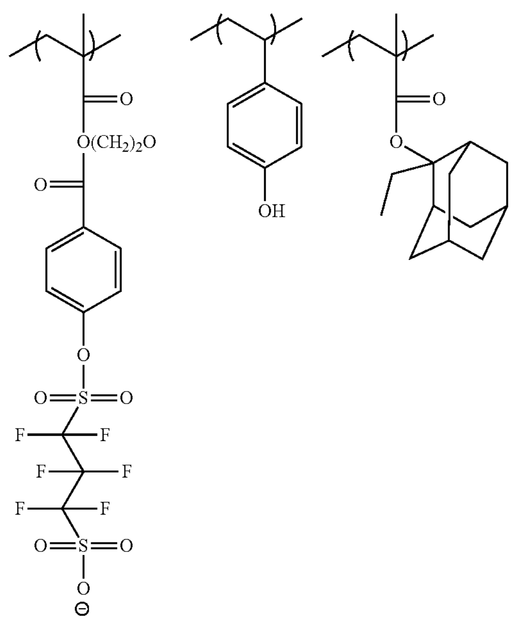
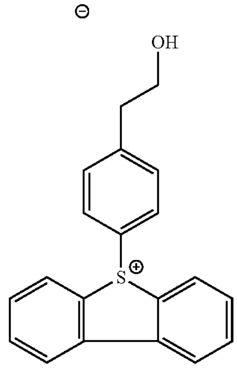
-continued
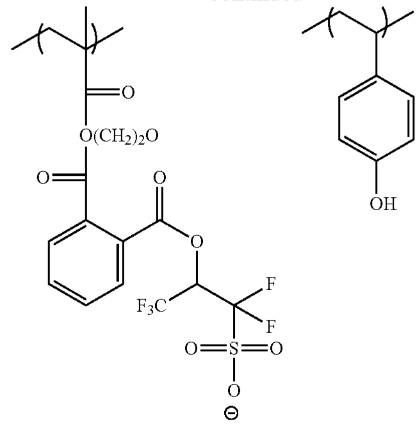
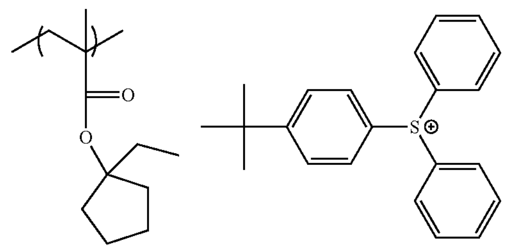
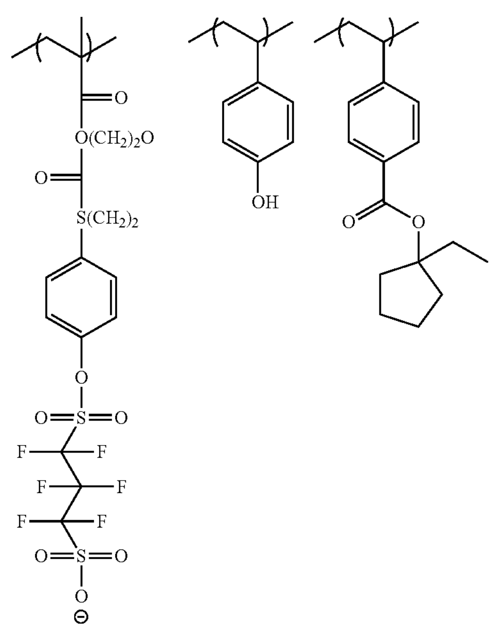
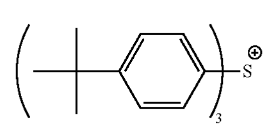

-continued
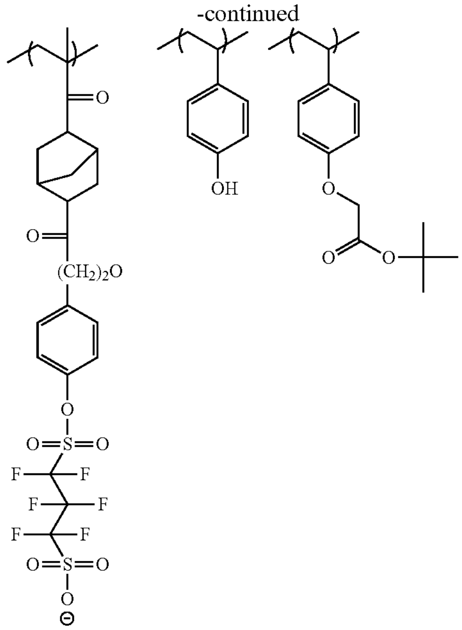
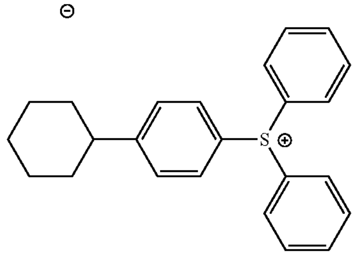
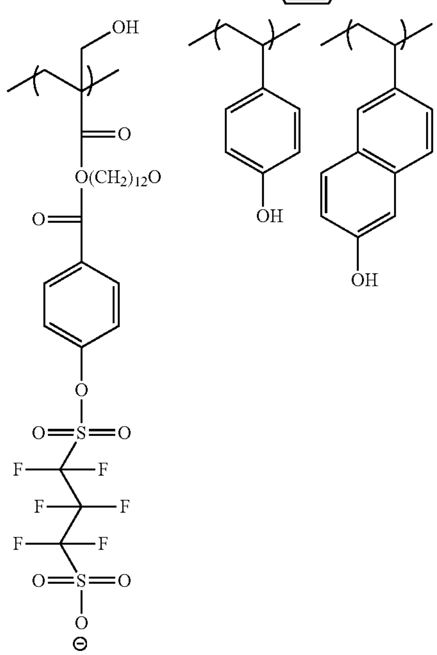
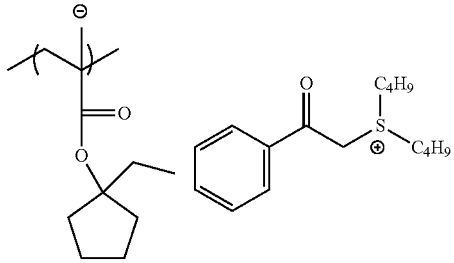
-continued
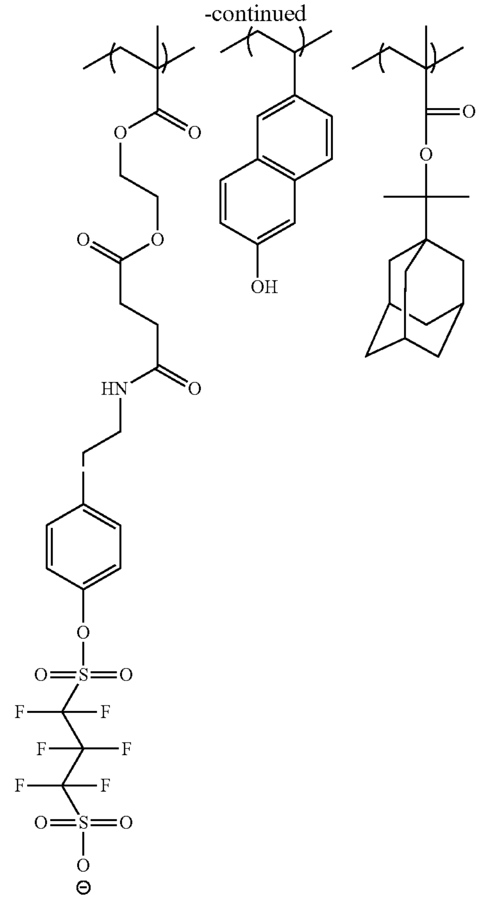
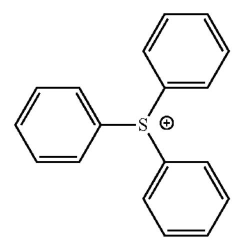
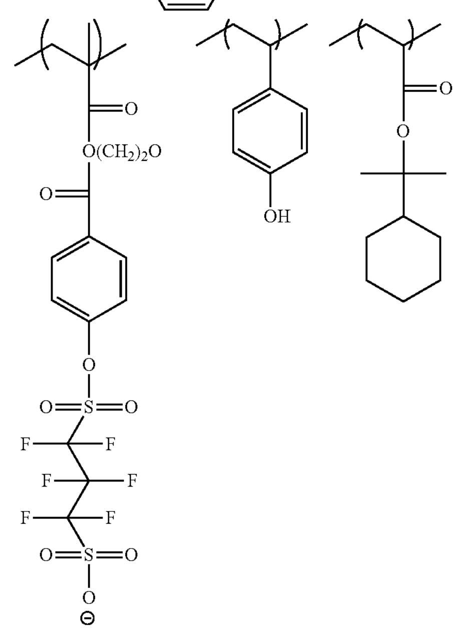

-continued
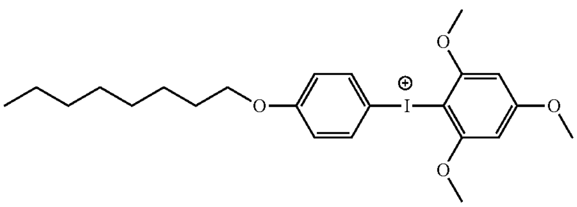
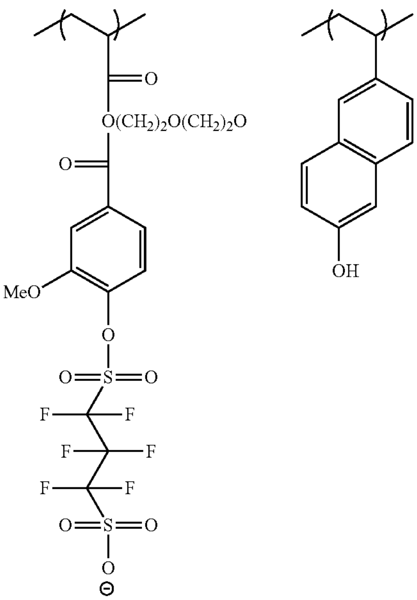
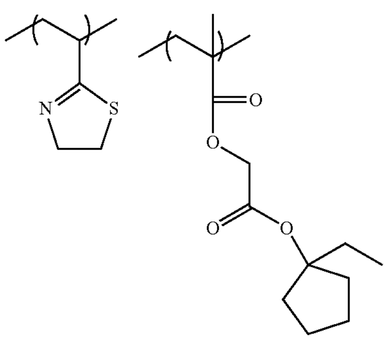
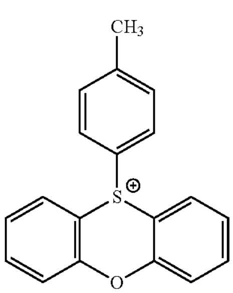
-continued
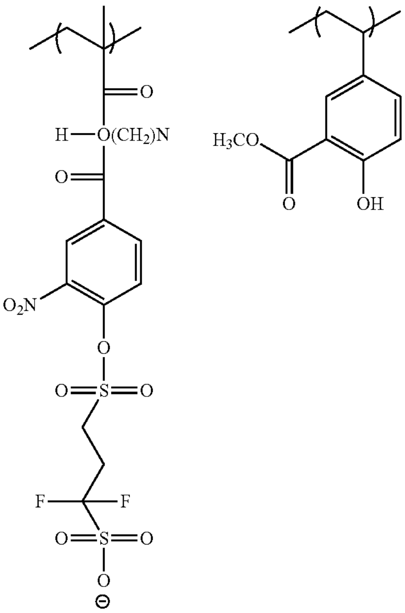
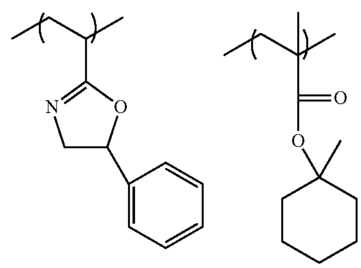
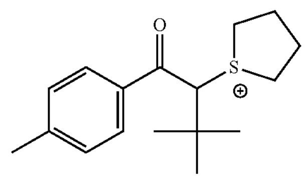
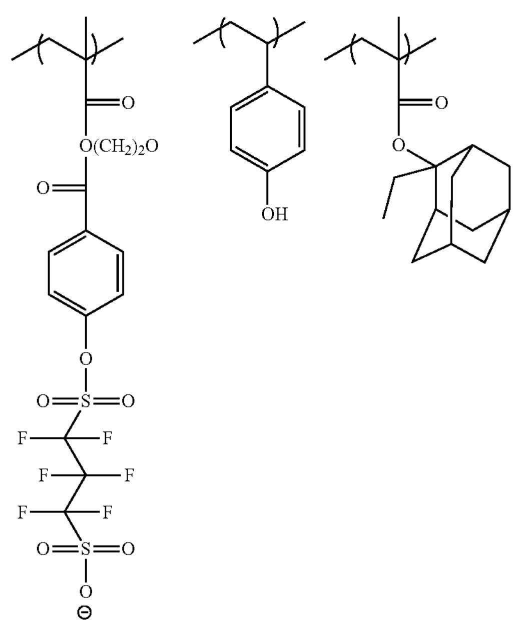

-continued
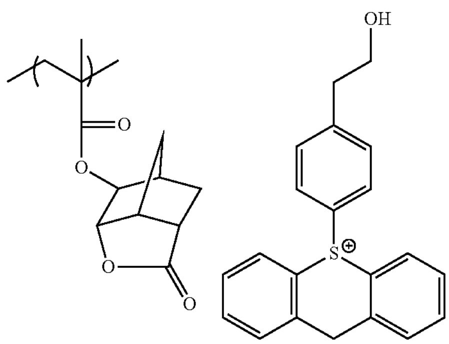
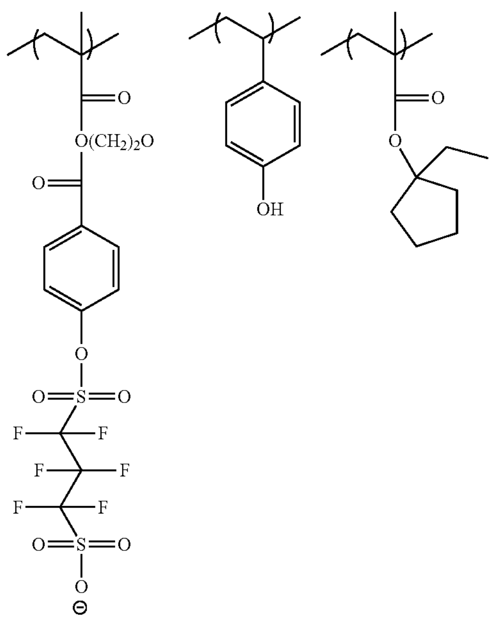
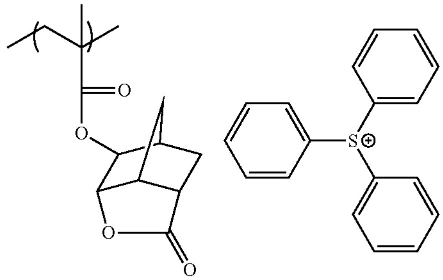
-continued
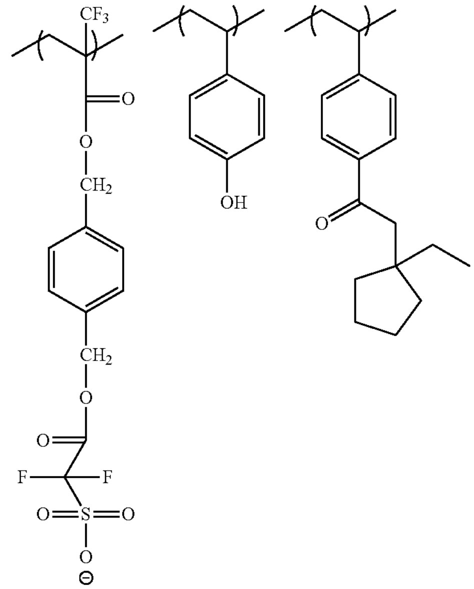
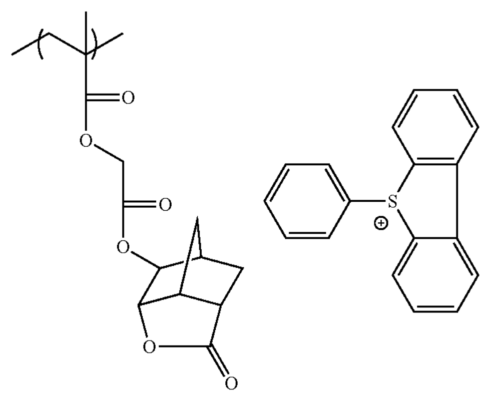
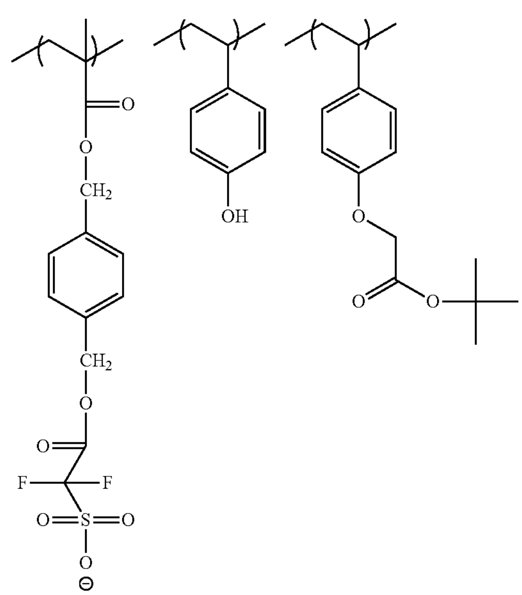

-continued
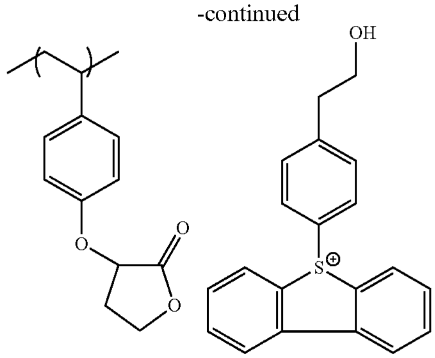
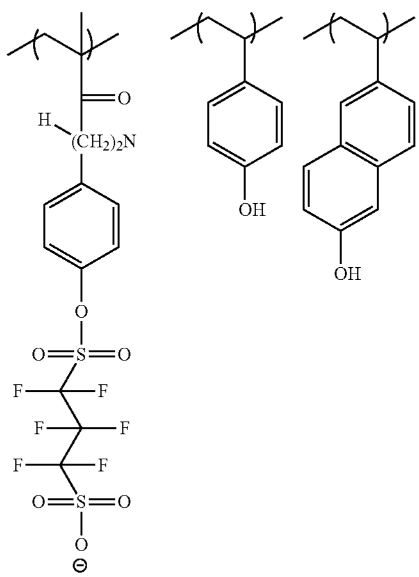
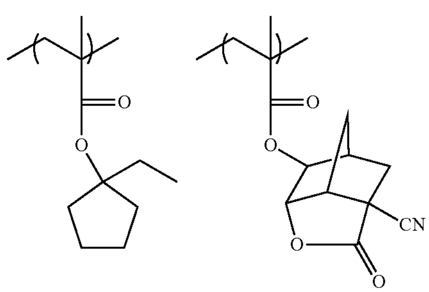
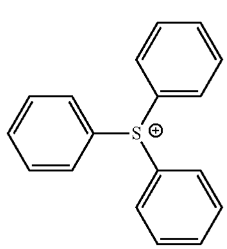
-continued
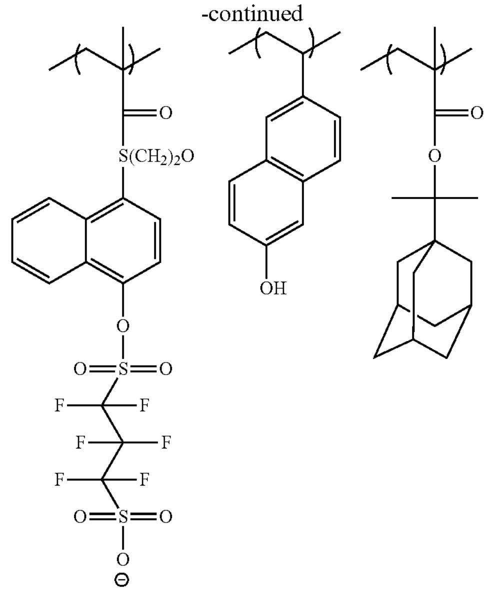
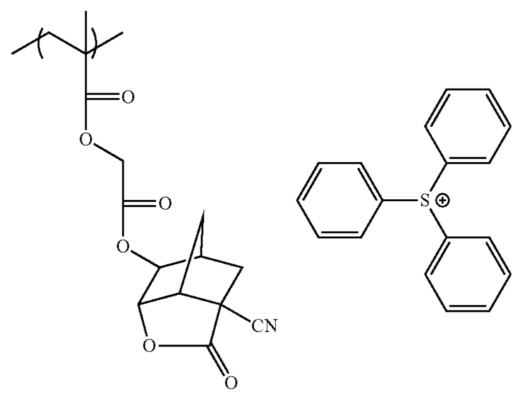
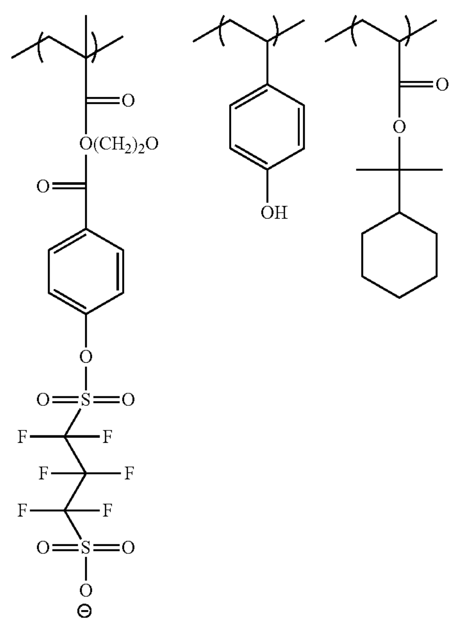

-continued
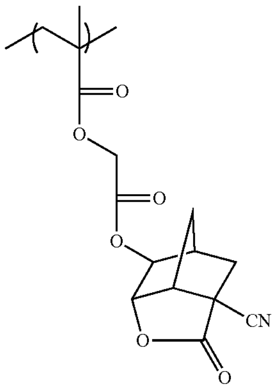
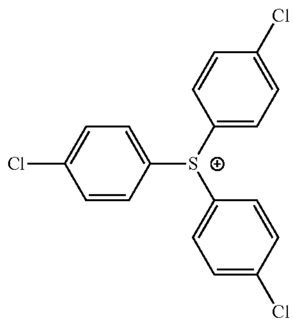
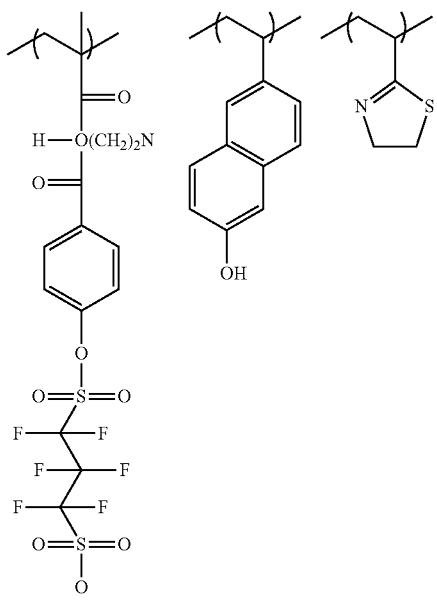
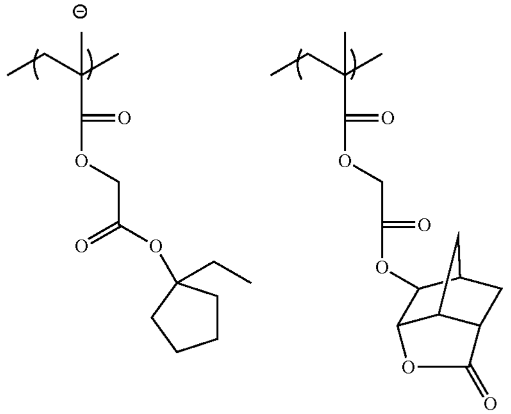
-continued
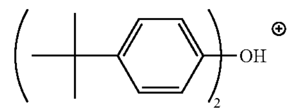
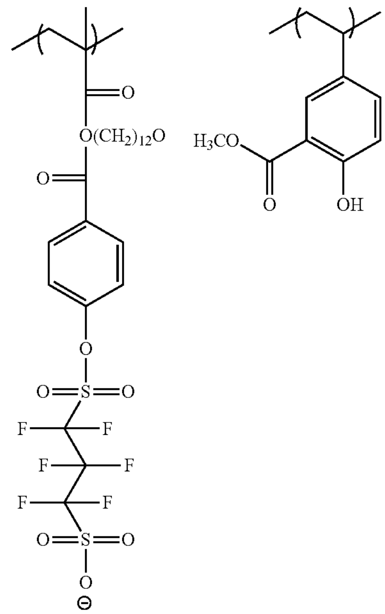
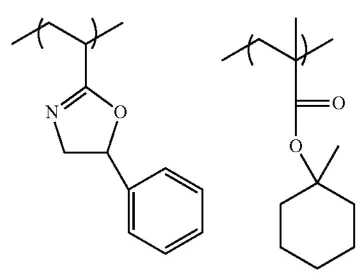
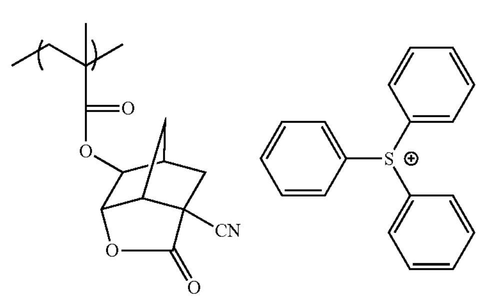

-continued
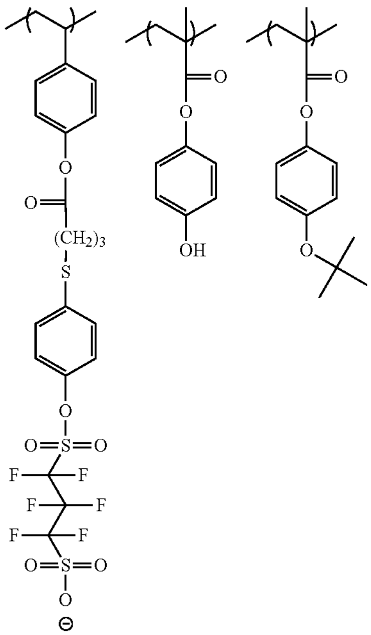
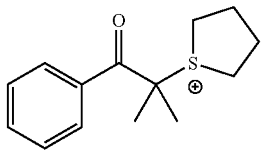
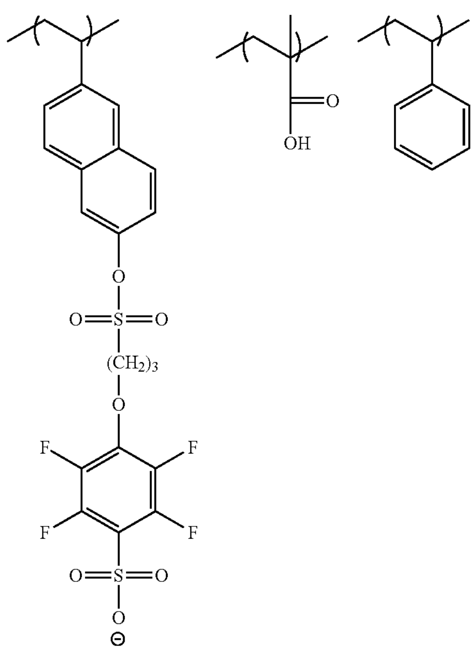
-continued
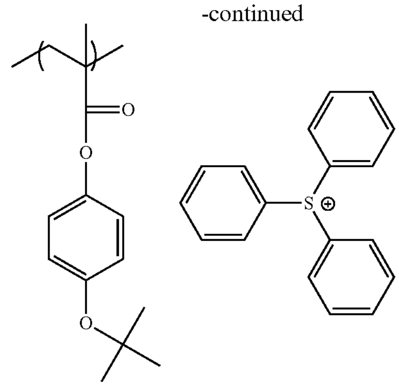
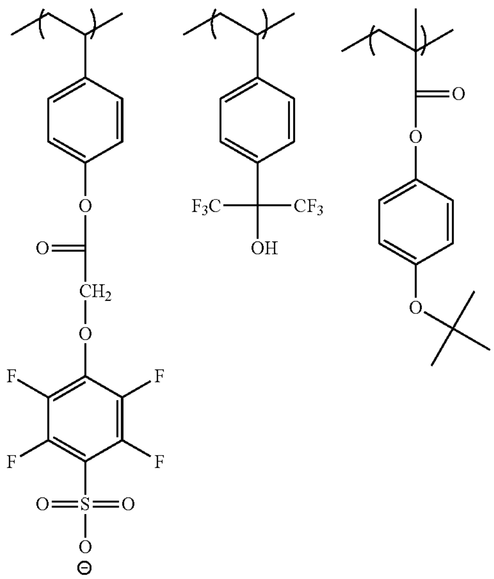
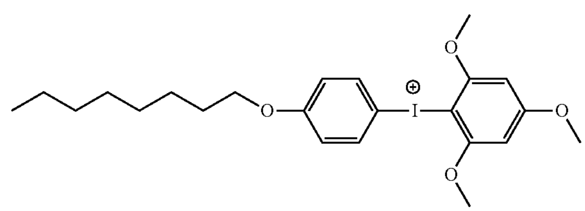
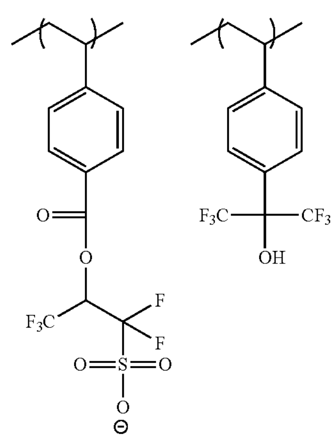

-continued
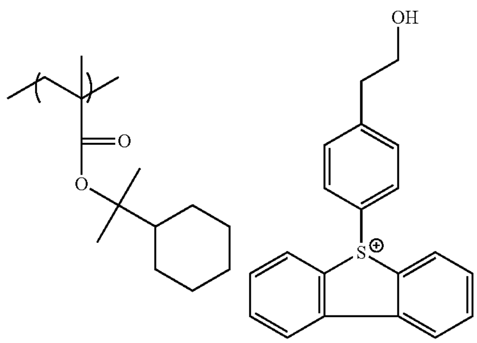
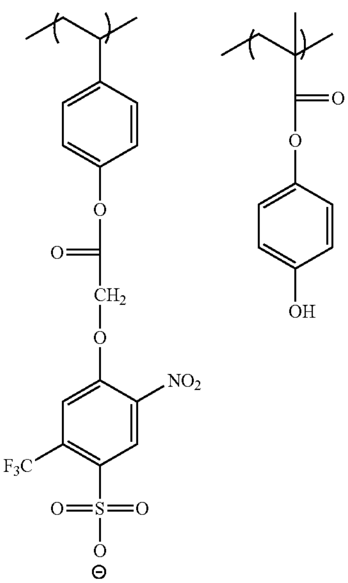
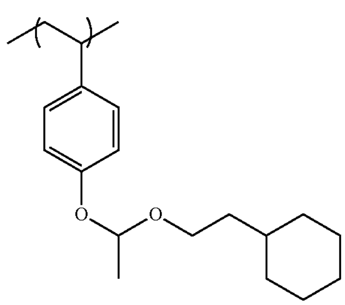
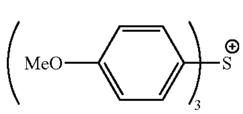
-continued
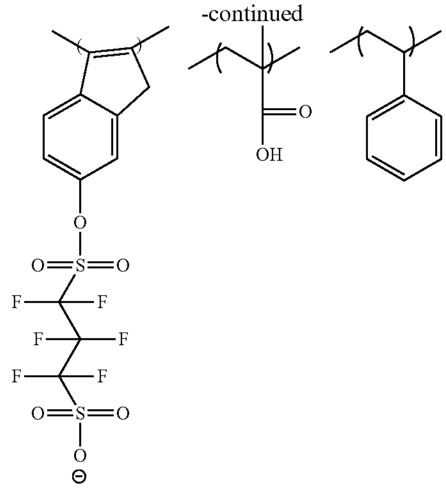
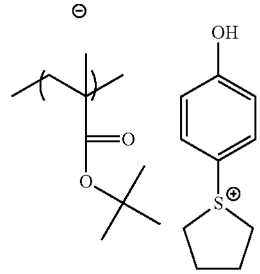
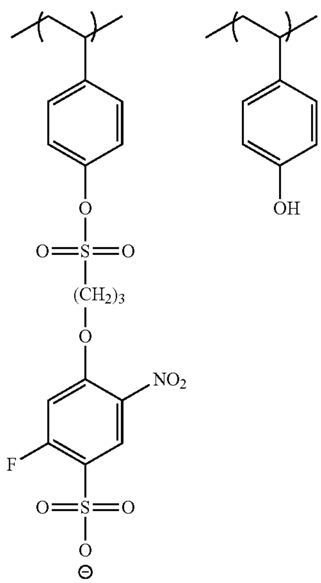
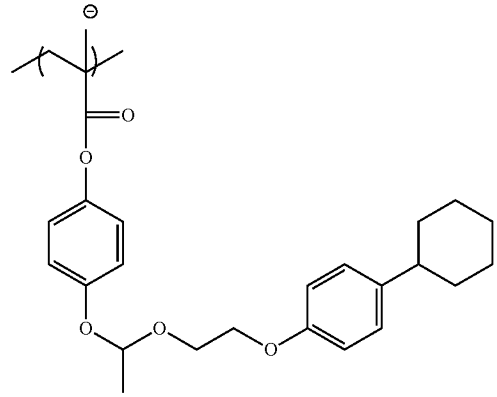

-continued
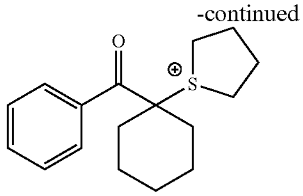
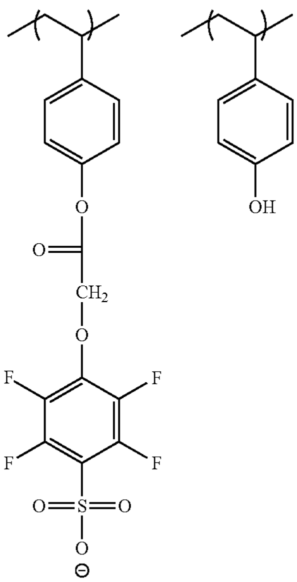
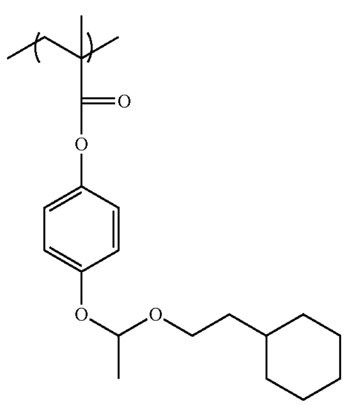
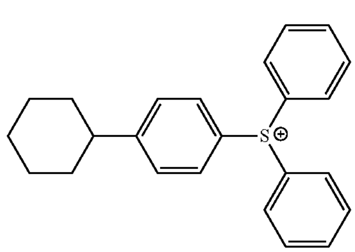
-continued
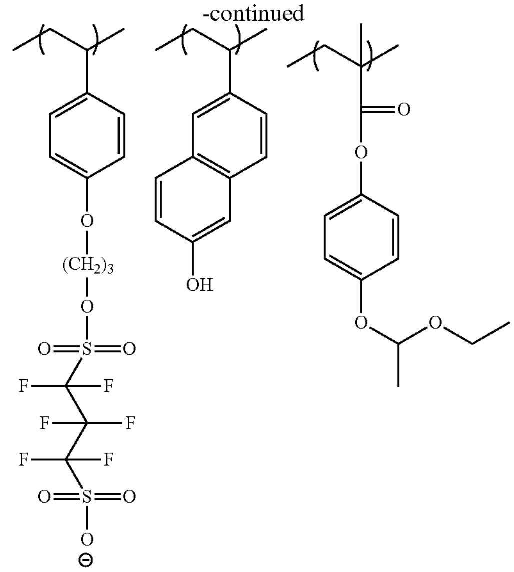
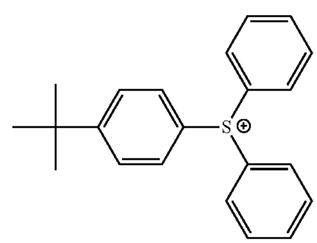
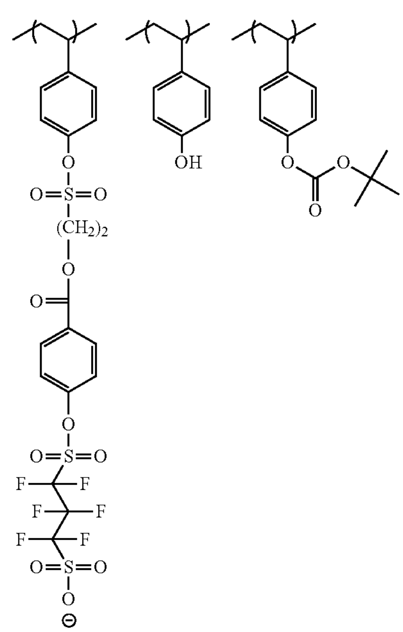

-continued
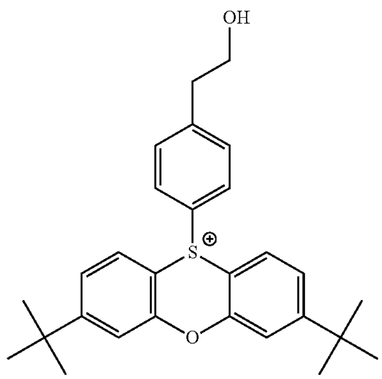
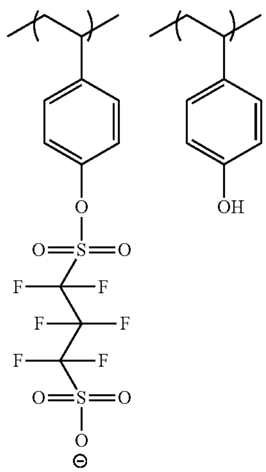
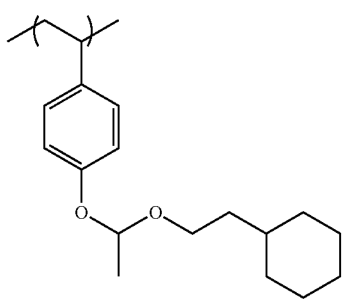
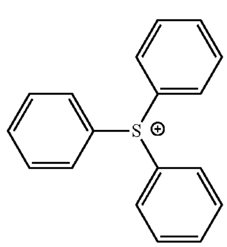
-continued
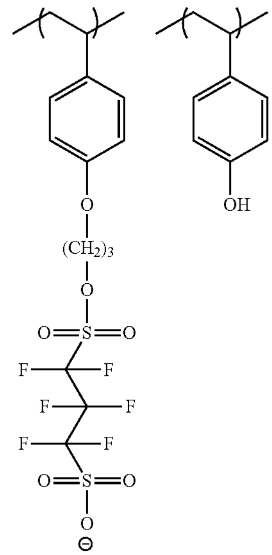
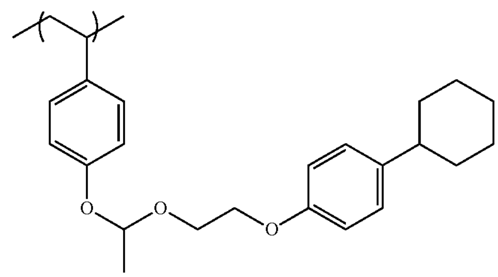
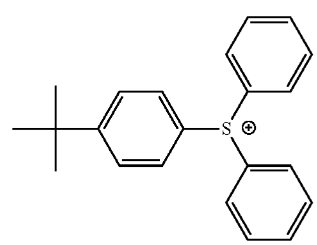
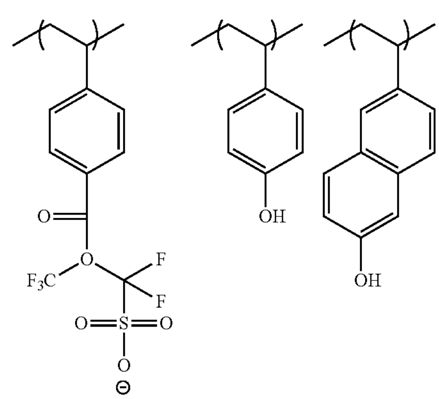

-continued
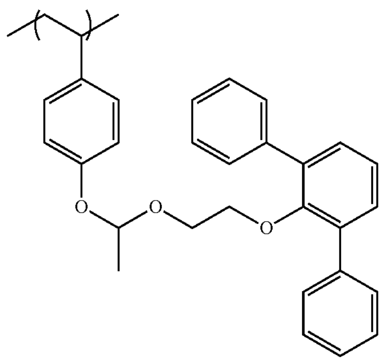
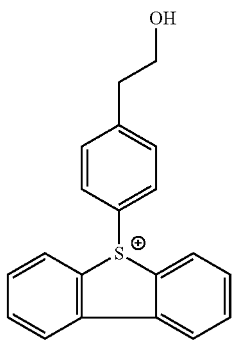
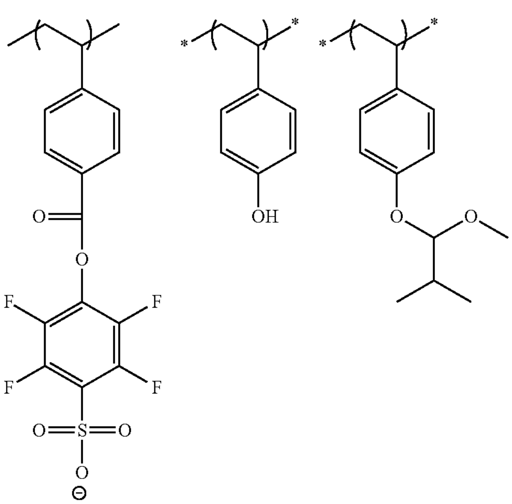
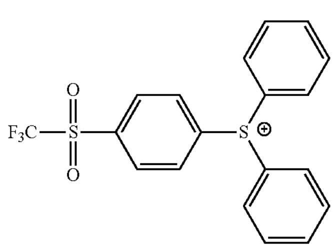
-continued
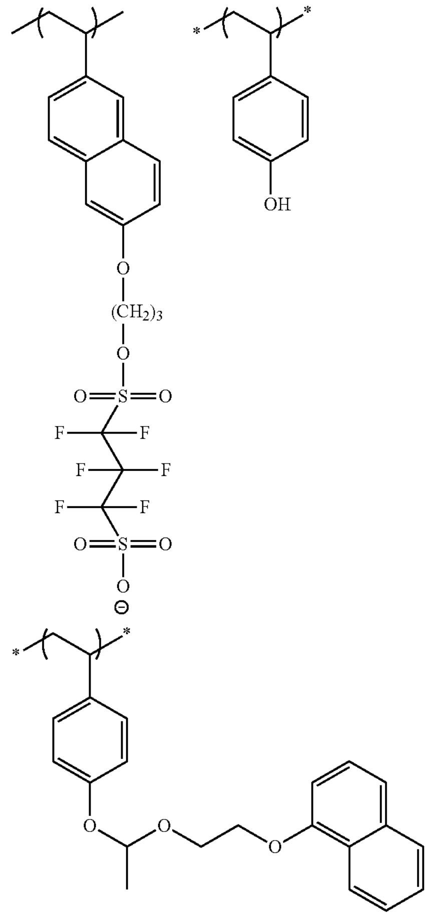
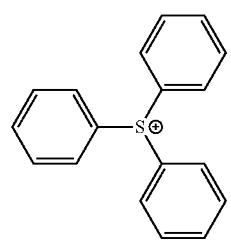
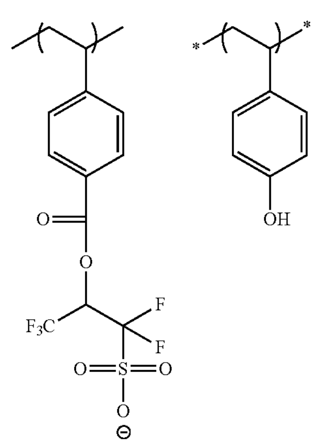

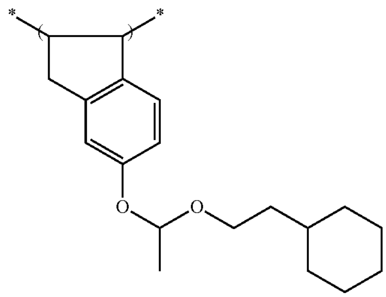
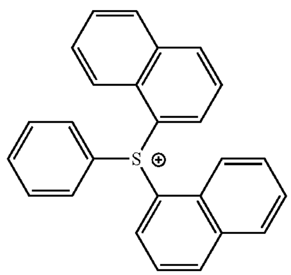
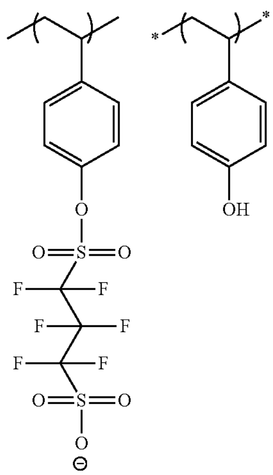
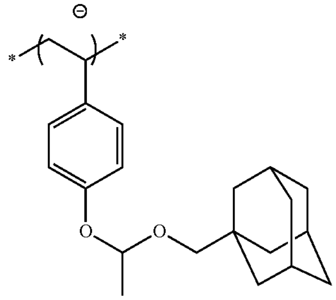
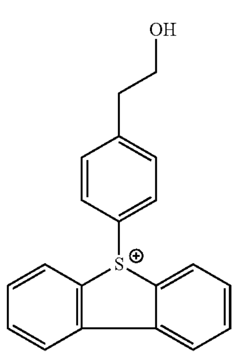
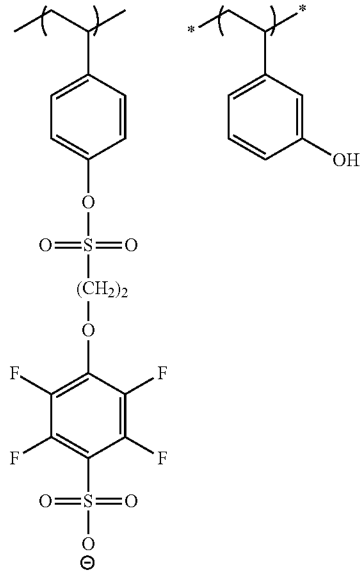
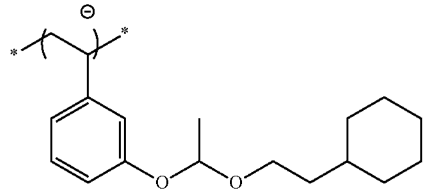
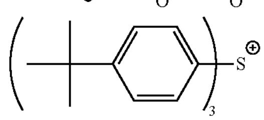
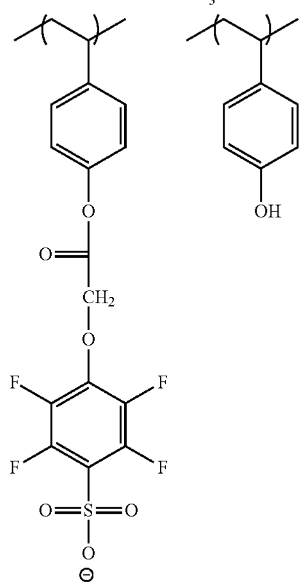
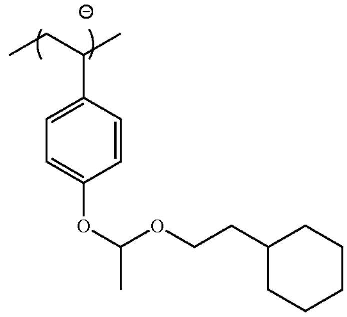

-continued
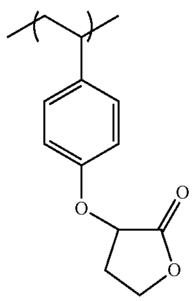
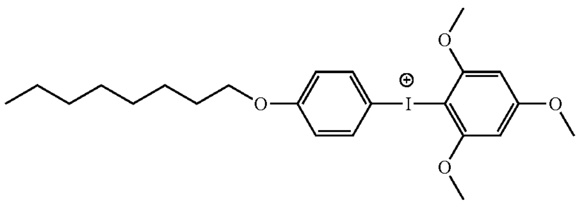
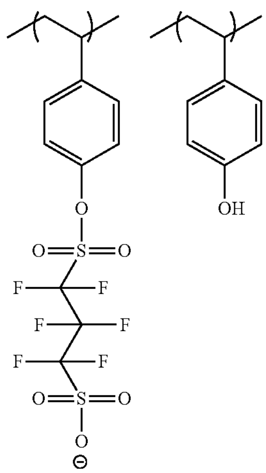
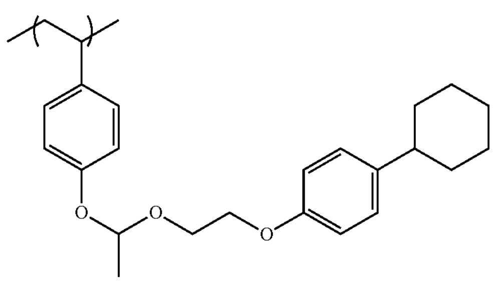
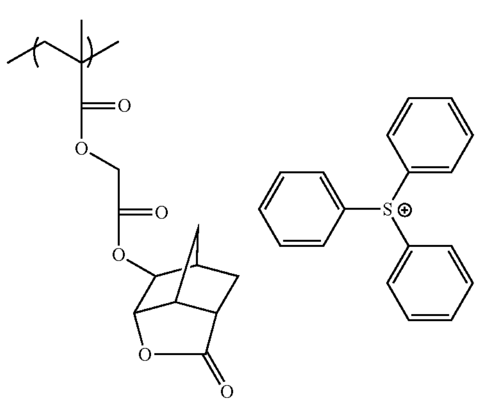
-continued
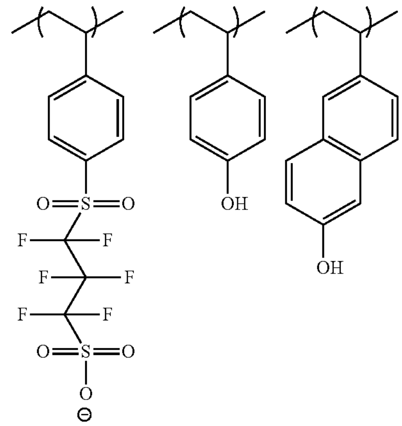
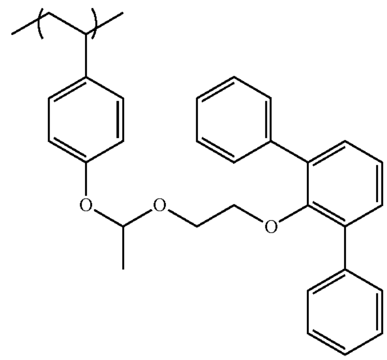
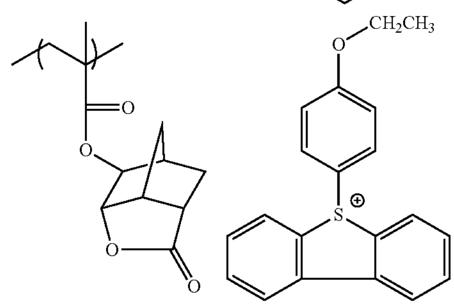
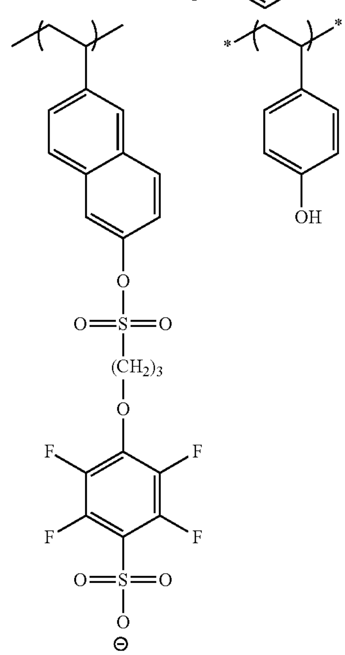

-continued
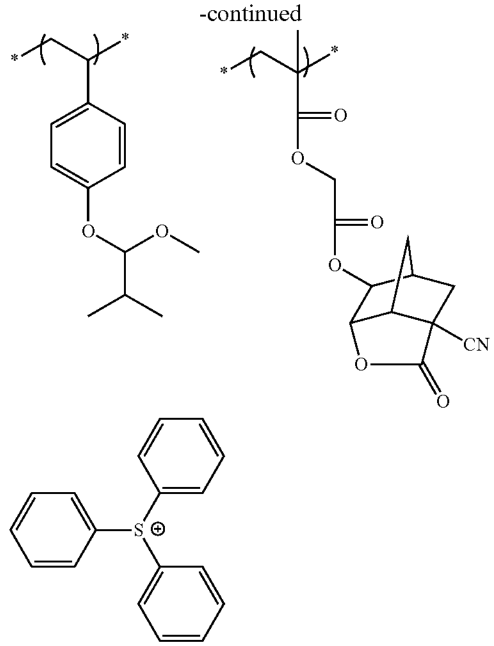
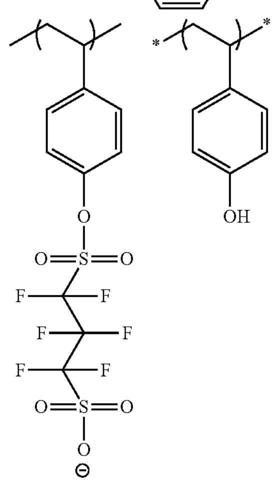
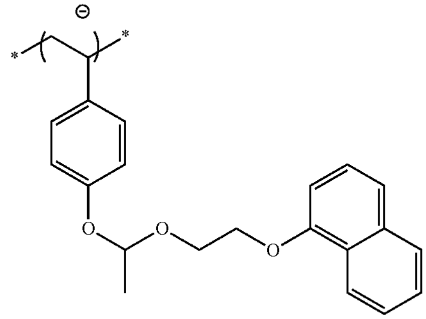
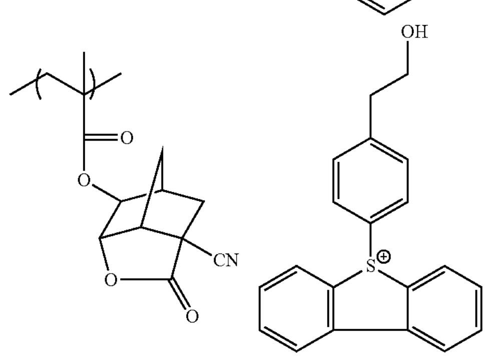
-continued
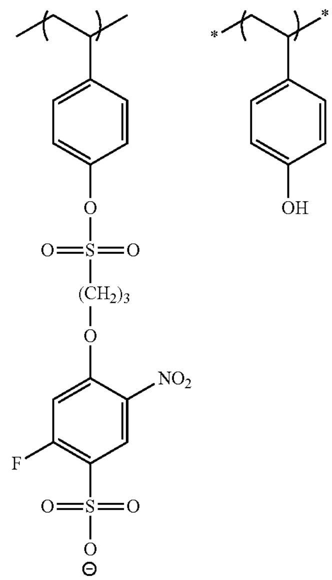
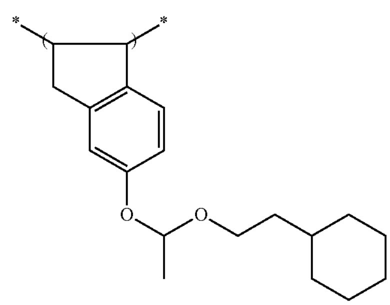
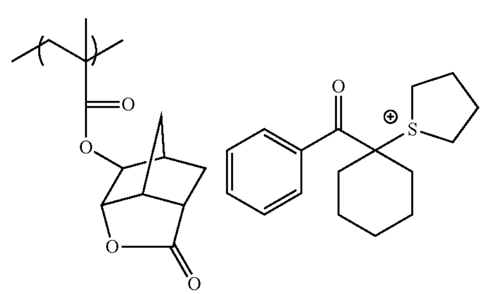

-continued
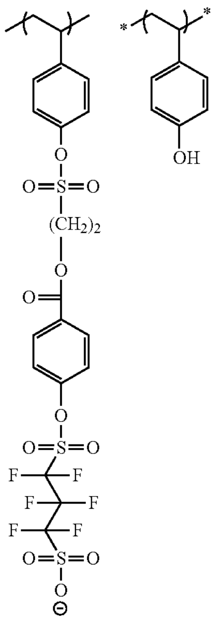
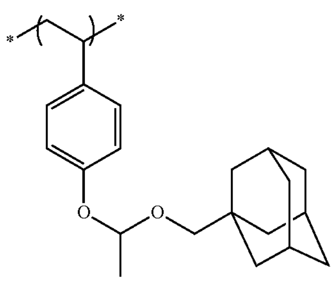
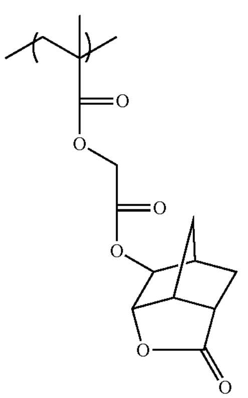
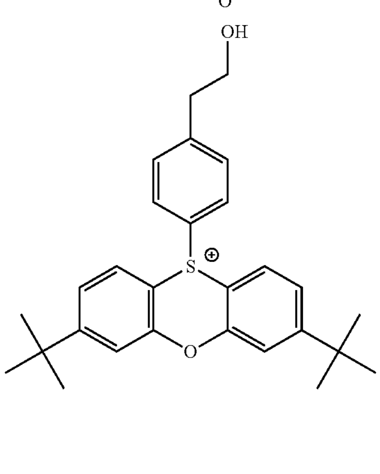
-continued
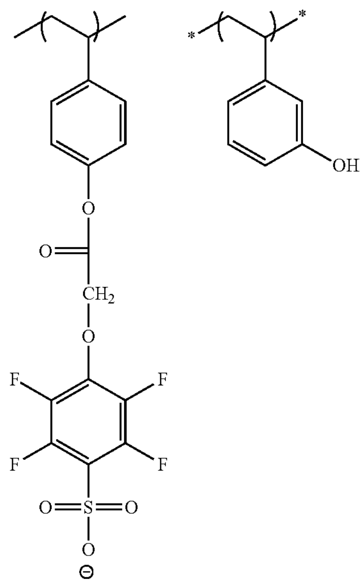
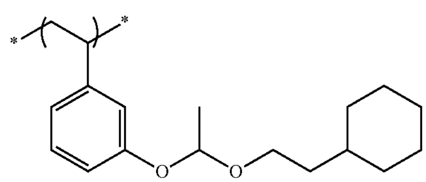
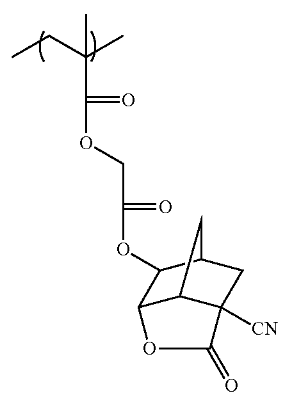
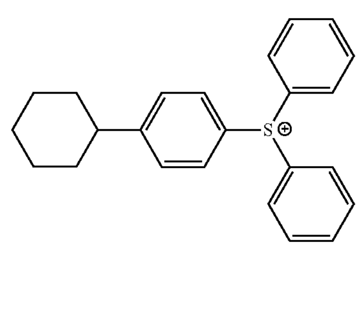

-continued
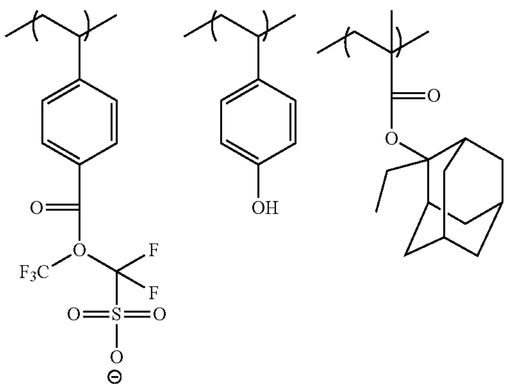
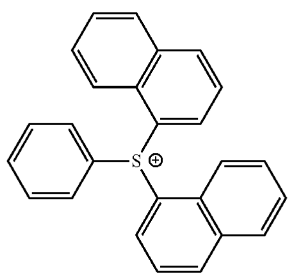
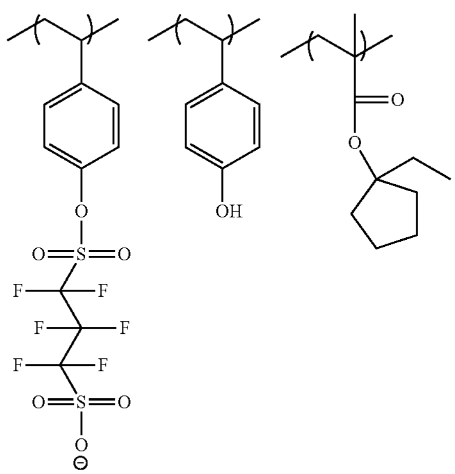
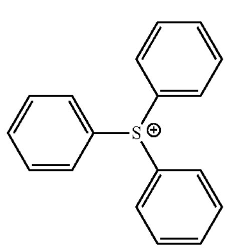
-continued
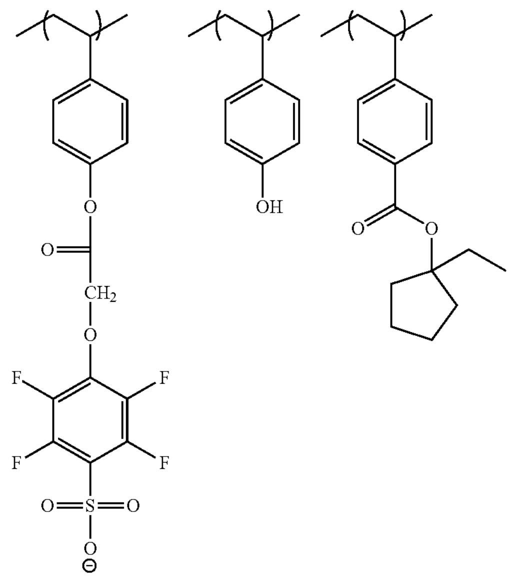
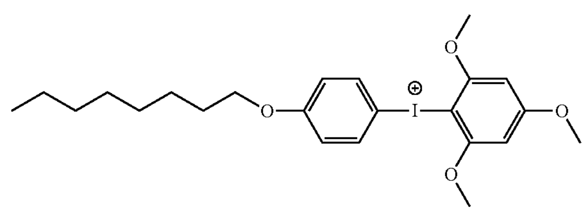
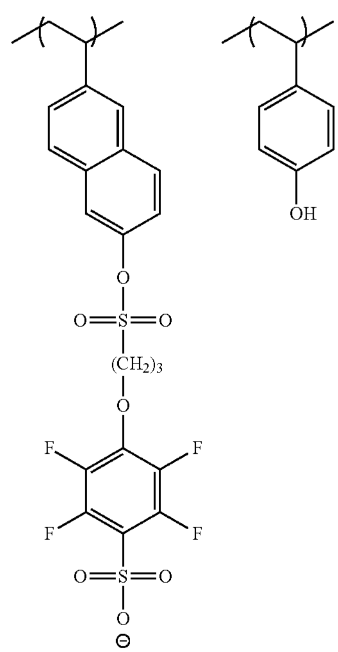

-continued
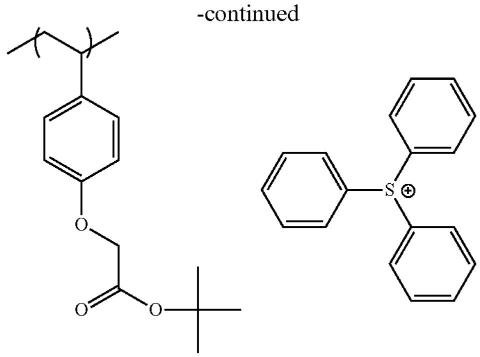
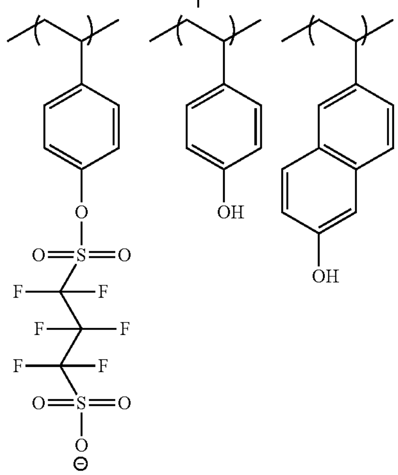
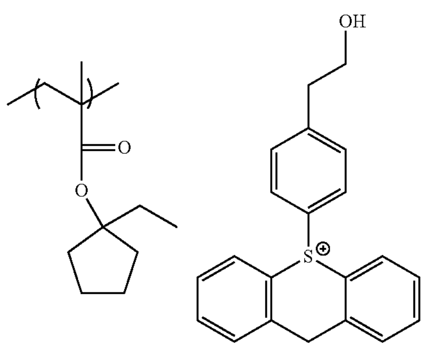
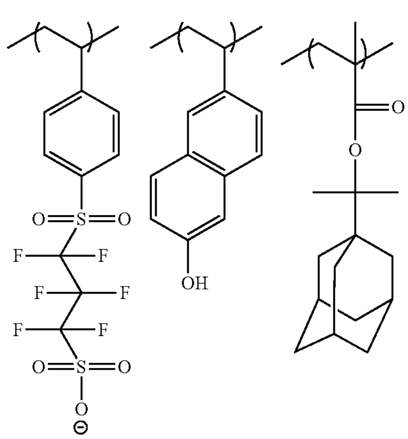
-continued
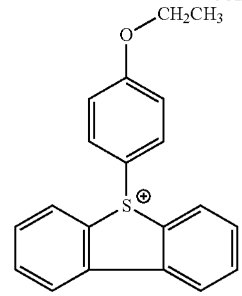
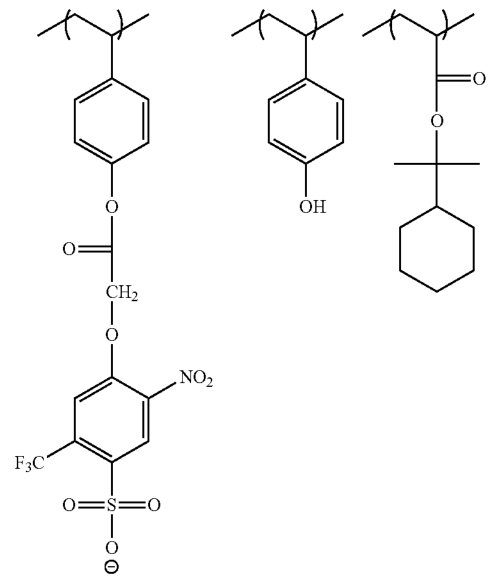
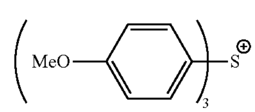
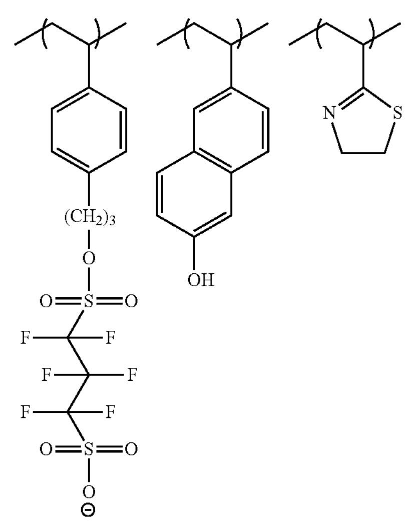

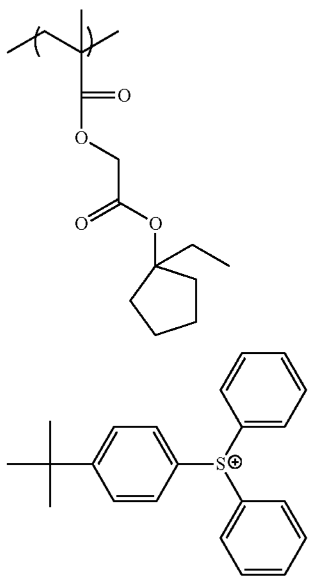
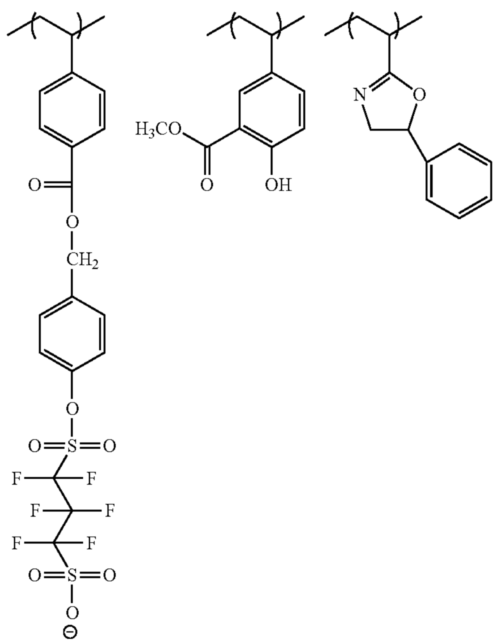
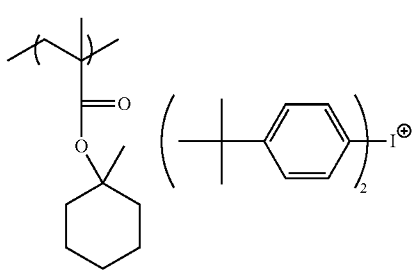
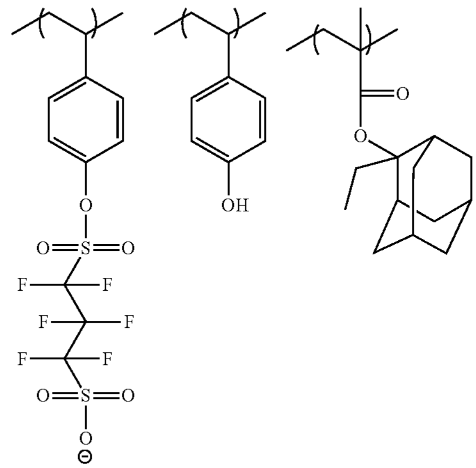
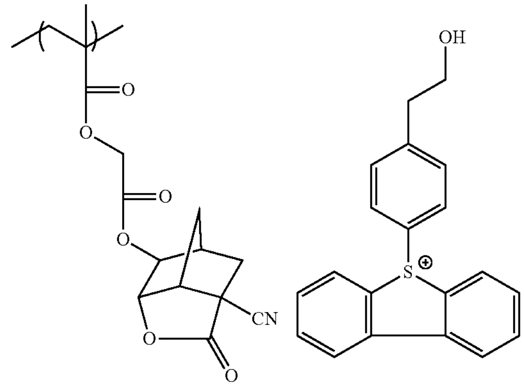
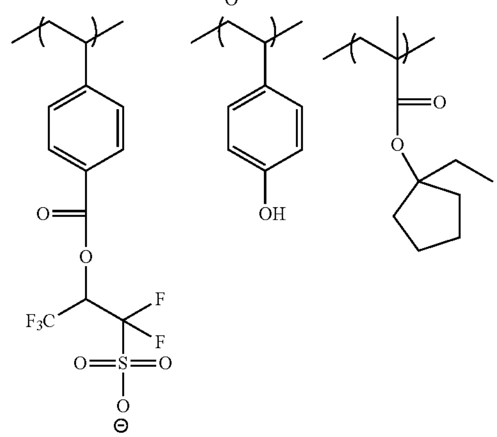
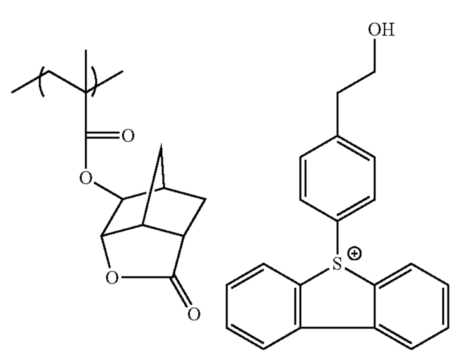

-continued
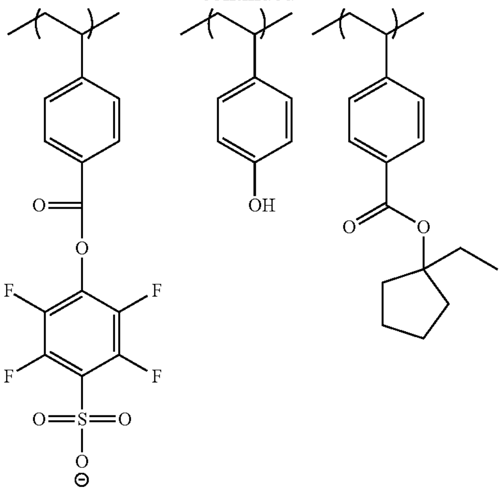
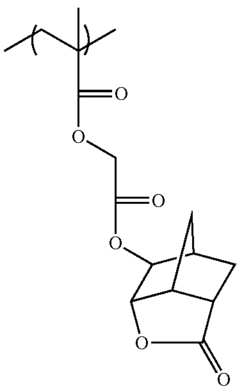
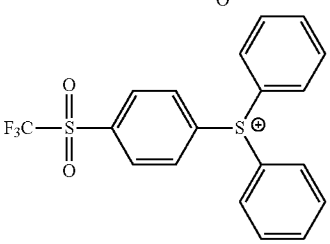
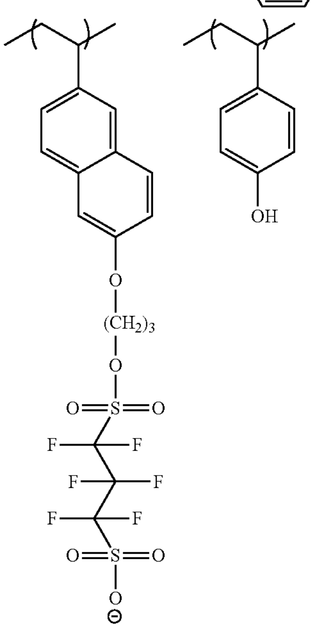
-continued
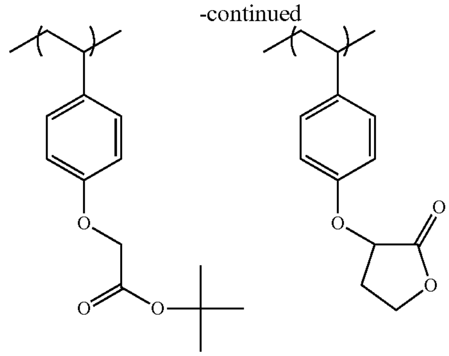
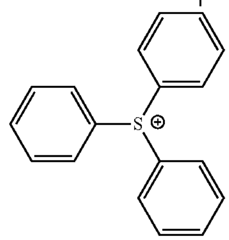
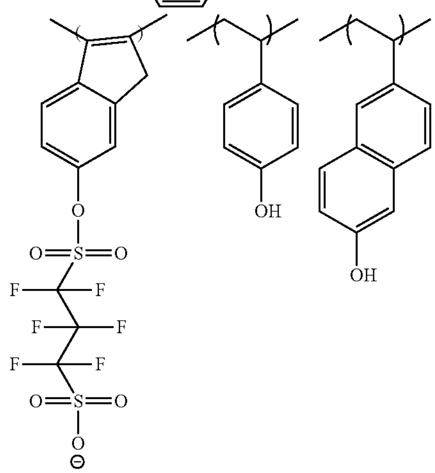
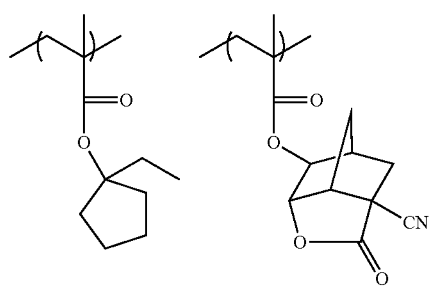
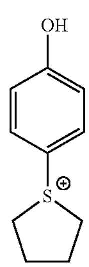

-continued
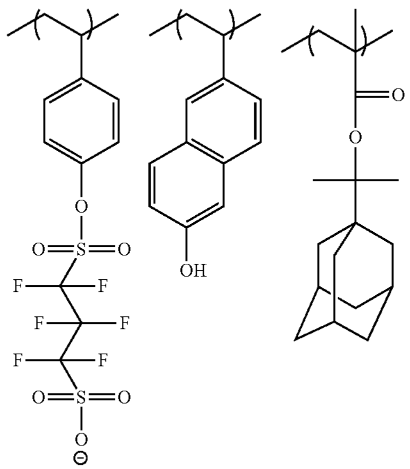
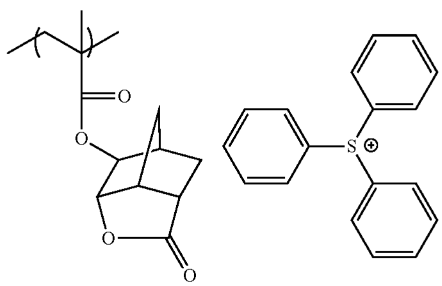
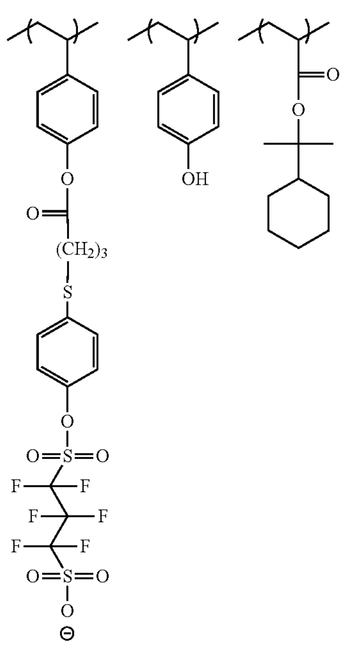
-continued
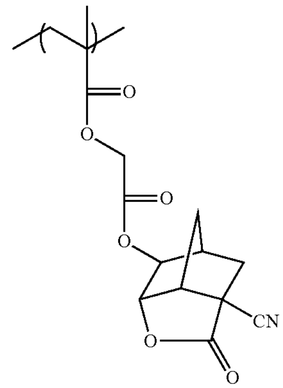
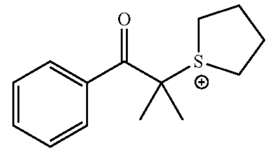
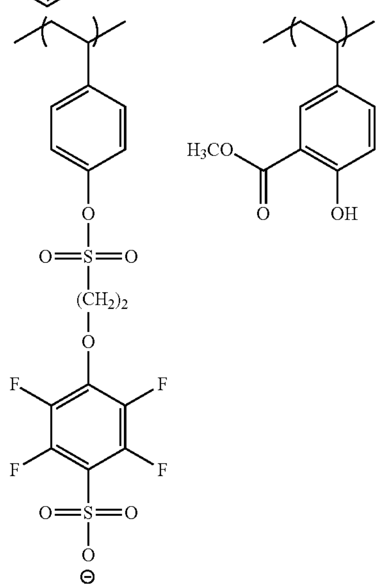
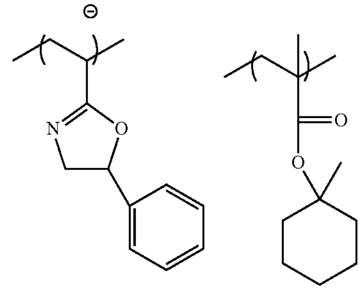
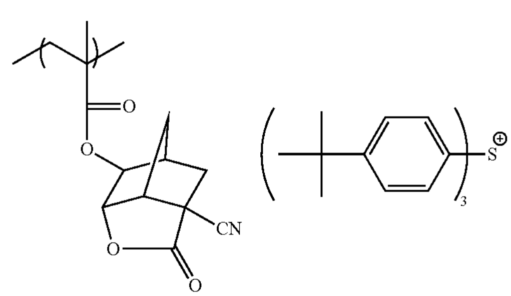

-continued
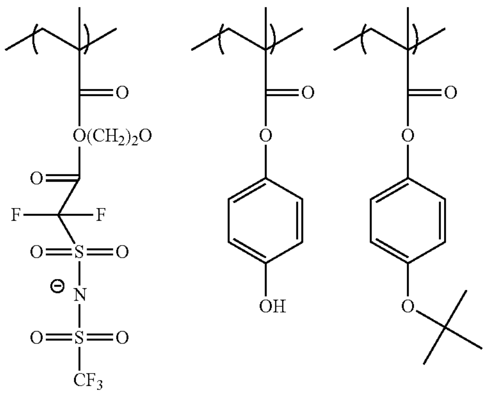
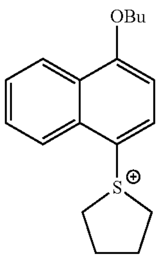
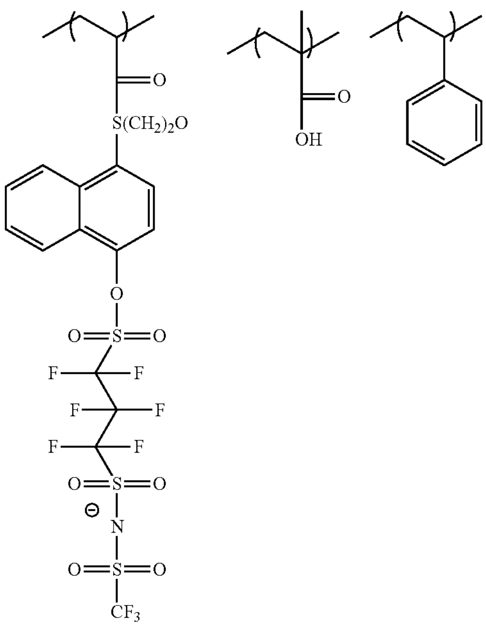
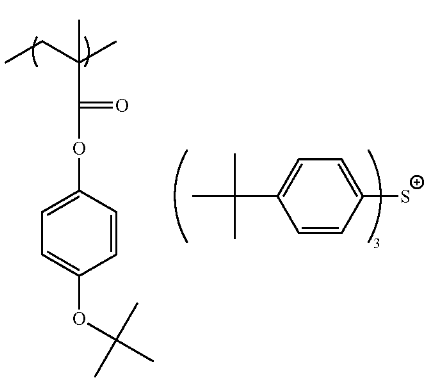
-continued
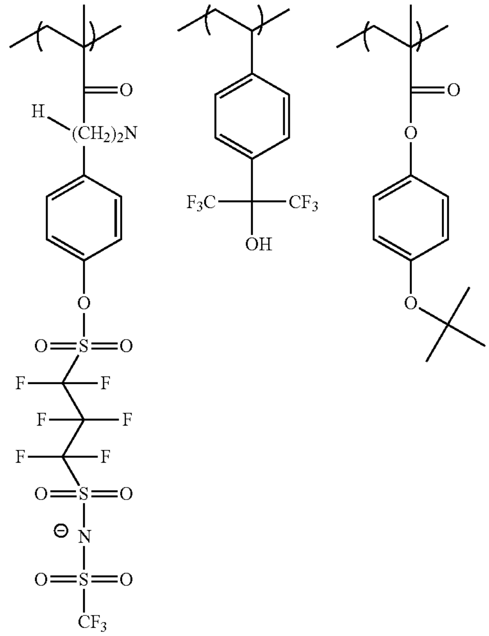
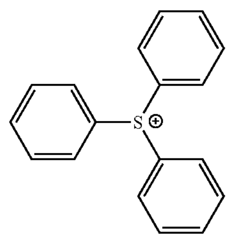
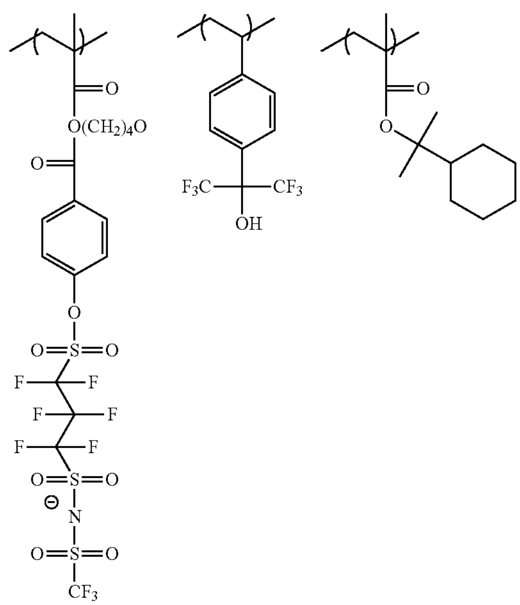
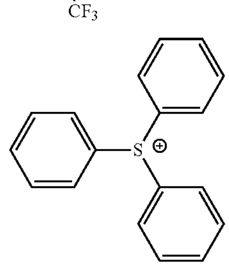

-continued
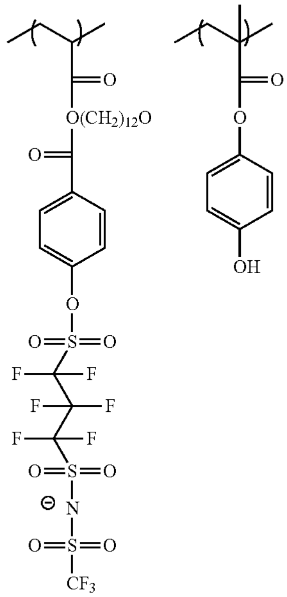
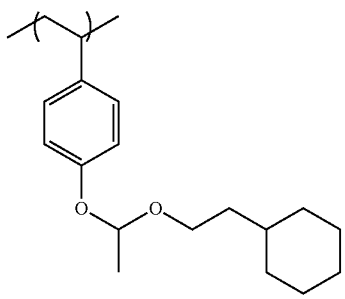
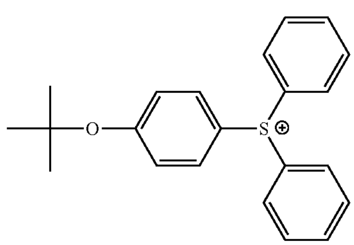
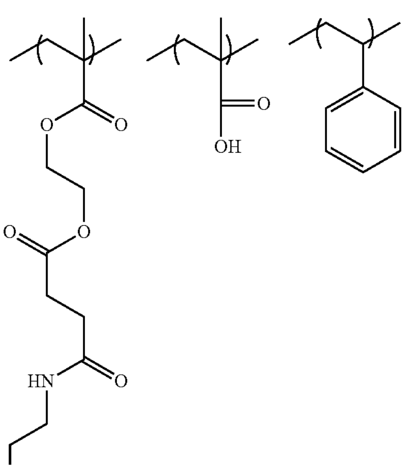
-continued
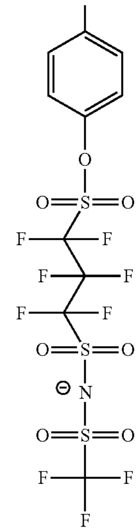
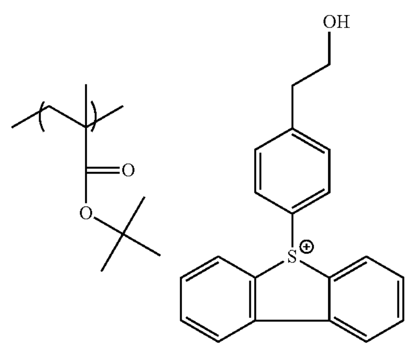
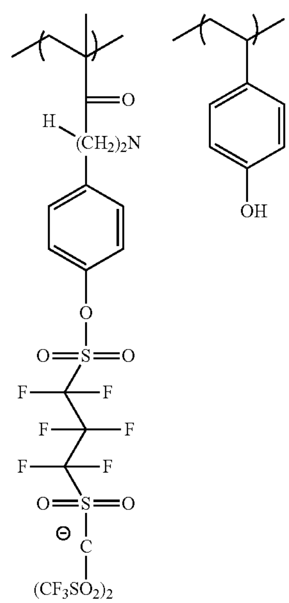

-continued
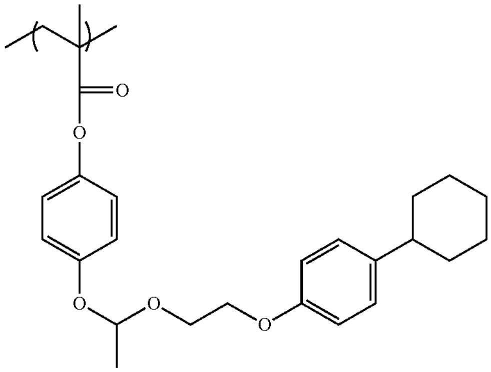
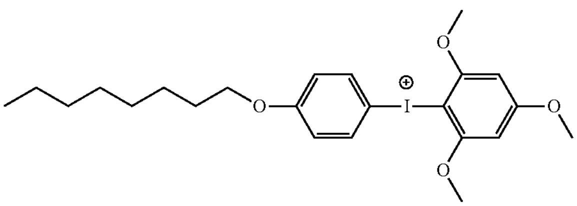
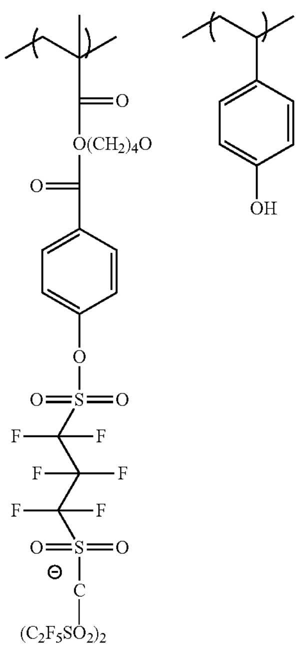
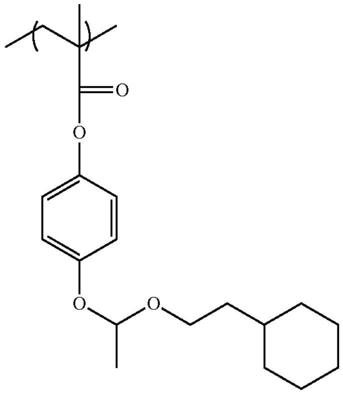
-continued
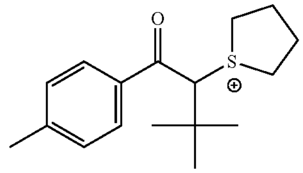
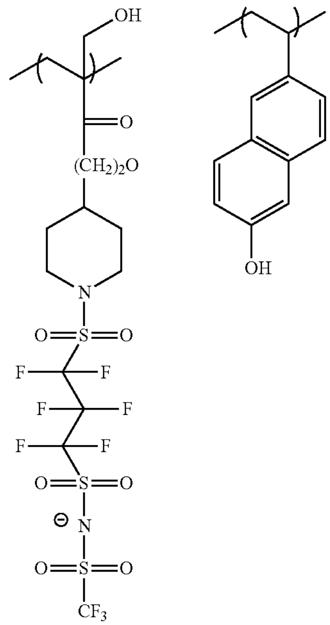
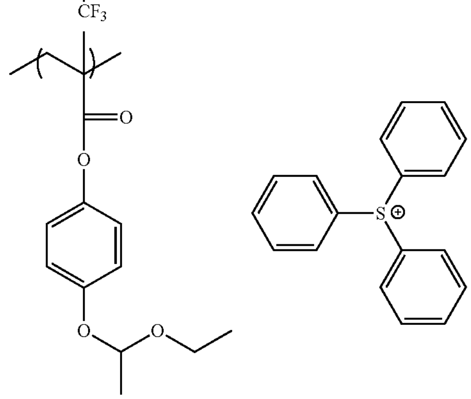
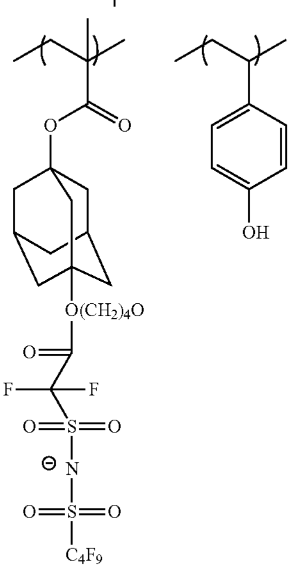

-continued
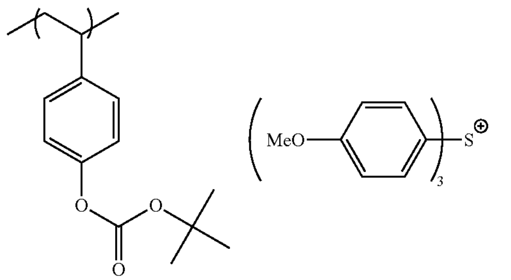
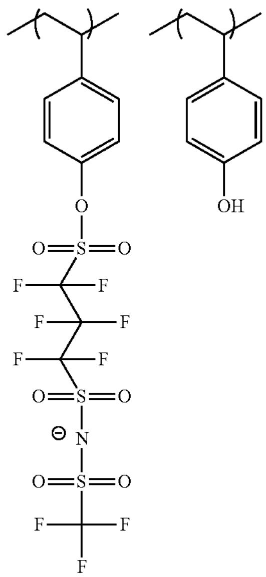
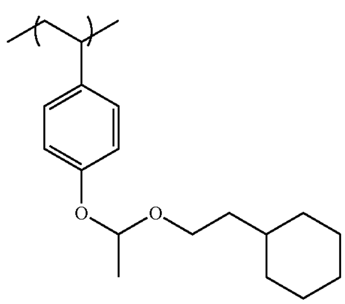
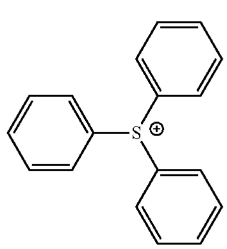
-continued
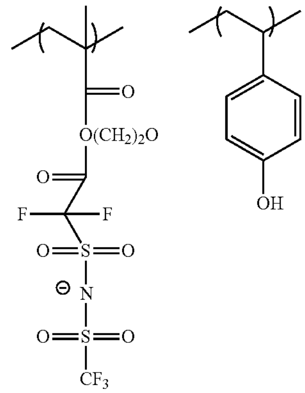
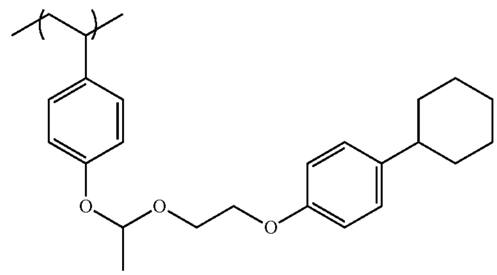
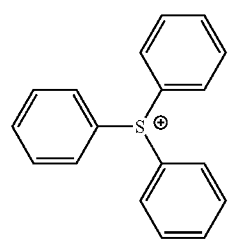
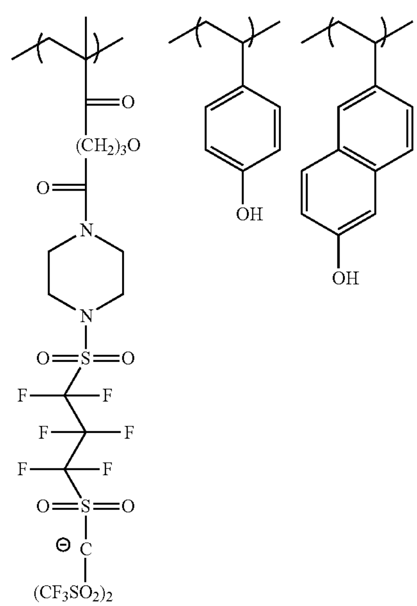

-continued
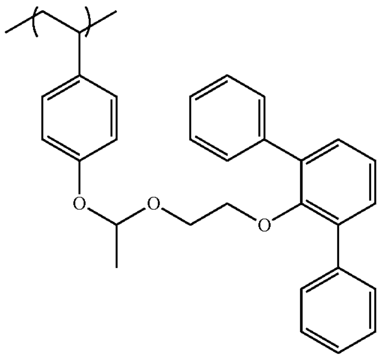
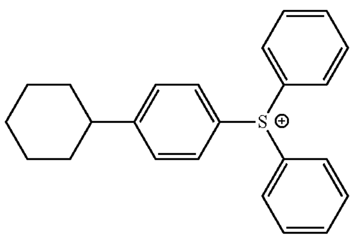
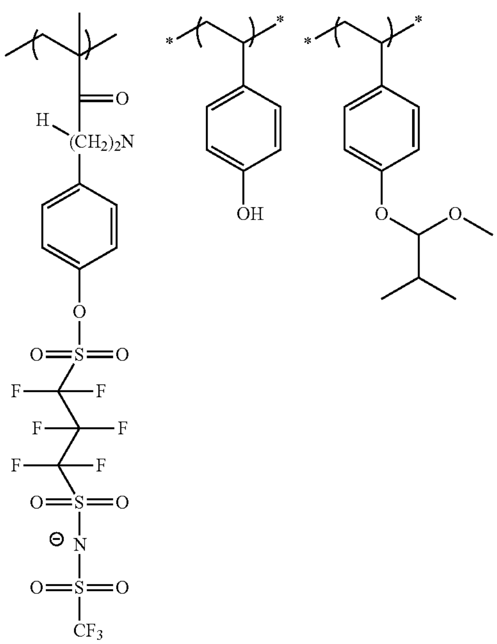
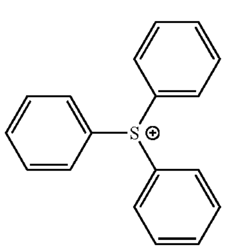
-continued
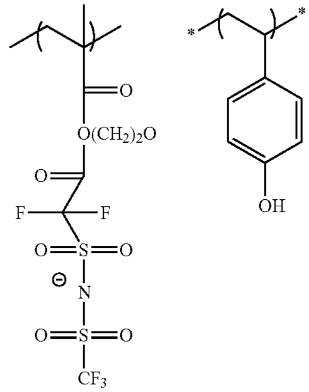
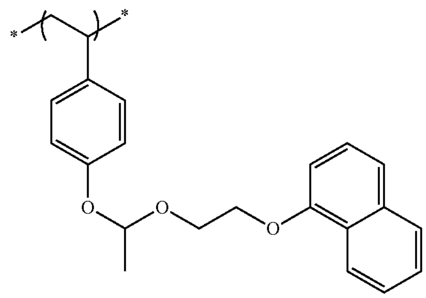
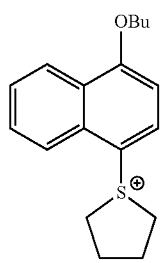
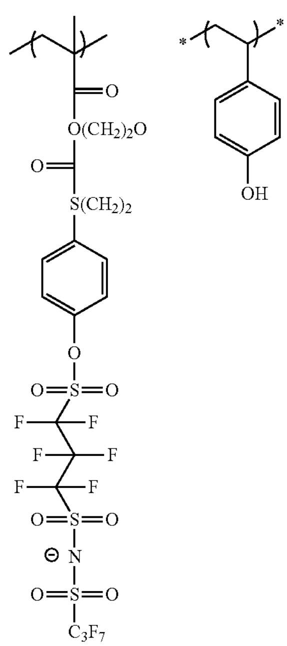

-continued
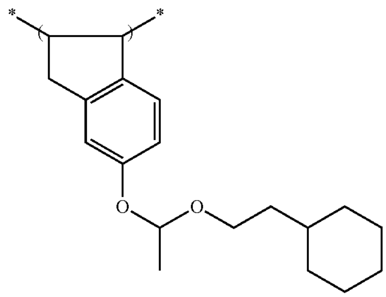
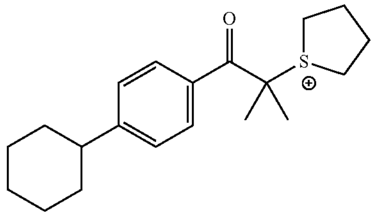
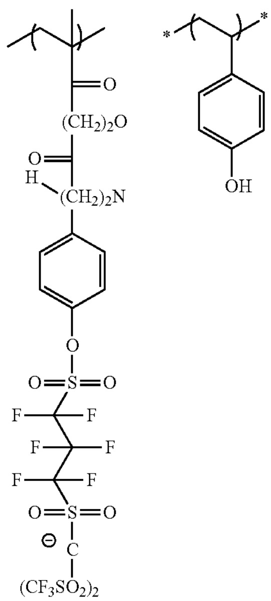
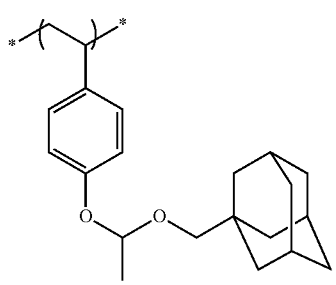
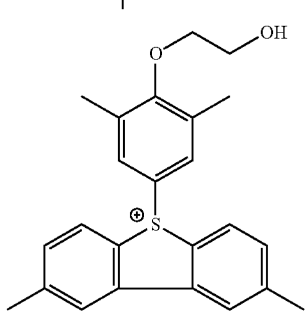
-continued
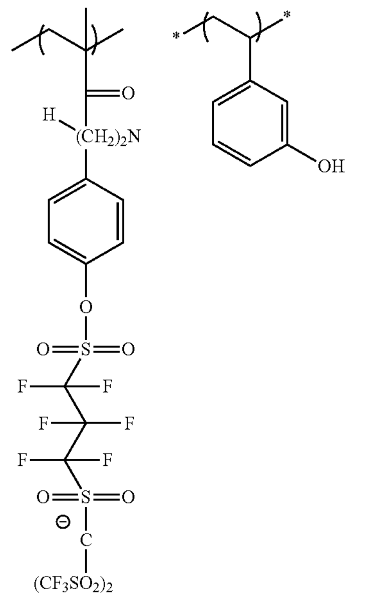
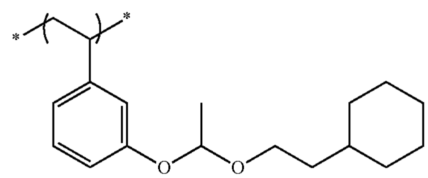
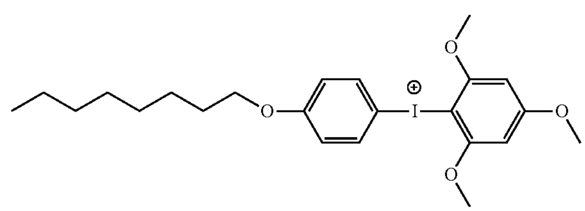
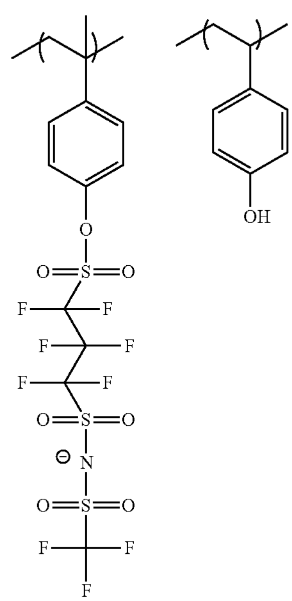

-continued
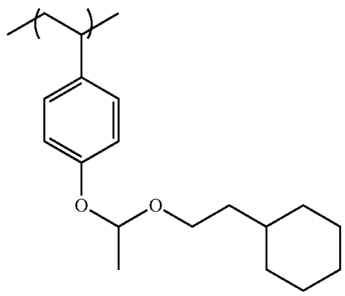
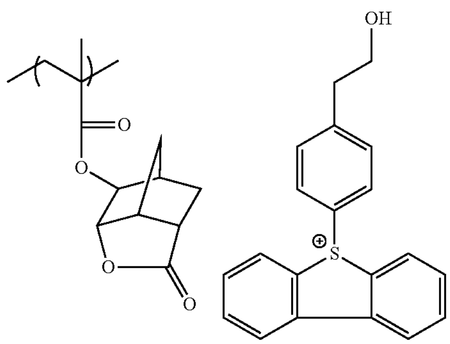
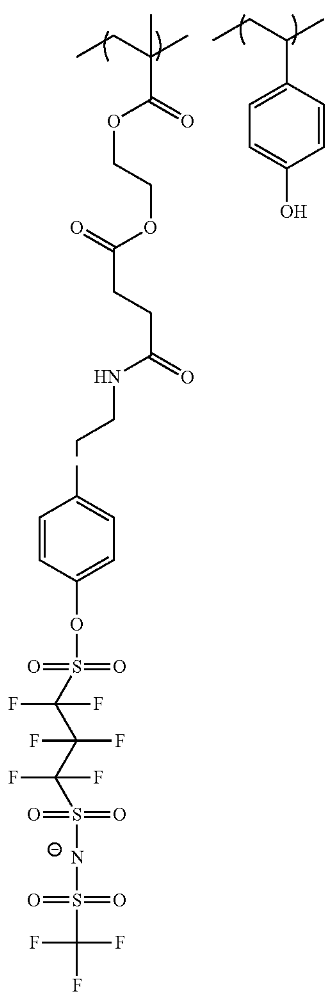
-continued
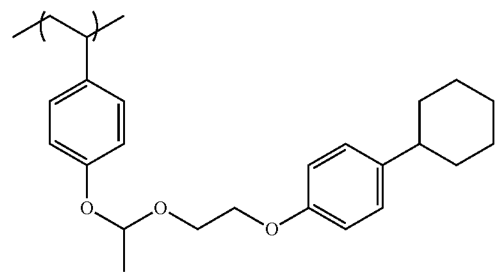
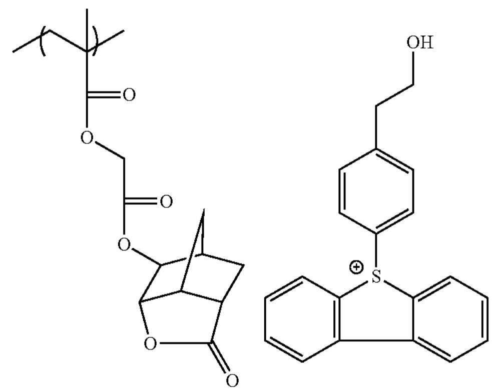
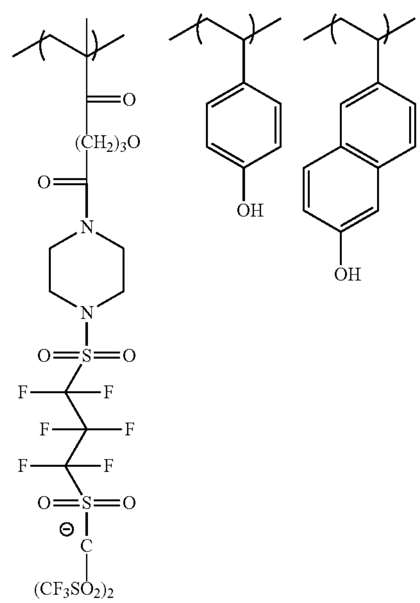
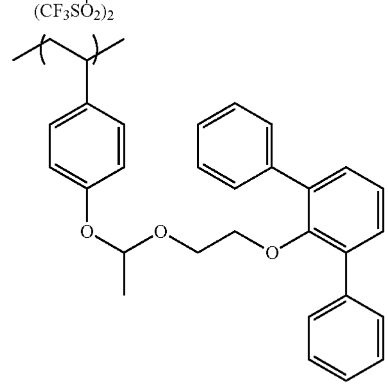

-continued
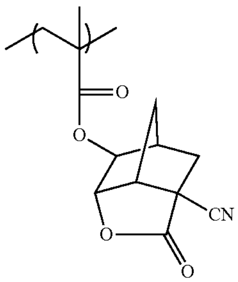
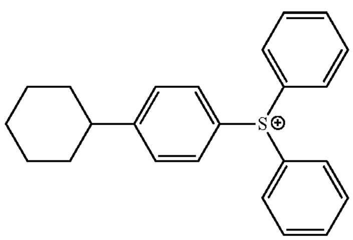
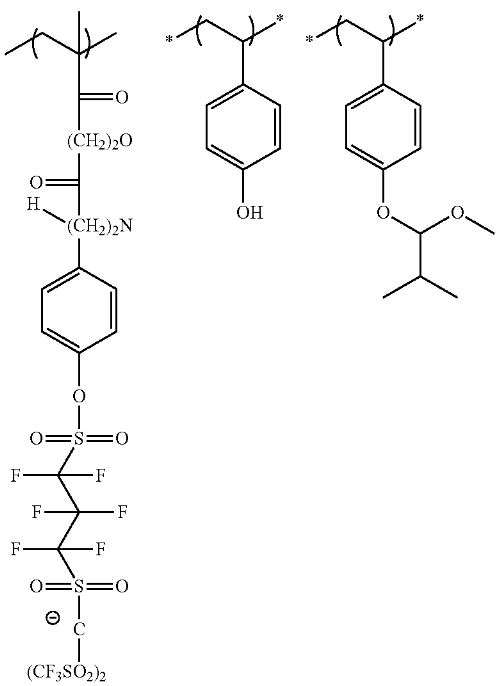
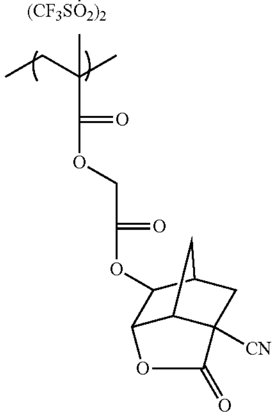
-continued
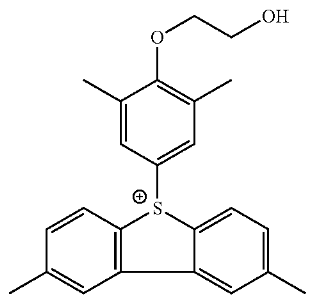
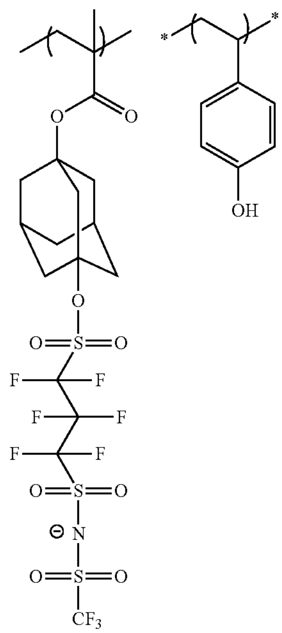
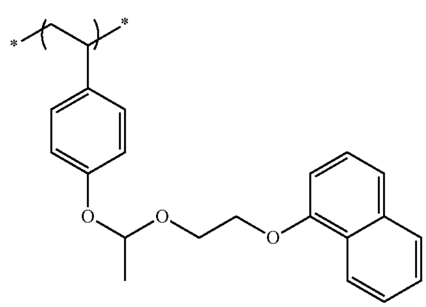
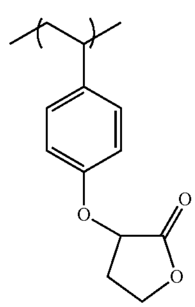

-continued
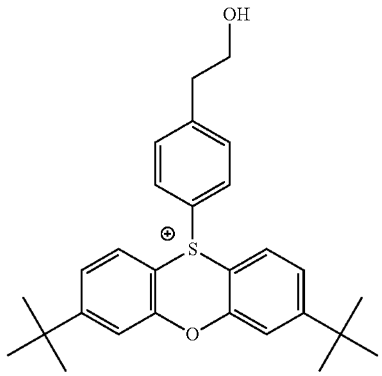
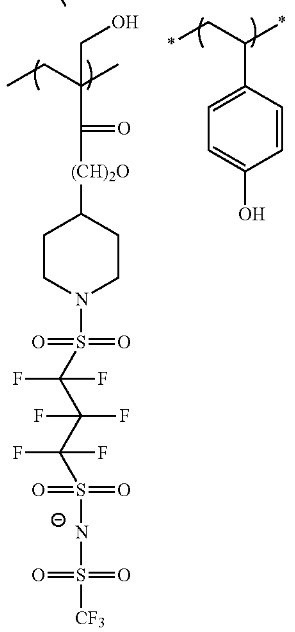
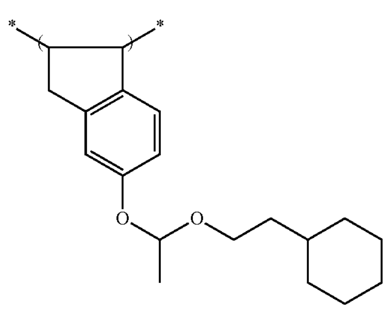
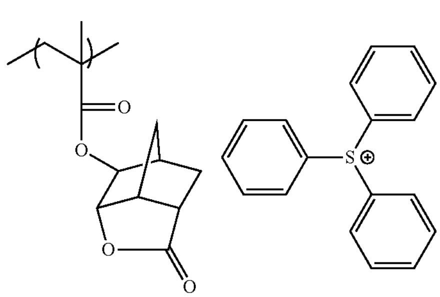
-continued
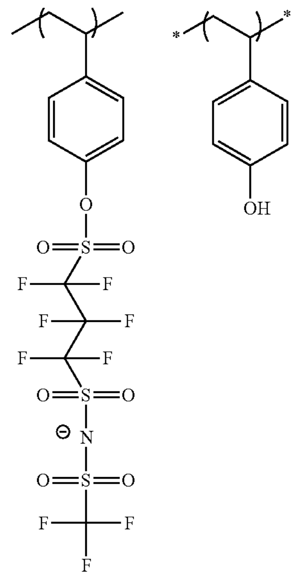
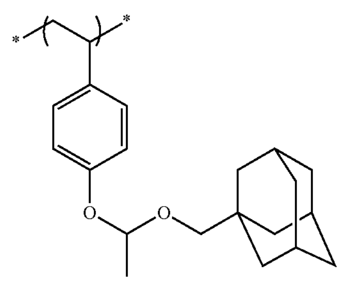
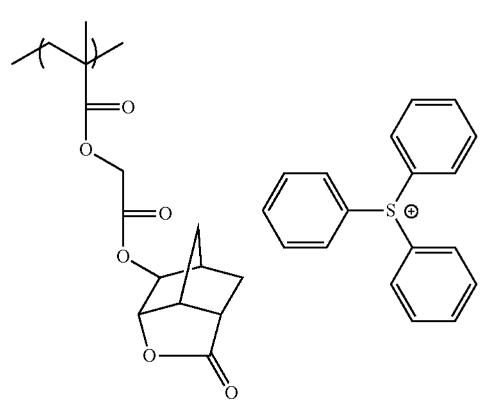

-continued
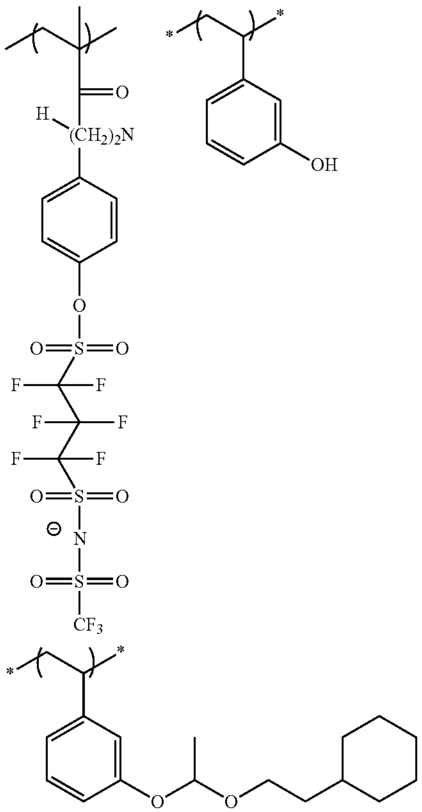
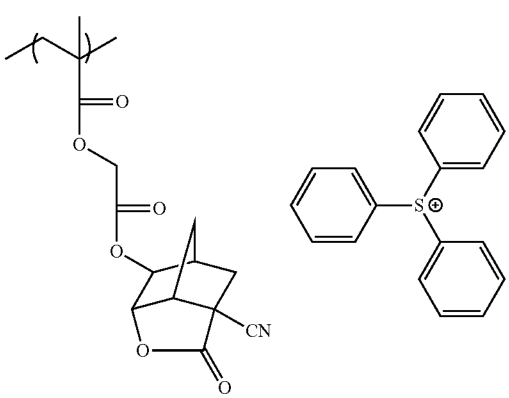
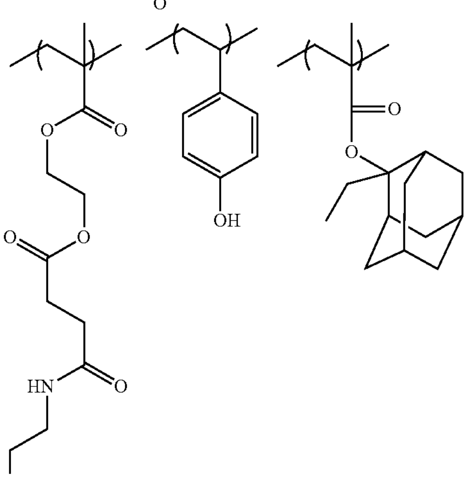
-continued
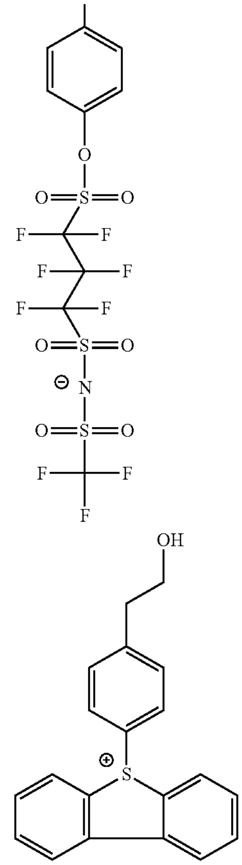
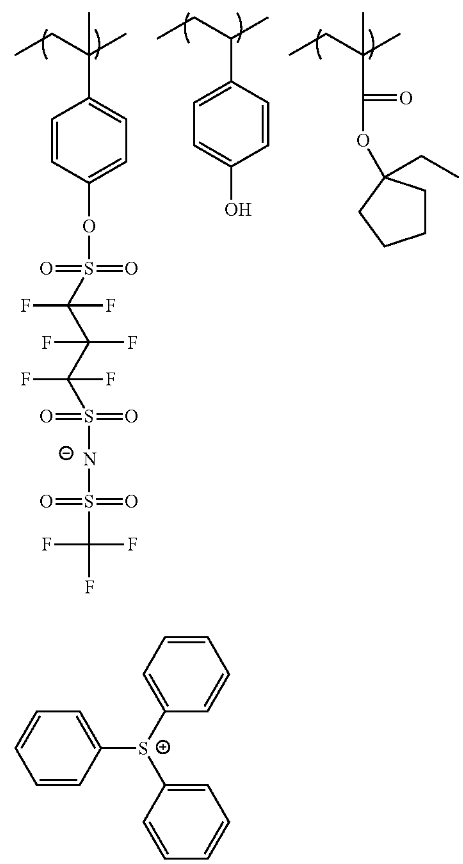

-continued
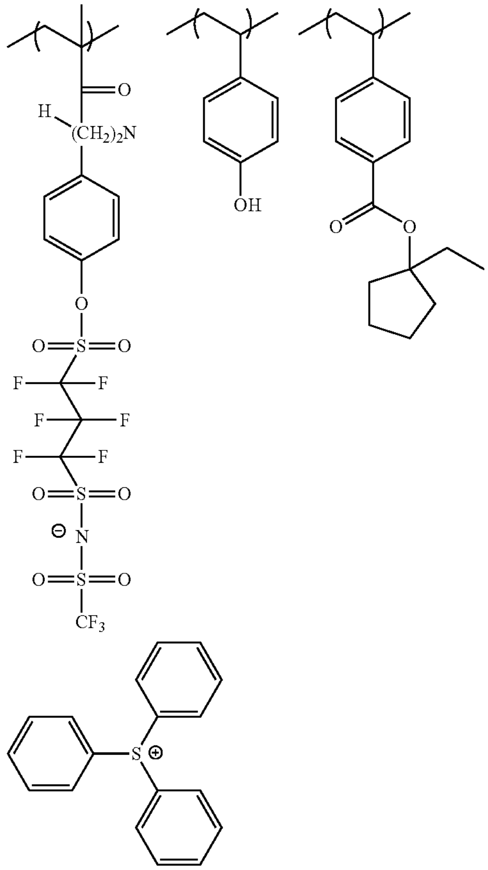
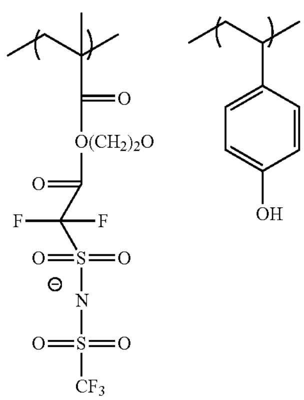
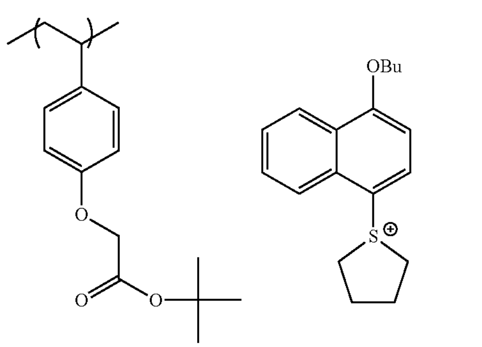
-continued
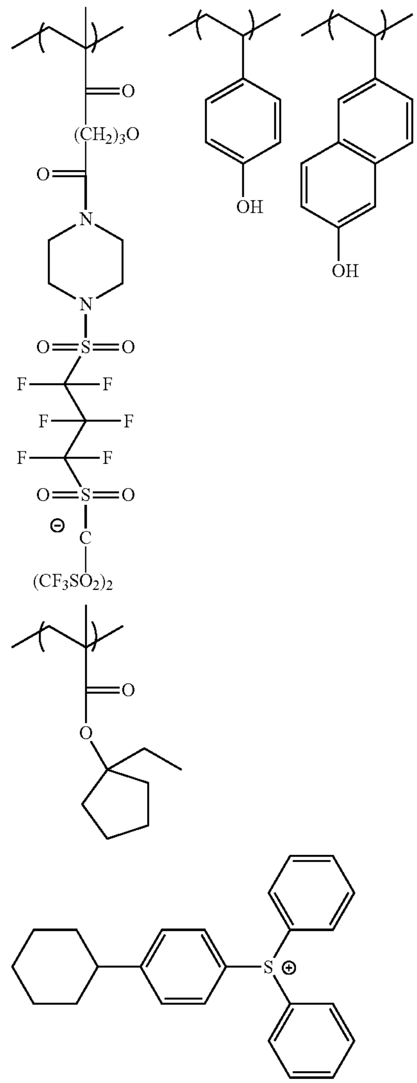
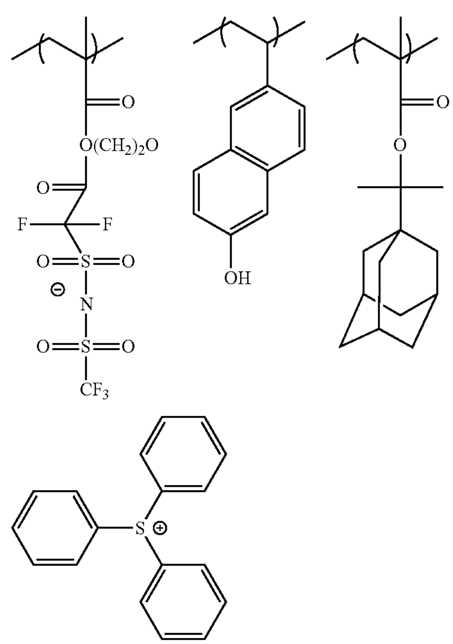

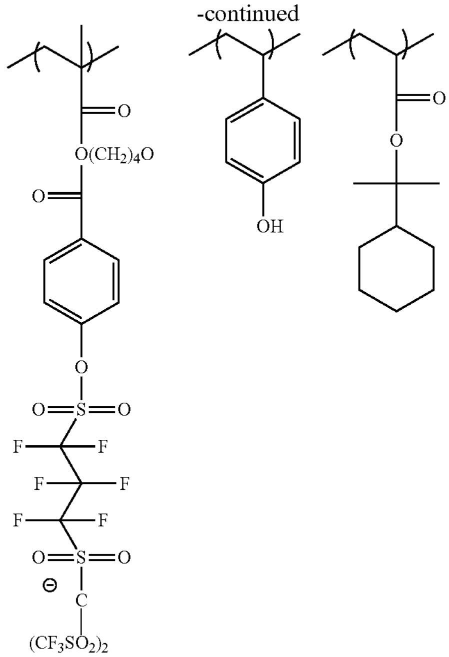
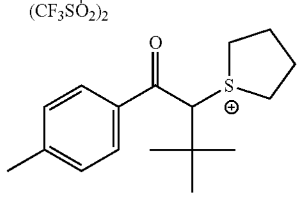
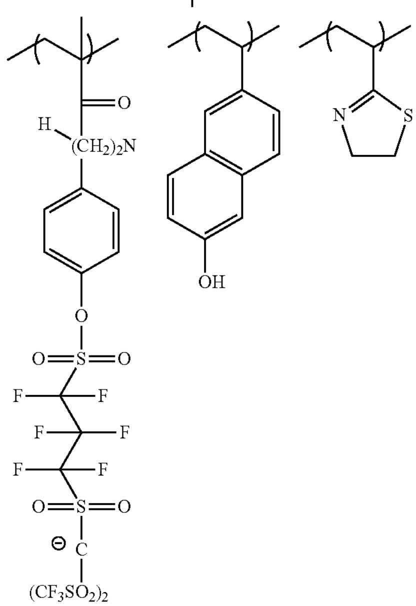
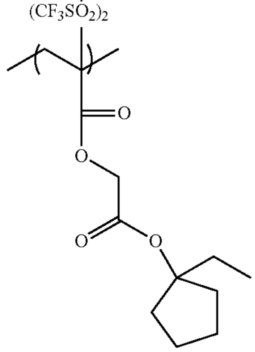
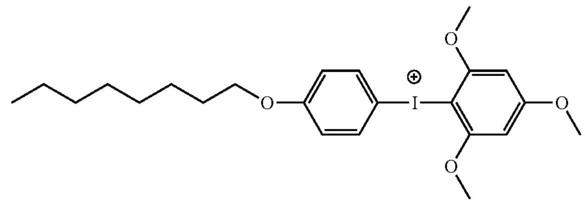
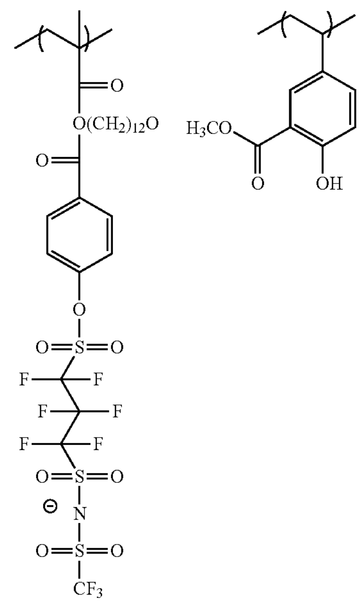
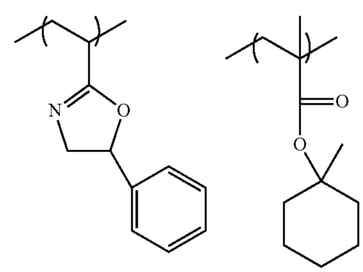
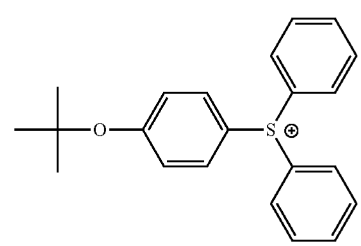

-continued
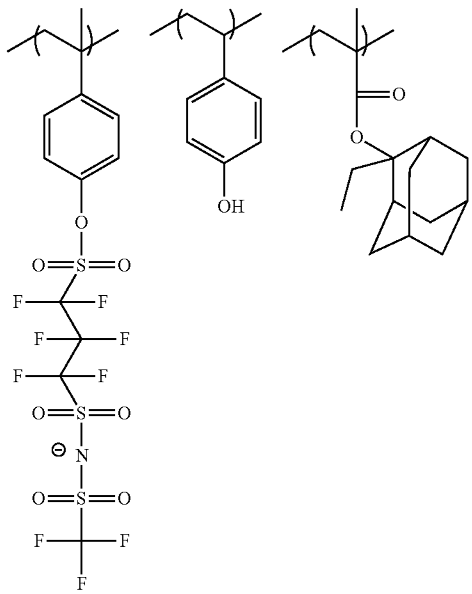
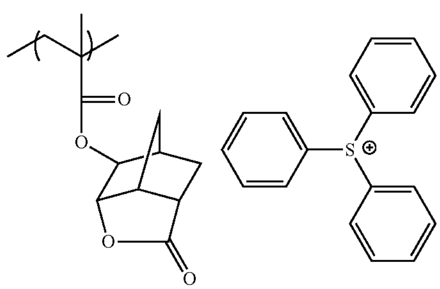
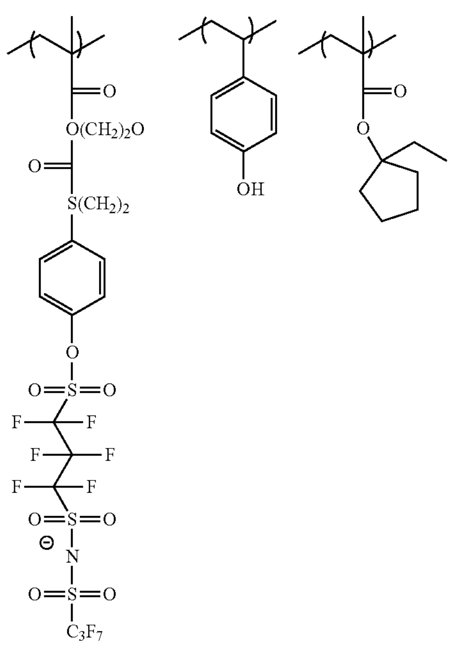
-continued
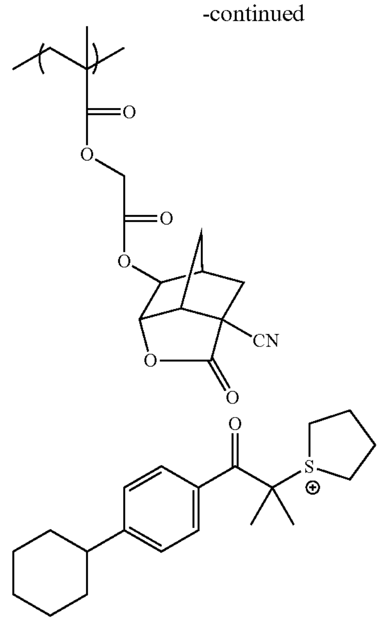
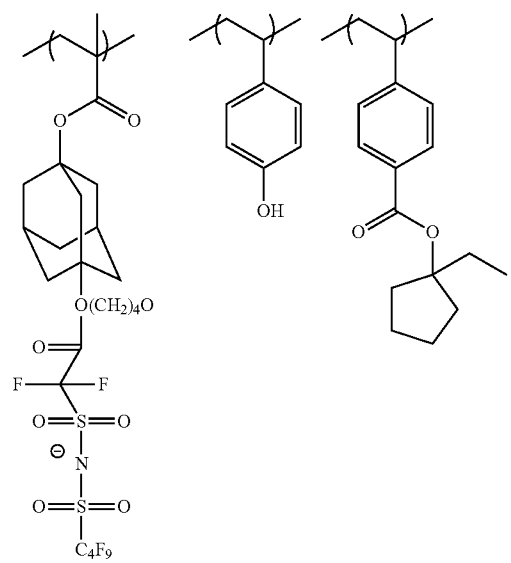
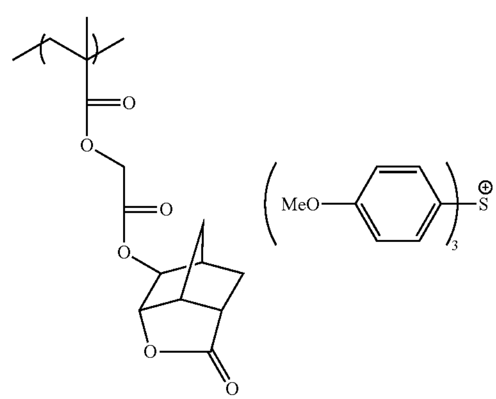

-continued
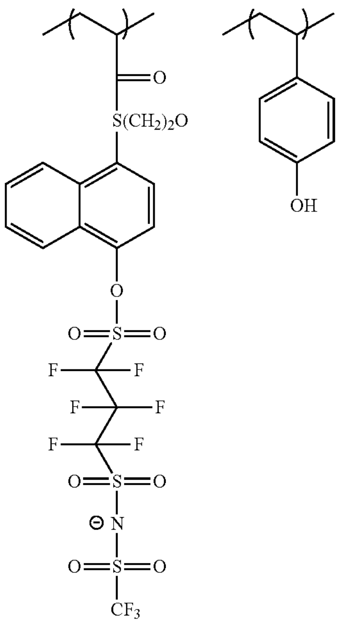
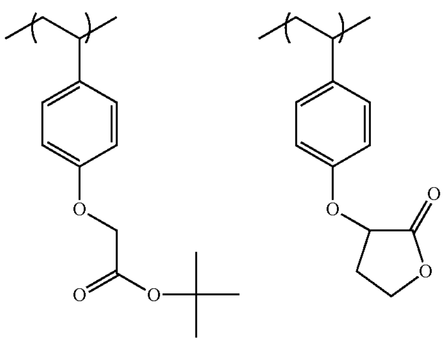
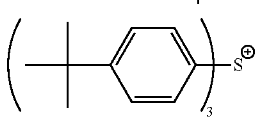
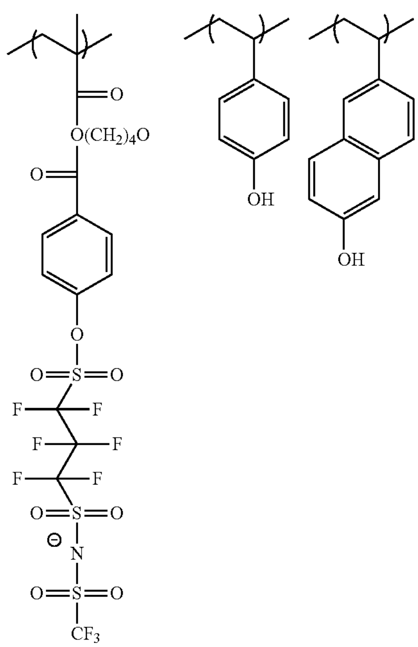
-continued
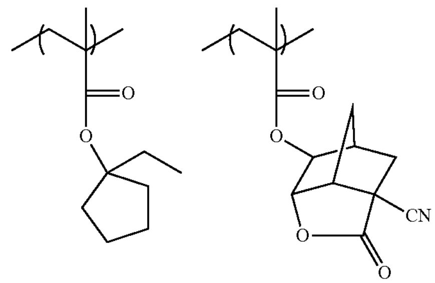
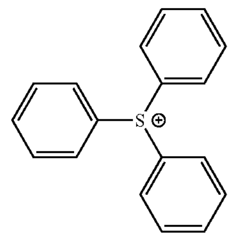
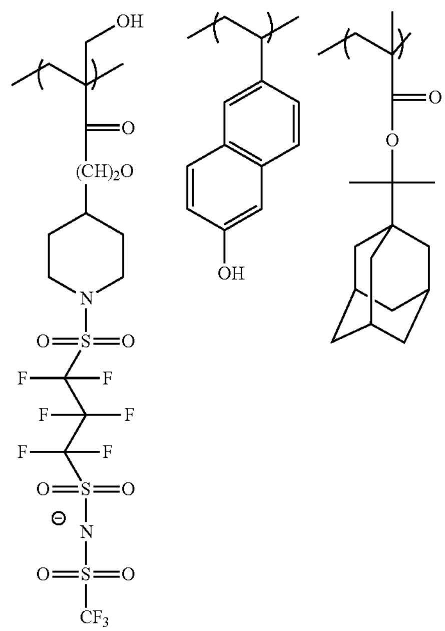
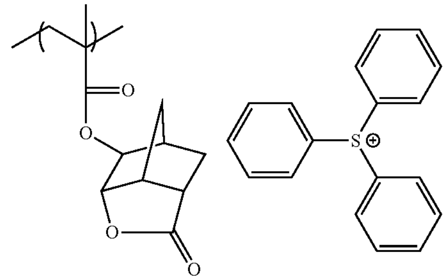

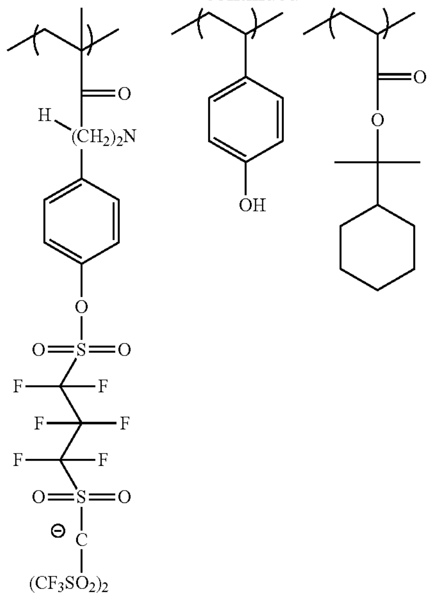
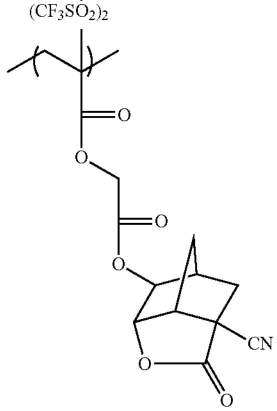
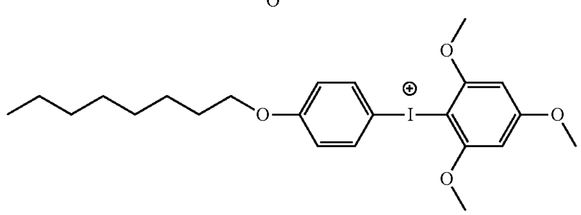
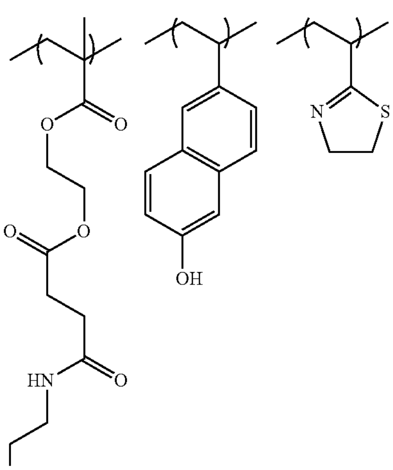
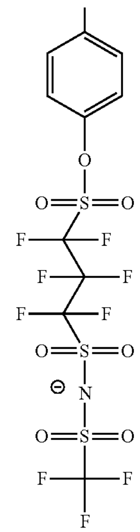
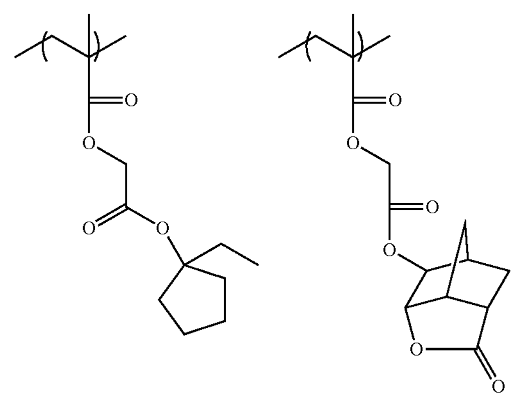
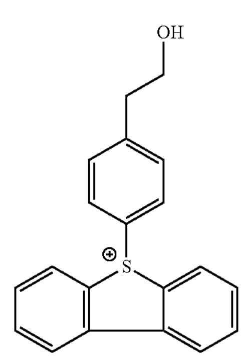

-continued

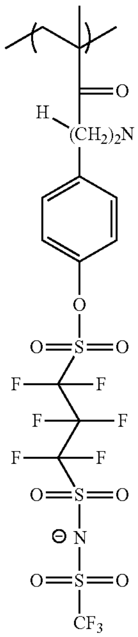

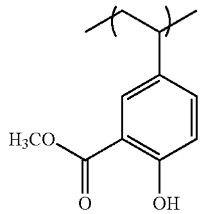

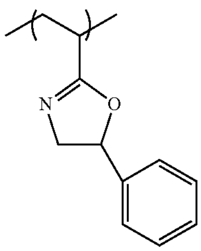

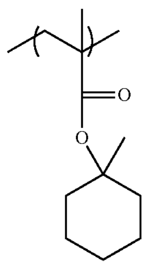

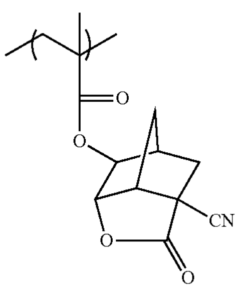

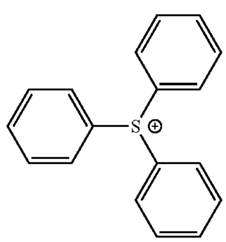

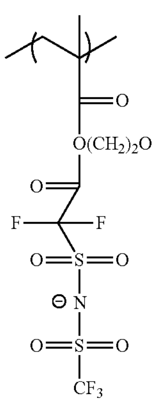

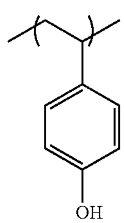

-continued

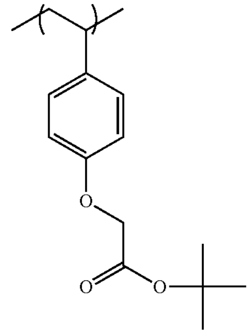

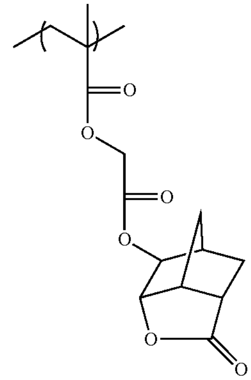

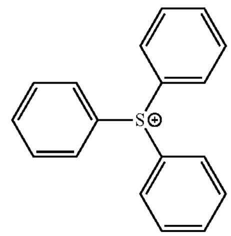

The actinic-ray- or radiation-sensitive resin composition of the present invention can further according to necessity contain a basic compound, a resin that when acted on by an acid, is decomposed to thereby increase its rate of dissolution in an alkali aqueous solution, any of conventional photoacid generators, a surfactant, an acid-decomposable dissolution inhibiting compound, a dye, a plasticizer, a photosensitizer, a compound capable of increasing the solubility in a developer, a compound having a functional group as a proton acceptor and the like.

<Basic Compound>

The actinic-ray- or radiation-sensitive resin composition of the present invention preferably contains a basic compound. The basic compound is preferably a nitrogenous organic basic compound.

Useful basic compounds are not particularly limited. However, for example, the compounds of categories (1) to (4) below are preferably used.

(1) Compounds of General Formula (BS-1) Below $$R-\underset{}{\overset{R}{\overset{|}{N}}}-R \tag{BS-1}$$

In general formula (BS-1), each of Rs independently represents any of a hydrogen atom, an alkyl group (linear or branched), a monovalent aliphatic hydrocarbon ring group (monocyclic or polycyclic), a monovalent aromatic ring group and a combination of an alkylene group and a monovalent aromatic ring group, provided that in no event all the three Rs are hydrogen atoms.

The number of carbon atoms of the alkyl group represented by R is not particularly limited. However, it is generally in the range of 1 to 20, preferably 1 to 12.

The number of carbon atoms of the monovalent aliphatic hydrocarbon ring group represented by R is not particularly limited. However, it is generally in the range of 3 to 20, preferably 5 to 15.

The number of carbon atoms of the monovalent aromatic ring group represented by R is not particularly limited. However, it is generally in the range of 6 to 20, preferably 6 to 10. In particular, an aryl group, such as a phenyl group, a naphthyl group and the like, can be mentioned.

The number of carbon atoms of the combination of an alkylene group and a monovalent aromatic ring group represented by R is not particularly limited. However, it is generally in the range of 7 to 20, preferably 7 to 11. In particular, an aralkyl group, such as a benzyl group and the like, can be mentioned.

In the alkyl group, monovalent aliphatic hydrocarbon ring group, monovalent aromatic ring group and combination of an alkylene group and a monovalent aromatic ring group represented by R, a hydrogen atom thereof may be replaced by a substituent. As the substituent, there can be mentioned, for example, an alkyl group, a monovalent aliphatic hydrocarbon ring group, a monovalent aromatic ring group, a combination of an alkylene group and a monovalent aromatic ring group, a hydroxyl group, a carboxyl group, an alkoxy group, an aryloxy group, an alkylcarbonyloxy group, an alkyloxycarbonyl group or the like.

In the compounds of General Formula (BS-1), it is preferred that only one of the three Rs be a hydrogen atom, and also that none of the Rs be a hydrogen atom.

Specific examples of the compounds of General Formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri (t-butyl)aniline and the like.

Any of the compounds of General Formula (BS-1) in which at least one of the Rs is a hydroxylated alkyl group can be mentioned as a preferred form of compound. Specific examples of the compounds include triethanolamine, N,N-dihydroxyethylaniline and the like.

With respect to the alkyl group represented by R, an oxygen atom may be present in the alkyl chain to thereby form an oxyalkylene chain. The oxyalkylene chain preferably consists of —$CH_2CH_2O$—. As particular examples thereof, there can be mentioned tris(methoxyethoxyethyl)amine, compounds shown in column 3 line 60 et seq. of U.S. Pat. No. 6,040,112 and the like.

(2) Compounds with Nitrogenous Heterocyclic Structure

The heterocyclic structure optionally may have aromaticity. It may have a plurality of nitrogen atoms, and also may have a heteroatom other than nitrogen. For example, there can be mentioned compounds with an imidazole structure (2-phenylbenzoimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. For example, there can be mentioned 1,5-diazabicyclo[4.3.0]non-5-ene, 1,8-diazabicyclo[5.4.0]-undec-7-ene and the like.

(3) Amine Compounds with Phenoxy Group

The amine compounds with a phenoxy group are those having a phenoxy group at the end of the alkyl group of each amine compound opposite to the nitrogen atom. The phenoxy group may have a substituent, such as an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group or the like.

Compounds having at least one oxyalkylene chain between the phenoxy group and the nitrogen atom are preferred. The number of oxyalkylene chains in each molecule is preferably in the range of 3 to 9, more preferably 4 to 6. Among the oxyalkylene chains, —$CH_2CH_2O$— is preferred.

Particular examples thereof include 2-[2-{2-(2,2-dimethoxy-phenoxyethoxy)ethyl}-bis-(2-methoxyethyl)]-amine, compounds (C1-1) to (C3-3) shown in section [0066] of US 2007/0224539 A1 and the like.

(4) Ammonium Salts

Ammonium salts can also be appropriately used. Hydroxides and carboxylates are preferred. Preferred particular examples thereof are tetraalkylammonium hydroxides, such as tetrabutylammonium hydroxide.

Also, use can be made of compounds synthesized in Examples of JP-A-2002-363146, compounds described in section [0108] of JP-A-2007-298569, and the like.

These basic compounds are used alone or in combination.

The amount of basic compound added is generally in the range of 0.001 to 10 mass %, preferably 0.01 to 5 mass %, based on the total solid of the composition.

The molar ratio of acid generator to basic compound is preferably in the range of 2.5 to 300. A molar ratio of 2.5 or higher is preferred from the viewpoint of sensitivity and resolving power. A molar ratio of 300 or below is preferred from the viewpoint of suppressing any resolving power drop due to pattern thickening over time until baking treatment after exposure. The molar ratio is more preferably in the range of 5.0 to 200, further more preferably 7.0 to 150.

The acid generator in the above molar ratio refers to the sum of repeating unit (a) contained in the resin (P) and acid generator other than resin (P) to be described hereinafter.

<Resin that when Acted on by an Acid, is Decomposed to Thereby Increase its Rate of Dissolution in an Alkali Aqueous Solution>

The actinic-ray- or radiation-sensitive resin composition of the present invention may contain, except the resin (P), a resin that when acted on by an acid, is decomposed to thereby increase its rate of dissolution in an alkali aqueous solution.

The resin that when acted on by an acid, is decomposed to thereby increase its rate of dissolution in an alkali aqueous solution (hereinafter also referred to as an “acid-decomposable resin”) is a resin provided at its principal chain or side chain or both thereof with a group that is decomposed by the action of an acid to thereby generate an alkali soluble group (acid-decomposable group). The resin provided at its side chain with an acid-decomposable group is preferred.

The acid-decomposable resin can be obtained by either reacting a precursor of acid-decomposable group with an alkali-soluble resin, or copolymerizing an alkali-soluble resin monomer having an acid-decomposable group bonded thereto with any of various monomers, as described in, for example, European Patent No. 254853 and JP-A’s 2-25850, 3-223860 and 4-251259.

It is preferred for the acid-decomposable group to be, for example, a group as obtained by, in a resin having an alkali-soluble group such as —COOH or —OH, substituting the hydrogen atom of the alkali soluble group with a group that is cleaved by the action of an acid.

Preferred particular examples of the acid-decomposable groups are the same as set forth above with respect to the resins of the present invention (for example, acid-decomposable groups mentioned above with respect to the repeating unit (B2) of the resin (P)).

The resins having alkali-soluble groups are not particularly limited. For example, there can be mentioned poly(o-hydroxystyrene), poly(m-hydroxystyrene), poly(p-hydroxystyrene), copolymers of these, a hydrogenated poly(hydroxystyrene), poly(hydroxystyrene) polymers having substituents of the structures shown below, a resin having phenolic hydroxyl, a styrene-hydroxystyrene copolymer, an α-methylstyrene-hydroxystyrene copolymer, an alkali-soluble resin having a hydroxystyrene structure unit such as a hydrogenated novolak resin, and an alkali-soluble resin comprising a repeating unit containing a carboxyl group such as (meth) acrylic acid or norbornene carboxylic acid.

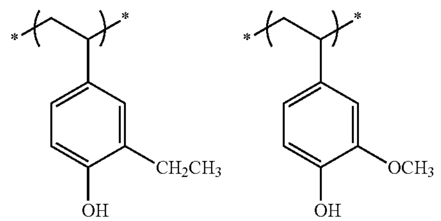

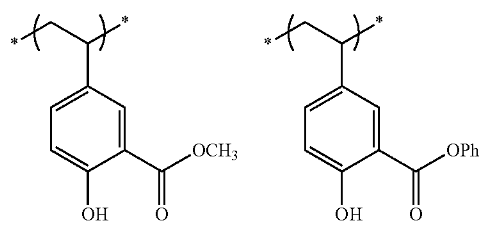

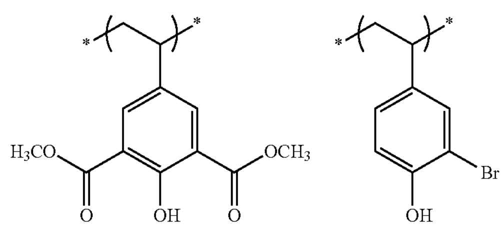

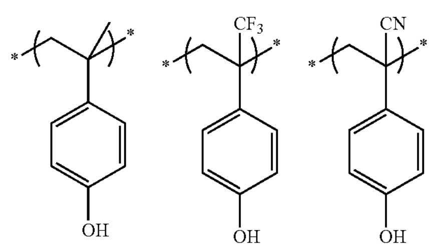

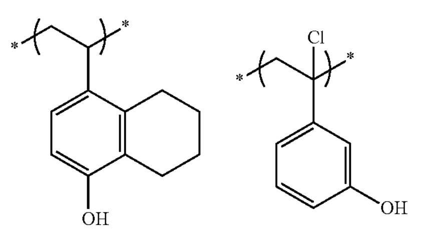

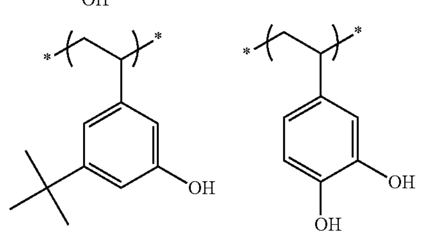

-continued

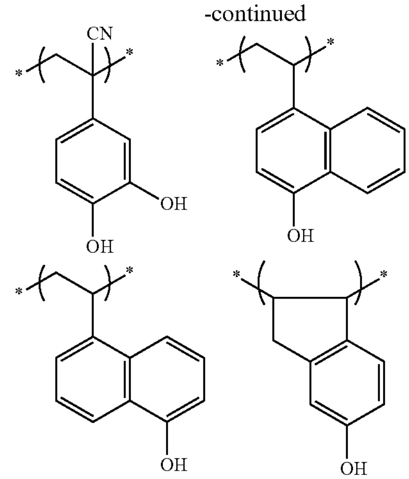

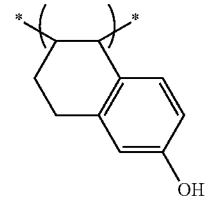

The alkali dissolution rate of these alkali-soluble resins as measured in a 2.38 mass % tetramethylammonium hydroxide (TMAH) solution (23° C.) is preferably 170 Å/sec or greater. The alkali dissolution rate is most preferably 330 Å/sec or greater.

The content of acid-decomposable groups can be expressed as the quotient of the formula X/(X+Y) in which X is the number of repeating units containing groups decomposable by an acid in the resin and Y is the number of repeating units containing alkali-soluble groups not protected by any acid-cleavable group in the resin. The content is preferably in the range of 0.01 to 0.7, more preferably 0.05 to 0.50 and further more preferably 0.05 to 0.40.

The weight average molecular weight of each of these acid-decomposable resins in terms of polystyrene molecular weight measured by GPC is preferably 50,000 or less, more preferably 1000 to 20,000 and most preferably 1000 to 10,000.

The dispersity (Mw/Mn) of the acid-decomposable resins is preferably in the range of 1.0 to 3.0, more preferably 1.05 to 2.0 and further more preferably 1.1 to 1.7.

Two or more types of acid-decomposable resins may be used in combination.

The amount of acid-decomposable resins, except the resin (P), contained in the actinic-ray- or radiation-sensitive resin composition of the present invention is preferably in the range of 0 to 70 mass %, more preferably 0 to 50 mass % and further more preferably 0 to 30 mass % based on the total solids of the composition.

<Acid Generator>

The actinic-ray- or radiation-sensitive resin composition of the present invention essentially contains the resin with a photoacid generating structure (P). Except the resin (P), a low-molecular compound that when exposed to actinic rays or radiation, generates an acid (hereinafter also referred to as an "acid generator") may be contained in the composition.

As such an acid generator, use can be made of a member appropriately selected from among a photoinitiator for photocationic polymerization, a photoinitiator for photoradical polymerization, a photo-achromatic agent and photo-discoloring agent for dyes, any of generally known compounds that when exposed to actinic rays or radiation, generate an acid, employed in microresists, etc., and mixtures thereof.

For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate. As particular examples of these, there can be mentioned, for example, those set forth in Sections [0164] to [0248] of US Patent Application Publication No. 2008/0241737 A1.

When an acid generator, except the resin with a photoacid generating structure (P), is used in the actinic-ray- or radiation-sensitive resin composition of the present invention, a single type of acid generator can be used alone, or two or more types of acid generators can be used in combination. The content of acid generator(s) in the composition, based on the total solids of the composition of the present invention, is preferably in the range of 0 to 20 mass %, more preferably 0 to 10 mass % and further more preferably 0 to 7 mass %. Although these acid generators are not essential components in the present invention, they are generally used in an amount of 0.01 mass % or more in order to attain the effect of the addition thereof.

<Organic Solvent>

The composition of the present invention may contain a solvent. The solvent is not limited as long as it can be used in the preparation of an actinic-ray- or radiation-sensitive resin composition through dissolution of the above-mentioned components. As the solvent, there can be mentioned, for example, an organic solvent, such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate or an alkyl pyruvate.

As preferred alkylene glycol monoalkyl ether carboxylates, there can be mentioned, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

As preferred alkylene glycol monoalkyl ethers, there can be mentioned, for example, propylene glycol monomethyl ether, propylene glycol monoethyl ether, propylene glycol monopropyl ether, propylene glycol monobutyl ether, ethylene glycol monomethyl ether and ethylene glycol monoethyl ether.

As preferred alkyl lactates, there can be mentioned, for example, methyl lactate, ethyl lactate, propyl lactate and butyl lactate.

As preferred alkyl alkoxypropionates, there can be mentioned, for example, ethyl 3-ethoxypropionate, methyl 3-methoxypropionate, methyl 3-ethoxypropionate and ethyl 3-methoxypropionate.

As preferred cyclolactones, there can be mentioned, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

As preferred optionally cyclized monoketone compounds, there can be mentioned, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

As preferred alkylene carbonates, there can be mentioned, for example, propylene carbonate, vinylene carbonate, ethylene carbonate and butylene carbonate.

As preferred alkyl alkoxyacetates, there can be mentioned, for example, acetic acid 2-methoxyethyl ester, acetic acid 2-ethoxyethyl ester, acetic acid 2-(2-ethoxyethoxy)ethyl ester, acetic acid 3-methoxy-3-methylbutyl ester and acetic acid 1-methoxy-2-propyl ester.

As preferred alkyl pyruvates, there can be mentioned, for example, methyl pyruvate, ethyl pyruvate and propyl pyruvate.

As a preferably employable solvent, there can be mentioned 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, ethyl 3-ethoxypropionate, ethyl pyruvate, acetic acid 2-ethoxyethyl ester, acetic acid 2-(2-ethoxyethoxy)ethyl ester or propylene carbonate. Especially preferred solvents are propylene glycol monomethyl ether acetate and propylene glycol monomethyl ether.

In the present invention, these solvents may be used either individually or in combination.

It is preferred for the actinic-ray- or radiation-sensitive resin composition of the present invention to contain a solvent having a boiling point of 150° C. or below measured under ordinary pressure (760 mmHg).

A single type of such a solvent can be used alone, or two or more types of such solvents can be used in combination. Also, these solvents may be used in combination with a solvent having a boiling point of over 150° C. measured under ordinary pressure. In the composition of the present invention, the content of solvent having a boiling point of 150° C. or below is preferably 50 mass % or greater, more preferably 65 mass % or greater and most preferably 70 to 100 mass % based on the total amount of solvents.

With respect to the solvent having a boiling point of 150° C. or below, the boiling point is preferably in the range of 50 to 150° C., more preferably 80 to 150° C.

It is preferred for the solvent having a boiling point of 150° C. or below to be an organic solvent. The organic solvent can be selected from among, for example, an alkylene glycol monoalkyl ether carboxylate, an alkylene glycol monoalkyl ether, an alkyl lactate, an alkyl alkoxypropionate, a cyclolactone, an optionally cyclized monoketone compound, an alkylene carbonate, an alkyl alkoxyacetate, an alkyl pyruvate and the like.

For example, solvents having a boiling point of 150° C. or below measured under ordinary pressure are selected from among the following solvents, and a single type thereof can be used alone, or two or more types thereof can be used in combination. Also, these solvents can be used in combination with a solvent having a boiling point of over 150° C. measured under ordinary pressure.

As preferred alkylene glycol monoalkyl ether carboxylates, there can be mentioned, for example, propylene glycol monomethyl ether acetate (PGMEA: 1-methoxy-2-acetoxypropane) (b.p.=146° C.), propylene glycol monoethyl ether acetate (b.p.=164-165° C.), propylene glycol monopropyl ether acetate (b.p.=173-174° C./740 mmHg), ethylene glycol monomethyl ether acetate (b.p.=143° C.) and ethylene glycol monoethyl ether acetate (b.p.=156° C.)

As preferred alkylene glycol monoalkyl ethers, there can be mentioned, for example, propylene glycol monomethyl ether (PGME: 1-methoxy-2-propanol) (b.p.=119° C.), propylene glycol monoethyl ether (b.p.=130-131° C.), propylene glycol monopropyl ether (b.p.=148° C.), propylene glycol monobutyl ether (b.p.=169-170° C.), ethylene glycol monomethyl ether (b.p.=124-125° C.) and ethylene glycol monoethyl ether (b.p.=134-135° C.).

As preferred alkyl lactates, there can be mentioned, for example, methyl lactate (b.p.=145° C.), ethyl lactate (b.p.=154° C.), propyl lactate (b.p.=169-172° C.) and butyl lactate (b.p.=185-187° C.).

As preferred alkyl alkoxypropionates, there can be mentioned, for example, ethyl 3-ethoxypropionate (b.p.=169-170° C.), methyl 3-methoxypropionate (b.p.=138-141° C.) and ethyl 3-methoxypropionate (b.p.=156-158° C.)

As preferred cyclolactones, there can be mentioned, for example, β-propiolactone (b.p.=162° C.), β-butyrolactone (b.p.=71-73° C./29 mmHg), γ-butyrolactone (b.p.=204-205° C.), α-methyl-γ-butyrolactone (b.p.=78-81° C./10 mmHg), β-methyl-γ-butyrolactone (b.p.=87-88° C./10 mmHg), γ-valerolactone (b.p.=82-85° C./10 mmHg), γ-caprolactone (b.p.=219° C.), γ-octanoic lactone (b.p.=234° C.) and α-hydroxy-γ-butyrolactone (b.p.=133° C./10 mmHg).

As preferred optionally cyclized monoketone compounds, there can be mentioned, for example, 2-butanone (b.p.=80° C.), 3-methylbutanone (b.p.=94-95° C.), pinacolone (b.p.=106° C.), 2-pentanone (b.p.=101-105° C.), 3-pentanone (b.p.=102° C.), 3-methyl-2-pentanone (b.p.=118° C.), 4-methyl-2-pentanone (b.p.=117-118° C.), 2-methyl-3-pentanone (b.p.=113° C.), 4,4-dimethyl-2-pentanone (b.p.=125-130° C.), 2,4-dimethyl-3-pentanone (b.p.=124° C.), 2,2,4,4-tetramethyl-3-pentanone (b.p.=152-153° C.), 2-hexanone (b.p.=127° C.), 3-hexanone (b.p.=123° C.), 5-methyl-2-hexanone (b.p.=145° C.), 2-heptanone (b.p.=149-150° C.), 3-heptanone (b.p.=146-148° C.), 4-heptanone (b.p.=145° C.), 2-methyl-3-heptanone (b.p.=158-160° C.), 5-methyl-3-heptanone (b.p.=161-162° C.), 2,6-dimethyl-4-heptanone (b.p.=165-170° C.), 2-octanone (b.p.=173° C.), 3-octanone (b.p.=167-168° C.), 2-nonanone (b.p.=192° C./743 mmHg), 3-nonanone (b.p.=187-188° C.), 5-nonanone (b.p.=186-187° C.), 2-decanone (b.p.=211° C.), 3-decanone (b.p.=204-205° C.), 4-decanone (b.p.=206-207° C.), 5-hexen-2-one (b.p.=128-129° C.), 3-penten-2-one (b.p.=121-124° C.), cyclopentanone (b.p.=130-131° C.), 2-methylcyclopentanone (b.p.=139° C.), 3-methylcyclopentanone (b.p.=145° C.), 2,2-dimethylcyclopentanone (b.p.=143-145° C.), 2,4,4-trimethylcyclopentanone (b.p.=160° C.), cyclohexanone (b.p.=157° C.), 3-methylcyclohexanone (b.p.=169-170° C.), 4-methylcyclohexanone (b.p.=169-171° C.), 4-ethylcyclohexanone (b.p.=192-194° C.), 2,2-dimethylcyclohexanone (b.p.=169-170° C.), 2,6-dimethylcyclohexanone (b.p.=174-176° C.), 2,2,6-trimethylcyclohexanone (b.p.=178-179° C.), cycloheptanone (b.p.=179° C.), 2-methylcycloheptanone (b.p.=182-185° C.) and 3-methylcycloheptanone (b.p.=100° C./40 mmHg).

As preferred alkylene carbonates, there can be mentioned, for example, propylene carbonate (b.p.=240° C.), vinylene carbonate (b.p.=162° C.), ethylene carbonate (b.p.=243-244° C./740 mmHg) and butylene carbonate (b.p.=88° C./0.8 mmHg).

As preferred alkyl alkoxyacetates, there can be mentioned, for example, acetic acid 2-methoxyethyl ester (b.p.=145° C.), acetic acid 2-ethoxyethyl ester (b.p.=155-156° C.), acetic acid 2-(2-ethoxyethoxy)ethyl ester (b.p.=219° C.) and acetic acid 1-methoxy-2-propyl ester (b.p.=145-146° C.).

As preferred alkyl pyruvates, there can be mentioned, for example, methyl pyruvate (b.p.=134-137° C.), ethyl pyruvate (b.p.=144° C.) and propyl pyruvate (b.p.=166° C.).

As a preferably employable solvent, there can be mentioned 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, ethyl 3-ethoxypropionate, ethyl pyruvate, acetic acid 2-ethoxyethyl ester, acetic acid 2-(2-ethoxyethoxy)ethyl ester or propylene carbonate. A solvent having a boiling point of 150° C. or below measured under ordinary pressure, such as 2-heptanone, propylene glycol monomethyl ether acetate or propylene glycol monomethyl ether, is especially preferred from the viewpoint of outgas reduction.

The ratio of solvents (including all solvents no matter whether or not the boiling point is 150° C. or higher) used to the total mass of the composition of the present invention can be appropriately regulated in accordance with desired film thickness, etc. Generally, the ratio is regulated so that the concentration of the total solids of the composition falls within the range of 0.5 to 30 mass %, preferably 1.0 to 20 mass % and more preferably 1.5 to 10 mass %.

<Surfactant>.

Preferably, the actinic-ray- or radiation-sensitive resin composition of the present invention further contains a surfactant. The surfactant is preferably a fluorinated and/or siliconized surfactant.

As such a surfactant, there can be mentioned Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., polysiloxane polymer KP-341 produced by Shin-Etsu Chemical Co., Ltd., or the like.

Surfactants other than these fluorinated and/or siliconized surfactants can also be used. In particular, the other surfactants include polyoxyethylene alkyl ethers, polyoxyethylene alkyl aryl ethers and the like.

Moreover, generally known surfactants can also be appropriately used. As useful surfactants, there can be mentioned, for example, those described in section [0273] et seq of US 2008/0248425 A1.

These surfactants may be used alone or in combination.

The amount of surfactant added is preferably in the range of 0.0001 to 2 mass %, more preferably 0.001 to 1 mass %, based on the total solids of the composition.

<Acid-Decomposable Dissolution Inhibiting Compound>

The actinic-ray- or radiation-sensitive resin composition of the present invention may contain a dissolution inhibiting compound of 3000 or less molecular weight that is decomposed by the action of an acid to thereby increase the solubility in an alkali developer (hereinafter referred to as "dissolution inhibiting compound").

The dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure are the same as described with respect to the acid-decomposable resin mentioned above.

When the actinic-ray- or radiation-sensitive resin composition of the present invention is irradiated with electron beams or EUV light, preferred use is made of one having a structure resulting from substitution of the phenolic hydroxyl group of a phenol compound with an acid-decomposable group. The phenol compound preferably contains 1 to 9 phenol skeletons, more preferably 2 to 6 phenol skeletons.

In the present invention, the molecular weight of each dissolution inhibiting compound is 3000 or less, preferably 300 to 3000 and more preferably 500 to 2500.

<Dye>

Suitable dyes are, for example, an oil dye and a basic dye.

The photosensitizers mentioned below can be added in order to enhance the efficiency of acid generation by exposure.

The compound capable of accelerating the dissolution in a developer that can be employed in the present invention is a low-molecular compound of 1000 or less molecular weight having either two or more phenolic OH groups or one or more carboxyl groups. When a carboxyl group is contained, an alicyclic or aliphatic compound is preferred. As the phenolic compound of 1000 or less molecular weight, there can be mentioned, for example, those described in JP-A's H4-122938 and H2-28531, U.S. Pat. No. 4,916,210 and EP 219294.

Moreover, the compounds having a functional group as a proton acceptor described in, for example, JP-A's 2006-208781 and 2007-286574 can also be appropriately used in the composition of the present invention.

<Method of Forming Pattern>

The actinic-ray- or radiation-sensitive resin composition of the present invention is applied to a support, such as a substrate, thereby forming a film. The thikness of thus obtained resist film is preferably in the range of 0.02 to 0.1 μm.

The application to the substrate is preferably carried out by a spin coating method. The rotating speed of spin coating is preferably in the range of 1000 to 3000 rpm.

For example, the actinic-ray- or radiation-sensitive resin composition is applied to a substrate (e.g., silicon, silicon/silicon dioxide coating, silicon nitride, quartz substrate with a Cr layer, or the like) for use in the production of precision integrated circuit elements, photomasks, imprint molds, etc. by appropriate application means, such as a spinner or a coater. The thus applied composition is dried, thereby forming a film. The application of the composition to the substrate can be preceded by the application of a heretofore known antireflection film.

The resultant film is exposed to actinic rays or radiation, preferably electron beams (EB), X-rays or EUV light, preferably baked (heated), and developed. Thus, a desirable pattern can be obtained.

In the development step, an alkali developer is usually employed. As the alkali developer for the composition of the present invention, use can be made of any of alkaline aqueous solutions of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, a cycloamine such as pyrrole or piperidine, or the like.

Before the use of the above alkali developer, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

With respect to the particulars of the fabrication of an imprint mold structure using the composition of the present invention, reference can be made to, for example, "Fundamentals of nanoimprint and its technology development/application deployment technology of nanoimprint substrate and its latest technology deployment" edited by Yoshihiko Hirai, published by Frontier Publishing (issued in June, 2006), Japanese Patent No. 4109085 and JPA-2008-162101.

EXAMPLE

The present invention will be described in greater detail below with reference to Examples, which however in no way limit the subject matter of the present invention.

<Synthesis of Monomer>

Synthetic Example 1

Synthesis of Monomer M-I-1

First, 12.64 parts by mass of 4-hydroxybenzoic acid was dissolved in 200 parts by mass of N-methyl-2-pyrrolidone (NMP), and 13.92 parts by mass of diaza(1,3)bicyclo[5.4.0]undecane (DBU) was added to the solution. In a nitrogen stream, the mixture was cooled to 0° C. Subsequently, 100 parts by mass of NMP solution having 30 parts by mass of 1,12-dibromoundecane dissolved therein was dropped into the cooled mixture over a period of 15 minutes. The mixture was agitated at 0° C. for two hours and further at 50° C. for four hours. Ethyl acetate was added, and the resultant organic phase was sequentially washed with a saturated aqueous sodium hydrogen carbonate solution and water. The washed organic phase was dried over sodium sulfate, and the solvent was evaporated off. The thus obtained residue was purified by silica gel column chromatography (Vol. ratio of hexane/ethyl acetate=2/1), thereby obtaining 20.0 parts by mass of oily 12-bromododecyl 4-hydroxybenzoate.

Next, 9.24 parts by mass of obtained oil and 7.58 parts by mass of 1,1,2,2,3,3-hexafluoropropane-1,3-disulfonyl difluoride were dissolved in 200 parts by mass of acetonitrile, and cooled to 0° C. Into the cooled solution, 100 parts by mass of an acetonitrile solution having 3.66 parts by mass of DBU dissolved therein was dropped over a period of 30 minutes. The mixture was agitated at 0° C. for an hour and further at room temperature for three hours. Ethyl acetate was added, and the resultant organic phase was sequentially washed with a saturated aqueous sodium hydrogen carbonate solution and water. The washed organic phase was dried over sodium sulfate, and the solvent was evaporated off. The thus obtained transparent oil residue was dissolved in a mixed solution consisting of 200 parts by mass of methanol and 100 parts by mass of acetone, and 20 parts by mass of solid sodium hydrogen carbonate was added to the solution. The mixture was agitated at 40° C. for five hours. Ethyl acetate was added, and the resultant organic phase was sequentially washed with a saturated aqueous sodium chloride solution and water. The washed organic phase was dried over sodium sulfate, and the residue was recrystallized from hexane, thereby obtaining 10.2 parts by mass of white solid.

Then, 6.0 parts by mass of obtained white solid was dissolved in 200 parts by mass of acetonitrile, and 1.62 parts by mass of methacrylic acid, 2.88 parts by mass of DBU and 100 parts by mass of methanol were sequentially added to the solution. In a nitrogen stream, the mixture was agitated at 70° C. for three hours. Ethyl acetate was added, and the resultant organic phase was sequentially washed with a saturated aqueous sodium hydrogen carbonate solution and water. The washed organic phase was dried over sodium sulfate, and the solvent was evaporated off. Thus, a light-brown solid was obtained.

Finally, 7.28 parts by mass of obtained light-brown solid was dissolved in 100 parts by mass of methanol, and 3.54 parts by mass of triphenylsulfonium bromide was added to the solution. The mixture was agitated at room temperature for three hours. Chloroform was added, and the resultant organic phase was washed with water. The solvent was evaporated off, thereby obtaining 8.3 parts by mass of transparent oily compound (M-I-1).

Synthetic Example 2

Synthesis of Monomer M-II-2

First, 100.00 parts by mass of p-acetoxystyrene was dissolved in 400 parts by mass of ethyl acetate and cooled to 0° C., and 47.60 parts by mass of sodium methoxide (28% methanol solution) was dropped into the cooled solution over a period of 30 minutes. The mixture was agitated at room temperature for five hours. Ethyl acetate was added, and the resultant organic phase was washed with distilled water three times. The washed organic phase was dried over sodium sulfate, and the solvent was distilled off, thereby obtaining 131.70 parts by mass of p-hydroxystyrene (54% ethyl acetate solution).

Next, 18.52 parts by mass of p-hydroxystyrene (54% ethyl acetate solution) was dissolved in 56.00 parts by mass of ethyl acetate, and 31.58 parts by mass of 1,1,2,2,3,3-hexafluoropropane-1,3-disulfonyl difluoride was added to the solution and cooled to 0° C. A liquid obtained by dissolving 12.63 parts by mass of triethylamine in 25.00 parts by mass of ethyl acetate was dropped into the cooled mixture over a period of 30 minutes and, while maintaining the temperature at 0° C., agitated for four hours. Ethyl acetate was added, and the resultant organic phase was washed with a saturated aqueous sodium chloride solution three times. The washed organic phase was dried over anhydrous sodium sulfate, and the solvent was distilled off, thereby obtaining 32.90 parts by mass of compound A.

Thereafter, 35.00 parts by mass of compound A was dissolved in 315 parts by mass of methanol and cooled to 0° C., and 245 parts by mass of a 1N aqueous sodium hydroxide solution was added. The mixture was agitated at room temperature for two hours, and the solvent was distilled off. Ethyl acetate was added, and the resultant organic phase was washed with a saturated aqueous sodium chloride solution three times. The washed organic phase was dried over anhydrous sodium sulfate, and the solvent was distilled off, thereby obtaining 34.46 parts by mass of compound B.

Finally, 28.25 parts by mass of obtained compound B was dissolved in 254.25 parts by mass of methanol, and 23.34 parts by mass of triphenylsulfonium bromide was added to the solution. The mixture was agitated at room temperature for three hours. The solvent was distilled off, and distilled water was added to the residue and extracted with chloroform three times. The thus obtained organic phase was washed with distilled water three times. The solvent was distilled off, thereby obtaining 42.07 parts by mass of desired compound (M-II-2).

Synthetic Example 3

Synthesis of Monomer M-III-7

First, 13.9 parts by mass of N-(4-hydroxyphenylethyl) methacrylamide and 21.4 parts by mass of 1,1,2,2,3,3-hexafluoropropane-1,3-disulfonyl difluoride were dissolved in 160 parts by mass of THF, and 160 parts by mass of triethylamine was added to the solution. The mixture was agitated at 50° C. for two hours, and 11.12 parts by mass of trifluoromethanesulfonamide was added. The mixture was further agitated at 80° C. for four hours. Ethyl acetate was added, and the resultant organic phase was sequentially washed with dilute hydrochloric acid and water. The washed organic phase was dried over sodium sulfate.

The solvent was evaporated off, and the residual brown oil was dissolved in 400 parts by mass of methanol. To the solution, 20 parts by mass of solid sodium hydrogen carbonate was added, and agitated at 50° C. for four hours. Ethyl acetate was added, and the resultant organic phase was sequentially washed with a saturated aqueous sodium chloride solution and water. The washed organic phase was dried over sodium sulfate, thereby obtaining 24.5 parts by mass of, in the form of a brown oil, N-(trifluoromethanesulfonyl)-1,1,2,2,3,3-hexafluoro-3-((4-(2-(methacrylamido)ethyl)phenoxy)sulfonyl)-1-propanesulfonamide sodium salt. Then, 24.4 parts by mass of obtained brown oil was dissolved in 200 parts by mass of methanol, and 12.86 parts by mass of triphenylsulfonium bromide was added to the solution. The mixture was agitated at room temperature for three hours. Chloroform amounting to 400 parts by mass was added, and the resultant organic phase was washed with water. The solvent was evaporated off, thereby obtaining 27.9 parts by mass of brown transparent oily compound (M-III-7).

Other compounds of general formulae (I) to (III), namely, M-I-13, M-I-2, M-I-63, M-I-83, M-I-86, M-II-83, M-II-7, M-II-33, M-II-66, M-II-88, M-III-9, M-III-28, M-III-48, M-III-65 and M-III-87 were also synthesized in the same manner as described above.

(M-I-1)

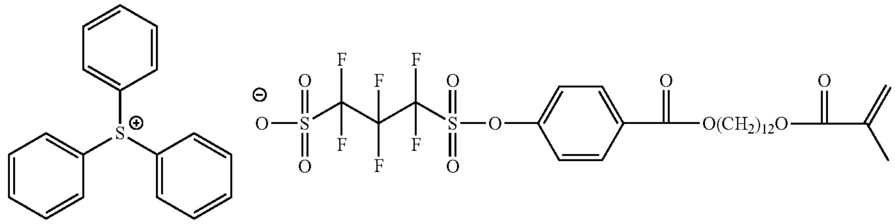

-continued
(M-I-13)
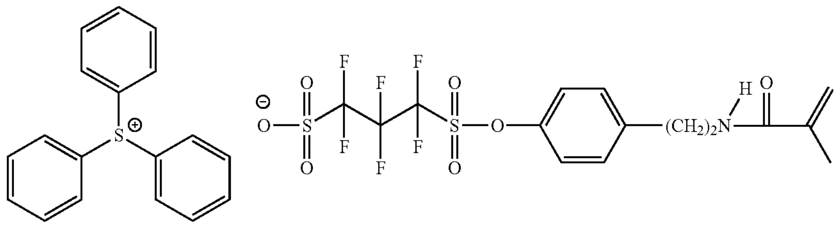
(M-I-2)
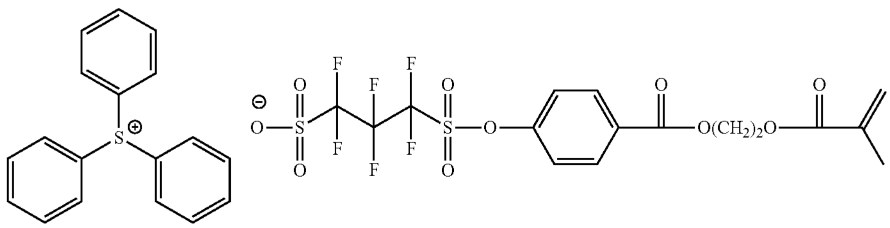
(M-I-63)
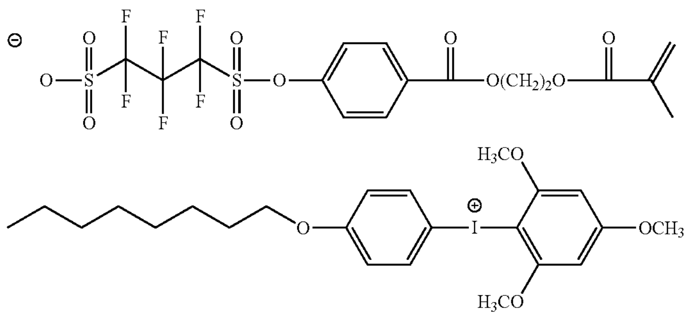
(M-I-83)
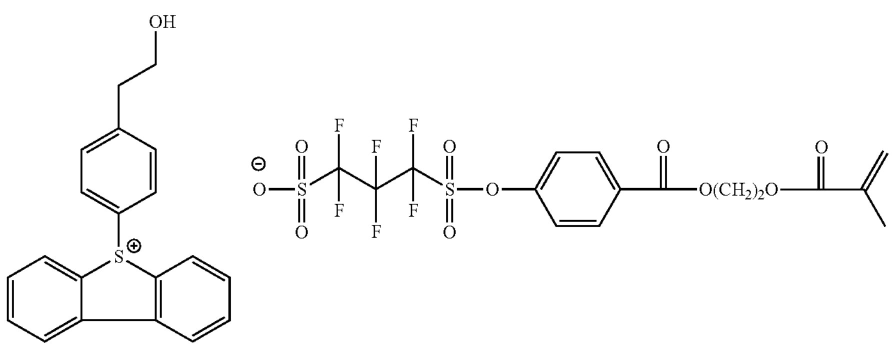
(M-I-86)
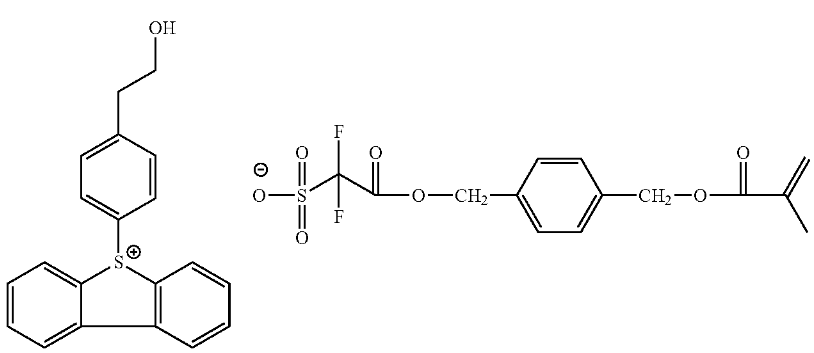

-continued
(M-II-2)
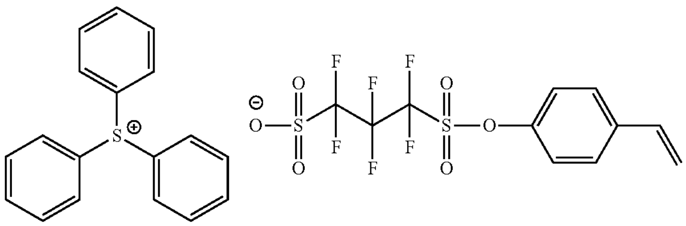
(M-II-83)
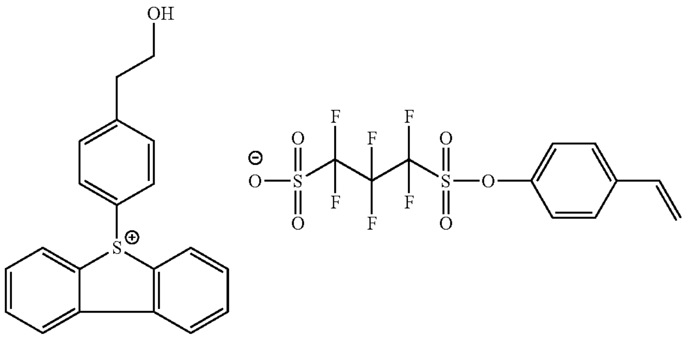
(M-II-7)
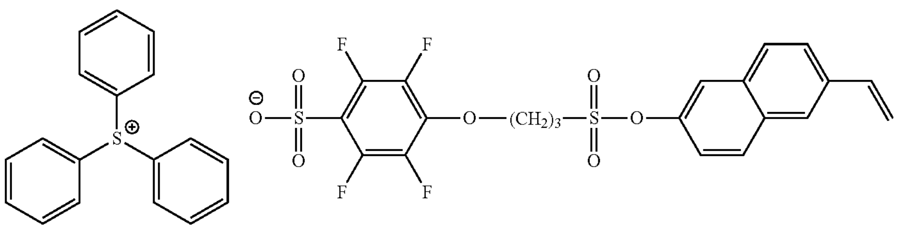
(M-II-33)
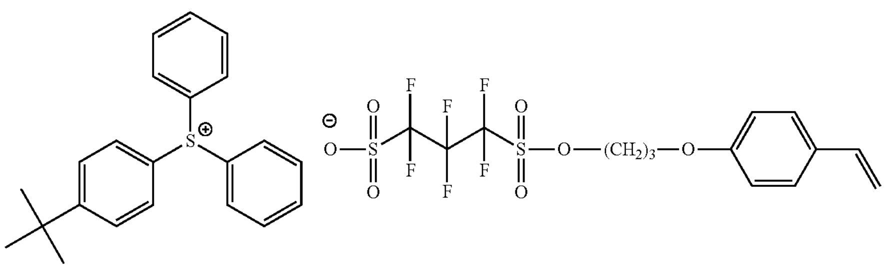
(M-II-66)
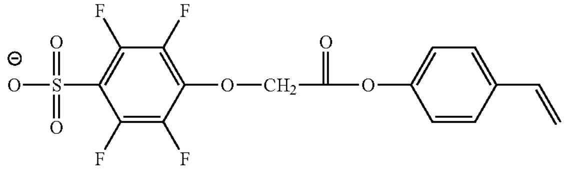
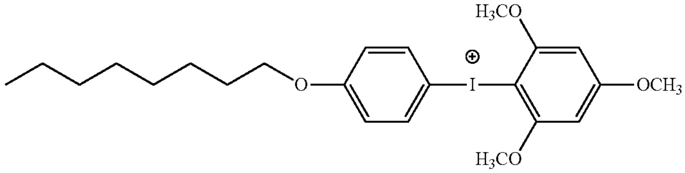

-continued
(M-II-88)
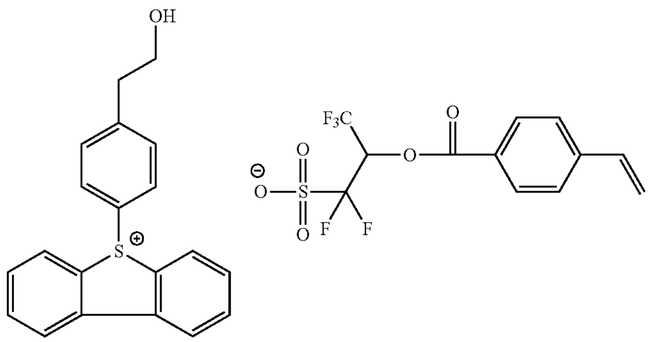
(M-III-7)
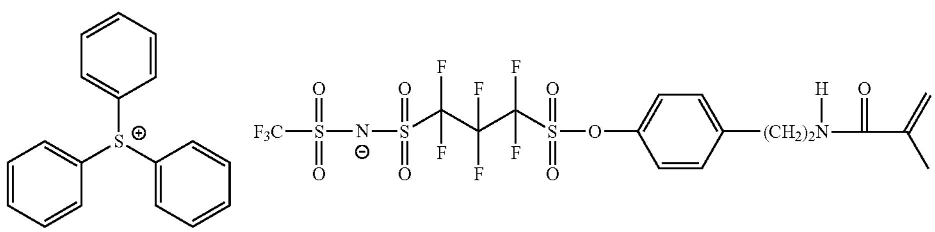
(M-III-28)
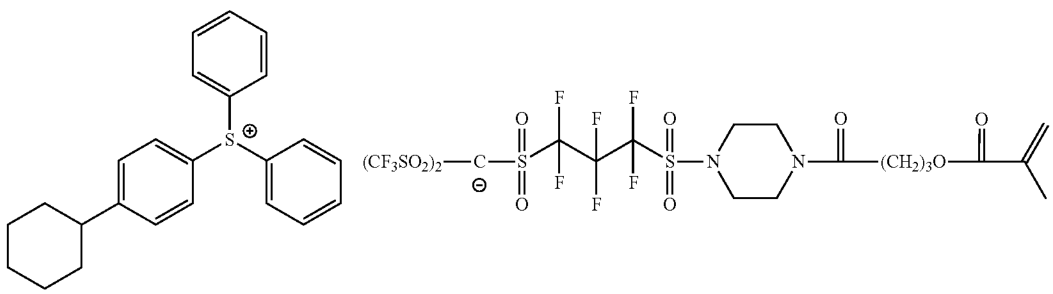
(M-III-9)
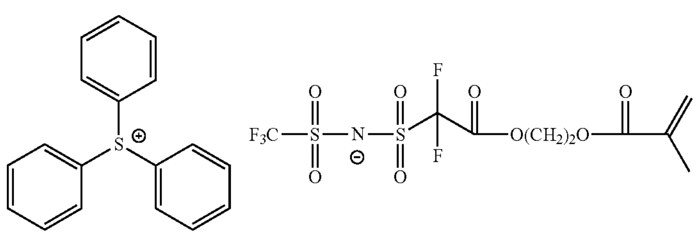
(M-III-48)
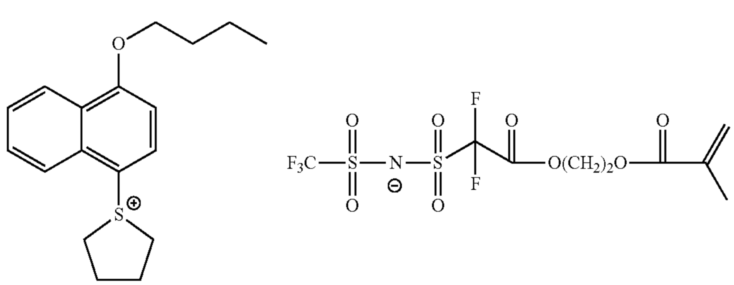
(M-III-65)
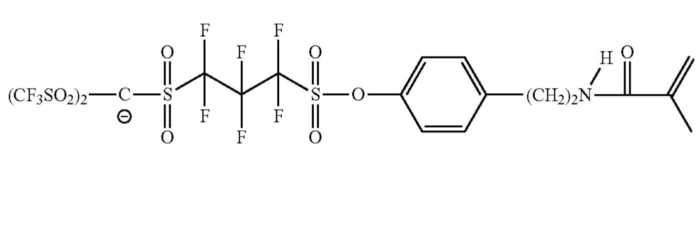

-continued

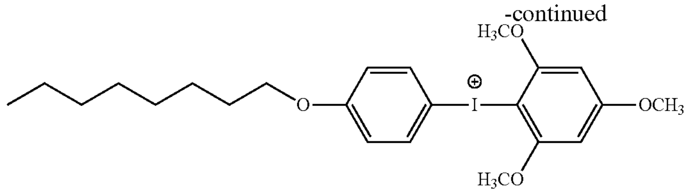

(M-III-87)

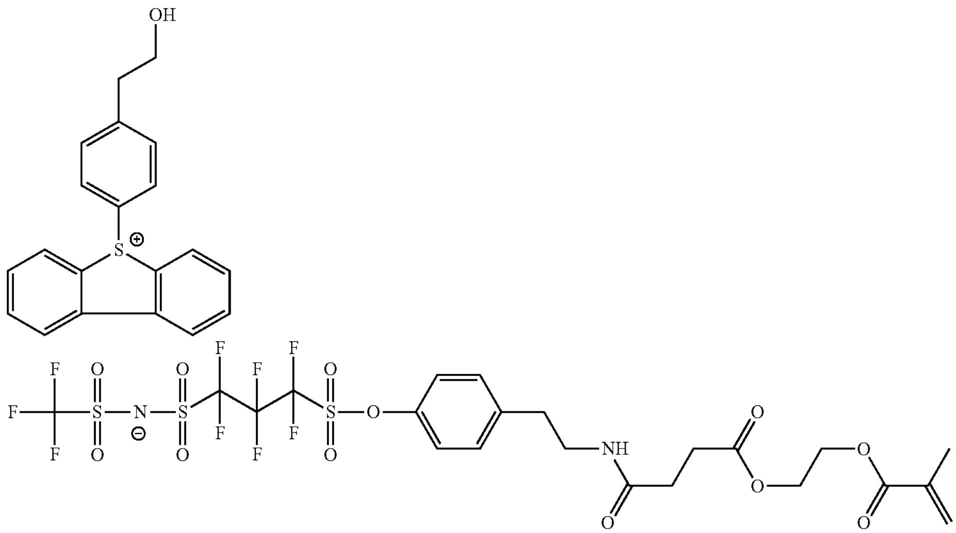

Synthesis of Resin (P)

Synthetic Example 1

Synthesis of Resin P-1

In a nitrogen stream, 9.3 parts by mass of 1-methoxy-2-propanol was heated at 80° C. While agitating the same, a mixed solution consisting of 4.01 parts by mass of monomer M-I-1 obtained in Synthetic Example 1 above, 9.05 parts by mass of 4-hydroxyphenyl methacrylate, 6.94 parts by mass of 4-tert-butoxyphenyl methacrylate, 37.3 parts by mass of 1-methoxy-2-propanol and 1.95 parts by mass (10 mol % based on the monomers) of dimethyl 2,2'-azobisisobutyrate (V601 produced by Wako Pure Chemical Industries, Ltd.) was dropped thereinto over a period of two hours. After the completion of the dropping, the mixture was further agitated at 80° C. for four hours. The thus obtained reaction liquid was allowed to stand still to cool, and the cooled reaction liquid was recrystallized from a large volume of hexane/ethyl acetate and dried in vacuum, thereby obtaining 13.2 parts by mass of resin P-1 according to the present invention.

The weight average molecular weight (Mw: in terms of standard polystyrene molecular weight) of the obtained resin as determined by GPC (carrier: N-methyl-2-pyrrolidone (NMP)) was 5900, and the dispersity (Mw/Mn) thereof was 1.66.

Resins P-2 to P-30 were synthesized in the same manner as described above. With respect to each of the syntheses, the employed monomer structures, component ratios, weight average molecular weight and dispersity are listed in Table given below.

TABLE 2

| Resin | Monomer A | Monomer B | Monomer B | Monomer C | Monomer D (lactone) |
|---|---|---|---|---|---|
| P-1 | MI-1 | 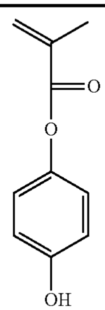 | 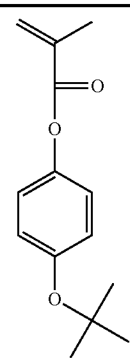 | | |

TABLE 2-continued
| | | | |
|---|---|---|---|
| P-2 | MII-7 | 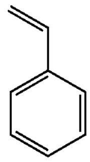 | 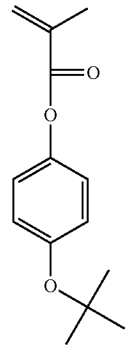 [SMILES: C=C(C)C(=O)Oc1ccc(OC(C)(C)C)cc1] |
| P-3 | MIII-7 | 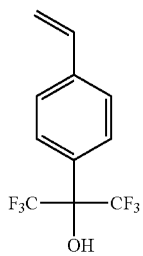 [SMILES: C=Cc1ccc(C(O)(C(F)(F)F)C(F)(F)F)cc1] | 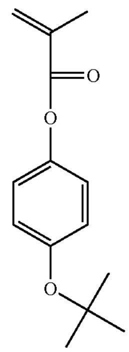 [SMILES: C=C(C)C(=O)Oc1ccc(OC(C)(C)C)cc1] |
| P-4 | MI-13 | 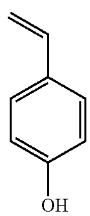 | 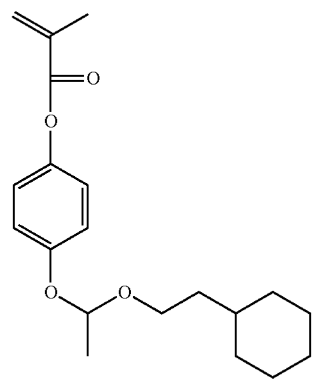 [SMILES: C=C(C)C(=O)Oc1ccc(OC(C)OCCC2CCCCC2)cc1] |
| P-5 | MII-33 | 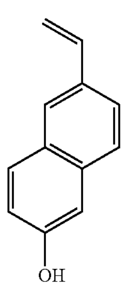 | 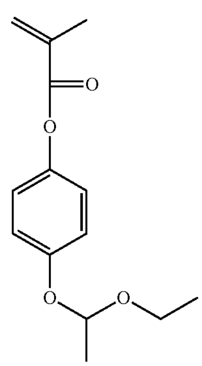 [SMILES: C=C(C)C(=O)Oc1ccc(OC(C)OCC)cc1] |

TABLE 2-continued
| | | | | |
|---|---|---|---|---|
| P-6 | MIII-65 | 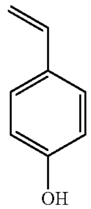 | 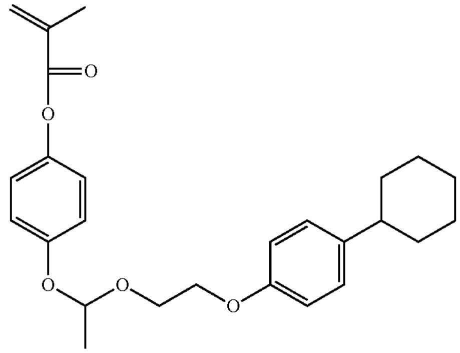 [SMILES: C=C(C)C(=O)Oc1ccc(OC(C)OCCOc2ccc(C3CCCCC3)cc2)cc1] | |
| P-7 | MII-88 | 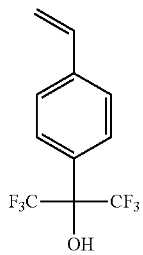 [SMILES: C=Cc1ccc(C(O)(C(F)(F)F)C(F)(F)F)cc1] | | 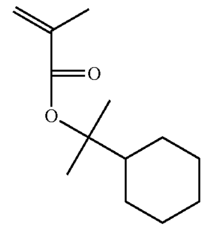 |
| P-8 | MI-86 | 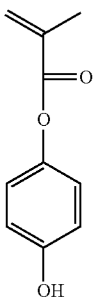 | 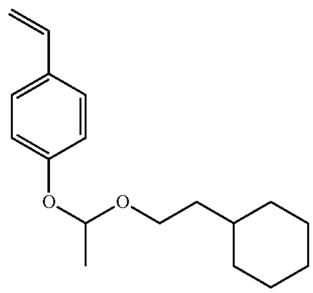 [SMILES: C=Cc1ccc(OC(C)OCCC2CCCCC2)cc1] | |
| P-9 | MIII-87 | 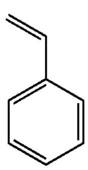 | | 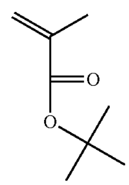 |
| P-10 | MI-83 | 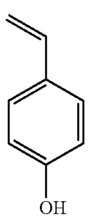 | | 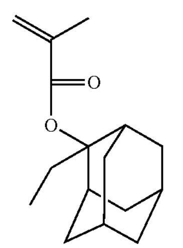 [SMILES: C=C(C)C(=O)OC1(CC)C2CC3CC(C2)CC1C3] |
| Resin | Monomer E | Component ratio (molar ratio) | Mw | Mw/Mn |
|---|---|---|---|---|
| P-1 | | 5/60/35 | 5900 | 1.66 |
| P-2 | 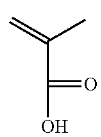 | 10/35/50/5 | 11100 | 1.72 |
| P-3 | | 5/60/35 | 7300 | 1.79 |
| P-4 | | 5/65/30 | 8500 | 1.68 |

TABLE 2-continued
| | | | | |
|---|---|---|---|---|
| P-5 | | 10/55/35 | 6200 | 1.63 |
| P-6 | | 10/50/40 | 7600 | 1.75 |
| P-7 | | 5/60/35 | 9000 | 1.70 |
| P-8 | | 5/60/35 | 5300 | 1.68 |
| P-9 | 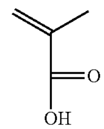 | 5/40/50/5 | 6700 | 1.73 |
| P-10 | | 5/70/25 | 7100 | 1.67 |
| Resin | Monomer A | Monomer B | Monomer B | Monomer B |
|---|---|---|---|---|
| P-11 | MII-2 | 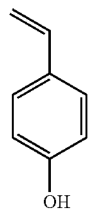 | | |
| P-12 | MII-66 | 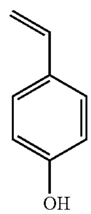 | | 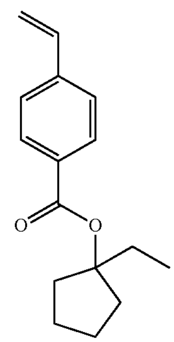 [SMILES: C=Cc1ccc(C(=O)OC2(CC)CCCC2)cc1] |
| P-13 | MIII-48 | 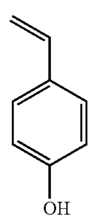 | | 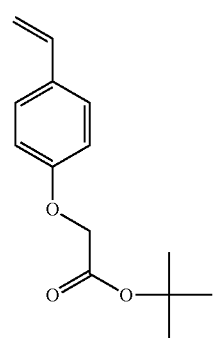 [SMILES: C=Cc1ccc(OCC(=O)OC(C)(C)C)cc1] |
| P-14 | MIII-28 | 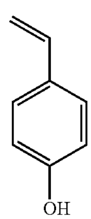 | 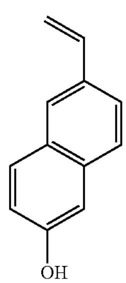 | |

TABLE 2-continued
| | | | | |
|---|---|---|---|---|
| P-15 | MI-63 | 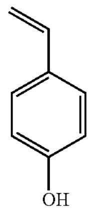 | | 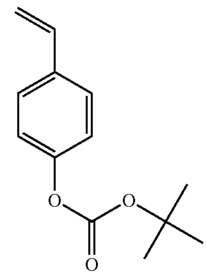 [SMILES: C=Cc1ccc(OC(=O)OC(C)(C)C)cc1] |
| P-16 | MII-2 | 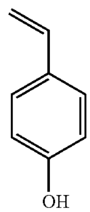 | | 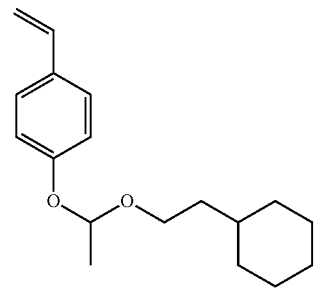 [SMILES: C=Cc1ccc(OC(C)OCCC2CCCCC2)cc1] |
| P-17 | MIII-9 | 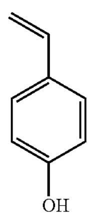 | | 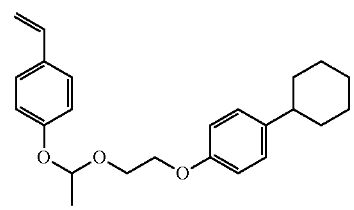 [SMILES: C=Cc1ccc(OC(C)OCCOc2ccc(C3CCCCC3)cc2)cc1] |
| P-18 | MIII-28 | 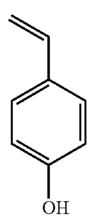 | 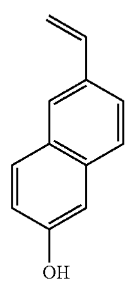 | 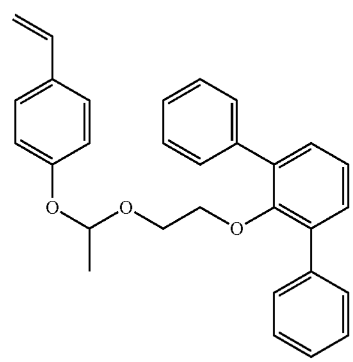 [SMILES: C=Cc1ccc(OC(C)OCCOc2c(-c3ccccc3)cccc2-c2ccccc2)cc1] |
| P-19 | MI-2 | 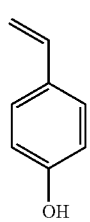 | | |
| P-20 | MII-83 | 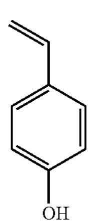 | | |

TABLE 2-continued
| Resin | Monomer C | Monomer D (lactone) | Component ratio (molar ratio) | Mw | Mw/Mn |
|---|---|---|---|---|---|
| P-11 | 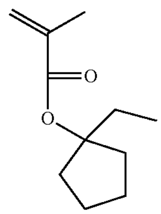 | | 5/65/30 | 4700 | 1.64 |
| P-12 | | | 10/70/20 | 5800 | 1.81 |
| P-13 | | | 5/70/25 | 6200 | 1.73 |
| P-14 | 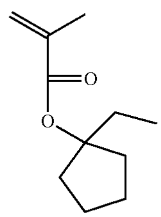 | | 5/50/10/35 | 8500 | 1.68 |
| P-15 | | | 5/60/35 | 7300 | 1.70 |
| P-16 | | | 10/60/30 | 5500 | 1.72 |
| P-17 | | | 5/70/25 | 6900 | 1.65 |
| P-18 | | | 5/50/25/20 | 6400 | 1.75 |
| P-19 | 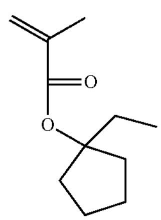 | 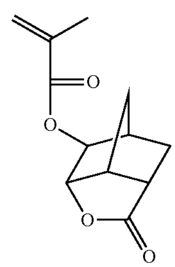 [SMILES: C=C(C)C(=O)OC1C2CC3C(=O)OC1C3C2] | 5/60/25/10 | 7900 | 1.81 |
| P-20 | 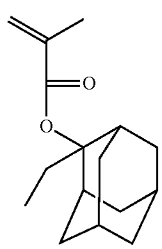 [SMILES: C=C(C)C(=O)OC1(CC)C2CC3CC(C2)CC1C3] | 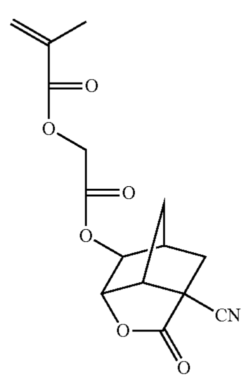 [SMILES: C=C(C)C(=O)OCC(=O)OC1C2CC3C1OC(=O)C3(C#N)C2] | 5/65/20/10 | 7200 | 1.74 |

TABLE 2-continued
| Resin | Monomer A | Monomer B | Monomer B | Monomer B | Monomer C |
|---|---|---|---|---|---|
| P-21 | MIII-9 | 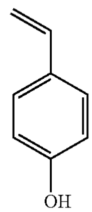 | | 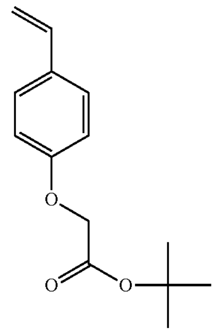 [SMILES: C=Cc1ccc(OCC(=O)OC(C)(C)C)cc1] | |
| P-22 | MII-66 | 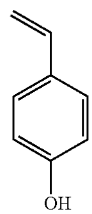 | | 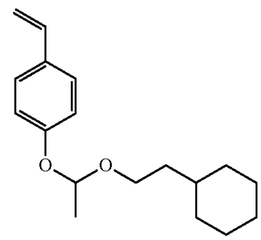 [SMILES: C=Cc1ccc(OC(C)OCCC2CCCCC2)cc1] | |
| P-23 | MIII-28 | 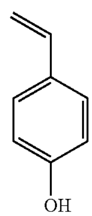 | 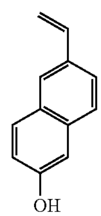 | 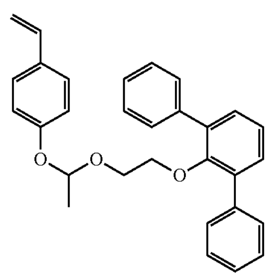 [SMILES: C=Cc1ccc(OC(C)OCCOc2c(-c3ccccc3)cccc2-c2ccccc2)cc1] | |
| P-24 | 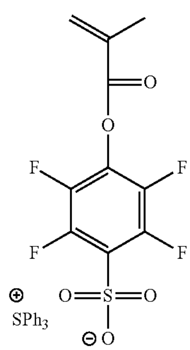 [SMILES: C=C(C)C(=O)Oc1c(F)c(F)c(S(=O)(=O)[O-])c(F)c1F ; "SPh3"] | 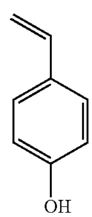 | | | 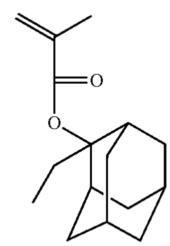 [SMILES: C=C(C)C(=O)OC1(CC)C2CC3CC(C2)CC1C3] |
| P-25 | 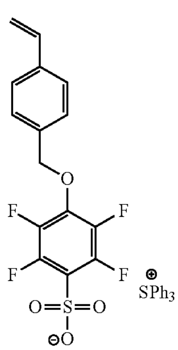 | 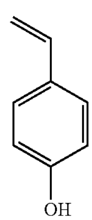 | | | 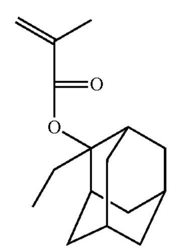 [SMILES: C=C(C)C(=O)OC1(CC)C2CC3CC(C2)CC1C3] |

TABLE 2-continued
| | | |
|---|---|---|
| P-26 | MI-1 | 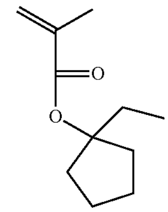 |
| P-27 | MII-2 | 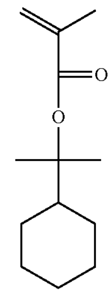 |
| P-28 | MIII-7 | 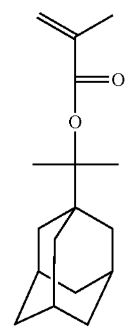 |
| P-29 | 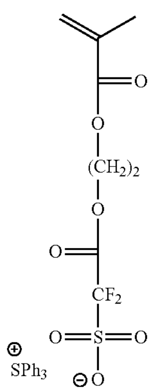 | 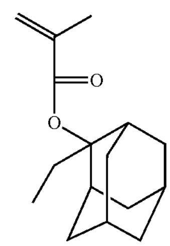 [SMILES: C=C(C)C(=O)OC1(CC)C2CC3CC(C2)CC1C3] |
| P-30 | 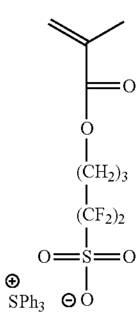 | 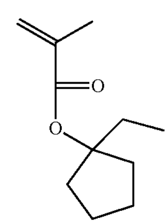 |

TABLE 2-continued
| Resin | Monomer D (lactone) | Monomer E | Component ratio (molar ratio) | Mw | Mw/Mn |
| --- | --- | --- | --- | --- | --- |
| P-21 | 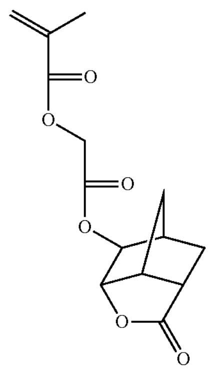 [SMILES: C=C(C)C(=O)OCC(=O)OC1C2CC3C(=O)OC1C3C2] | | 5/65/20/10 | 10200 | 1.69 |
| P-22 | 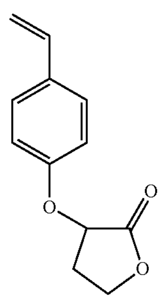 | | 5/60/25/10 | 5600 | 1.75 |
| P-23 | 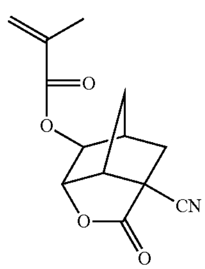 [SMILES: C=C(C)C(=O)OC1C2CC3C1OC(=O)C3(C#N)C2] | | 5/45/20/20/10 | 6700 | 1.73 |
| P-24 | | | 3/47/50 | 5000 | 1.73 |
| P-25 | | | 3/47/50 | 8200 | 1.81 |
| P-26 | 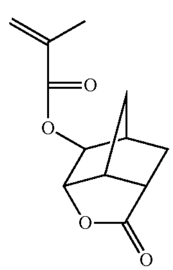 [SMILES: C=C(C)C(=O)OC1C2CC3C(=O)OC1C3C2] | 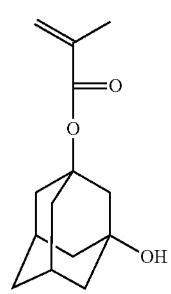 [SMILES: C=C(C)C(=O)OC12CC3CC(CC(O)(C3)C1)C2] | 10/40/35/15 | 4600 | 1.62 |

TABLE 2-continued
| | | | | | |
|---|---|---|---|---|---|
| P-27 | 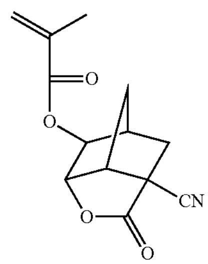 [SMILES: C=C(C)C(=O)OC1C2CC3C1OC(=O)C3(C#N)C2] | 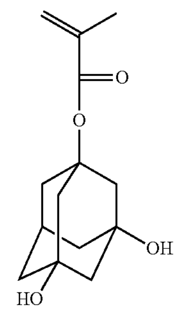 | 5/45/40/10 | 6300 | 1.72 |
| P-28 | 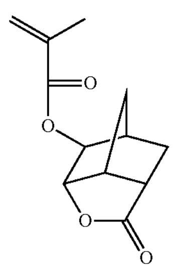 [SMILES: C=C(C)C(=O)OC1C2CC3C(=O)OC1C3C2] | 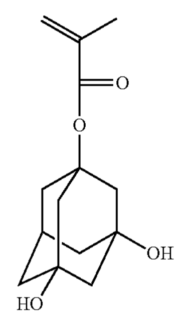 [SMILES: C=C(C)C(=O)OC12CC3CC(O)(CC(O)(C3)C1)C2] | 5/35/40/20 | 5000 | 1.80 |
| P-29 | 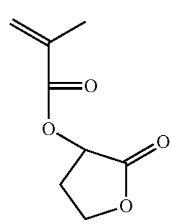 | 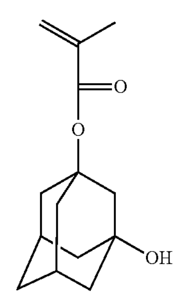 [SMILES: C=C(C)C(=O)OC12CC3CC(CC(O)(C3)C1)C2] | 5/40/20/35 | 5900 | 1.68 |
| P-30 | 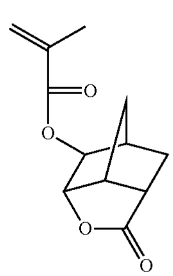 [SMILES: C=C(C)C(=O)OC1C2CC3C(=O)OC1C3C2] | | 3/50/47 | 12300 | 1.85 |

TABLE 2-continued
(P-1)
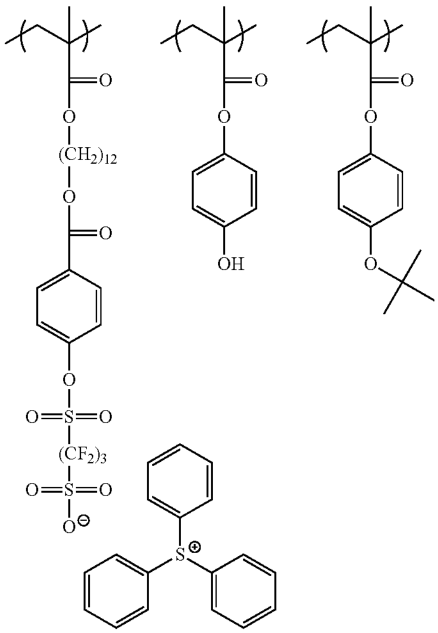
(P-2)
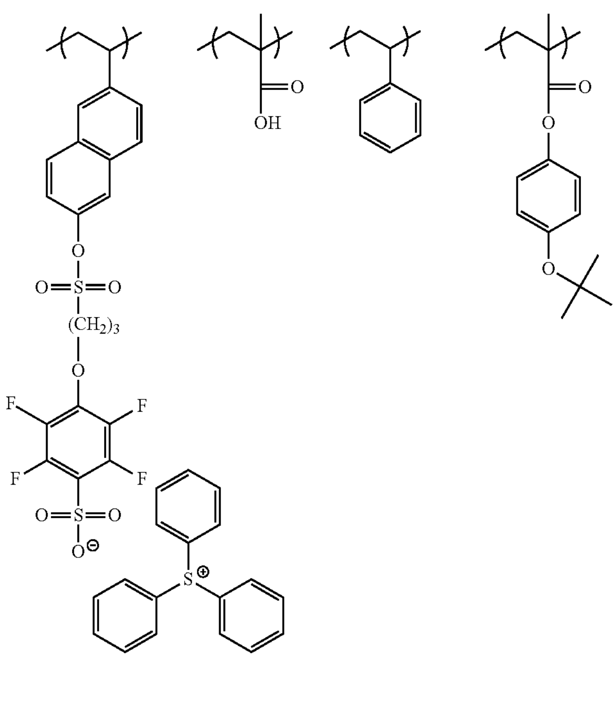

TABLE 2-continued
(P-3)
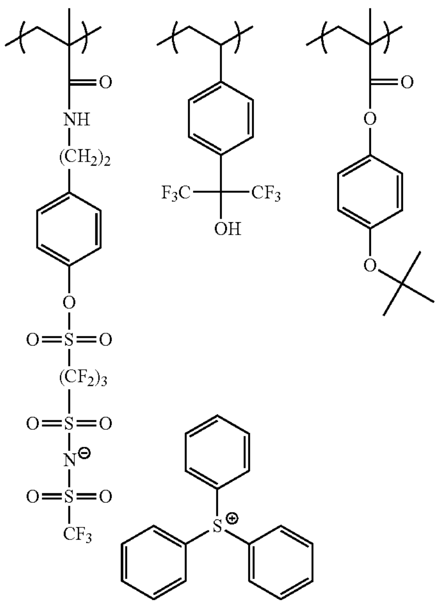
(P-4)
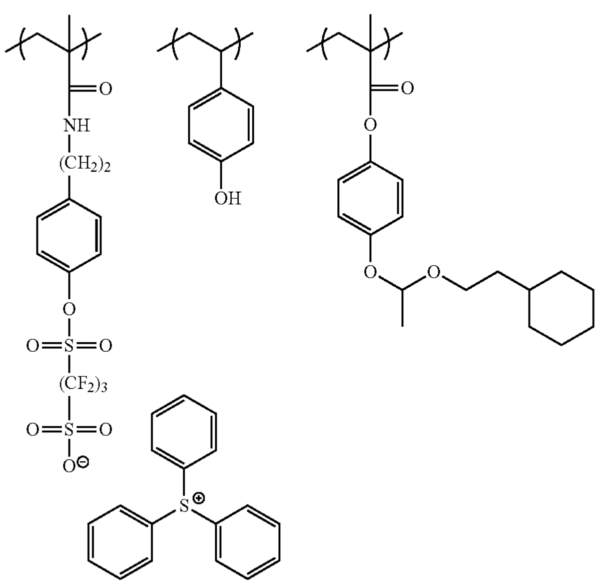

TABLE 2-continued
(P-5)
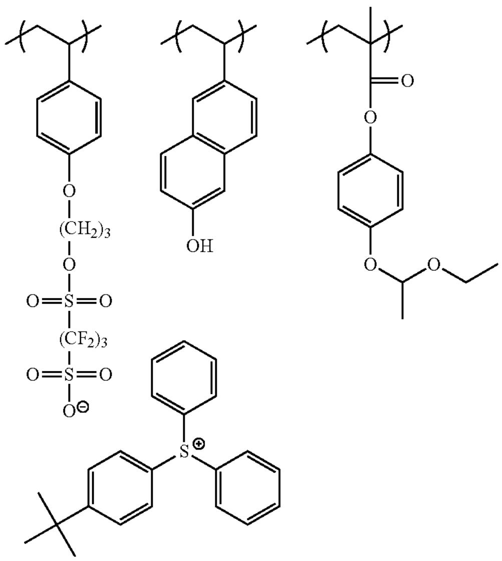
(P-6)
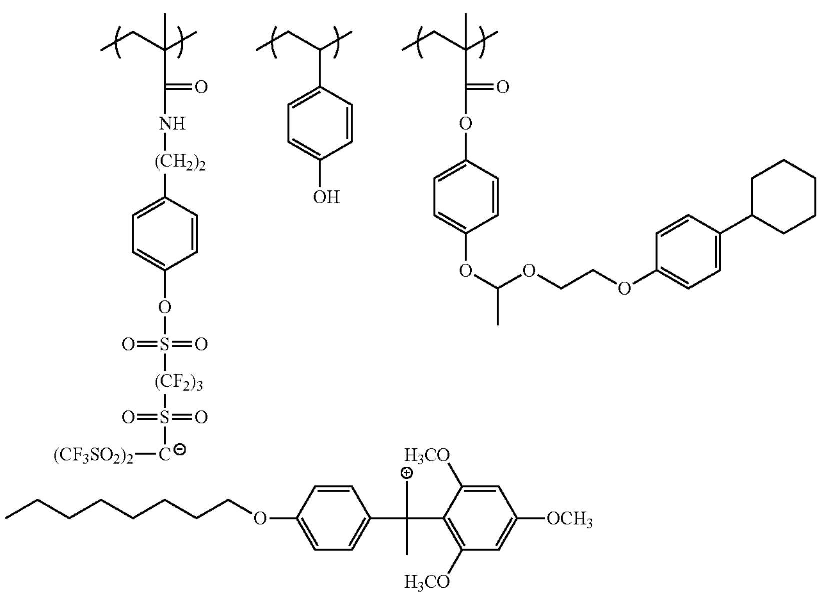

TABLE 2-continued
(P-7)
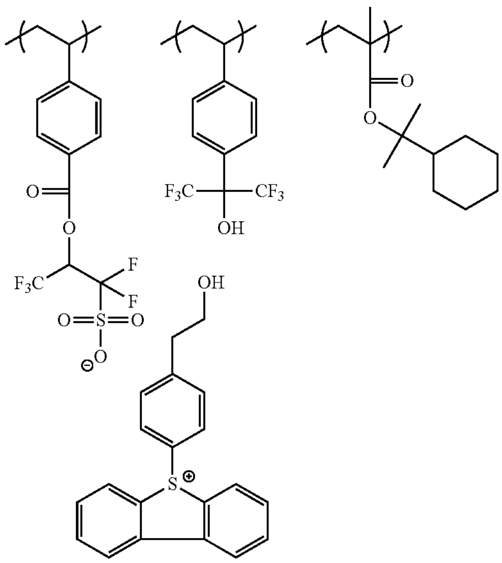
(P-8)
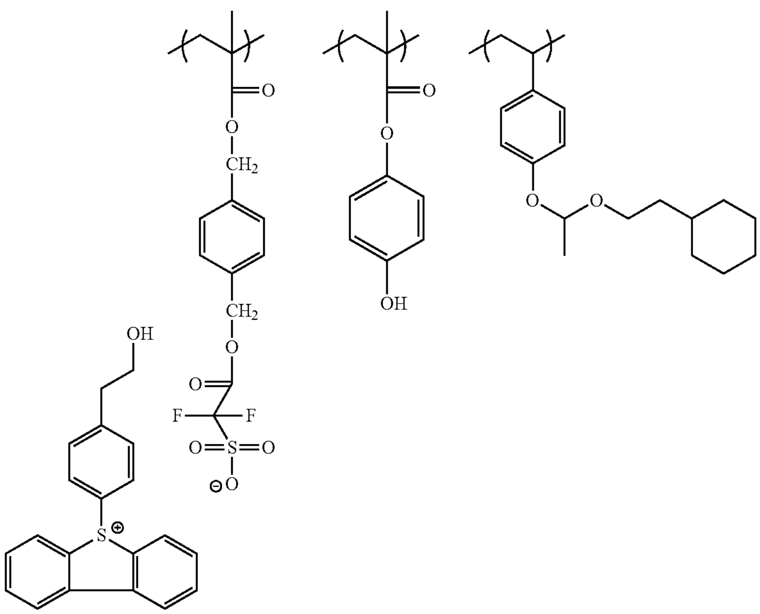
(P-9)
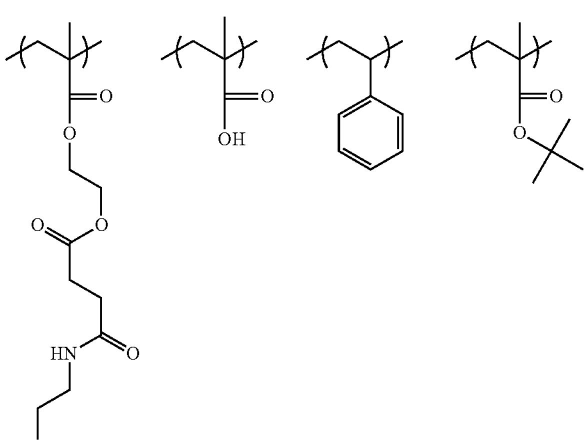

TABLE 2-continued
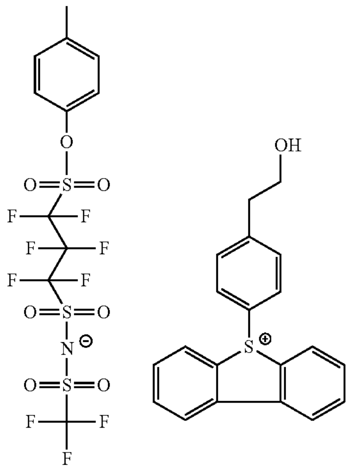
(P-10)
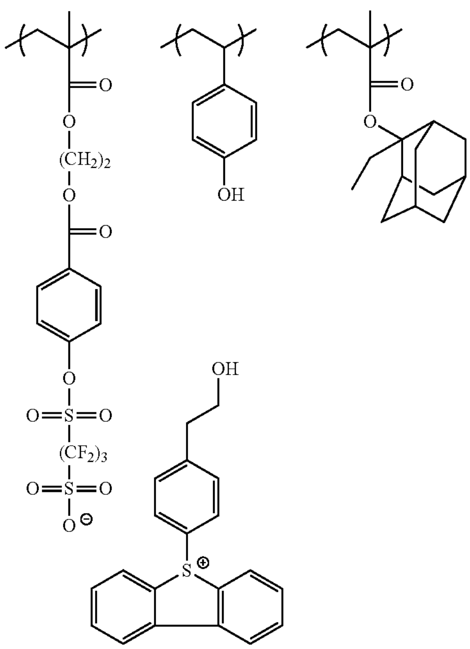
(P-11)
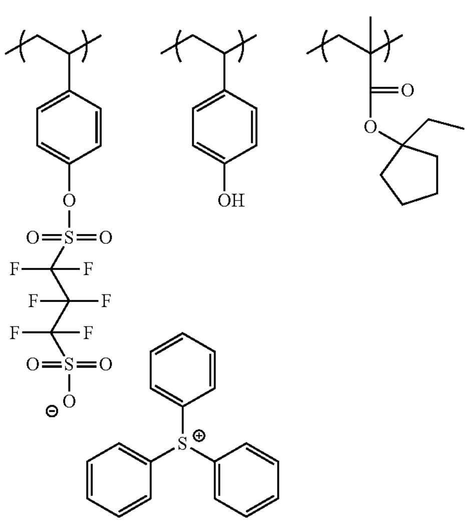

TABLE 2-continued
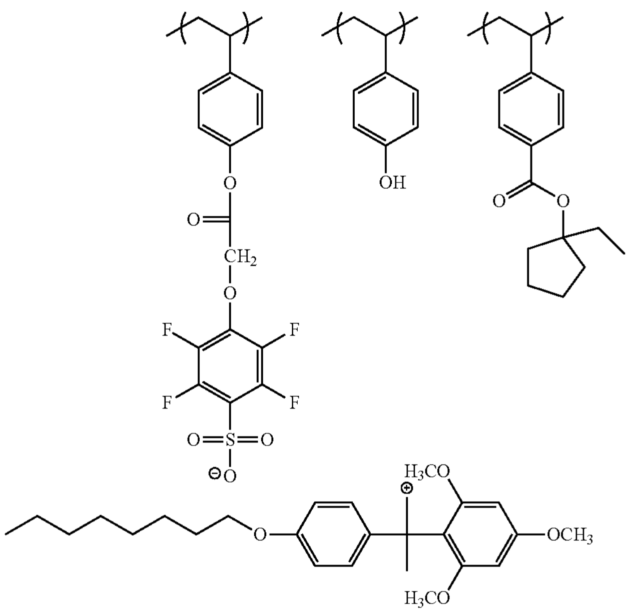
(P-12)
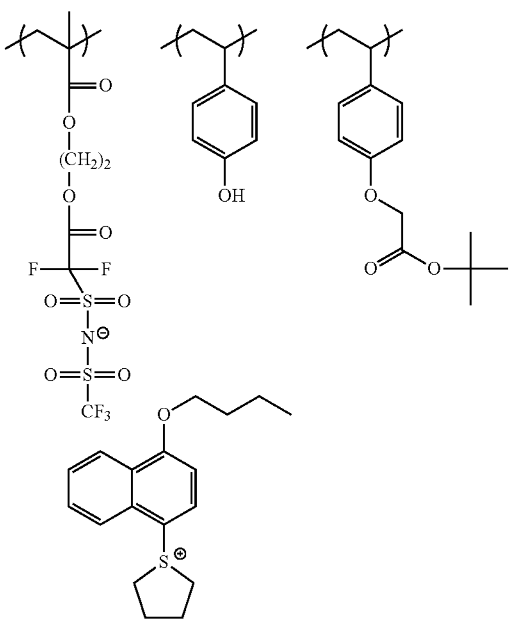
(P-13)
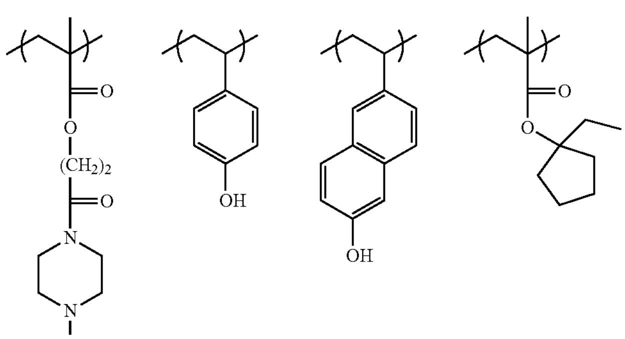
(P-14)

TABLE 2-continued
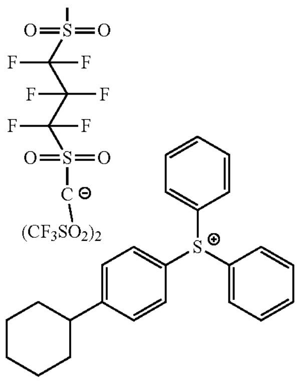
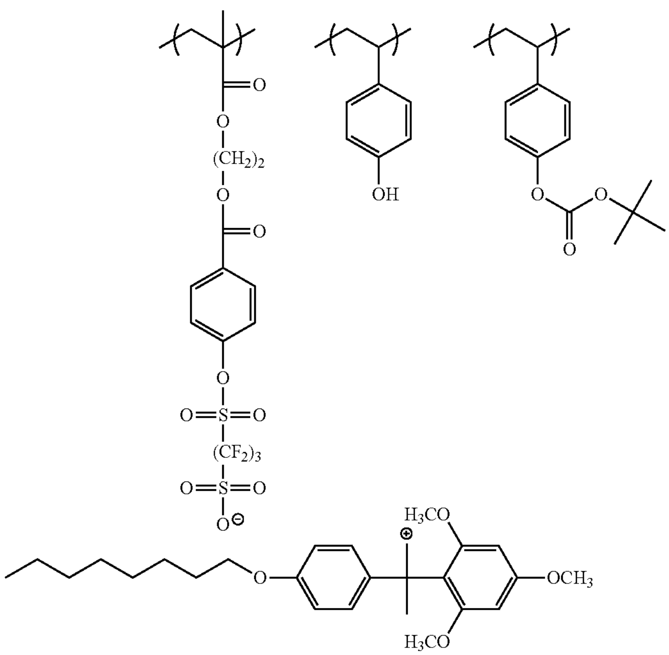
(P-15)
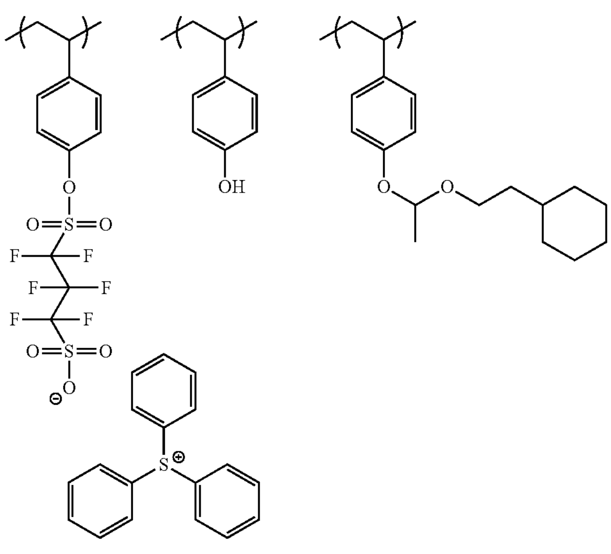
(P-16)

TABLE 2-continued
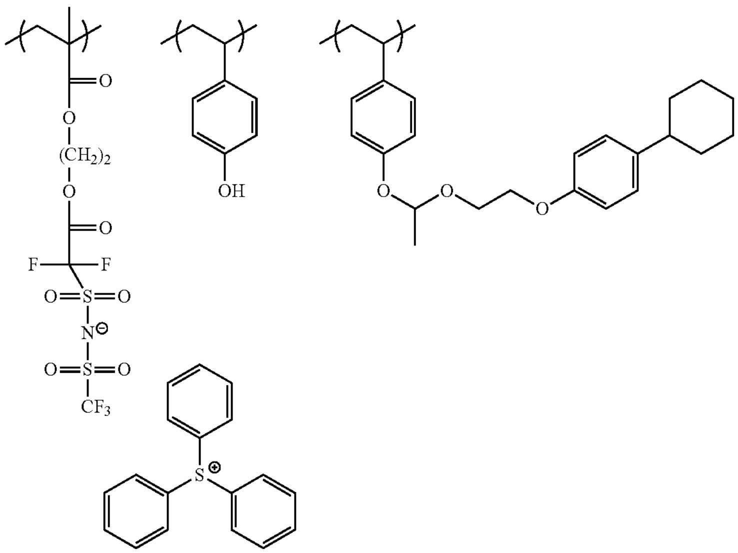
(P-17)
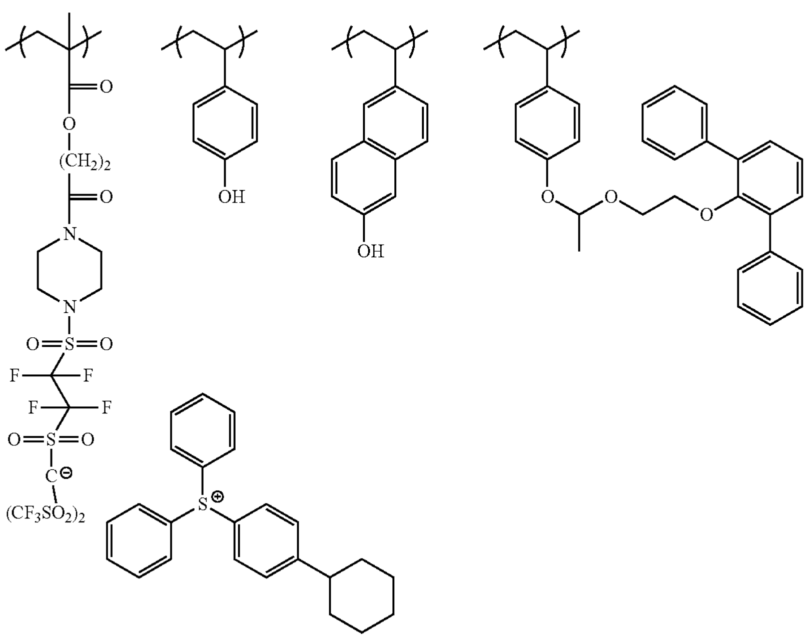
(P-18)

TABLE 2-continued
(P-19)
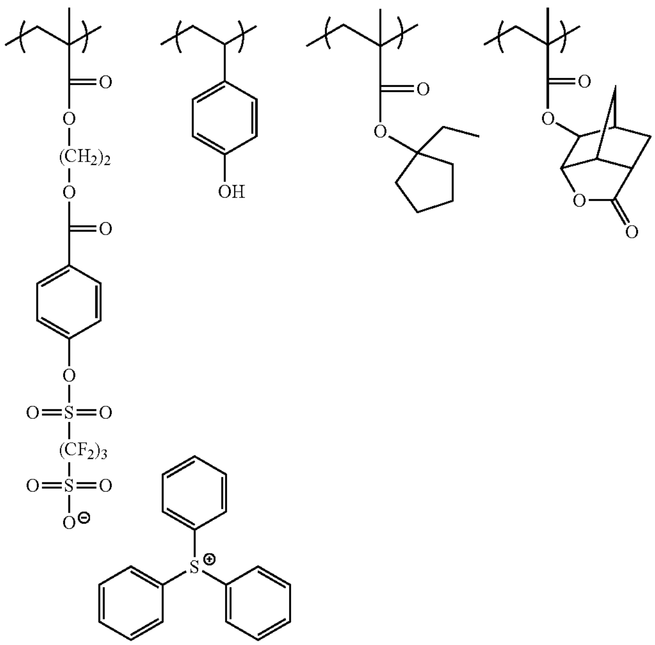
(P-20)
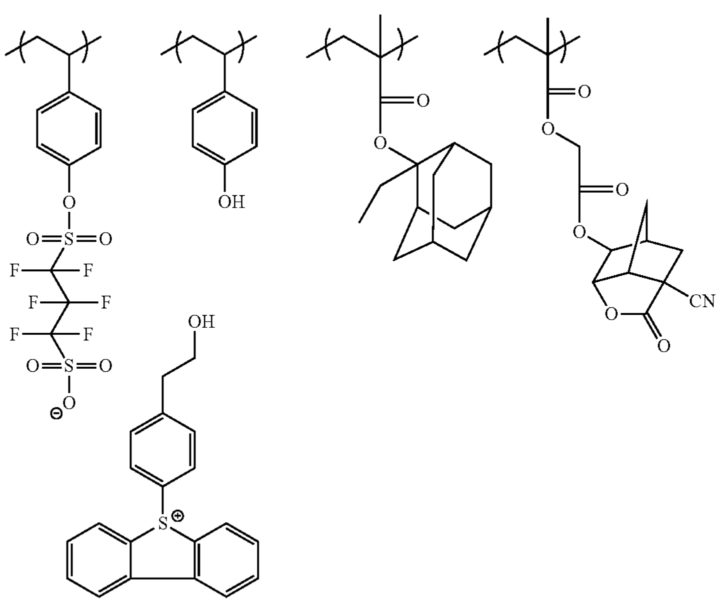

TABLE 2-continued
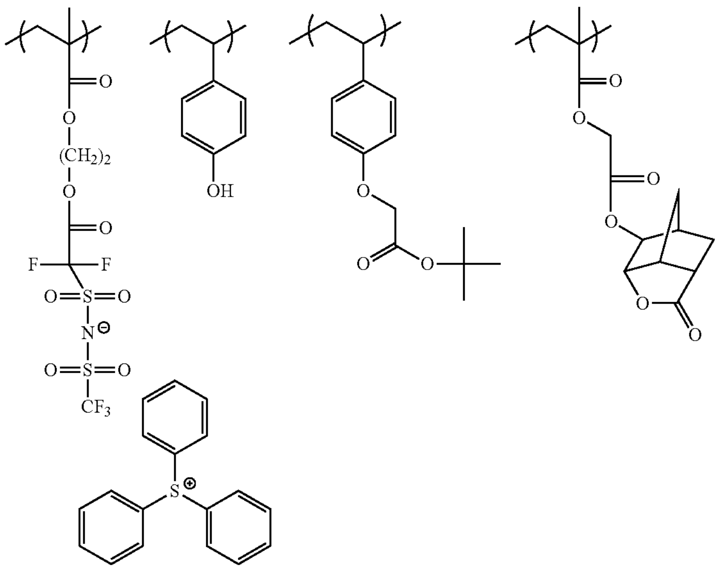
(P-21)
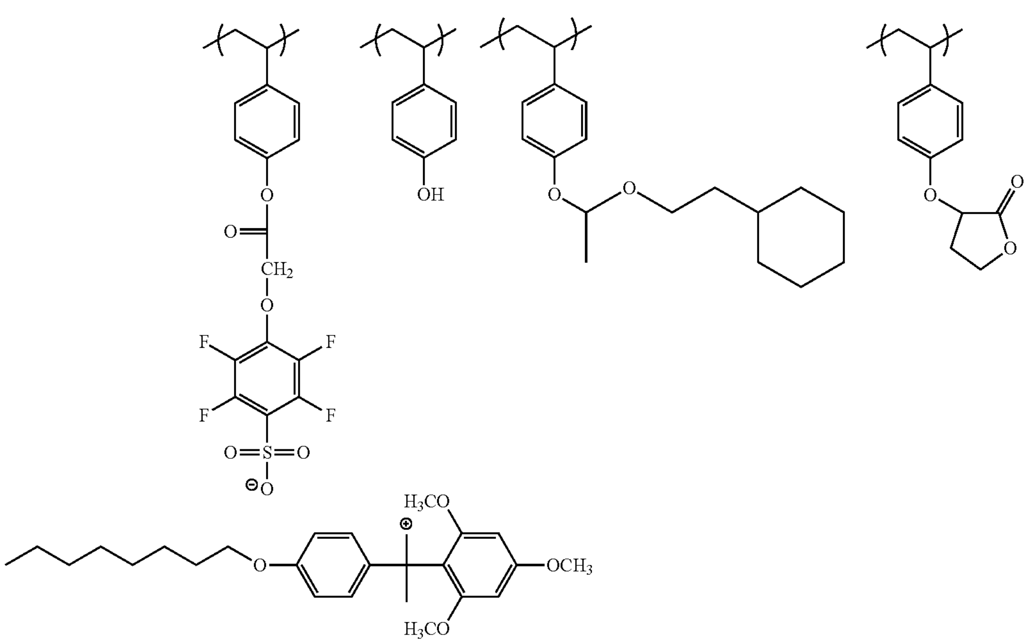
(P-22)

TABLE 2-continued
(P-23)
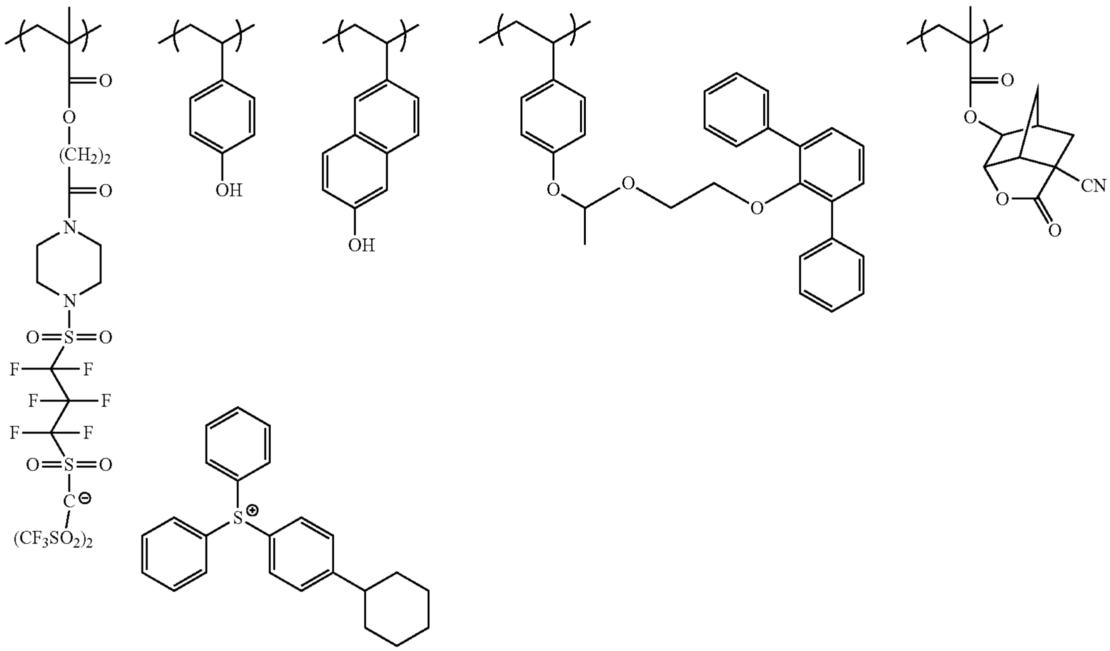
(P-24)
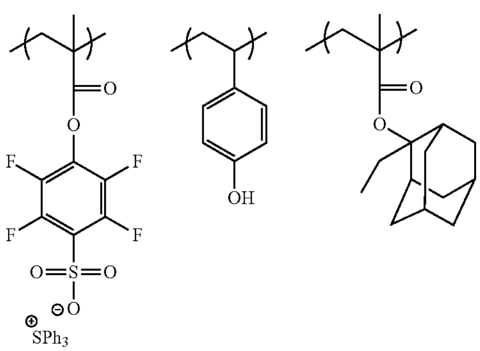
(P-25)
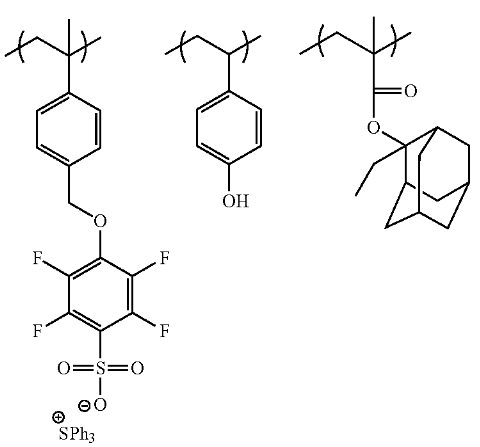

TABLE 2-continued
(P-26)
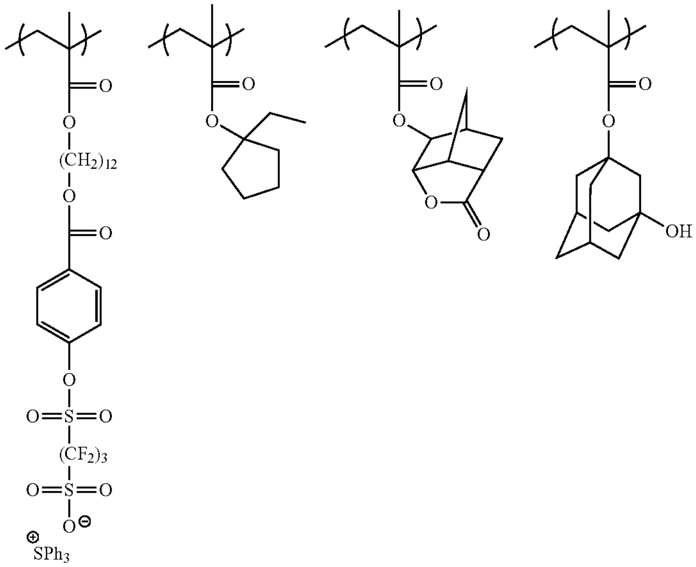
(P-27)
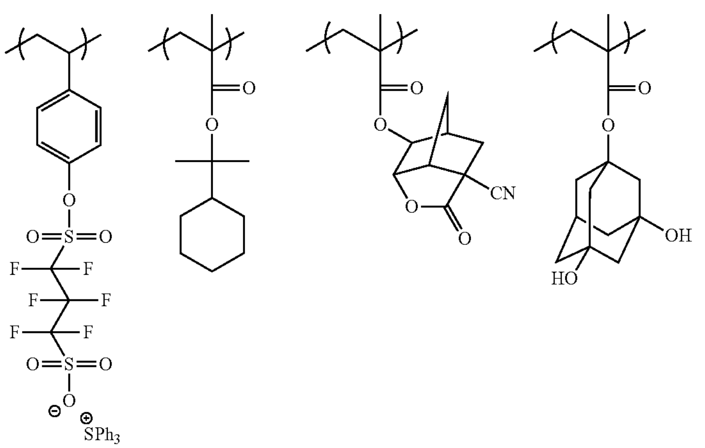
(P-28)
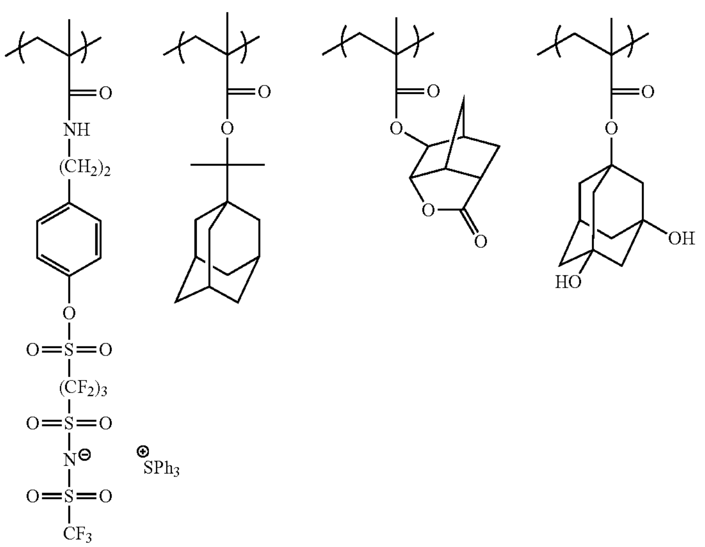

TABLE 2-continued (P-29)

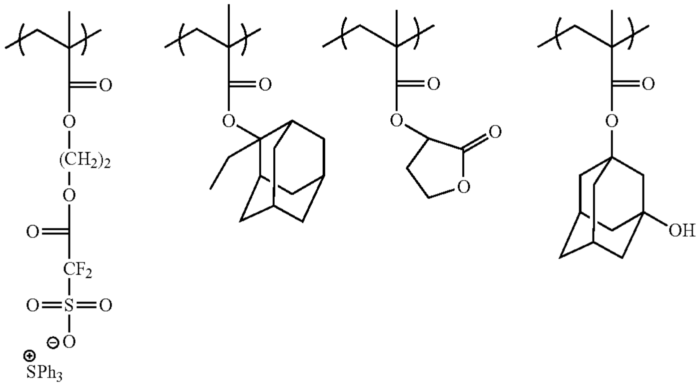

(P-30)

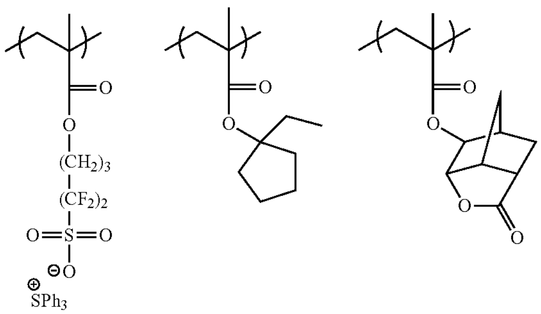

<Preparation of Actinic-Ray- or Radiation-Sensitive Resin Composition>

The components of Table 3-1 and Table 4 below were dissolved in the mixed solvents of Table 3-1 and Table 4, and the thus obtained solutions were passed through a polytetrafluoroethylene filter of 0.1 μm pore size, thereby obtaining radiation-sensitive resin compositions (positive resist solutions) of the concentrations of total solids (mass %) indicated in Table 3-1 and Table 4. The solutions were evaluated by the following methods. The concentrations (mass %) of components of Table 3 and Table 4 are based on the total solids. The evaluation results are given in Tables 3-2 and 4.

TABLE 3-1

(EB exposure)

| | Resin (P) [conc. (mass %)] | Other resin [conc. (mass %)] | Conventional acid generator [conc. (mass %)] | Basic compound [conc. (mass %)] | Organic solvent (D) [mass ratio] | Surfactant [conc. (mass %)] | Total solid conc. (mass %) |
|---|---|---|---|---|---|---|---|
| Ex. 1 | P-1 [99.95] | — | — | — | S1/S2 [40/60] | W-1 [0.05] | 4.0 |
| Ex. 2 | P-2 [99.95] | | | | S1/S2 [40/60] | W-2 [0.05] | 4.0 |
| Ex. 3 | P-3 [99.95] | — | — | — | S1/S2 [40/60] | W-3 [0.05] | 4.0 |
| Ex. 4 | P-4 [99.95] | — | — | — | S1/S2 [40/60] | W-1 [0.05] | 4.0 |
| Ex. 5 | P-5 [99.95] | — | — | — | S1/S2 [40/60] | W-2 [0.05] | 4.0 |
| Ex. 6 | P-6 [99.95] | — | — | — | S1/S2/S3 [30/60/10] | W-3 [0.05] | 4.0 |
| Ex. 7 | P-7 [99.95] | — | — | — | S1/S2 [40/60] | W-1 [0.05] | 4.0 |
| Ex. 8 | P-8 [99.95] | — | — | — | S1/S2 [40/60] | W-3 [0.05] | 4.0 |
| Ex. 9 | P-9 [99.95] | — | — | — | S1/S2 [40/60] | W-2 [0.05] | 4.0 |
| Ex. 10 | P-10 [99.95] | — | — | — | S1/S2 [40/60] | W-3 [0.05] | 4.0 |
| Ex. 11 | P-11 [99.95] | — | — | — | S1/S2 [40/60] | W-2 [0.05] | 4.0 |
| Ex. 12 | P-12 [99.95] | — | — | — | S1/S2 [40/60] | W-1 [0.05] | 4.0 |

TABLE 3-1-continued (EB exposure)

| | Resin (P) [conc. (mass %)] | Other resin [conc. (mass %)] | Conventional acid generator [conc. (mass %)] | Basic compound [conc. (mass %)] | Organic solvent (D) [mass ratio] | Surfactant [conc. (mass %)] | Total solid conc. (mass %) |
|---|---|---|---|---|---|---|---|
| Ex. 13 | P-13 [99.95] | — | — | — | S1/S2 [40/60] | W-3 [0.05] | 4.0 |
| Ex. 14 | P-14 [99.95] | — | — | — | S1/S2 [40/60] | W-2 [0.05] | 4.0 |
| Ex. 15 | P-15 [99.95] | — | — | — | S1/S2 [40/60] | W-1 [0.05] | 4.0 |
| Ex. 16 | P-16 [99.95] | — | — | — | S1/S2/S3 [30/60/10] | W-2 [0.05] | 4.0 |
| Ex. 17 | P-17 [99.95] | — | — | — | S1/S2 [40/60] | W-3 [0.05] | 4.0 |
| Ex. 18 | P-18 [99.95] | — | — | — | S1/S2 [40/60] | W-1 [0.05] | 4.0 |
| Ex. 19 | P-19 [99.95] | — | — | — | S1/S2 [40/60] | W-1 [0.05] | 4.0 |
| Ex. 20 | P-20 [99.95] | — | — | — | S1/S2 [40/60] | W-2 [0.05] | 4.0 |
| Ex. 21 | P-21 [99.95] | — | — | — | S1/S2 [40/60] | W-1 [0.05] | 4.0 |
| Ex. 22 | P-22 [99.95] | — | — | — | S1/S2/S3 [30/60/10] | W-3 [0.05] | 4.0 |
| Ex. 23 | P-23 [99.95] | — | — | — | S1/S2 [40/60] | W-2 [0.05] | 4.0 |
| Ex. 24 | P-3 [98.65] | — | PAG2 [1] | TOA [0.3] | S1/S2 [40/60] | W-1 [0.05] | 4.0 |
| Ex. 25 | P-4 [99.85] | — | — | TBAH [0.1] | S1/S2 [40/60] | W-2 [0.05] | 4.0 |
| Ex. 26 | P-10 [99.85] | — | — | TBAH [0.1] | S1/S2/S3 [30/60/10] | W-1 [0.05] | 4.0 |
| Ex. 27 | P-11 [99.85] | — | — | TOA [0.1] | S1/S2 [40/60] | W-2 [0.05] | 4.0 |
| Ex. 28 | P-12 [99.85] | — | — | TBAH [0.1] | S1/S2 [40/60] | W-1 [0.05] | 4.0 |
| Ex. 29 | P-13 [98.75] | — | PAG2 [1] | TBAH/TOA [0.1/0.1] | S1/S2 [40/60] | W-3 [0.05] | 4.0 |
| Ex. 30 | P-14/P-11 [49.85/50] | — | — | TOA [0.1] | S1/S2 [40/60] | W-1 [0.05] | 4.0 |
| Ex. 31 | P-15 [99.85] | — | — | TBAH [0.1] | S1/S2 [40/60] | W-2 [0.05] | 4.0 |
| Ex. 32 | P-16 [69.85] | P-31 [30] | — | TOA [0.1] | S1/S2 [40/60] | W-1 [0.05] | 4.0 |
| Ex. 33 | P-17 [99.85] | — | — | TOA [0.1] | S1/S2 [40/60] | W-3 [0.05] | 4.0 |
| Ex. 34 | P-18 [99.85] | — | — | TBAH [0.1] | S1/S2 [40/60] | W-1 [0.05] | 4.0 |
| Ex. 35 | P-19 [99.85] | — | — | TBAH [0.1] | S1/S2/S3 [30/60/10] | W-1 [0.05] | 4.0 |
| Ex. 36 | P-20 [99.85] | — | — | TOA [0.1] | S1/S2 [40/60] | W-2 [0.05] | 4.0 |
| Ex. 37 | P-21/P-11 [50/49.85] | — | — | TOA [0.1] | S1/S2 [40/60] | W-3 [0.05] | 4.0 |
| Comp. 1 | P-24 [99.85] | — | — | TBAH [0.1] | S1/S2 [40/60] | W-2 [0.05] | 4.0 |
| Comp. 2 | P-25 [99.85] | — | — | TBAH [0.1] | S1/S2 [40/60] | W-1 [0.05] | 4.0 |
| Comp. 3 | P-26 [99.75] | — | — | TOA [0.2] | S1/S2 [40/60] | W-3 [0.05] | 4.0 |
| Comp. 4 | P-27 [99.85] | — | — | TOA [0.1] | S1/S2 [40/60] | W-1 [0.05] | 4.0 |
| Comp. 5 | P-28 [99.85] | — | — | TBAH [0.1] | S1/S2 [40/60] | W-2 [0.05] | 4.0 |
| Comp. 6 | P-29 [99.85] | — | — | TOA [0.1] | S1/S2 [40/60] | W-1 [0.05] | 4.0 |
| Comp. 7 | P-30 [99.85] | — | — | TOA [0.1] | S1/S2 [40/60] | W-3 [0.05] | 4.0 |

TABLE 3-2

| (EB exposure) resistance | | | | | | |
|---|---|---|---|---|---|---|
| | Sensitivity (μC/cm²) | Resolving power (nm) | Configuration of pattern | LER (nm) | Aging stability of resist | Etching resistance |
| Ex. 1 | 19.6 | 70 | Rectangle | 6.0 | ○ | ○ |
| Ex. 2 | 14.3 | 75 | Rectangle | 6.4 | ○ | ○ |
| Ex. 3 | 20.5 | 70 | Rectangle | 6.1 | ○ | ○ |
| Ex. 4 | 19.2 | 65 | Rectangle | 5.8 | ○ | ○ |
| Ex. 5 | 15.5 | 70 | Rectangle | 6.0 | ○ | ○ |
| Ex. 6 | 17.9 | 70 | Rectangle | 5.9 | ○ | ○ |
| Ex. 7 | 19.8 | 65 | Rectangle | 5.8 | ○ | ○ |
| Ex. 8 | 19.1 | 65 | Rectangle | 5.9 | ○ | ○ |
| Ex. 9 | 17.4 | 70 | Rectangle | 6.0 | ○ | ○ |
| Ex. 10 | 18.6 | 60 | Rectangle | 5.1 | ○ | ○ |
| Ex. 11 | 17.9 | 60 | Rectangle | 5.0 | ○ | ○ |
| Ex. 12 | 13.7 | 60 | Rectangle | 5.5 | ○ | ○ |
| Ex. 13 | 17.2 | 60 | Rectangle | 5.3 | ○ | ○ |
| Ex. 14 | 19.0 | 60 | Rectangle | 5.2 | ○ | ○ |
| Ex. 15 | 19.3 | 65 | Rectangle | 5.4 | ○ | ○ |
| Ex. 16 | 13.6 | 60 | Rectangle | 5.4 | ○ | ○ |
| Ex. 17 | 19.3 | 65 | Rectangle | 5.3 | ○ | ○ |
| Ex. 18 | 20.1 | 65 | Rectangle | 5.3 | ○ | ○ |
| Ex. 19 | 18.2 | 60 | Rectangle | 4.9 | ○ | ○ |
| Ex. 20 | 18.5 | 60 | Rectangle | 4.8 | ○ | ○ |
| Ex. 21 | 18.6 | 60 | Rectangle | 4.9 | ○ | ○ |
| Ex. 22 | 19.0 | 60 | Rectangle | 5.1 | ○ | ○ |
| Ex. 23 | 20.4 | 60 | Rectangle | 5.2 | ○ | ○ |
| Ex. 24 | 27.5 | 65 | Rectangle | 5.6 | ○ | ○ |
| Ex. 25 | 24.1 | 60 | Rectangle | 5.2 | ○ | ○ |
| Ex. 26 | 23.6 | 55 | Rectangle | 4.3 | ○ | ○ |
| Ex. 27 | 22.9 | 55 | Rectangle | 4.2 | ○ | ○ |
| Ex. 28 | 18.8 | 55 | Rectangle | 4.7 | ○ | ○ |
| Ex. 29 | 24.3 | 60 | Rectangle | 4.8 | ○ | ○ |
| Ex. 30 | 24.0 | 55 | Rectangle | 4.4 | ○ | ○ |
| Ex. 31 | 24.2 | 60 | Rectangle | 4.4 | ○ | ○ |
| Ex. 32 | 21.7 | 60 | Rectangle | 5.0 | ○ | ○ |
| Ex. 33 | 24.2 | 60 | Rectangle | 4.3 | ○ | ○ |
| Ex. 34 | 25.1 | 60 | Rectangle | 4.3 | ○ | ○ |
| Ex. 35 | 23.2 | 55 | Rectangle | 4.1 | ○ | ○ |
| Ex. 36 | 23.6 | 55 | Rectangle | 4.1 | ○ | ○ |
| Ex. 37 | 23.5 | 55 | Rectangle | 4.2 | ○ | ○ |
| Comp. 1 | 29.8 | 65 | Taper | 6.0 | x | ○ |
| Comp. 2 | 29.9 | 80 | Taper | 7.5 | ○ | ○ |
| Comp. 3 | 43.6 | 65 | Rectangle | 6.3 | ○ | x |
| Comp. 4 | 51.0 | 60 | Rectangle | 6.1 | ○ | x |
| Comp. 5 | 52.2 | 60 | Rectangle | 6.2 | ○ | x |
| Comp. 6 | 63.4 | 60 | Rectangle | 6.0 | ○ | x |
| Comp. 7 | 66.0 | 60 | Rectangle | 6.0 | ○ | x |

TABLE 4

| (EUV exposure) | | | | | | | |
|---|---|---|---|---|---|---|---|
| | Resin (P) [99.85 mass %] | Basic compound [0.1 mass %)] | Organic solvent (D) [mass ratio] | Surfactant [0.05 mass %] | Total solid conc. (mass %) | Sensitivity (mJ/cm²) | Configuration of pattern |
| Ex. 38 | P-10 | TBAH | S1/S2 [40/60] | W-2 | 4.0 | 22.3 | Rectangle |
| Ex. 39 | P-11 | TOA | S1/S2 [40/60] | W-1 | 4.0 | 20.8 | Rectangle |
| Ex. 40 | P-12 | TBAH | S1/S2/S3 [30/60/10] | W-3 | 4.0 | 16.6 | Rectangle |
| Ex. 41 | P-13 | TOA | S1/S2 [40/60] | W-1 | 4.0 | 21.9 | Rectangle |
| Ex. 42 | P-14 | TOA | S1/S2 [40/60] | W-2 | 4.0 | 22.7 | Rectangle |
| Ex. 43 | P-15 | TBAH | S1/S2 [40/60] | W-3 | 4.0 | 23.2 | Rectangle |
| Ex. 44 | P-16 | TOA | S1/S2/S3 [30/60/10] | W-1 | 4.0 | 16.5 | Rectangle |
| Ex. 45 | P-17 | TOA | S1/S2 [40/60] | W-2 | 4.0 | 24.0 | Rectangle |
| Ex. 46 | P-18 | TBAH | S1/S2 [40/60] | W-1 | 4.0 | 25.6 | Rectangle |
| Ex. 47 | P-19 | TBAH | S1/S2 [40/60] | W-3 | 4.0 | 21.9 | Rectangle |
| Ex. 48 | P-20 | TOA | S1/S2/S3 [30/60/10] | W-1 | 4.0 | 22.7 | Rectangle |
| Ex. 49 | P-21 | TOA | S1/S2 [40/60] | W-2 | 4.0 | 22.4 | Rectangle |

The abbreviations appearing in the Tables have the following meanings.

[Resin (P)]

Resins (P-1) to (P-30) are as defined hereinbefore.

Resin (P-31)

(P-31)

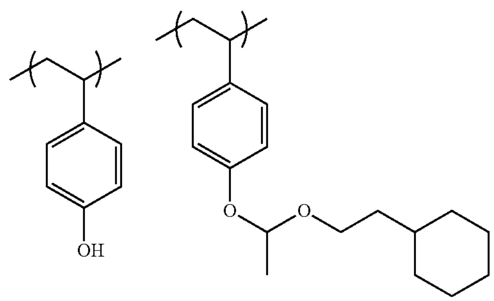

Mw = 5000, Mw/Mn = 1.5

[Acid Generator]

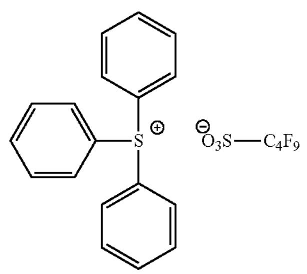

PAG2

[Basic Compound]

TBAH: tetrabutylammonium hydroxide, and

TOA: trioctylamine.

[Surfactant]

W-1: Megafac F176 (produced by Dainippon Ink & Chemicals, Inc., fluorinated),

W-2: Megafac R08 (produced by Dainippon Ink & Chemicals, Inc., fluorinated and siliconized), and W-3: polysiloxane polymer (produced by Shin-Etsu Chemical Co., Ltd., siliconized).

[Solvent]

S1: propylene glycol monomethyl ether acetate (PGMEA),

S2: propylene glycol monomethyl ether (PGME), and

S3: ethyl lactate (EL).

(Exposure Condition 1: EB Exposure) Examples 1 to 37 and Comparative Examples 1 to 7

Each of the prepared radiation-sensitive resin compositions was uniformly applied onto a silicon substrate having undergone hexamethyldisilazane treatment by means of a spin coater, and dried by baking on a hot plate at 120° C. for 90 seconds. Thus, radiation-sensitive films each having a thickness of 100 nm were formed.

Each of the formed radiation-sensitive films was irradiated with electron beams by means of an electron beam irradiating apparatus (HL750 manufactured by Hitachi, Ltd., acceleration voltage 50 KeV). The irradiated film was immediately baked on a hot plate at 110° C. for 90 seconds. The baked film was developed with a 2.38 mass % aqueous tetramethylammonium hydroxide solution at 23° C. for 60 seconds, rinsed with pure water for 30 seconds and dried. Thus, line and space patterns were formed. The obtained patterns were evaluated in the following manners.

(Exposure Condition 2: EUV Exposure) Examples 38 to 49

Each of the prepared radiation-sensitive resin compositions was uniformly applied onto a silicon substrate having undergone hexamethyldisilazane treatment by means of a spin coater, and dried by baking on a hot plate at 120° C. for 90 seconds. Thus, radiation-sensitive films each having a thickness of 100 nm were formed.

Each of the formed radiation-sensitive films was irradiated with EUV by means of an EUV exposure apparatus (manufactured by Lithotec Japan Co., Ltd., wavelength 13 nm). The irradiated film was immediately baked on a hot plate at 110° C. for 90 seconds. The baked film was developed with a 2.38 mass % aqueous tetramethylammonium hydroxide solution at 23° C. for 60 seconds, rinsed with pure water for 30 seconds and dried. Thus, line and space patterns (line:space=1:1) were formed. The obtained patterns were evaluated in the following manners.

<Evaluation of Resist>

[Sensitivity]

The configuration of a cross section of each of the obtained patterns was observed by means of a scanning electron microscope (model S-9220, manufactured by Hitachi, Ltd.). The sensitivity was defined as the minimum exposure energy at which a 100 nm line (line:space=1:1) could be resolved.

[Resolving Power]

The resolving power was defined as a limiting resolving power (line and space separated or resolved from each other) under the amount of exposure exhibiting the above sensitivity.

[Configuration of Pattern]

The configuration of a cross section of each 100 nm line pattern formed under the amount of exposure exhibiting the above sensitivity was observed by means of a scanning electron microscope (model S-4300, manufactured by Hitachi, Ltd.) The pattern configuration was evaluated into being rectangular, slightly tapering and tapering on a 3-point scale.

[LER]

A 100 nm line pattern formed under the amount of exposure exhibiting the above sensitivity was observed by means of a scanning electron microscope (model S-9220, manufactured by Hitachi, Ltd.). The distance between actual edge and a reference line on which edges were to be present was measured on arbitrary 30 points within 50 μm in the longitudinal direction of the pattern. The standard deviation of measured distances was determined, and 3σ was computed therefrom.

[Aging Stability of Resist]

Each of the compositions was stored at room temperature for a month. The degree of storage anterior-posterior sensitivity change was evaluated. Sensitivity change (%)=[absolute value of storage anterior-posterior sensitivity difference/sensitivity before storage]×100.

(Judgment Criteria)

o: when the sensitivity change was less than 15%, and x: when the sensitivity change was 15% or greater.

[Etching Resistance]

A 200 nm thick positive resist film was formed on a wafer. Plasma etching thereof was carried out using a mixed gas consisting of $C_4F_6$ (20 ml/min) and $O_2$ (40 ml/min) at 23° C.

for 30 seconds. Thereafter, the amount of remaining film was determined and the etching rate was calculated therefrom.

(Judgment Criteria)

o: when the etching rate was less than 15 Å/sec, and x: when the etching rate was 15 Å/sec or greater.

It is apparent from Table 3-2 that the actinic-ray- or radiation-sensitive resin compositions of the present invention are satisfactory in all the high sensitivity, high resolution, good pattern configuration, good line edge roughness, resist aging stability and dry etching resistance under EB exposure.

It is apparent from Table 4 that the actinic-ray- or radiation-sensitive resin compositions of the present invention simultaneously satisfy the requirements for high sensitivity and good pattern configuration under EUV light exposure.

The invention claimed is:

1. An actinic-ray- or radiation-sensitive resin composition comprising a resin (P) containing:

at least one repeating unit (A) that when exposed to actinic rays or radiation, is decomposed to thereby generate an acid and is expressed by general formula (II) below;

a repeating unit (B) containing at least an aromatic ring group provided that the repeating unit (B) does not include that of general formula (II); and a repeating unit (D) containing a group that when acted on by an alkali developer is decomposed to thereby increase its dissolution rate in the alkali developer, (I)

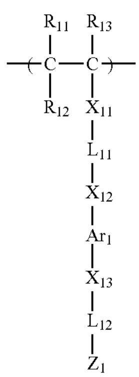

(II)

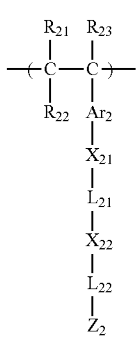

-continued (III)

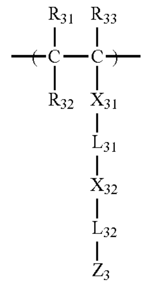

in general formula (II), each of $R_{21}$, $R_{22}$ and $R_{23}$ independently represents a hydrogen atom, an alkyl group, a monovalent aliphatic hydrocarbon ring group, a halogen atom, a cyano group or an alkoxycarbonyl group, provided that $R_{22}$ may be bonded to $Ar_2$ to thereby form a ring, which $R_{22}$ in this instance is an alkylene group;

$Ar_2$ represents a bivalent aromatic ring group;

$X_{21}$ represents —O—, —S—, —CO—, —$SO_2$—, —NR— (R represents a hydrogen atom or an alkyl group), a bivalent nitrogenous nonaromatic heterocyclic group or a group composed of a combination of these;

$L_{21}$ represents a single bond, an alkylene group, an alkenylene group, a bivalent aliphatic hydrocarbon ring group, a bivalent aromatic ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these;

$X_{22}$ represents a single bond, —O—, —S—, —CO—, —$SO_2$—, —NR— (R represents a hydrogen atom or an alkyl group), a bivalent nitrogenous nonaromatic heterocyclic group or a group composed of a combination of these;

$L_{22}$ represents a bivalent aromatic ring group; and $Z_2$ represents a moiety that when exposed to actinic rays or radiation, is converted to a sulfonate group.

2. The actinic-ray- or radiation-sensitive resin composition according to claim 1, wherein at least any of the repeating units (B1) of general formula (IV) below is contained as the repeating unit (B), (IV)

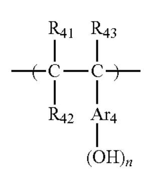

wherein each of $R_{41}$, $R_{42}$ and $R_{43}$ independently represents a hydrogen atom, an alkyl group, a monovalent aliphatic hydrocarbon ring group, a halogen atom, a cyano group or an alkoxycarbonyl group, provided that $R_{42}$ may be bonded to $Ar_4$ to thereby form a ring, which $R_{42}$ in this instance is an alkylene group;

$Ar_4$ represents a bivalent aromatic ring group; and n is an integer of 1 to 4.

3. The actinic-ray- or radiation-sensitive resin composition according to claim 1, wherein at least a repeating unit (B2) containing a group that when acted on by an acid, is decomposed to thereby generate an alkali-soluble group is contained as the repeating unit (B).

4. The actinic-ray- or radiation-sensitive resin composition according to claim 3, wherein the repeating unit (B2) is any of those of general formulae(V) and (VI) below, (V)

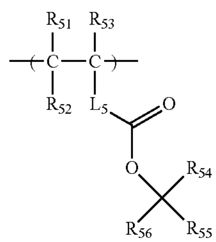

(VI)

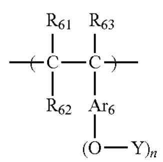

in general formula (V), each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L_5$ to thereby form a ring, which $R_{52}$ in this instance is an alkylene group;

$L_5$ represents a single bond or a bivalent connecting group, provided that $L_5$ may be bonded to $R_{52}$ to thereby form a ring, which $L_5$ in this instance is a trivalent connecting group; and $R_{54}$ represents an alkyl group, and each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to thereby form a ring, provided that at least one of $L_5$, $R_{55}$ and $R_{56}$ is an aromatic ring group or a group containing an aromatic ring group, and that $R_{55}$ and $R_{56}$ are not simultaneously hydrogen atoms, and in general formula (VI), each of $R_{61}$, $R_{62}$ and $R_{63}$ independently represents a hydrogen atom, an alkyl group, a monovalent aliphatic hydrocarbon ring group, a halogen atom, a cyano group or an alkoxycarbonyl group, provided that $R_{62}$ may be bonded to $Ar_6$ to thereby form a ring, which $R_{62}$ in this instance is an alkylene group;

$Ar_6$ represents an aromatic ring group;

Y, or each of Ys independently, represents a hydrogen atom or a group that when acted on by an acid, is cleaved, provided that at least one of Ys is a group that when acted on by an acid, is cleaved; and n is an integer of 1 to 4.

5. The actinic-ray- or radiation-sensitive resin composition according to claim 4, wherein the repeating unit (B2) is general formula (VI).

6. The actinic-ray- or radiation-sensitive resin composition according to claim 5, wherein in general formula (VI), Y is represented by the following general formula (VI-A):

(VI-A)

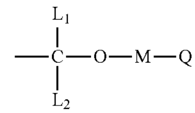

wherein in formula (VI-A), each of $L_1$ and $L_2$ independently represents a hydrogen atom, an alkyl group, a monovalent aliphatic hydrocarbon ring group, a monovalent aromatic ring group or a group consisting of an alkylene group combined with a monovalent aromatic ring group;

M represents a single bond or a bivalent connecting group;

Q represents an alkyl group, a monovalent aliphatic hydrocarbon ring group optionally containing a heteroatom, a monovalent aromatic ring group optionally containing a heteroatom, an amino group, an ammonium group, a mercapto group, a cyano group or an aldehyde group; and at least two of Q, M and $L_1$ may be bonded to each other to thereby form a ring.

7. The actinic-ray- or radiation-sensitive resin composition according to claim 6, wherein in general formula (VI-A) M is a bivalent connecting group composed of a combination of an alkylene group and —O—.

8. The actinic-ray- or radiation-sensitive resin composition according to claim 1, wherein the resin (P) further contains any of the repeating units (C) of general formula (V') below, (V')

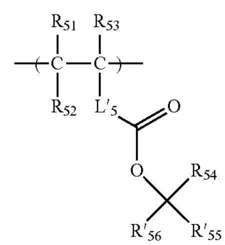

in which each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L'_5$ to thereby form a ring, which $R_{52}$ in this instance is an alkylene group;

$L'_5$ represents a single bond or any of bivalent connecting groups not including a bivalent aromatic ring group, provided that $L'_5$ may form a ring in cooperation with $R_{52}$, which $L'_5$ in this instance is a trivalent connecting group; and $R_{54}$ represents an alkyl group, and each of $R'_{55}$ and $R'_{56}$ independently represents a hydrogen atom, an alkyl group or a monovalent aliphatic hydrocarbon ring group, provided that $R'_{55}$ and $R'_{56}$ may be bonded to each other to thereby form a ring.

9. The actinic-ray- or radiation-sensitive resin composition according to claim 1, which further comprises a basic compound.

10. The actinic-ray- or radiation-sensitive resin composition according to claim 1, wherein in general formula (II), $X_{21}$ is —O—.

11. The actinic-ray- or radiation-sensitive resin composition according to claim 1, wherein in general formula (II), $L_{21}$ is an alkylene group.

12. The actinic-ray- or radiation-sensitive resin composition according to claim 1, adapted for exposure using electron beams, X-rays or EUV light as an exposure light source.

13. A method of forming a pattern, comprising the steps of forming the actinic-ray- or radiation-sensitive resin composition according to claim 1 into a film, exposing the film and developing the exposed film.

14. The method of forming a pattern according to claim 13, wherein the exposure is carried out using electron beams, X-rays or EUV light as an exposure light source.

* * * * *

UNITED STATES PATENT AND TRADEMARK OFFICE

CERTIFICATE OF CORRECTION

PATENT NO. : 9,052,590 B2
APPLICATION NO. : 13/393173
DATED : June 9, 2015
INVENTOR(S) : Hidenori Takahashi et al.

It is certified that error appears in the above-identified patent and that said Letters Patent is hereby corrected as shown below:

ON THE TITLE PAGE

Please add “*” before the date in item (45).

Signed and Sealed this
Eighth Day of December, 2015

Michelle K. Lee
*Director of the United States Patent and Trademark Office*